(12) United States Patent
Endoh et al.

(10) Patent No.: US 7,315,059 B2
(45) Date of Patent: Jan. 1, 2008

(54) SEMICONDUCTOR MEMORY DEVICE AND MANUFACTURING METHOD FOR THE SAME

(75) Inventors: Tetsuo Endoh, Natori (JP); Fujio Masuoka, 2-33-18, Higashikatsuyama, Aoba-ku, Sendai-shi, Miyagi (JP) 981-0923; Shinji Horii, Kasaoka (JP); Takuji Tanigami, Fukuyama (JP); Yoshihisa Wada, Fukuyama (JP); Takashi Yokoyama, Kasaoka (JP); Noboru Takeuchi, Fukuyama (JP)

(73) Assignees: Fujio Masuoka, Sendai-shi (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/854,555

(22) Filed: May 25, 2004

(65) Prior Publication Data

US 2004/0238879 A1 Dec. 2, 2004

(30) Foreign Application Priority Data

May 27, 2003 (JP) ............................. 2003-149379

(51) Int. Cl.
*H01L 29/792* (2006.01)
(52) U.S. Cl. ................................ 257/324; 257/E29.309
(58) Field of Classification Search ........ 257/315–323, 257/324, E29.309
See application file for complete search history.

(56) References Cited

U.S. PATENT DOCUMENTS

2002/0058381 A1   5/2002   Lee

2002/0096703 A1   7/2002   Vora
2003/0075756 A1*  4/2003   Suzuki ........................ 257/315
2005/0133851 A1*  6/2005   Forbes ........................ 257/315

FOREIGN PATENT DOCUMENTS

JP          06-013628         1/1994

(Continued)

OTHER PUBLICATIONS

Chen, J. T-Y. et al. (2000). "A New Dual Floating Gate Flash Cell for Multilevel Opertion," *Extended Abstracts of the 2000 International Conference on Solid State Devices and Materials*, Abstract C-5-4, pp. 282-283.

Endoh et al. (2003) "Novel Ultrahigh-Density Flash Memory With a Stacked-Surrounding Gate Transistor (S-SGT) Structured Cell" *IEEE Transactions On Electron Devices* 50 (4): 945-951.

(Continued)

*Primary Examiner*—Lynne Gurley
*Assistant Examiner*—Andrew O. Arena
(74) *Attorney, Agent, or Firm*—Morrison & Foerster LLP

(57) ABSTRACT

The present invention provides a semiconductor memory device having one or more protruding semiconductor layers formed on a semiconductor substrate of a first conductivity type and a plurality of memory cells on surfaces of the protruding semiconductor layers, wherein each of the memory cells is formed of a charge storage layer, a control gate and an impurity diffusion layer of a second conductivity type which is formed in a portion of the protruding semiconductor layer and the plurality of memory cells is aligned to at least a predetermined direction, and the control gates of the plurality of memory cells is aligned to the predetermined direction are placed so as to be separated from each other.

11 Claims, 152 Drawing Sheets

FOREIGN PATENT DOCUMENTS

| | | |
|---|---|---|
| JP | 07-045797 | 2/1995 |
| JP | 08-162547 | 6/1996 |
| JP | 2870478 | 1/1999 |
| JP | 2000-514946 | 11/2000 |
| JP | 2001-077219 | 3/2001 |
| JP | 2001-077220 | 3/2001 |

OTHER PUBLICATIONS

Endoh et al. (2001) "Novel Ultra High Density Flash Memory With a Stacked-Surrounding Gate Transistor (S-SGT) Structured Cell" *IEEE*: 33-36.

European Search Report dated May 25, 2007, directed to counterpart EP application 04253144.2 (4 pages).

* cited by examiner

SEMICONDUCTOR MEMORY DEVICE AND MANUFACTURING METHOD FOR THE SAME

CROSS-REFERENCE TO RELATED APPLICATION

This application is related to Japanese application No. 2003-149379 filed on May 27, 2003, whose priority is claimed under 35 USC §119, the disclosure of which is incorporated by reference in its entirety.

BACKGROUND OF THE INVENTION

1. Field of the Invention

The present invention relates to a semiconductor memory device and a manufacturing method for the same, and in particular to a semiconductor memory device, which includes a memory transistor having a charge storage layer and a control gate, and a manufacturing method for the same.

2. Description of the Related Art

Non-volatile memories represented by a NAND-type flash memory are used in a variety of fields such as in computers, communications, measurement equipment, automatic control apparatuses, consumer electronics for private use and the like as compact data recording media having large capacities. Accordingly, demand for non-volatile memories having large capacities at low costs is very high.

However, the capacity of a so-called planar-type memory, where memory cells are formed in a plane on a semiconductor substrate, is restricted by the minimum processing dimensions (feature size) that are the resolution limit of the photolithographic technology. Under such circumstances, multi-value technology and three-dimensional technology of a memory cell are respectively desired as the technologies for achieving the integration in the next generation without depending on an improvement of the photolithographic technology.

Multi-valued memory cells are roughly divided into a threshold value control type wherein a memory cell is made to have three or more threshold values and a charge storage region divided type where the region for holding a charge is divided within one memory cell so that each divided region independently stores a charge. A floating gate type, for example, is included in the former threshold value control type, and an NROM type (see, for example, Japanese Unexamined Patent Publication No. 2001-77220), a divided floating gate type (see, for example, Extended Abstract of the 2000 International Conference on Solid State Devices and Materials, Sendai, 2000, pp.282-283 and Japanese Patent No. 2870478) and the like are known as examples of the latter charge storage region divided type.

An NROM type memory cell which is a charge storage region divided type is shown in FIG. 153. Here, in FIG. 153 a semiconductor substrate is denoted as 1, an element isolation region is denoted as 50, an element region is denoted as 15, an impurity diffusion layer is denoted as 12, a silicon oxide film is denoted as 18, a silicon nitride film is denoted as 17, a silicon oxide film is denoted as 20, and a control gate is denoted as 60. In this memory cell the charge storage layer is formed of oxide film/nitride film/oxide film (ONO film) and, thereby two charge holding regions are created in one memory cell so that it becomes possible to store two-bit data in one memory cell.

In addition, FIGS. 154 and 155 show floating gate division type memory cells which are a charge storage region divided type. In FIGS. 154 and 155 a semiconductor substrate is denoted as 1, an element isolation insulating film is denoted as 2, first diffusion regions are denoted as 3, second diffusion regions are denoted as 4, a first insulating film is denoted as 6, first floating gate electrodes are denoted as 7, second floating gate electrodes are denoted as 7a, a second insulating film is denoted as 8, control gate electrodes are denoted as 9 and an insulating film is denoted as 10. Here, FIG. 155 shows a cross section of the memory cells along III-IV of FIG. 154. In these memory cells the floating gate in one memory cell is divided into the first floating gate 7 and the second floating gate 7a and, thereby it becomes possible to store two-bit data in one memory cell.

Thus a capacity greater than that of the planar type memory is secured in the same processing dimensions in either of the above described multiple value technologies, so as to overcome the capacity restriction due to the resolution limit of the photolithographic technology.

On the other hand, a memory cell is placed in the direction perpendicular to the substrate according to the three-dimensional technology of a memory cell and, thereby a capacity greater than that of the planar type memory is implemented in the same processing dimensions in the same manner as in the multiple value technology. Here, the precision required for the control of the amount of charge is the same as in the planar type memory according to this three-dimensional technology while the number of memory cells aligned in the direction perpendicular to the substrate is increased and, thereby an increase in the capacity can be implemented.

According to the above described multiple value technology of a memory cell, the greater the amount of data stored in one memory cell in the threshold value control type, the higher the precision required in the charge amount control technology. Accordingly, the operational speed is lowered. In addition, there is a problem in the charge storage region divided type where data that exceed two bits cannot be stored in one memory cell. Furthermore, bit lines and source lines are respectively formed of impurity diffusion layers in the charge storage region divided type and, therefore, a punch through phenomenon is introduced in the planar cell array when the distance between the respective impurity diffusion layers is reduced together with the reduction of the minimum processing dimensions in the manufacturing process or due to the reduction of the design rule in the manufacturing process. This hinders the scaling down and is not appropriate for an increase in the integration.

In addition, in the three-dimensional technology, the more the number of layers of a memory cell is increased, the greater becomes the number of manufacturing steps causing an increase in the manufacturing costs, an increase in the period of time for the manufacture and a decrease in the yield. Furthermore, in a manufactured memory cell, dispersion occurs in the cell characteristics due to the difference in the film quality of the tunnel film caused by thermal hysteresis at each stage and due to the difference in the profile of the impurity diffusion layers.

SUMMARY OF THE INVENTION

The present invention is made in view of the above problems, and an object of the present invention is to provide a semiconductor memory device with a high capacity at a low cost wherein a variety of problems such as a decrease in the operational speed due to the multiple values, harmful effects due to the scaling down, a dispersion in the cell characteristics due to the three-dimensional structure, an increase in the manufacture cost, an increase in the period of time for the manufacture, a decrease in the yield and difficulty in the process control have been solved at the same time as well as to provide a manufacturing method for the same.

According to the present invention, a semiconductor memory device, wherein each of the memory cells is formed of a charge storage layer, a control gate and an impurity diffusion layer of a second conductivity type which is formed in a portion of the protruding semiconductor layer and the plurality of memory cells is aligned to at least a predetermined direction, and the control gates of the plurality of memory cells is aligned to the predetermined direction are placed so as to be separated from each other.

In addition, according to the present invention, a manufacturing method for a semiconductor memory device, comprising the steps of:

(a) forming one or more protrusions on a semiconductor substrate of a first conductivity type;

(b1) forming one or more protruding semiconductor layers on the semiconductor substrate by carrying out once the step of digging the semiconductor substrate using the protrusions as a mask;

(c) forming sidewall spacers of insulating films so as to cover sides of the protruding semiconductor layers;

(d) introducing impurities of a second conductivity type in a portion or the entirety of corners of the protruding semiconductor layers in a self aligned manner relative to the sidewall spacers;

(e) forming charge storage layers so as to cover sides of the protruding semiconductor layers after the removal of the sidewall spacers; and (f) forming a first conductivity film so as to cover the charge storage layers, thereby forming, on the surfaces of the one or more protruding semiconductor layers formed on the semiconductor substrate of the first conductivity type, a plurality of memory cells composed of the charge storage layers, control gates and the impurity diffusion layers of the second conductivity type.

Furthermore, according to the present invention, a manufacturing method for a semiconductor memory device, comprising the steps of:

(a) forming one or more protrusions on a semiconductor substrate of a first conductivity type;

(b) forming protruding semiconductor layers in step forms on the semiconductor substrate by carrying out, one or more times, the steps of (i) forming first sidewall spacers of insulating films on sides of the protrusions; and (ii) digging the semiconductor substrate by using the first sidewall spacers as a mask;

(c2) forming second sidewall spacers of insulating films so as to cover sides of the protruding semiconductor layers after the removal of the first sidewall spacers;

(d) introducing impurities of a second conductivity type in a portion or the entirety of corners of the protruding semiconductor layers in a self aligned manner relative to the second sidewall spacers;

(e2) forming charge storage layers so as to cover sides of the protruding semiconductor layers after the removal of the second sidewall spacers; and (f) forming a first conductivity film so as to cover the charge storage layers, thereby forming, on the surfaces of the one or more protruding semiconductor layers formed on the semiconductor substrate of the first conductivity type, a plurality of memory cells composed of the charge storage layers, control gates and the impurity diffusion layers of the second conductivity type.

Furthermore, according to the present invention, a manufacturing method for a semiconductor memory device, comprising the steps of:

(a) forming one or more protrusions on a semiconductor substrate of a first conductivity type;

(b) forming protruding semiconductor layers in step forms on the semiconductor substrate by carrying out, one or more times, the steps of (i) forming sidewall spacers of insulating films on sides of the protrusions; and (ii) digging the semiconductor substrate by using the sidewall spacers as a mask;

(e) forming charge storage layers so as to cover sides of the protruding semiconductor layers after the removal of the sidewall spacers;

(f) forming a first conductivity film so as to cover the charge storage layers; and (g) processing the first conductivity film into sidewall spacer forms on sides of the protruding semiconductor layers by carrying out anisotropic etching, thereby forming, on the surfaces of the one or more protruding semiconductor layers formed on the semiconductor substrate of the first conductivity type, a plurality of memory cells composed at least the charge storage layers and control gates.

DESCRIPTION OF THE PREFERRED EMBODIMENTS

In the following, a semiconductor memory device according to the present invention and a manufacturing method for the same are described in detail in reference to the drawings.

Figure 1:
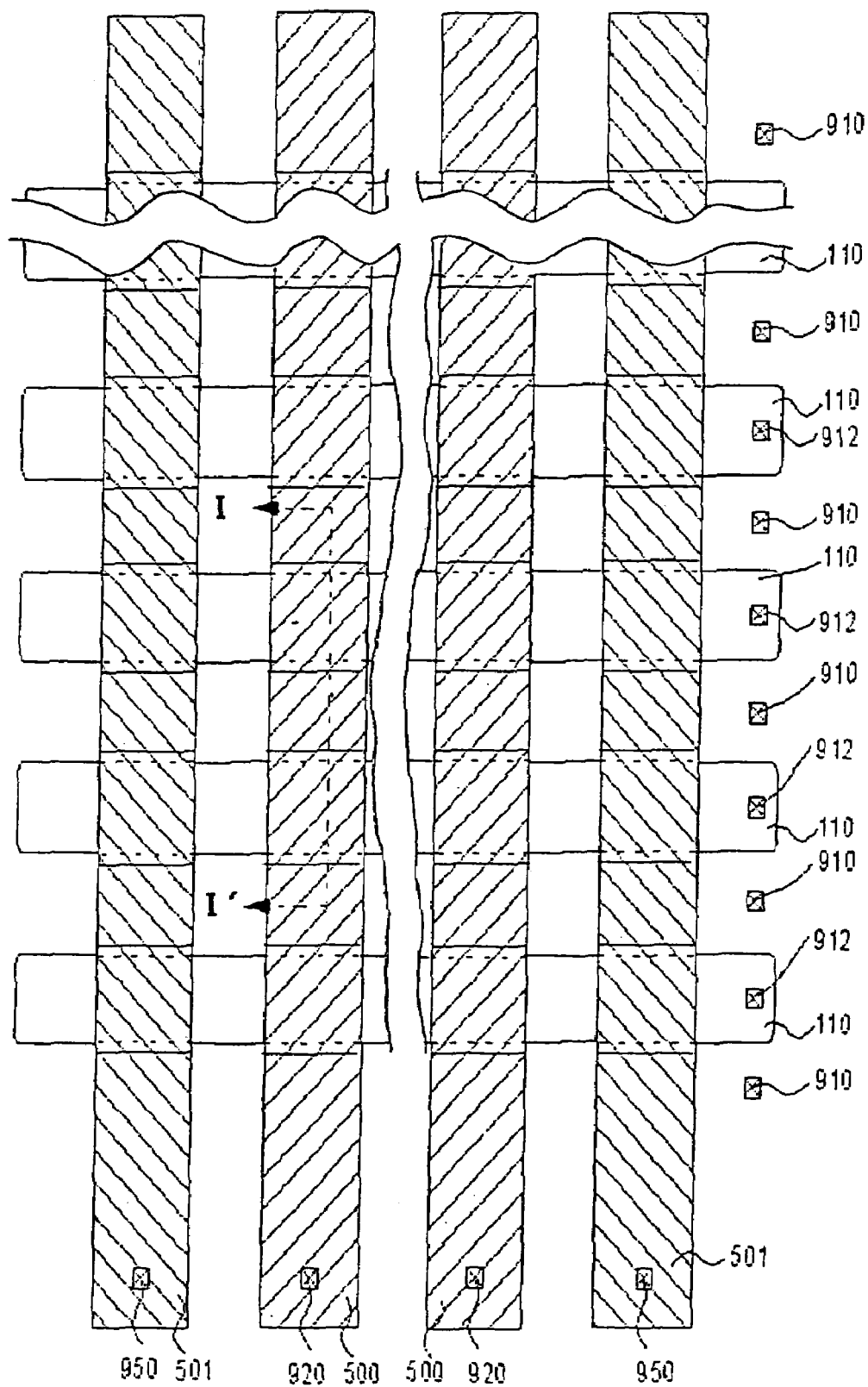
FIG. 1 is a plan view showing a memory array of semiconductor memory devices according to first to ninth embodiments of the present invention.

FIG. 1 is a plan view showing a memory array of semiconductor memory devices according to first to ninth embodiments of the present invention.

FIGS. 2 to 10 are cross sectional views of the semiconductor memory devices according to the first to ninth embodiments, respectively, taken along line I-I' of FIG. 1. In addition, FIGS. 11 to 19 are cross sectional views of the semiconductor memory devices taken along line II-II' of FIGS. 2 to 10, respectively, while FIGS. 20 to 28 are cross sectional views of the semiconductor memory devices taken along line III-III' of FIGS. 2 to 10, respectively.

Figure 2:
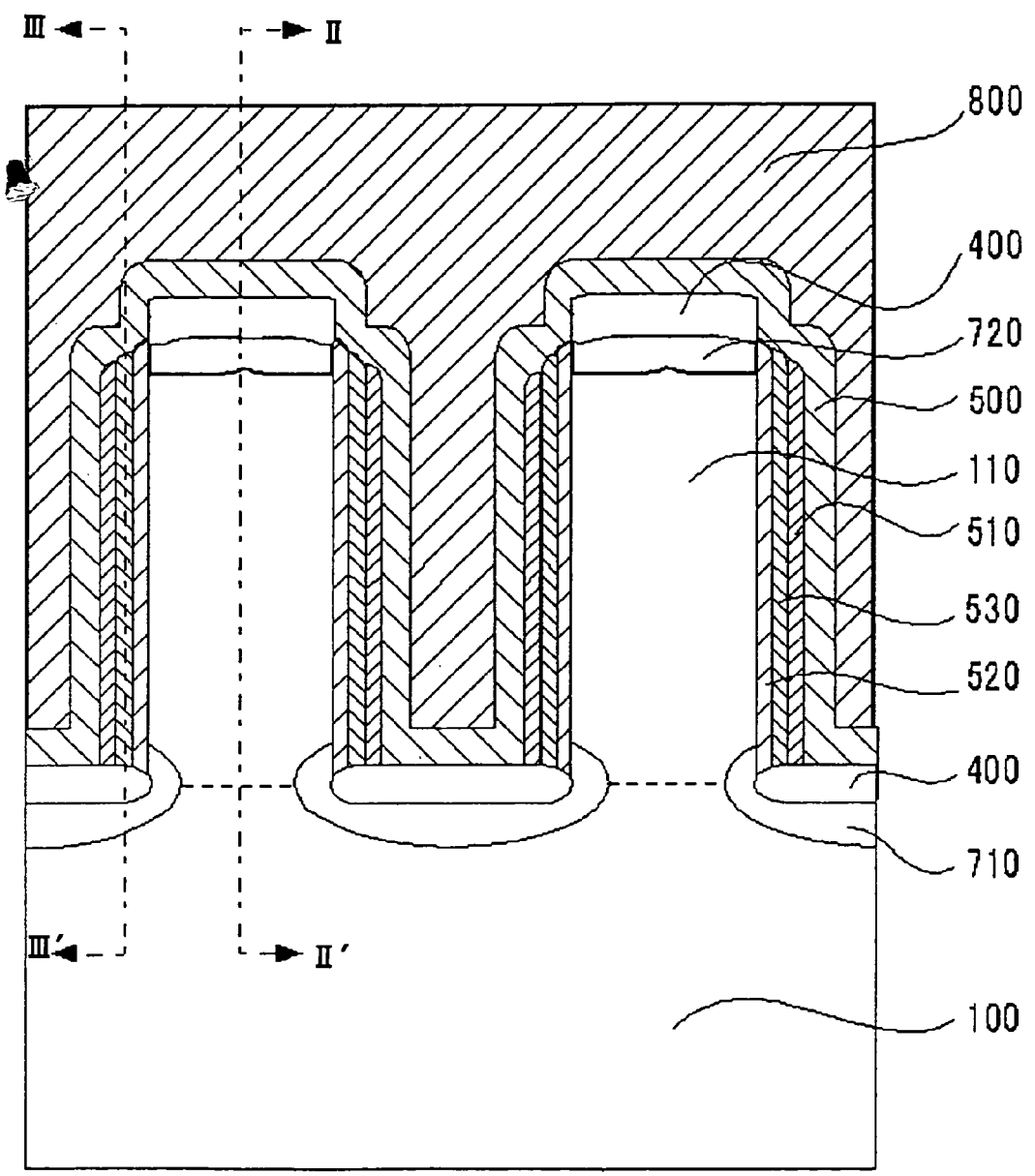
FIGS. 2 to 10 are cross sectional views through section I-I' of FIG. 1 showing the semiconductor memory devices according to the first to ninth embodiments, respectively.
Figure 11:
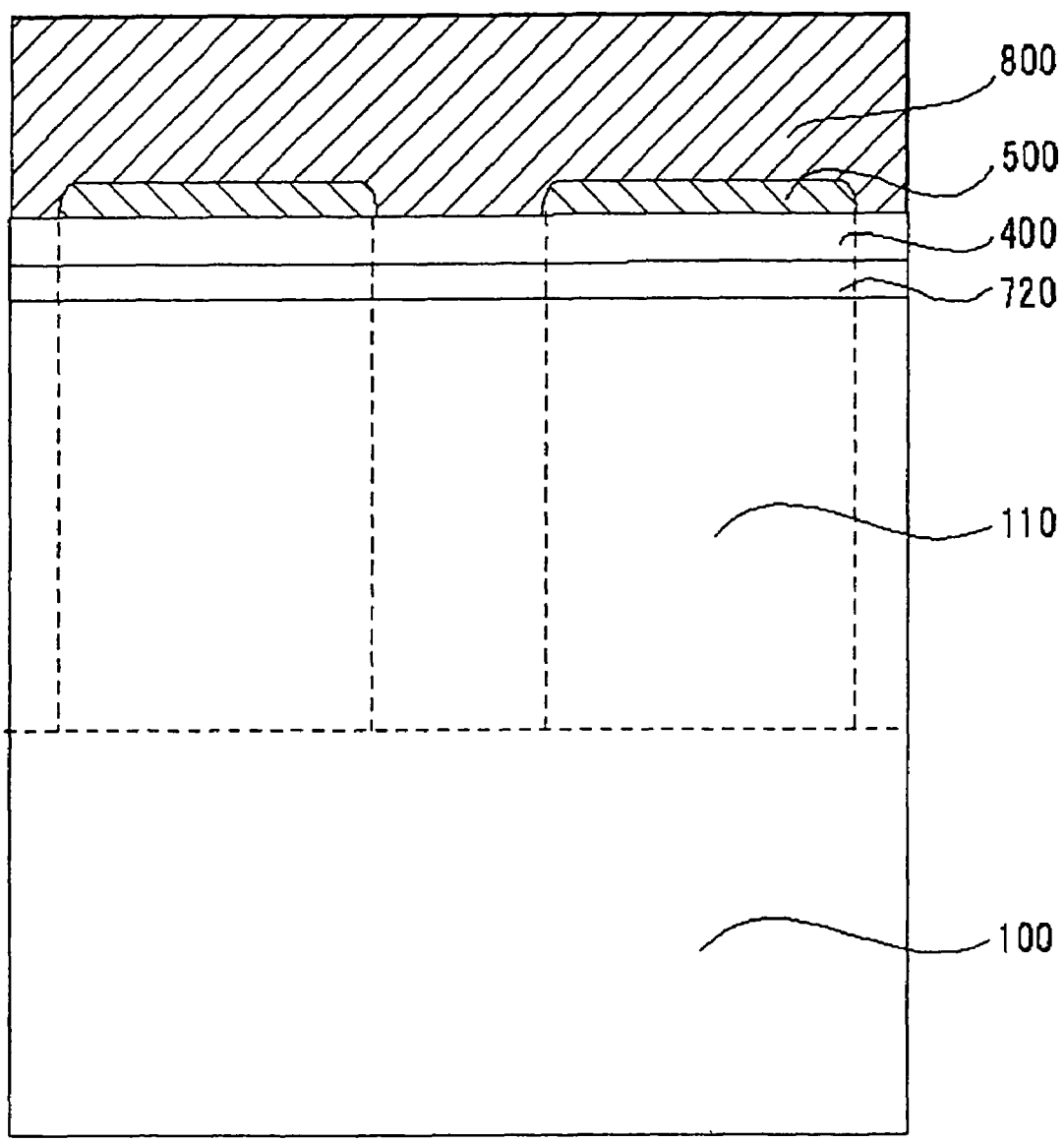
FIGS. 11 to 19 are cross sectional views of the semiconductor memory devices taken along line II-II' of FIGS. 2 to 10, respectively.
Figure 20:
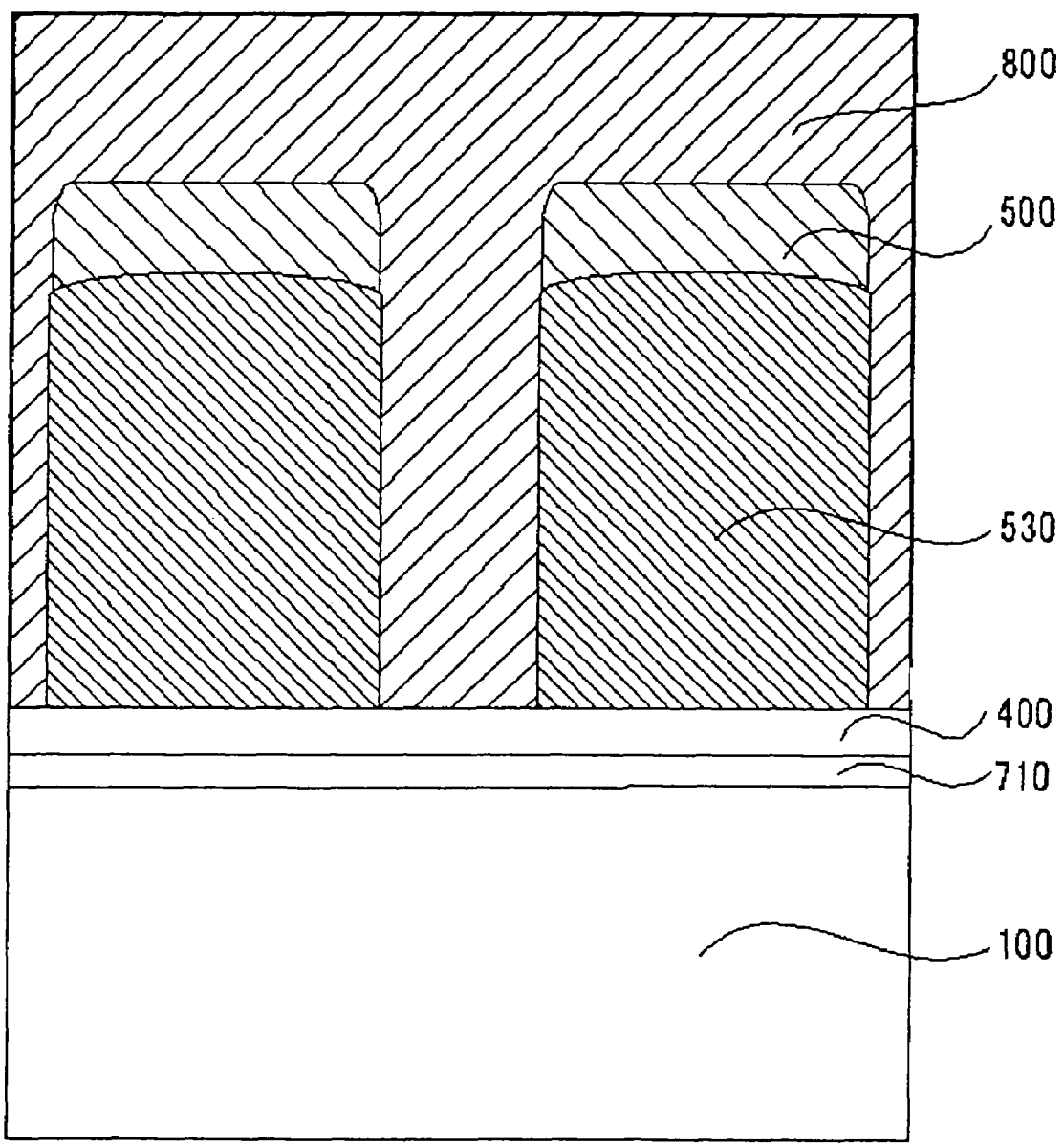
FIGS. 20 to 28 are cross sectional views of the semiconductor memory devices taken along line III-III' of FIGS. 2 to 10, respectively.

FIGS. 2, 11 and 20 show a semiconductor memory device of the first embodiment and in this case, at least one or more protruding semiconductor layers 110, of which the forms in the cross section in the horizontal direction are of bands, are aligned parallel to a p-type silicon substrate 100 in the memory array.

In one memory cell, a surface of a protruding semiconductor layer 110 is used as an active region surface and a control gate 500 is formed above this active region surface via a charge storage layer made up of oxide film/nitride film/oxide film (for example so called ONO film of silicon oxide film 520/silicon nitride film 530/silicon oxide film 510) and furthermore, an impurity diffusion layer 720 formed on the upper surface of the protruding semiconductor layer 110 and an impurity diffusion layer 710 formed on the surface of the silicon substrate 100, which is the semiconductor substrate between the protruding semiconductor layers 110, are provided to form the memory cell.

Memory cells are aligned in series via the impurity diffusion layers 720 formed on the upper surfaces of the protruding semiconductor layers 110 and the impurity diffusion layers 710 formed on the surface of the silicon substrate 100 while the control gate 500 is formed in a continuous manner parallel to the direction in which the memory cells are connected in series. In addition, at least one or more silicon oxide films 400, which are element isolation films, are formed on the impurity diffusion layers 710 and 720 so as to be placed between the respective memory cells.

Figure 3:
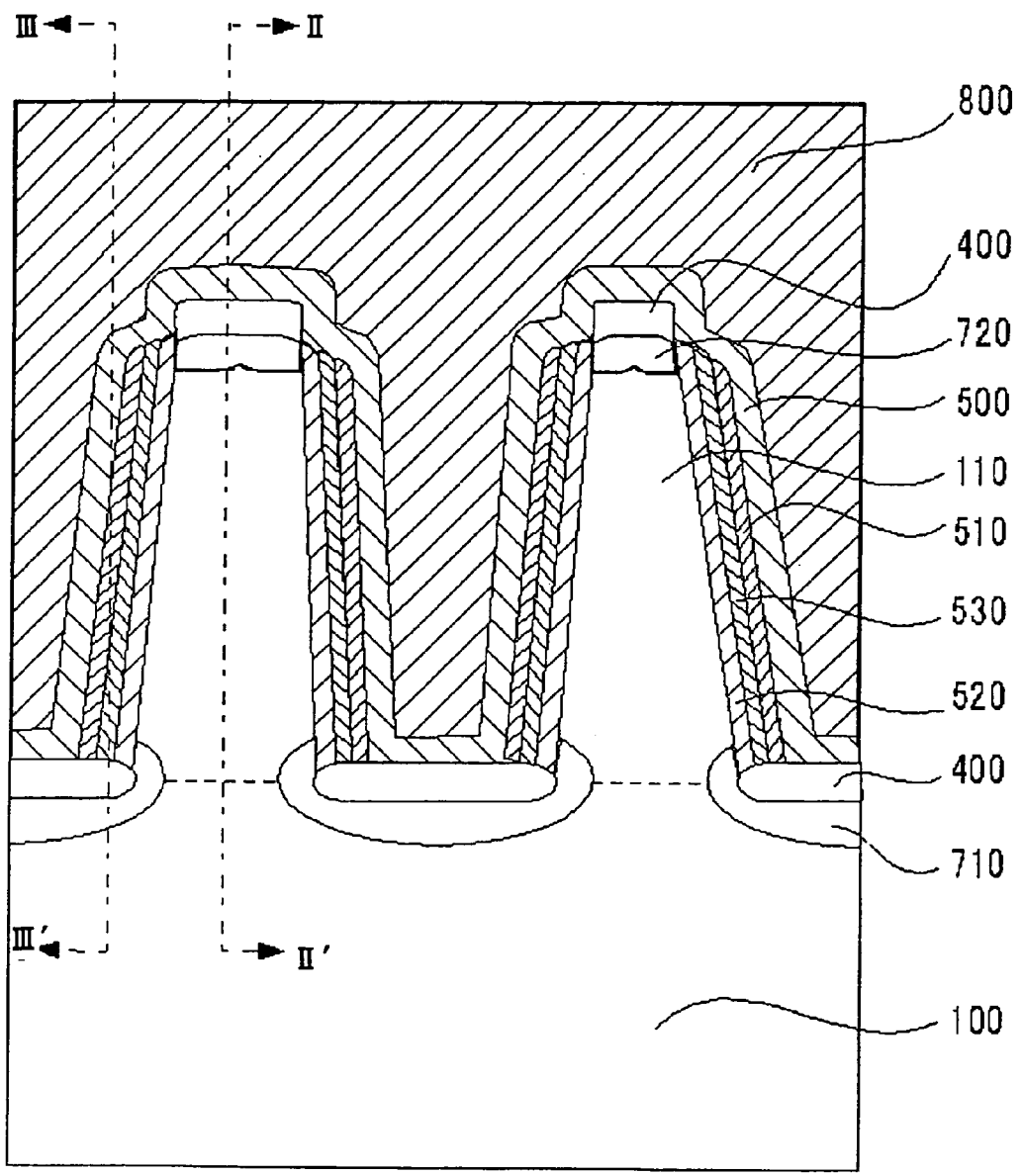
Figure 12:
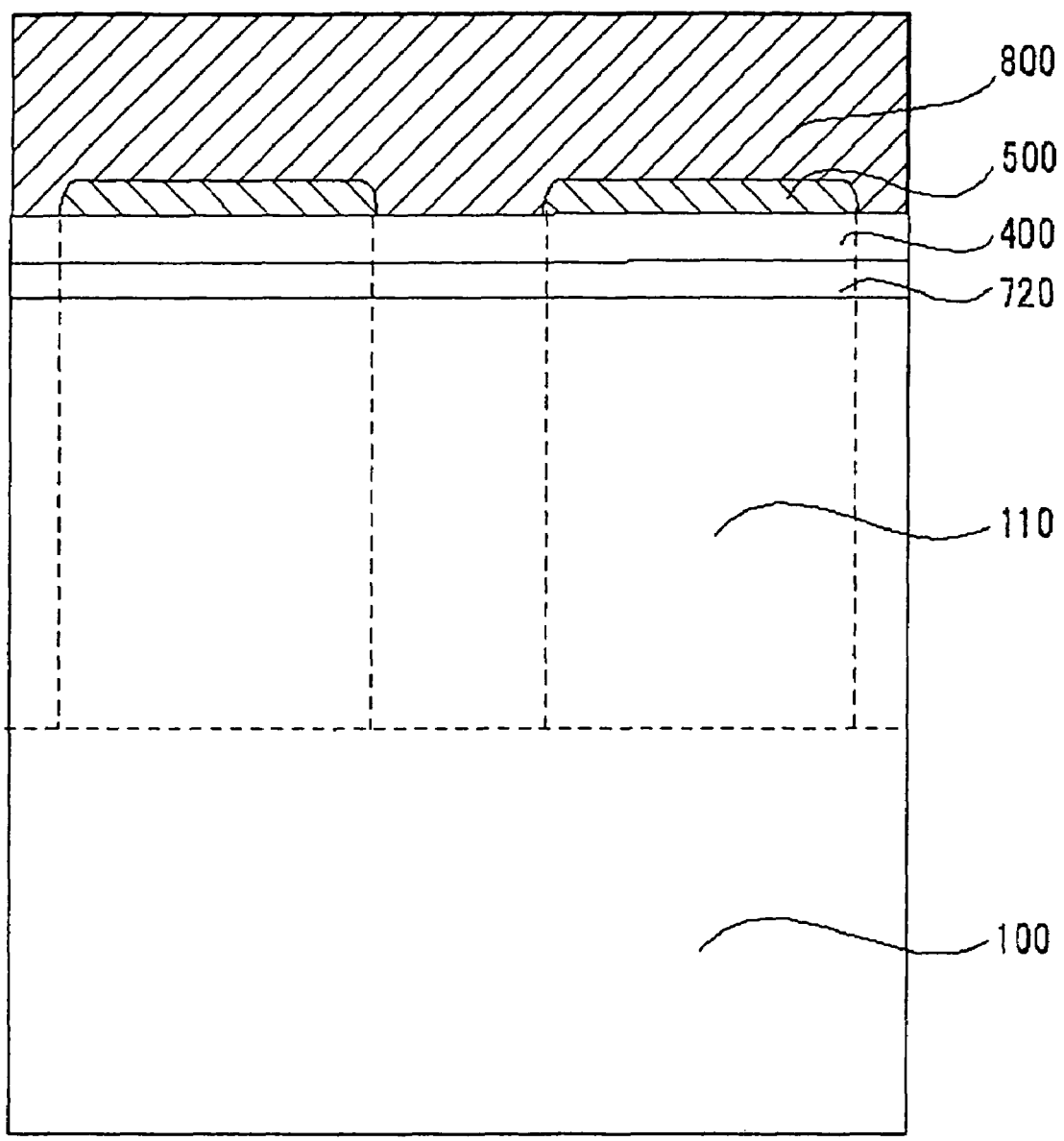
Figure 21:
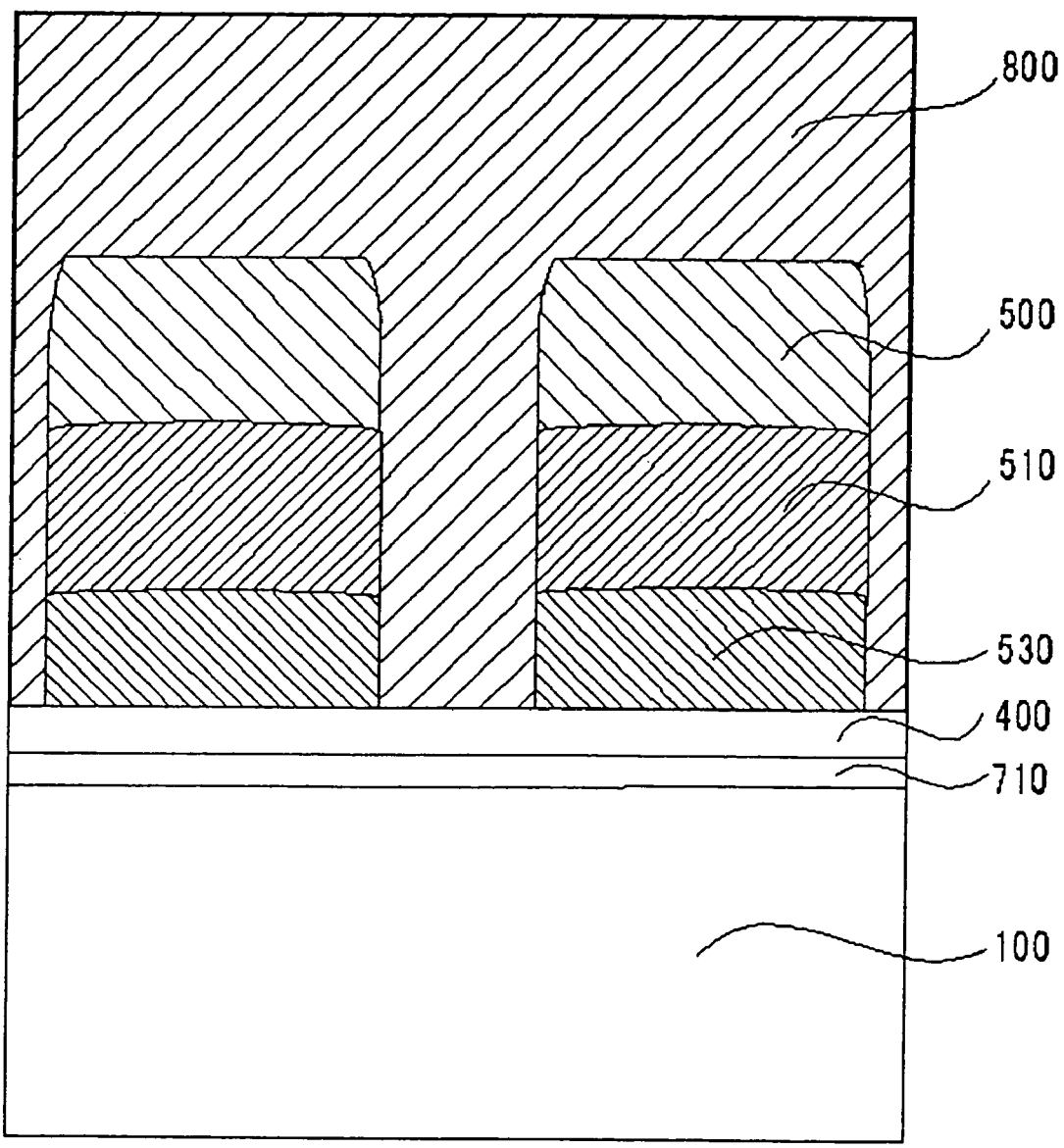

FIGS. 3, 12 and 21 show a semiconductor memory device according to the second embodiment and in this case, the area of a protruding semiconductor layer 110 in the cross section in the horizontal direction (the direction parallel to the plane of the substrate) relative to the silicon substrate 100 becomes smaller step by step or in a continuous manner as the distance from the silicon substrate 100 in the direction perpendicular to the silicon substrate. That is to say, the form in the cross section of a protruding semiconductor layer 110 in the direction perpendicular to the plane of the silicon substrate 100 is of a step formation having two or more steps.

Figure 4:
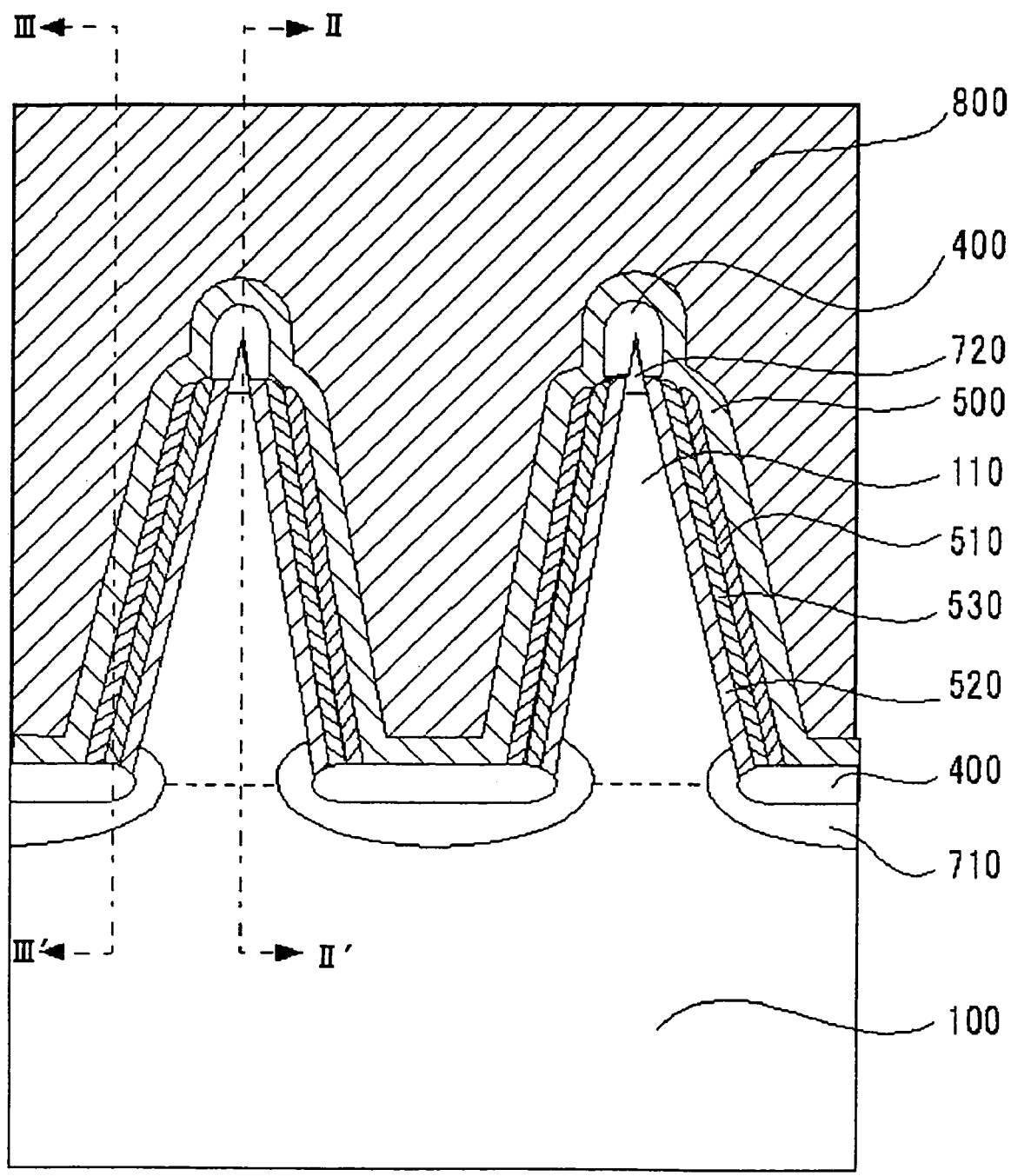
Figure 13:
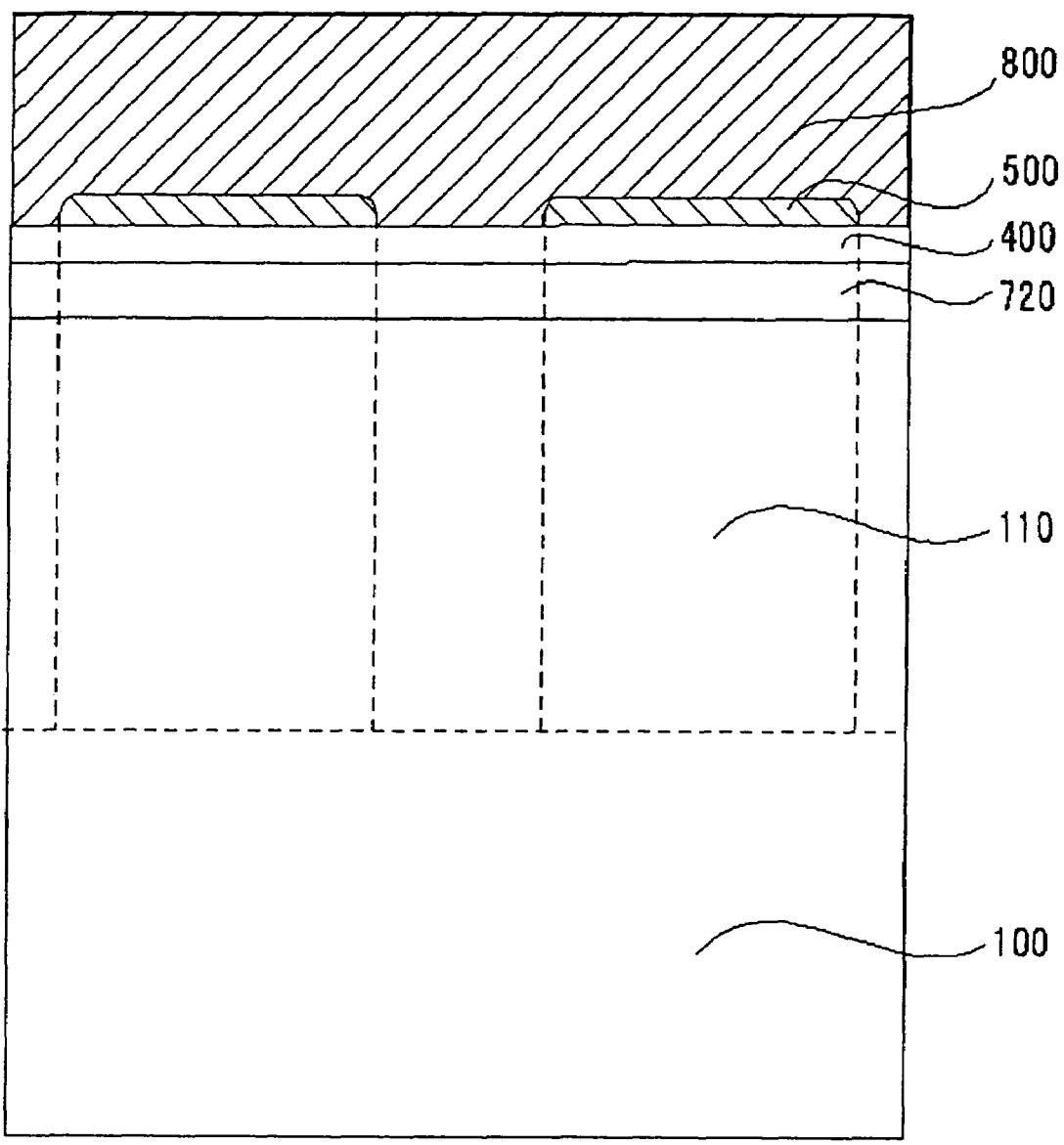
Figure 22:
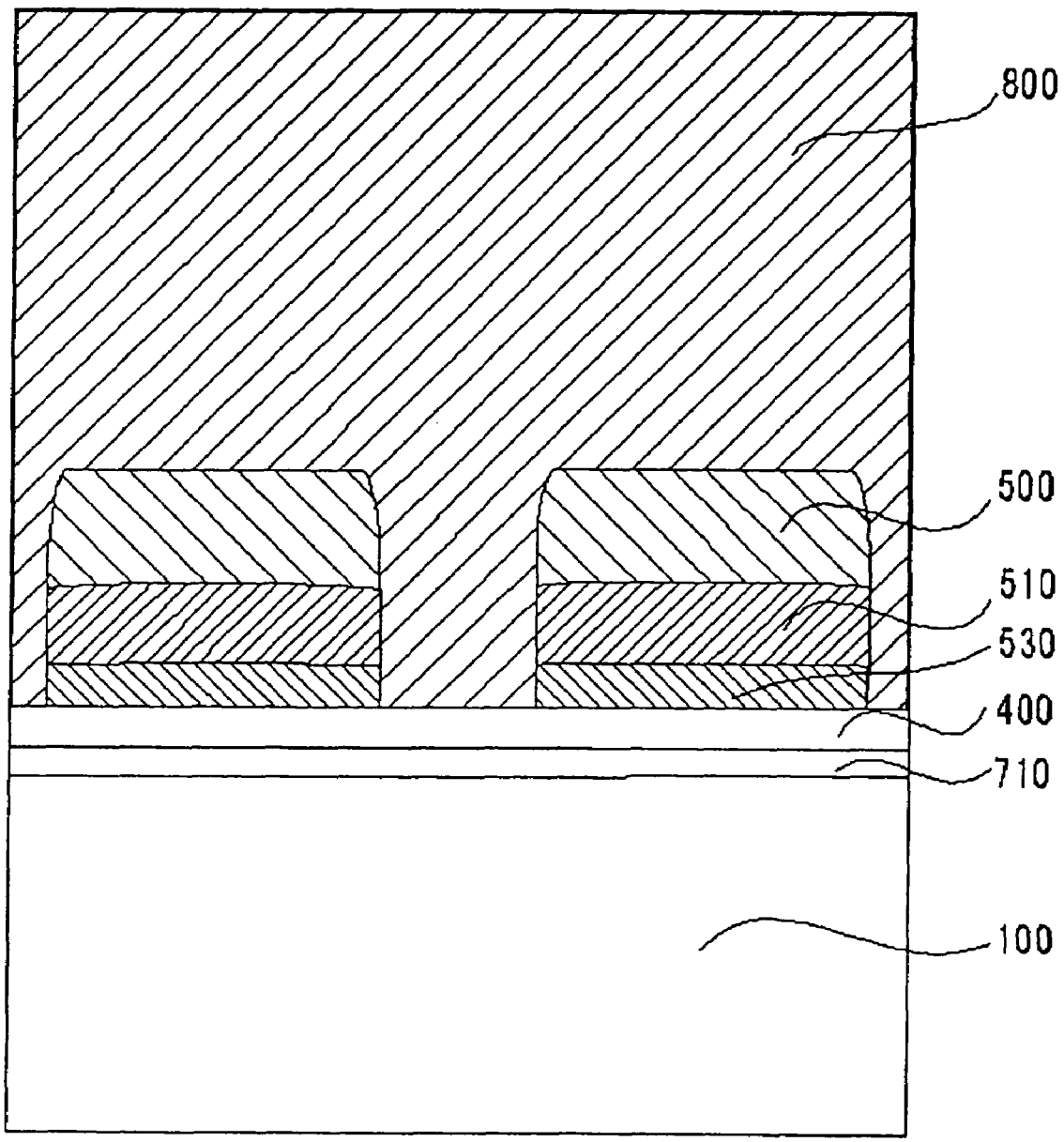

FIGS. 4, 13 and 22 show a semiconductor memory device according to the third embodiment and in this case, the area in the cross section of a protruding semiconductor layer 110 in the horizontal direction relative to the silicon substrate 100 becomes smaller step by step or in a continuous manner so that the upper portion of the protruding semiconductor layer 110 is formed of two planes forming an acute angle.

Figure 5:
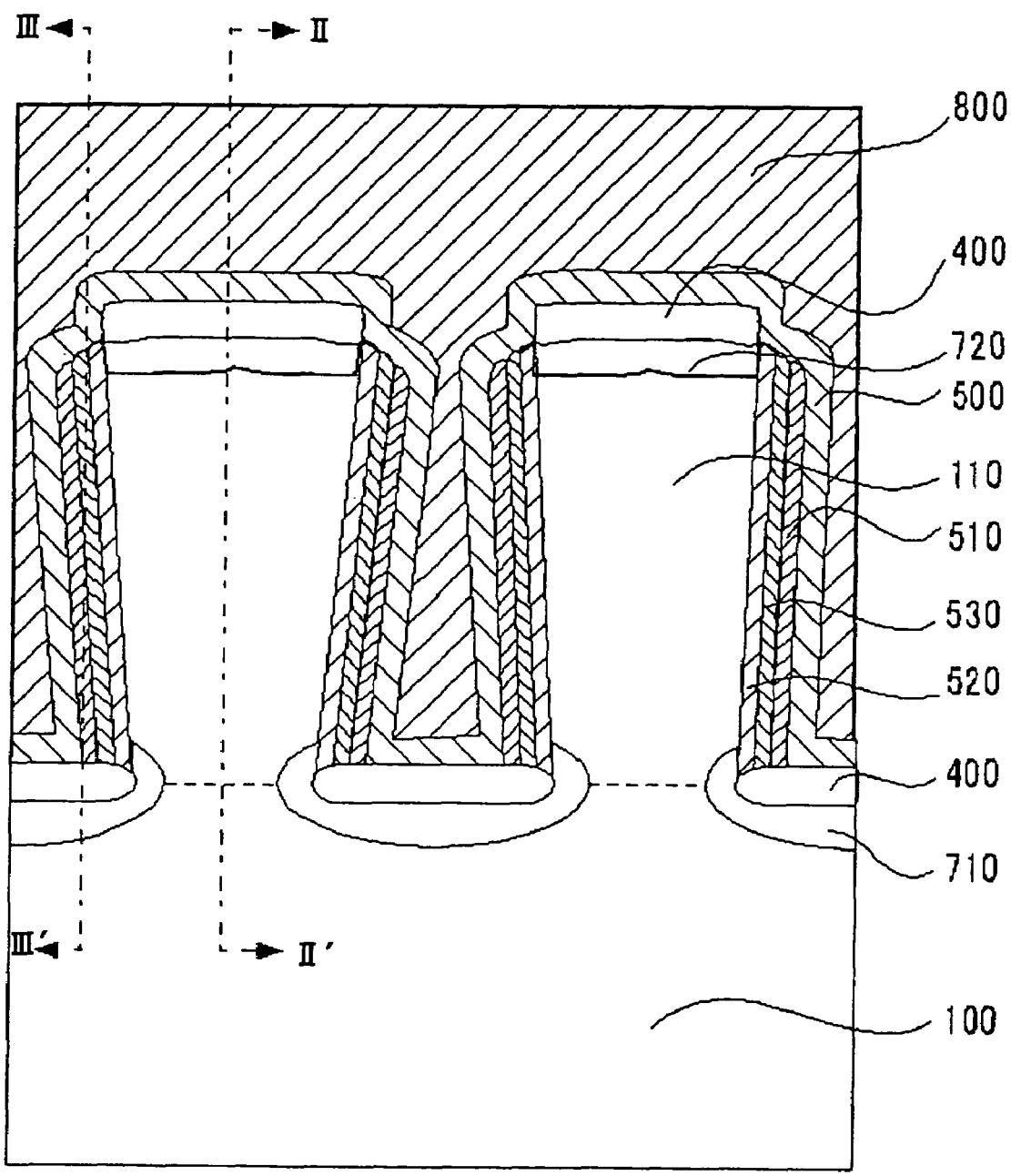
Figure 14:
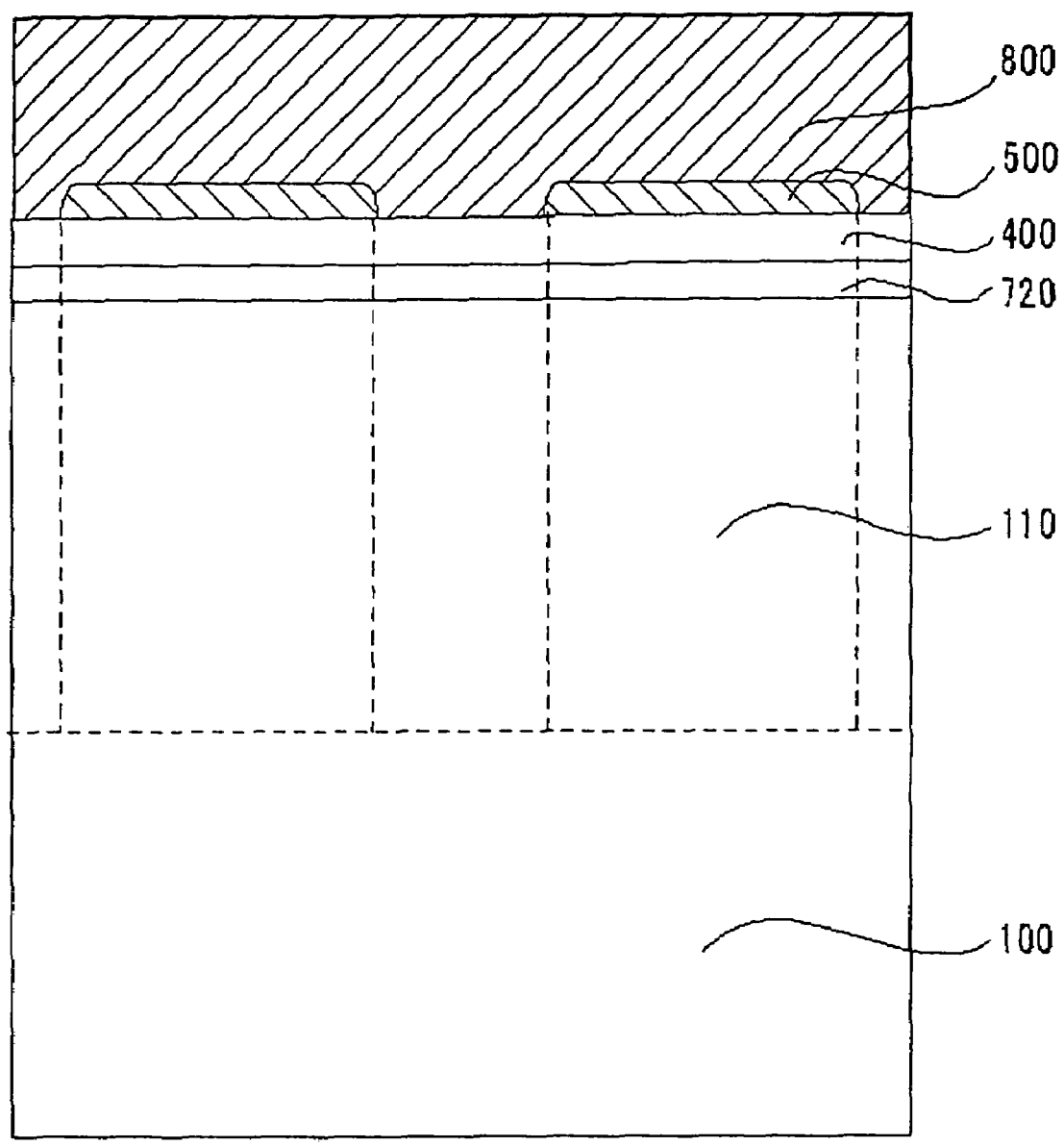
Figure 23:
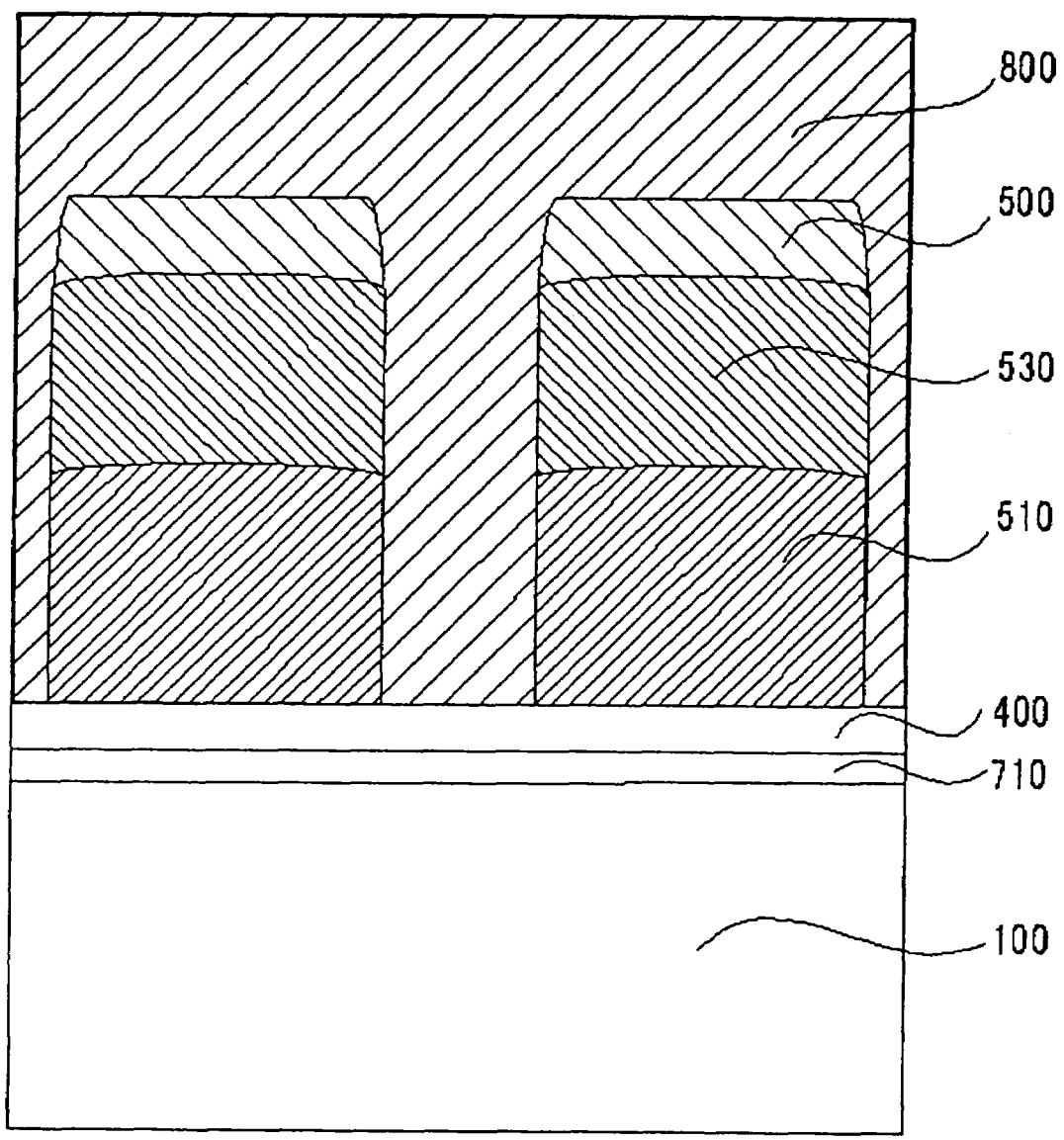

FIGS. 5, 14 and 23 show a semiconductor memory device according to the fourth embodiment and in this case, the area in the cross section of a protruding semiconductor layer 110 in the horizontal direction relative to the silicon substrate 100 becomes greater step by step or in a continuous manner as the distance from the silicon substrate 100 in the direction perpendicular to the silicon substrate.

Figure 6:
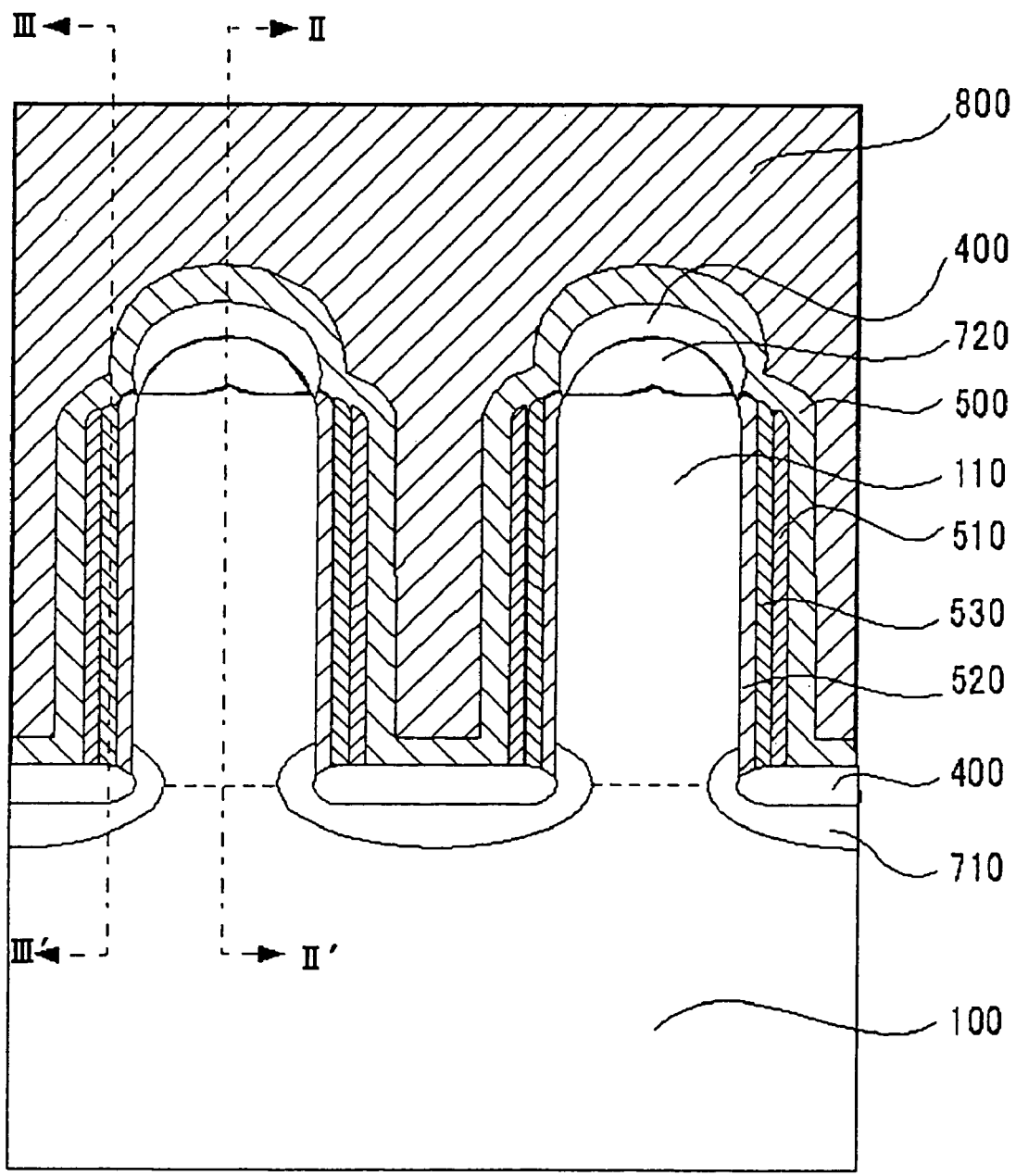
Figure 15:
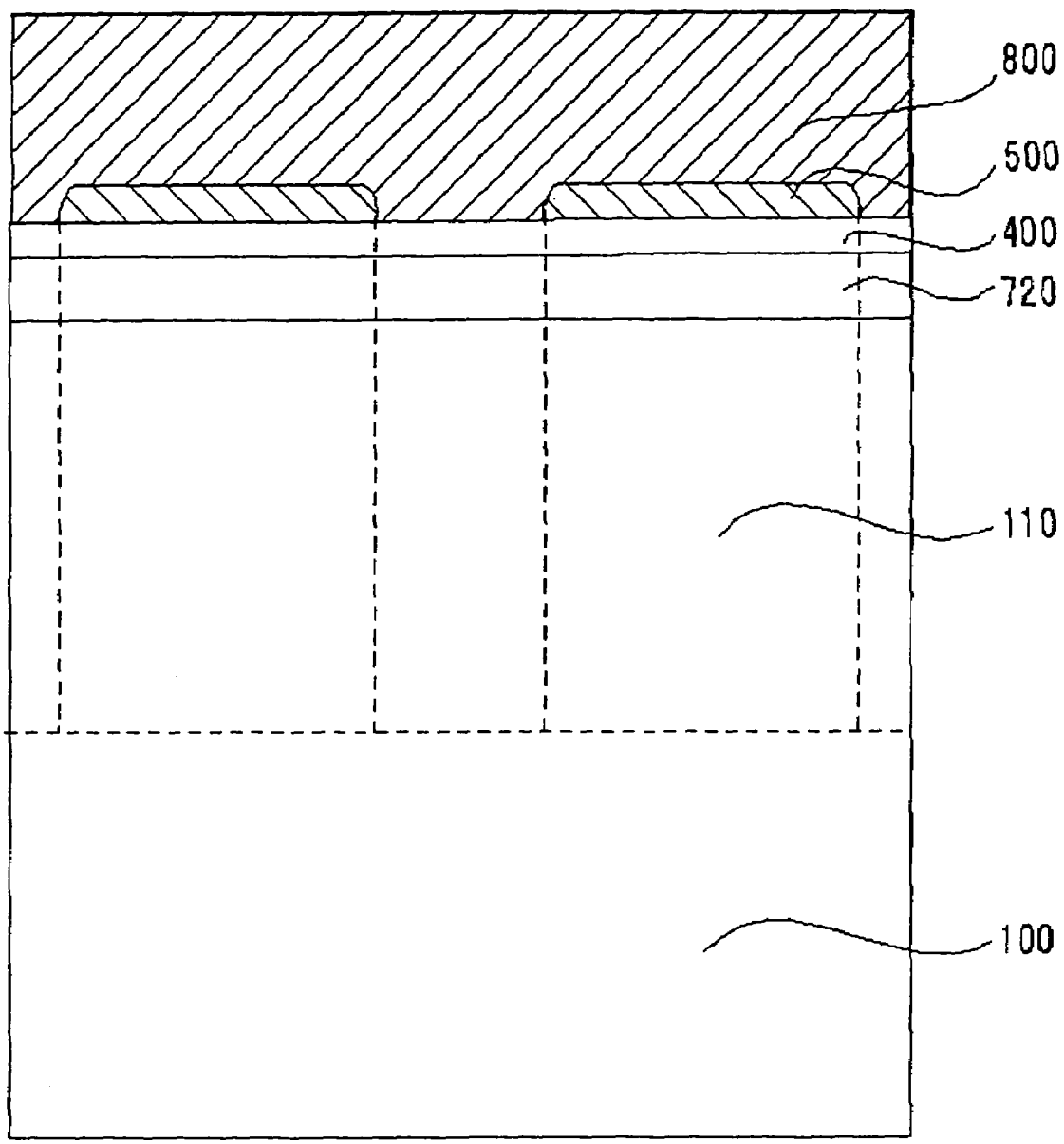
Figure 24:
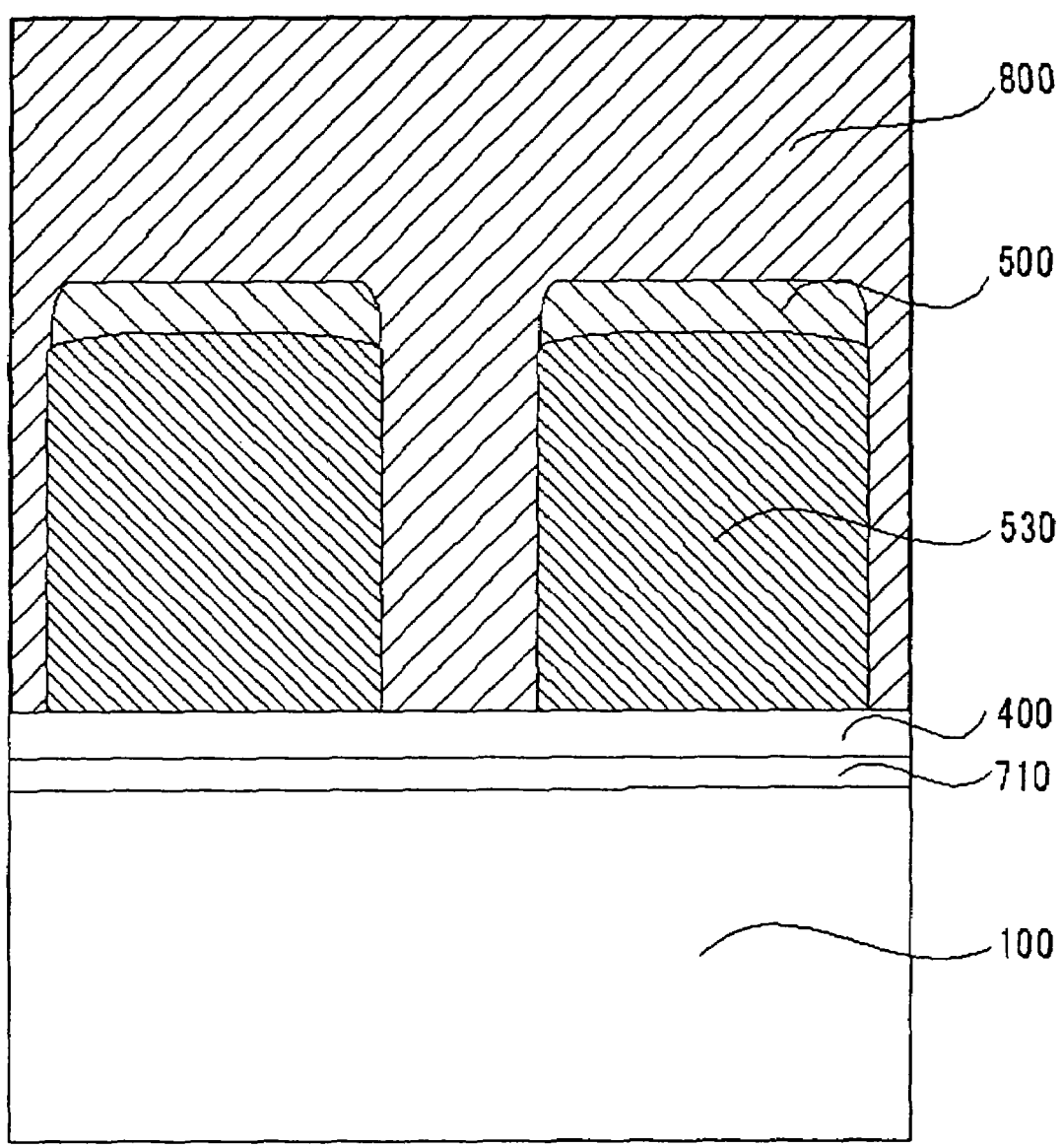

FIGS. 6, 15 and 24 show a semiconductor memory device according to the fifth embodiment and in this case, the upper portion of a protruding semiconductor layer 110 is formed of curved surfaces.

Figure 7:
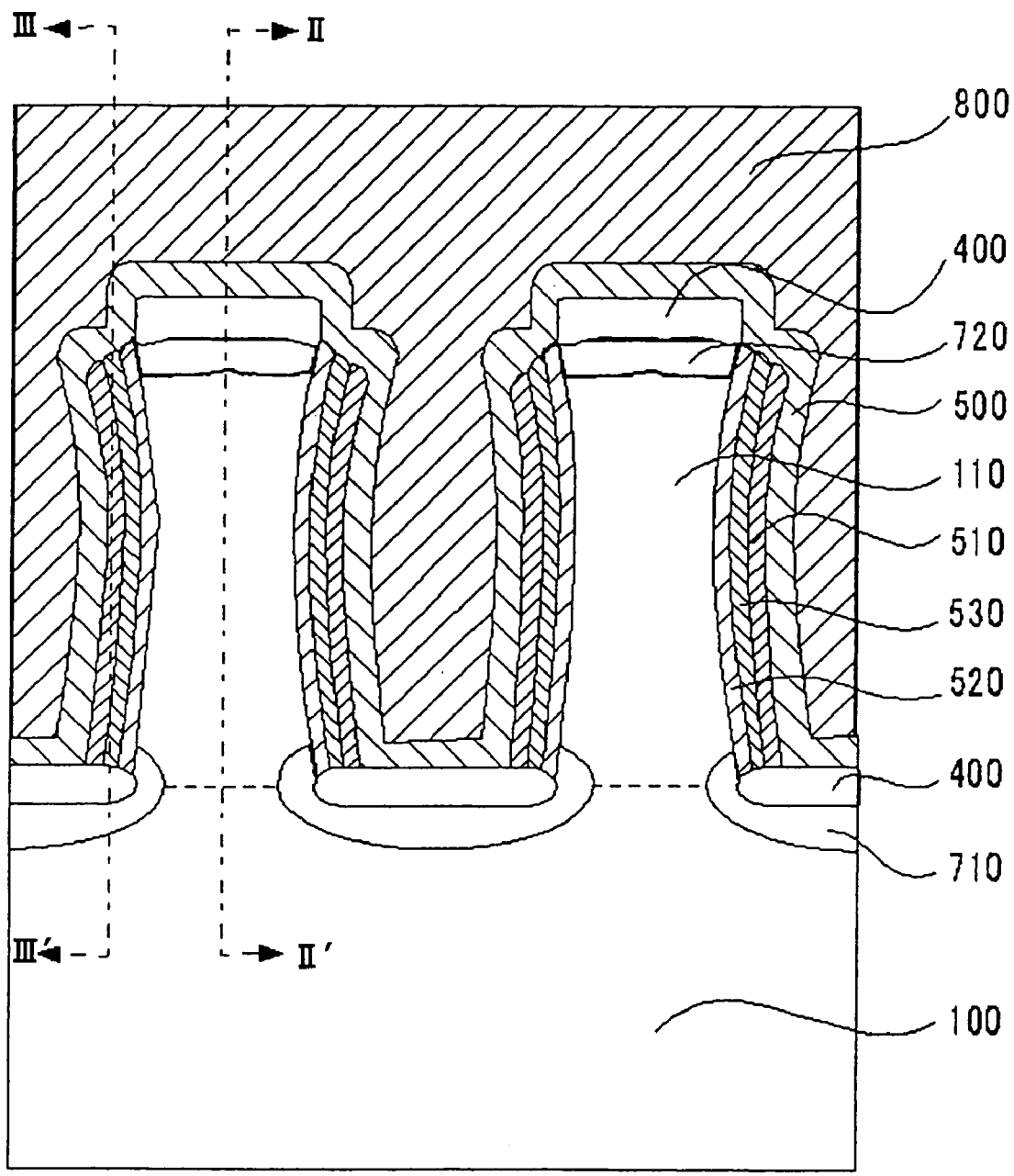
Figure 16:
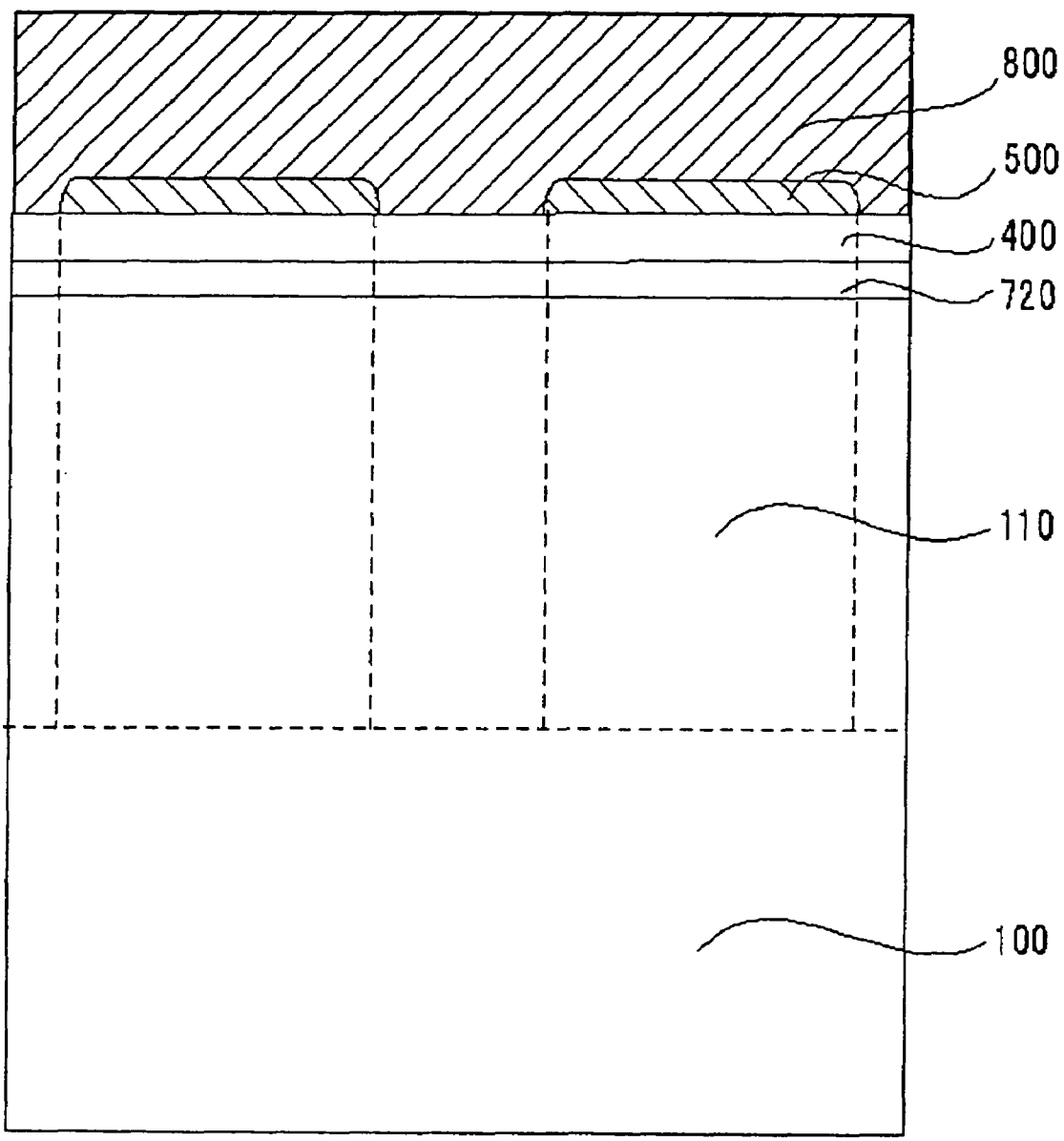
Figure 25:
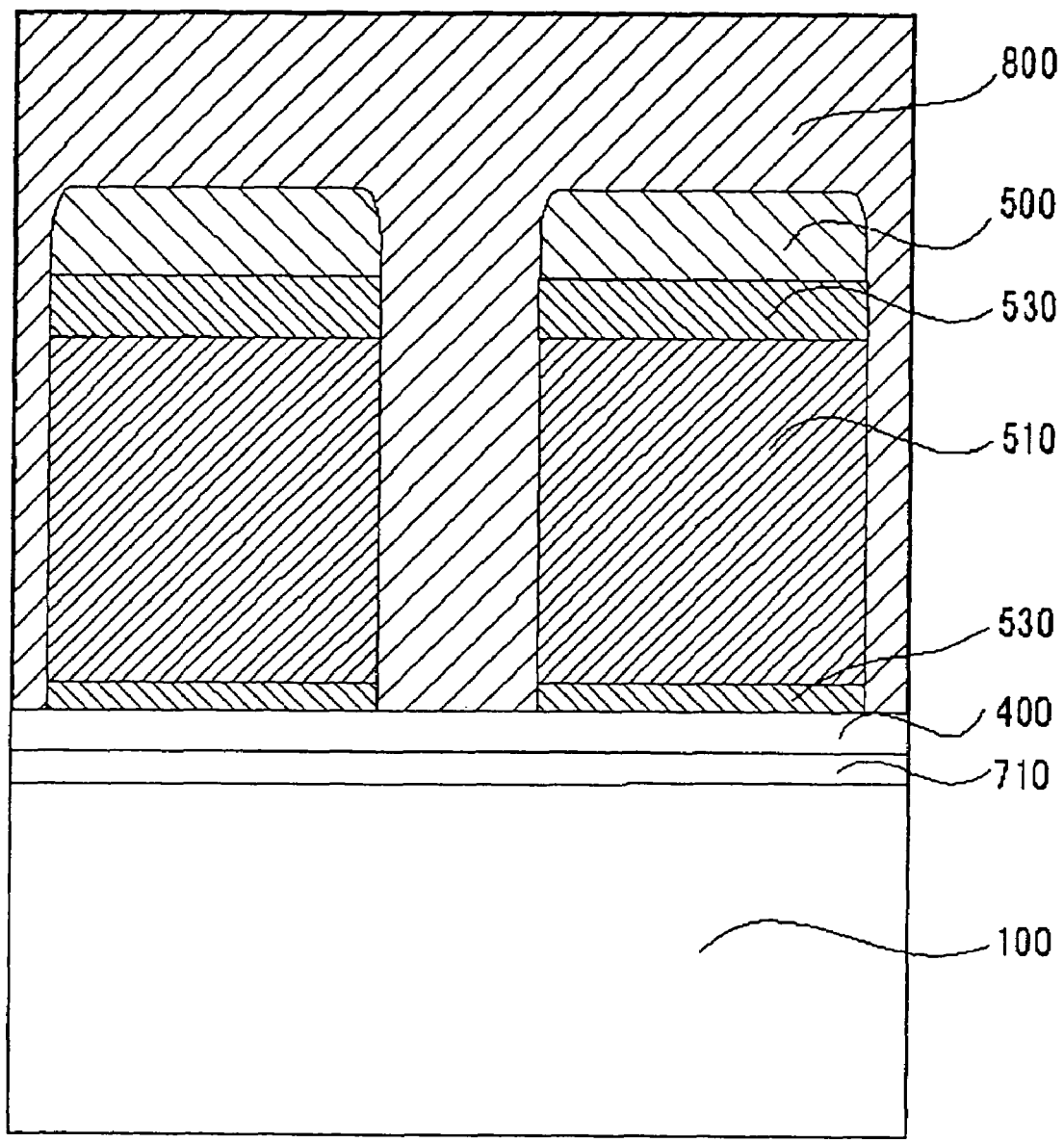

FIGS. 7, 16 and 25 show a semiconductor memory device according to the sixth embodiment and in this case, the surfaces of the memory cells formed of charge storage layers and control gates on a protruding semiconductor layer 110 are recessed in form.

Figure 8:
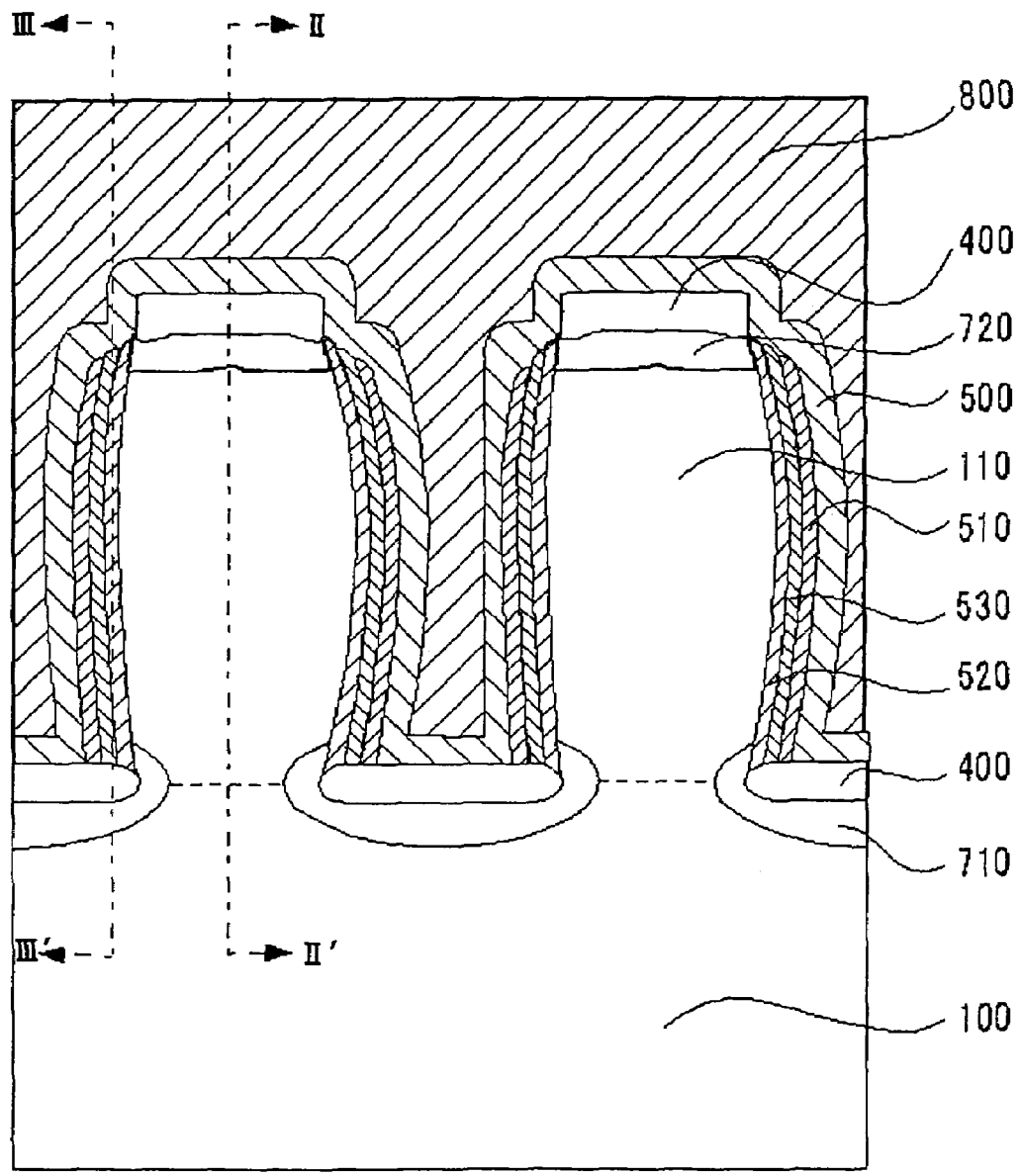
Figure 17:
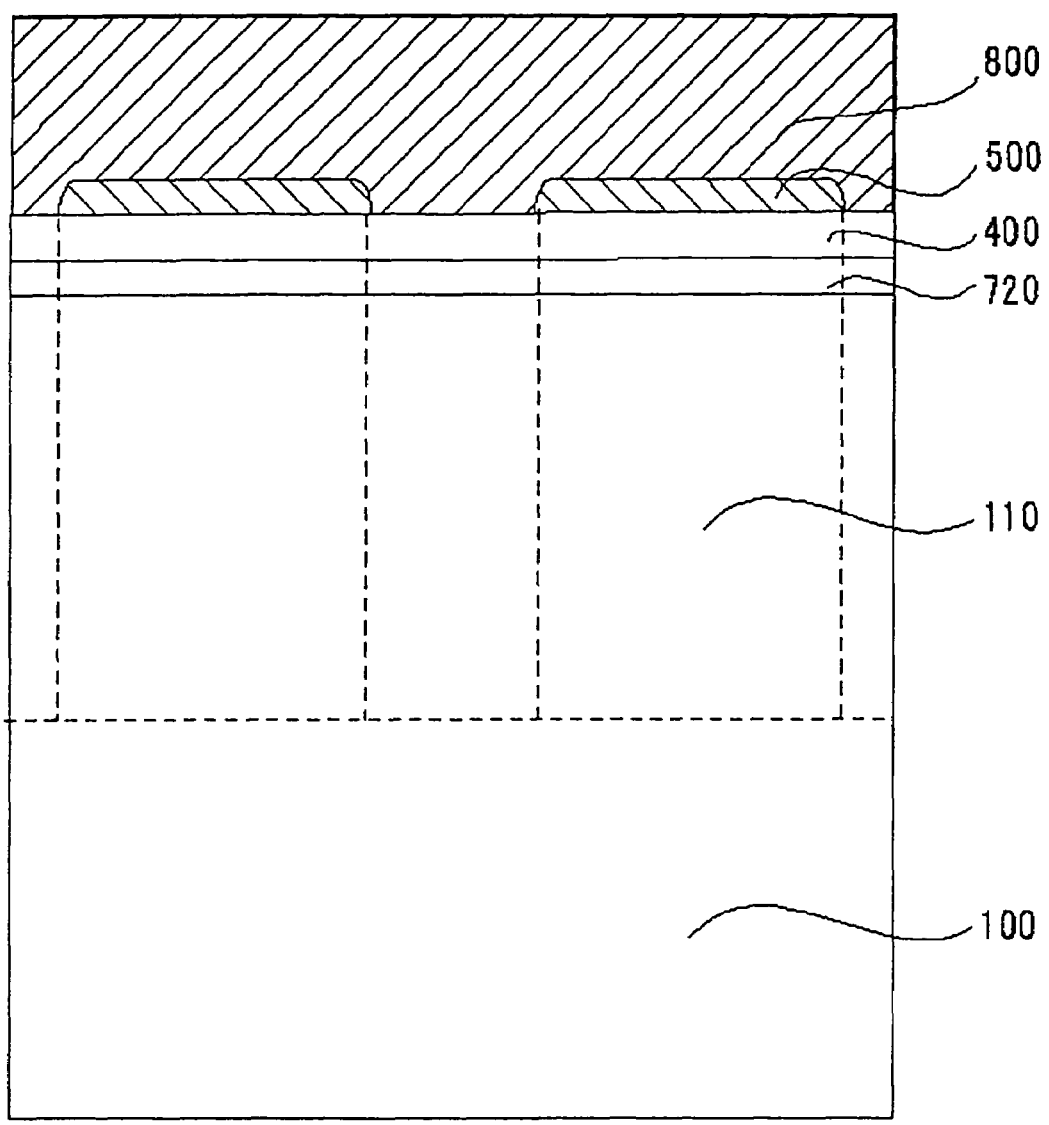
Figure 26:
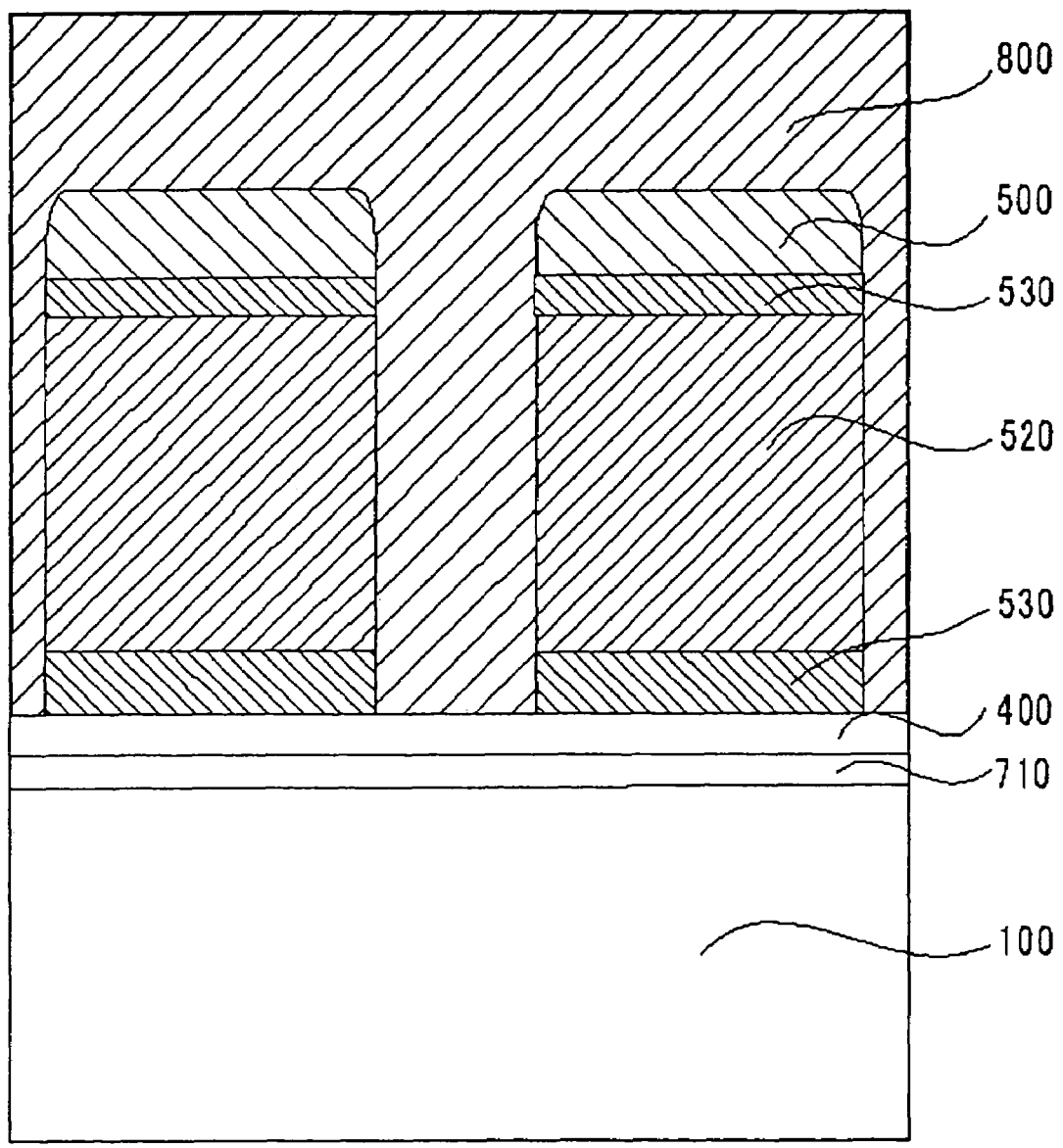

FIGS. 8, 17 and 26 show a semiconductor memory device according to the seventh embodiment and, in this case, the surfaces on which memory cells are formed are bulged in form. Here, the forms or the degrees of recesses and bulges are not limited as long as the memory cells have desired functions.

Figure 9:
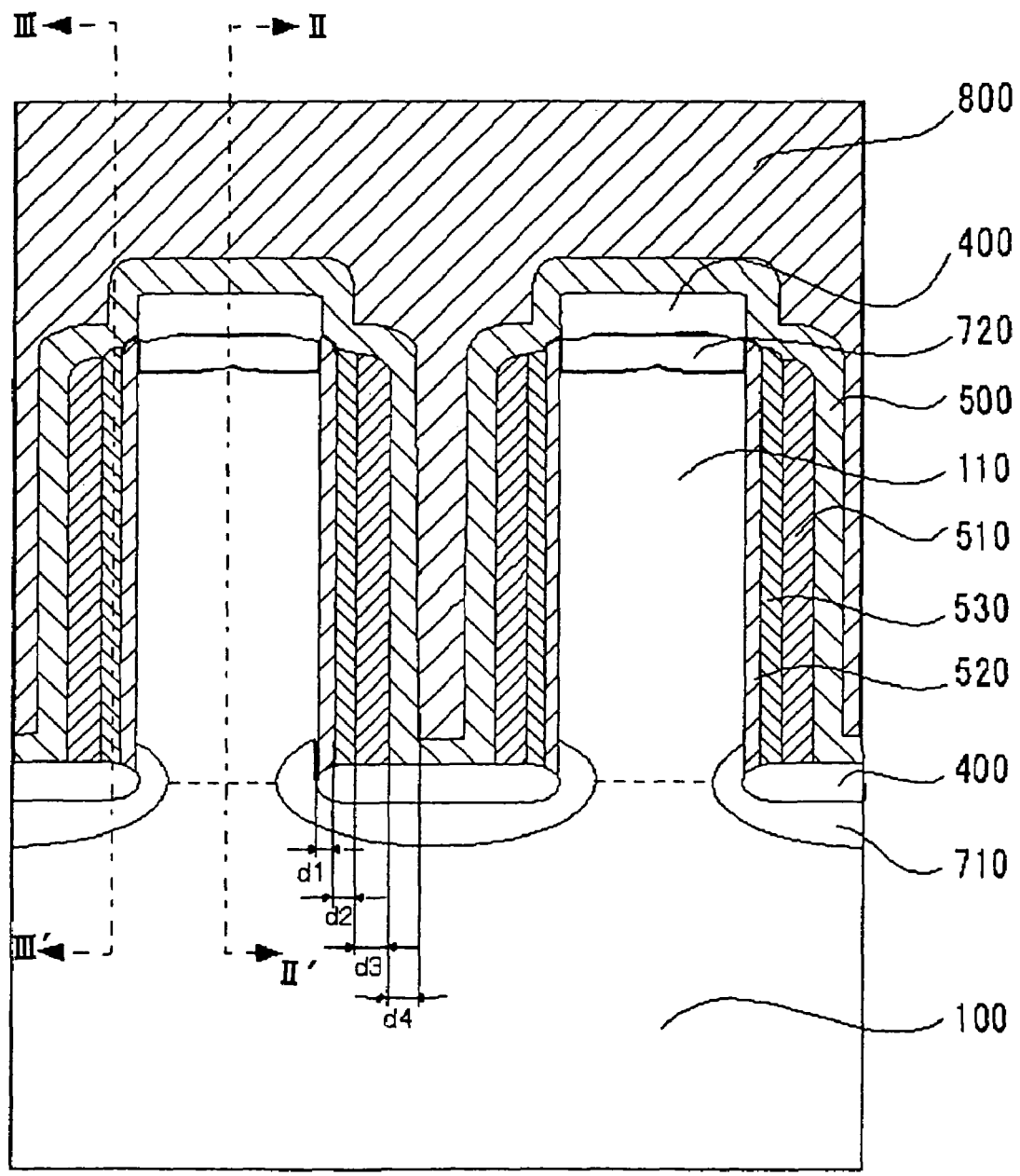
Figure 18:
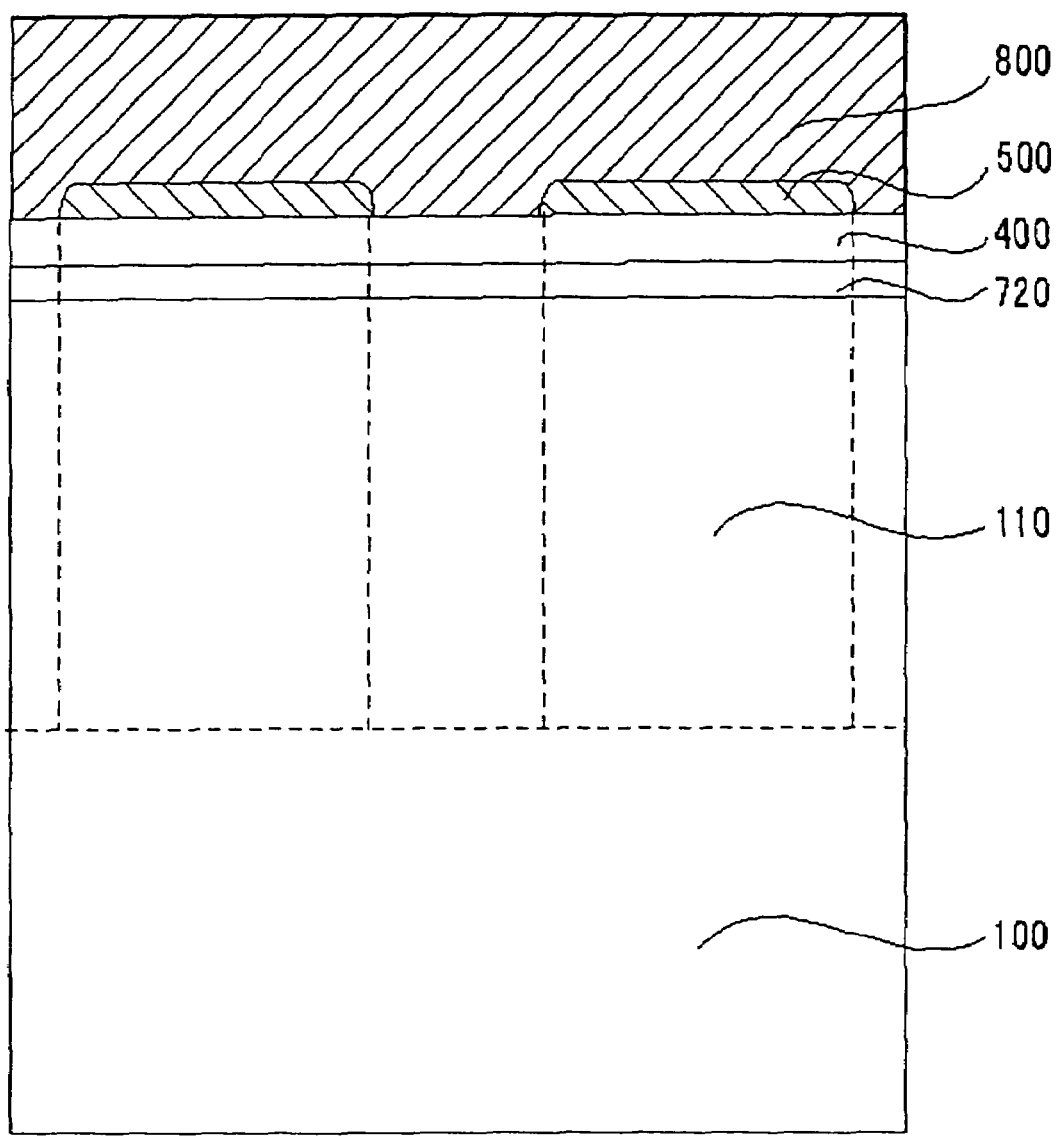
Figure 27:
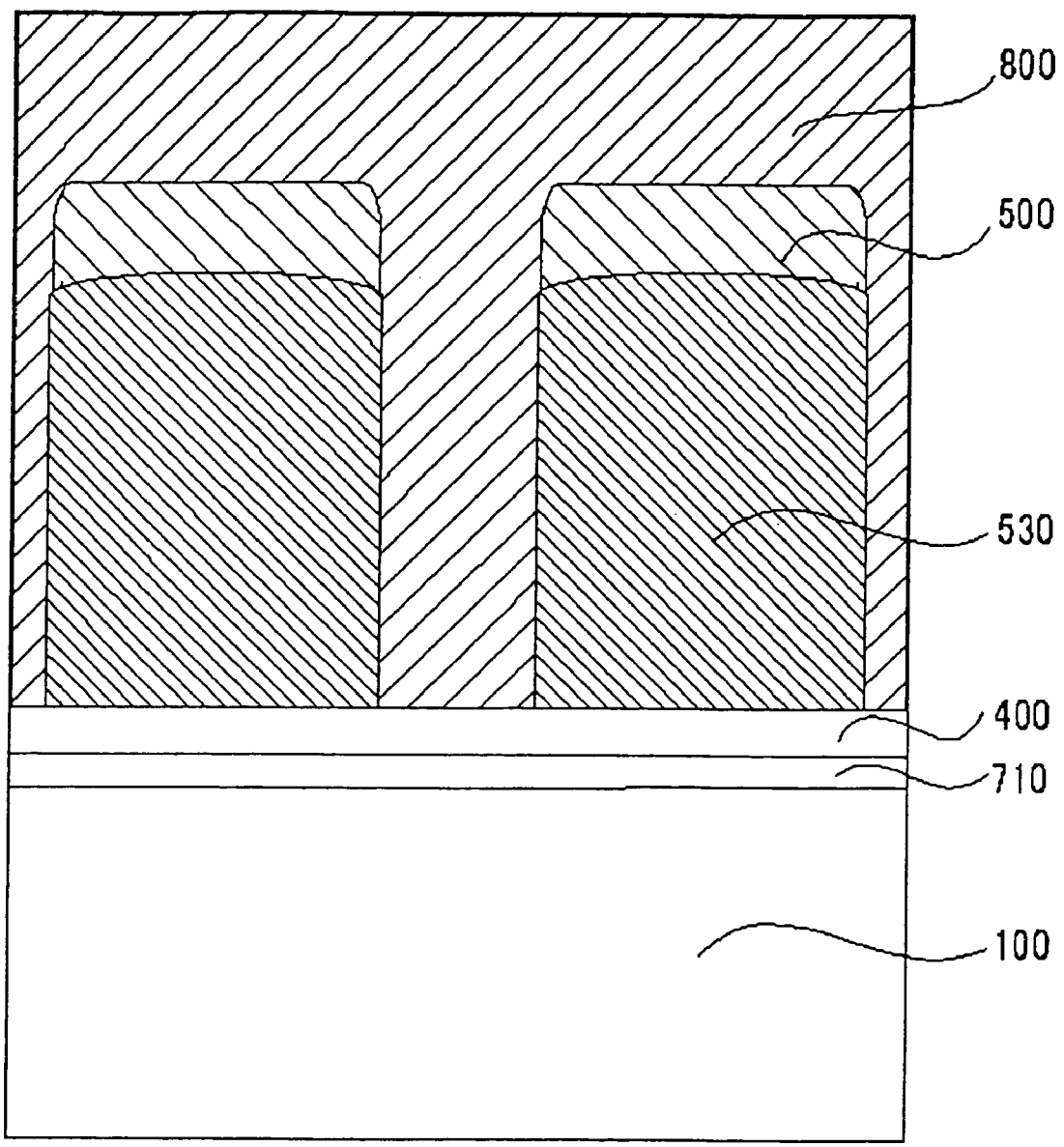

FIGS. 9, 18 and 27 show a semiconductor memory device according to the eighth embodiment and in this case, the film thicknesses of the silicon oxide film 520, the silicon nitride film 530 and the silicon oxide film 510 that form the charge storage layer as well as the film thickness of the control gate 500 differ from those of the semiconductor memory device shown in FIGS. 2, 11 and 20.

d1, d2, d3 and d4 shown in FIG. 9 indicate the film thicknesses of the silicon oxide film 520, the silicon nitride film 530, the silicon oxide film 510 and the control gate 500, respectively. Here, the film thicknesses of the respective films 520, 530, 510 and 500 are not limited in regards to the sizes as long as it is possible for the memory cell to have desired functions and film thicknesses of the two or more from among the respective films may be equal.

Figure 10:
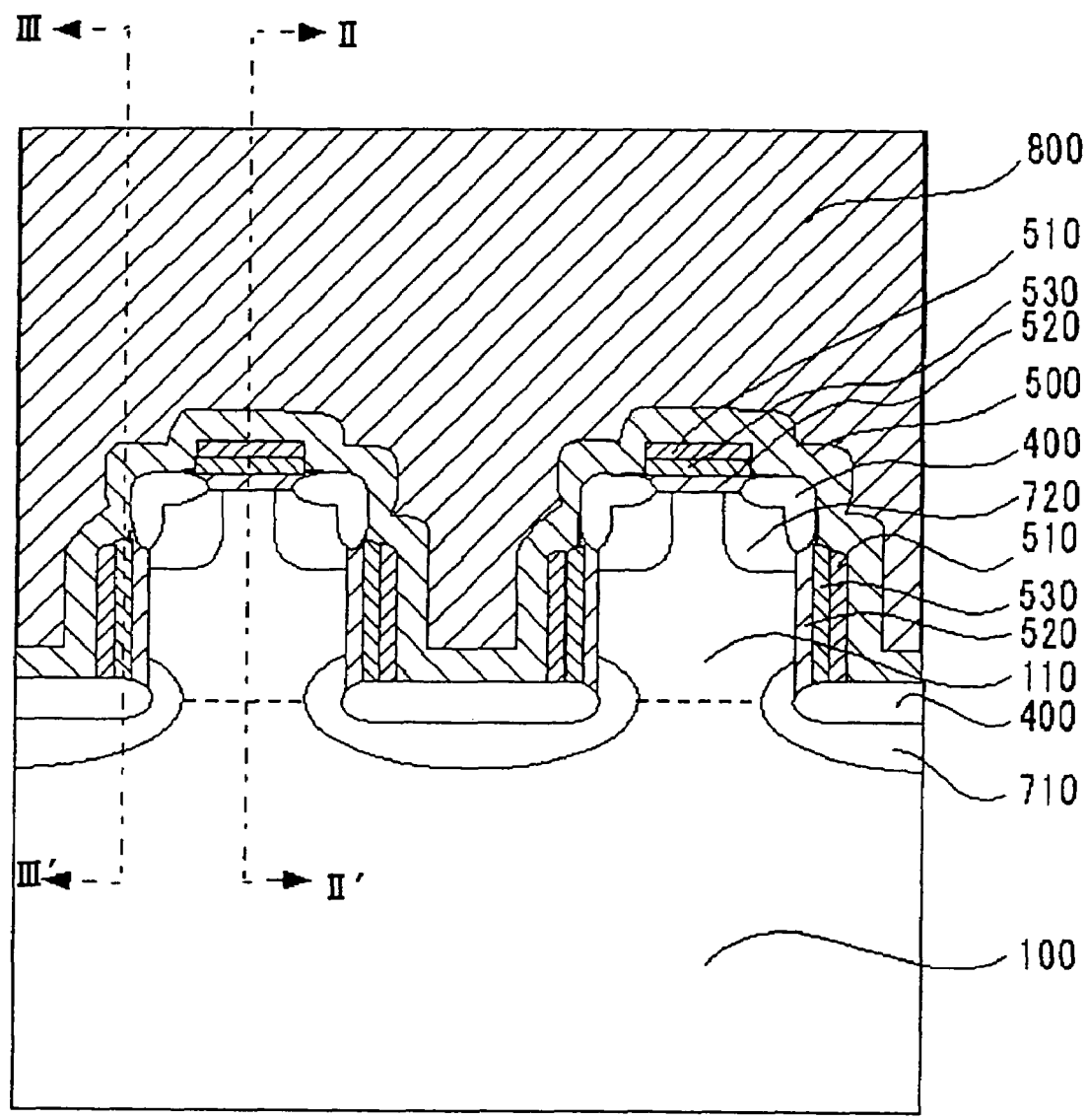
Figure 19:
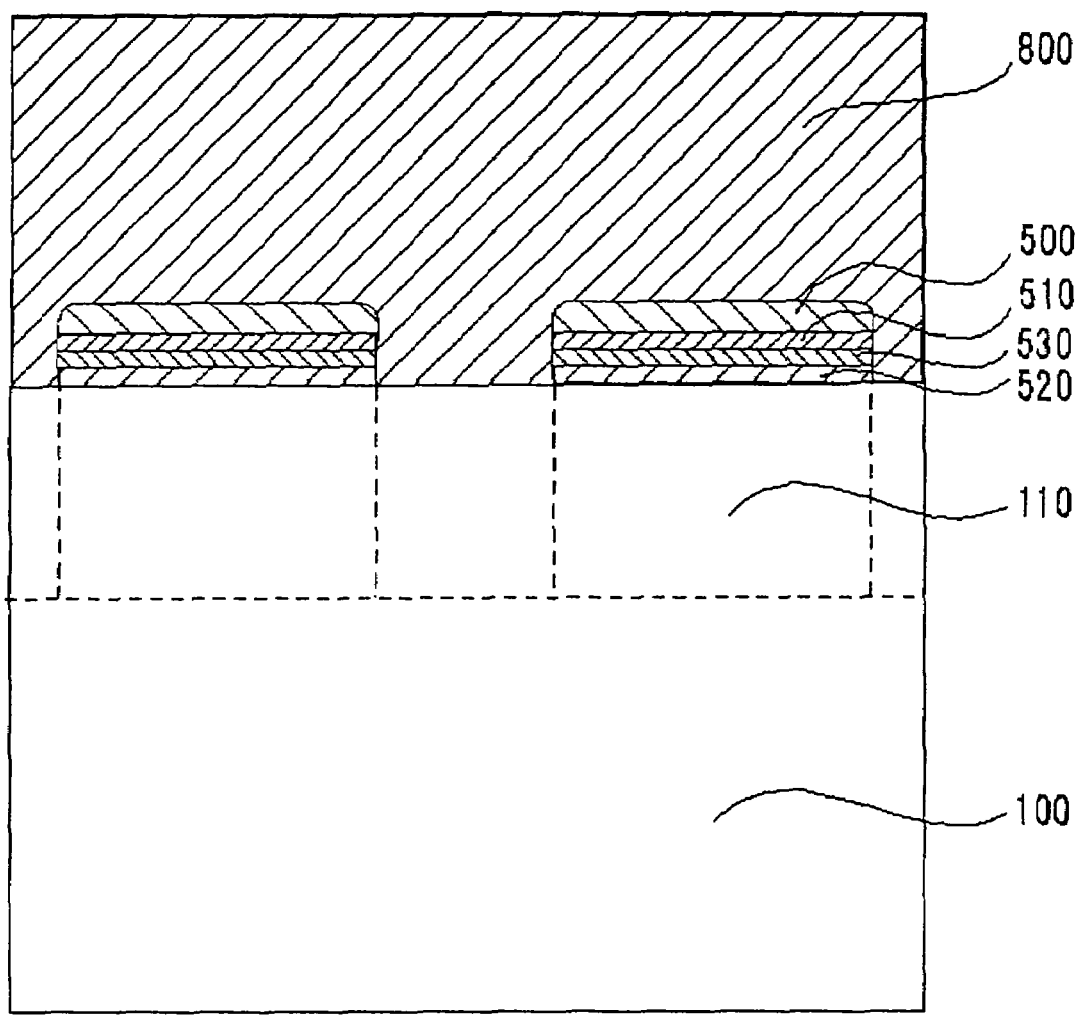
Figure 28:
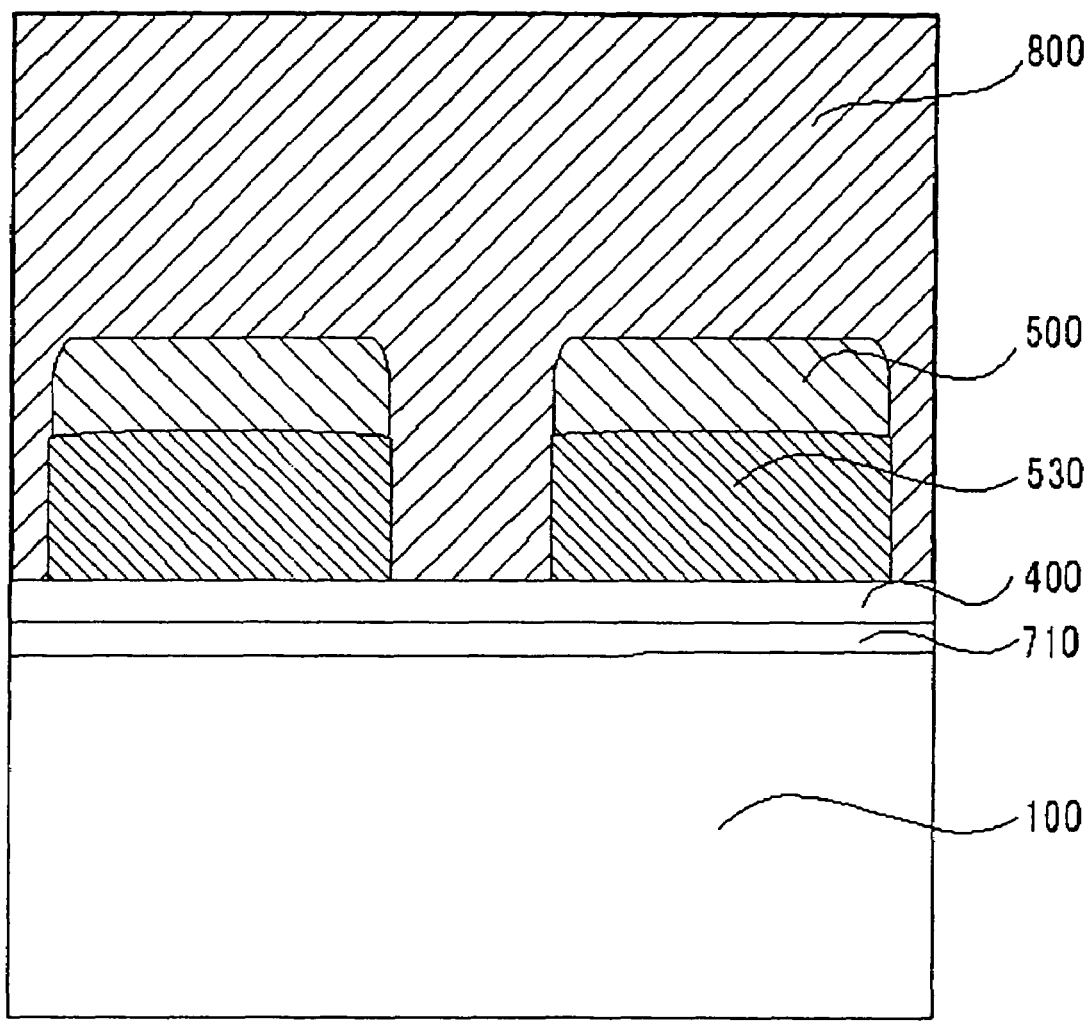

FIGS. 10, 19 and 28 show a semiconductor memory device according to the ninth embodiment and, in this case, three memory cells are provided in a protruding semiconductor layer 110 unlike the semiconductor memory device shown in FIGS. 2, 11 and 20. More specifically, a protruding semiconductor layer having one step, that is, a protruding semiconductor layer of which one side for the formation of memory cells is formed of one flat surface may have at least two or more memory cells and may have three or more memory cells as shown in FIG. 10.

Figure 29:
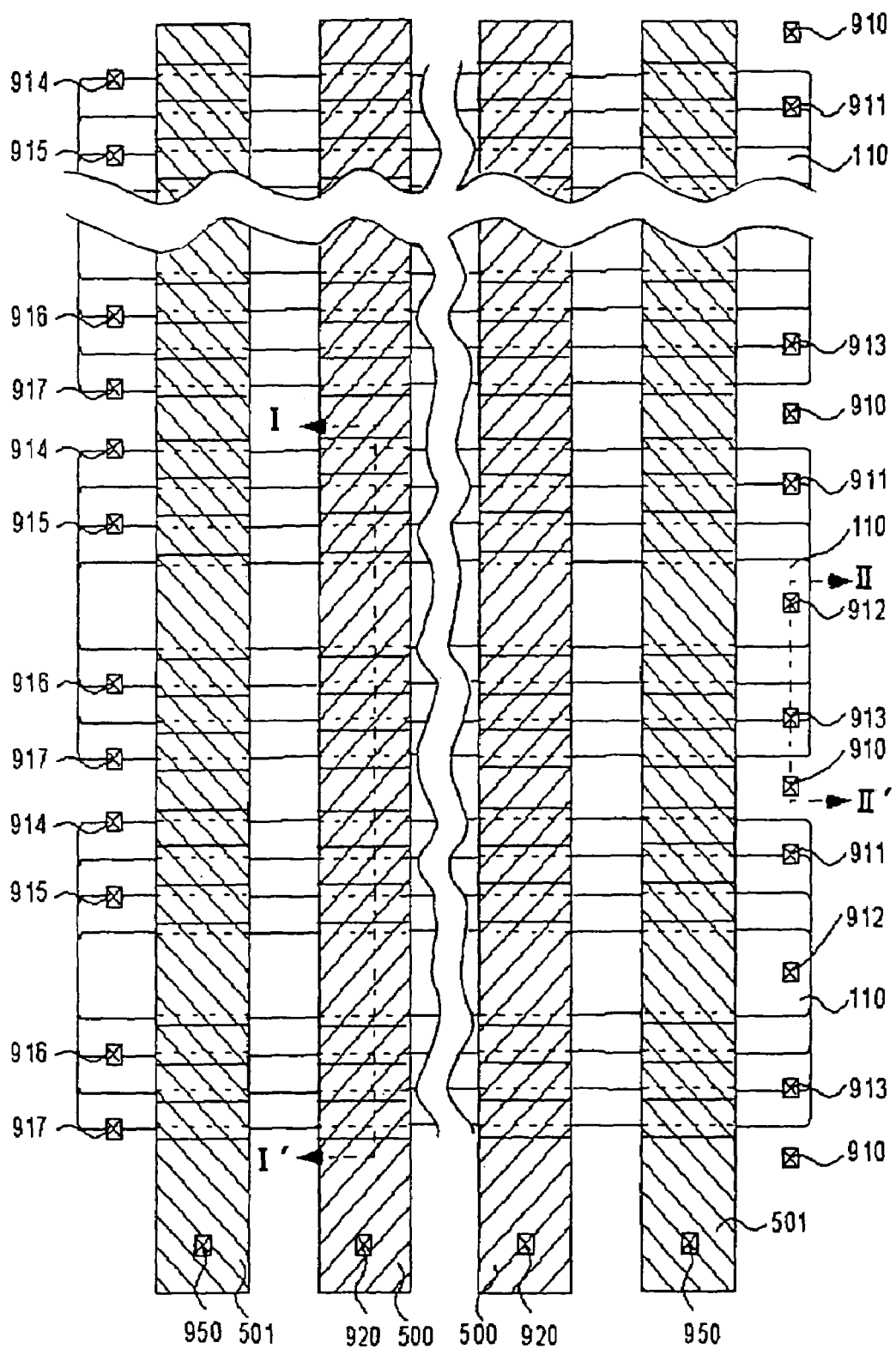
FIG. 29 is a plan view showing a memory array of semiconductor memory devices according to tenth to twenty-second embodiments of the present invention.
Figure 30:
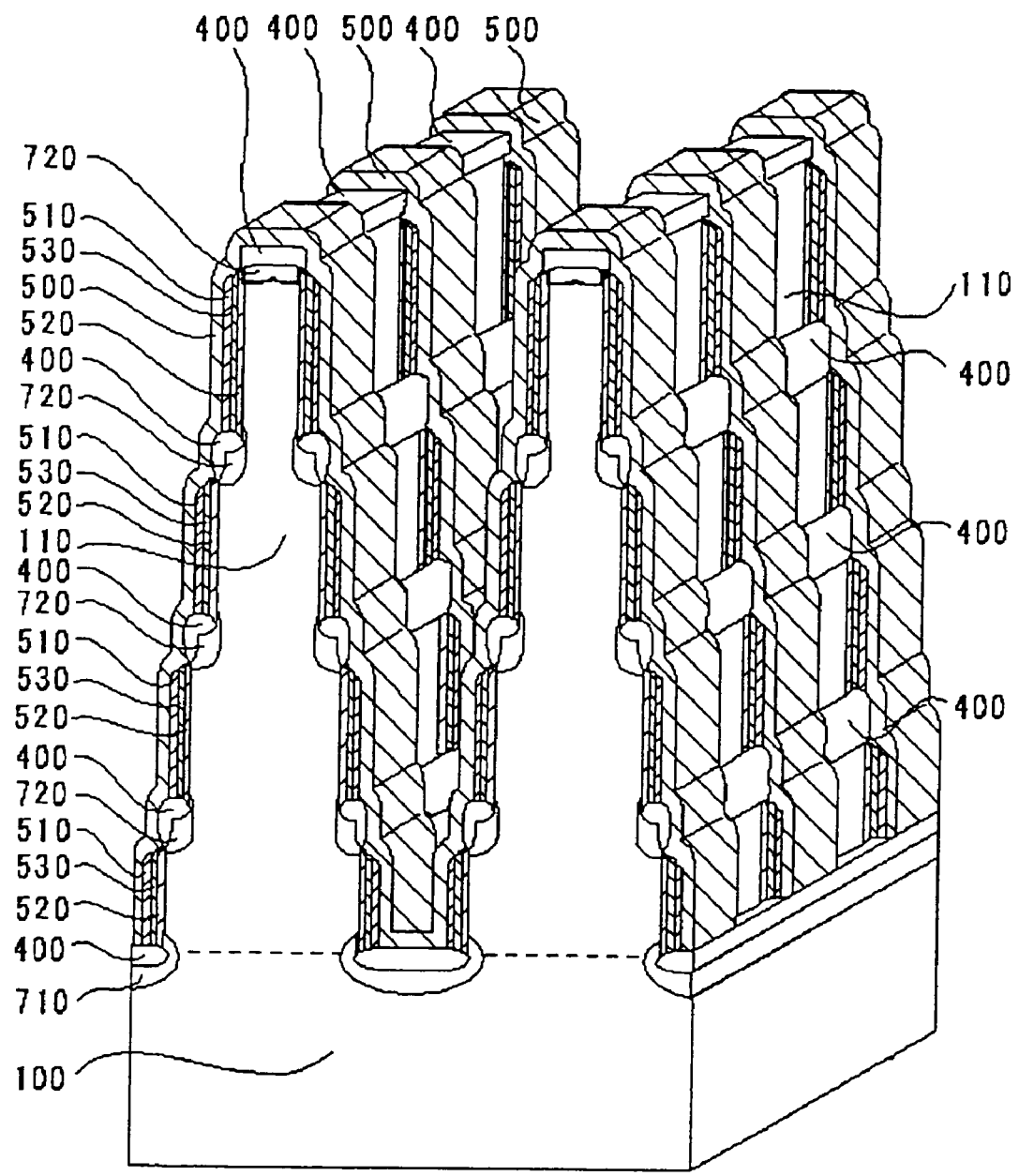
FIG. 30 is a perspective view of a memory array according to the tenth embodiment.
Figure 74:
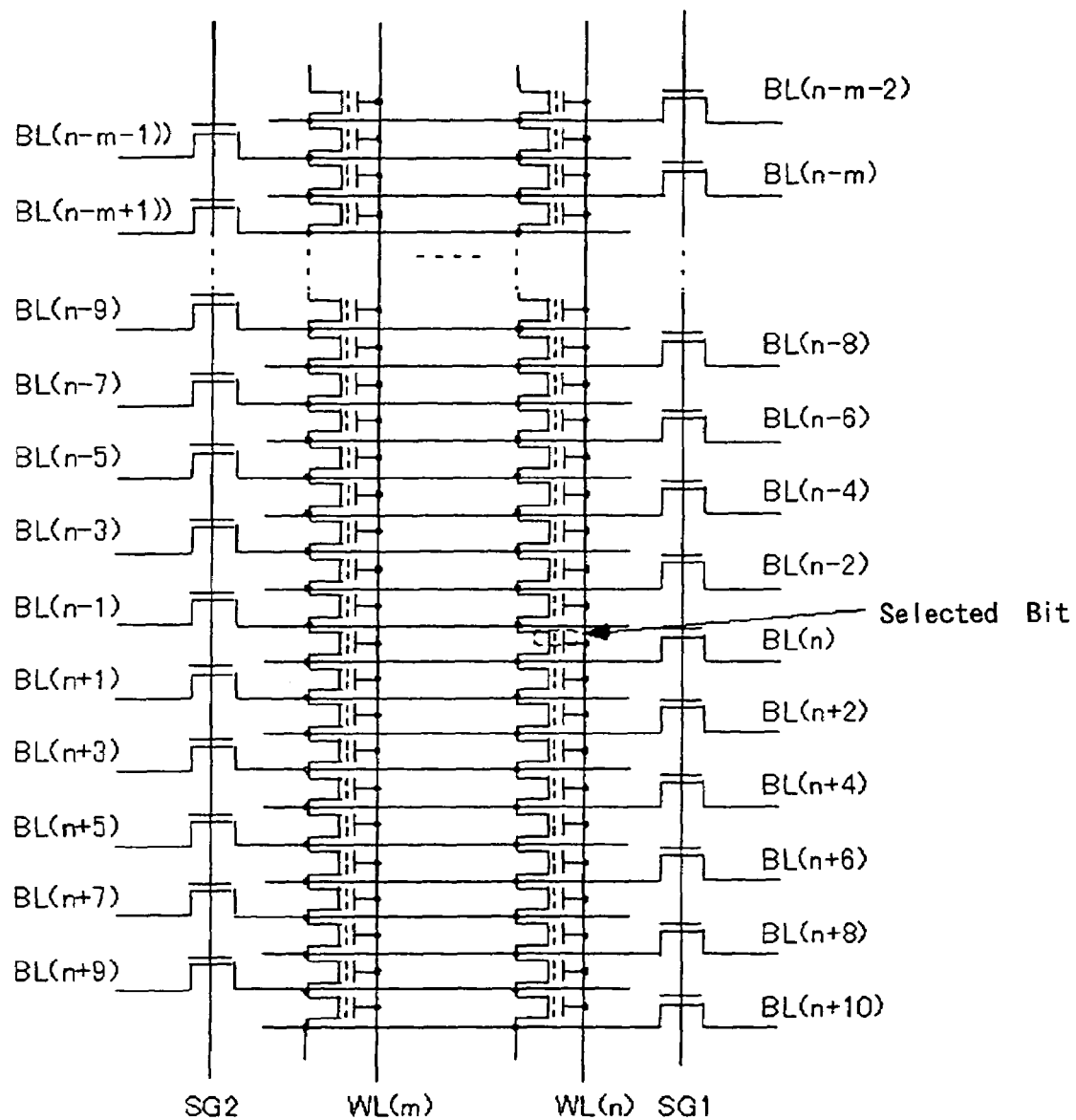
FIG. 74 is an equivalent circuit diagram of the memory array shown in FIG. 29.
Figure 75:
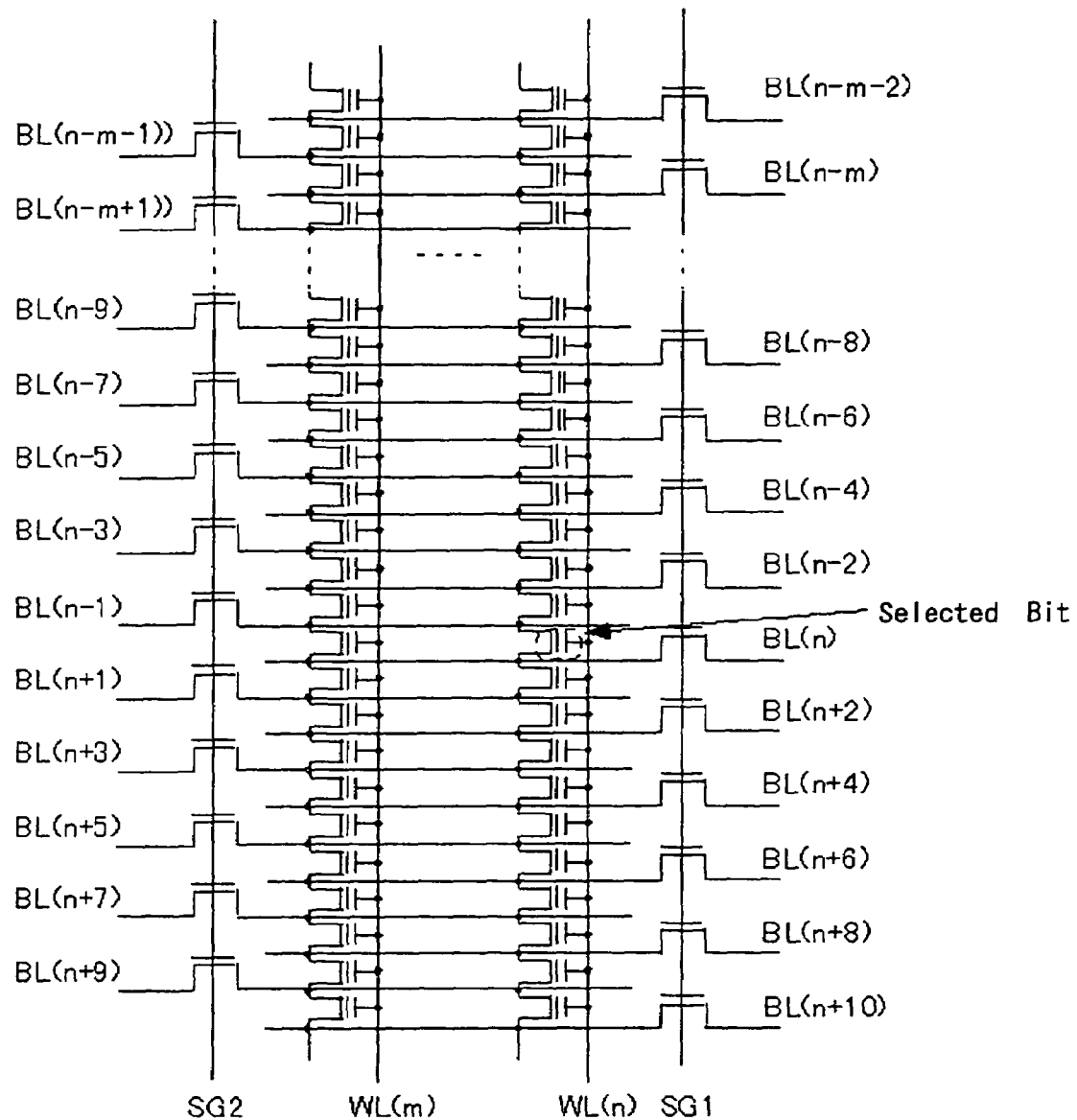
FIG. 75 is an equivalent circuit diagram of another memory array shown in FIG. 29.

FIG. 29 is a plan view showing a memory array of semiconductor memory devices according to tenth to twenty-second embodiments of the present invention and FIG. 30 is a perspective view of a memory array according to the tenth embodiment. In addition, the equivalent circuit diagram of the memory array shown in FIG. 29 is shown in FIGS. 74 and 75.

Figure 31:
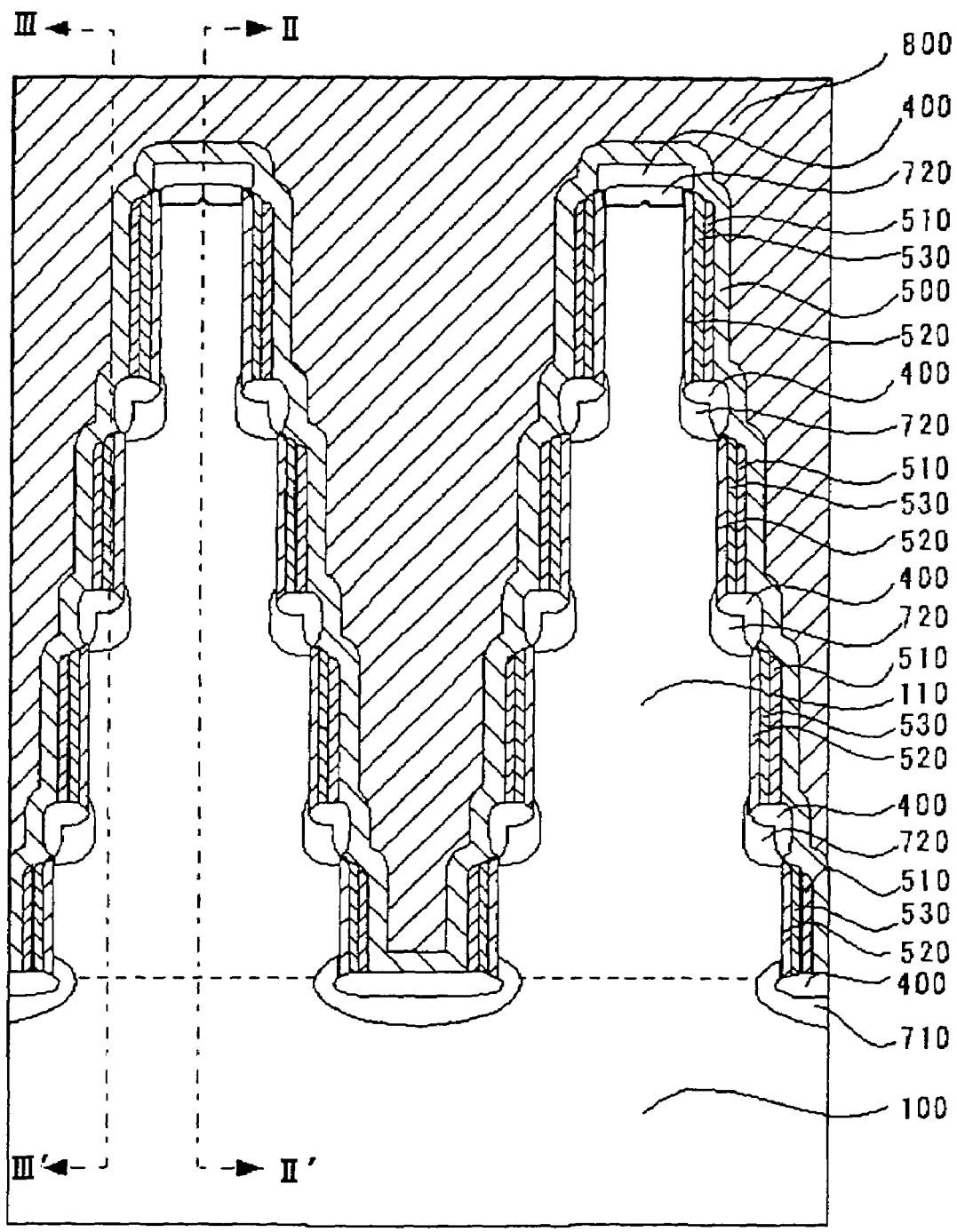
FIGS. 31 to 43 are cross sectional views through section I-I' of FIG. 29 showing the semiconductor memory devices according to the tenth to twenty-second embodiments, respectively.
Figure 44:
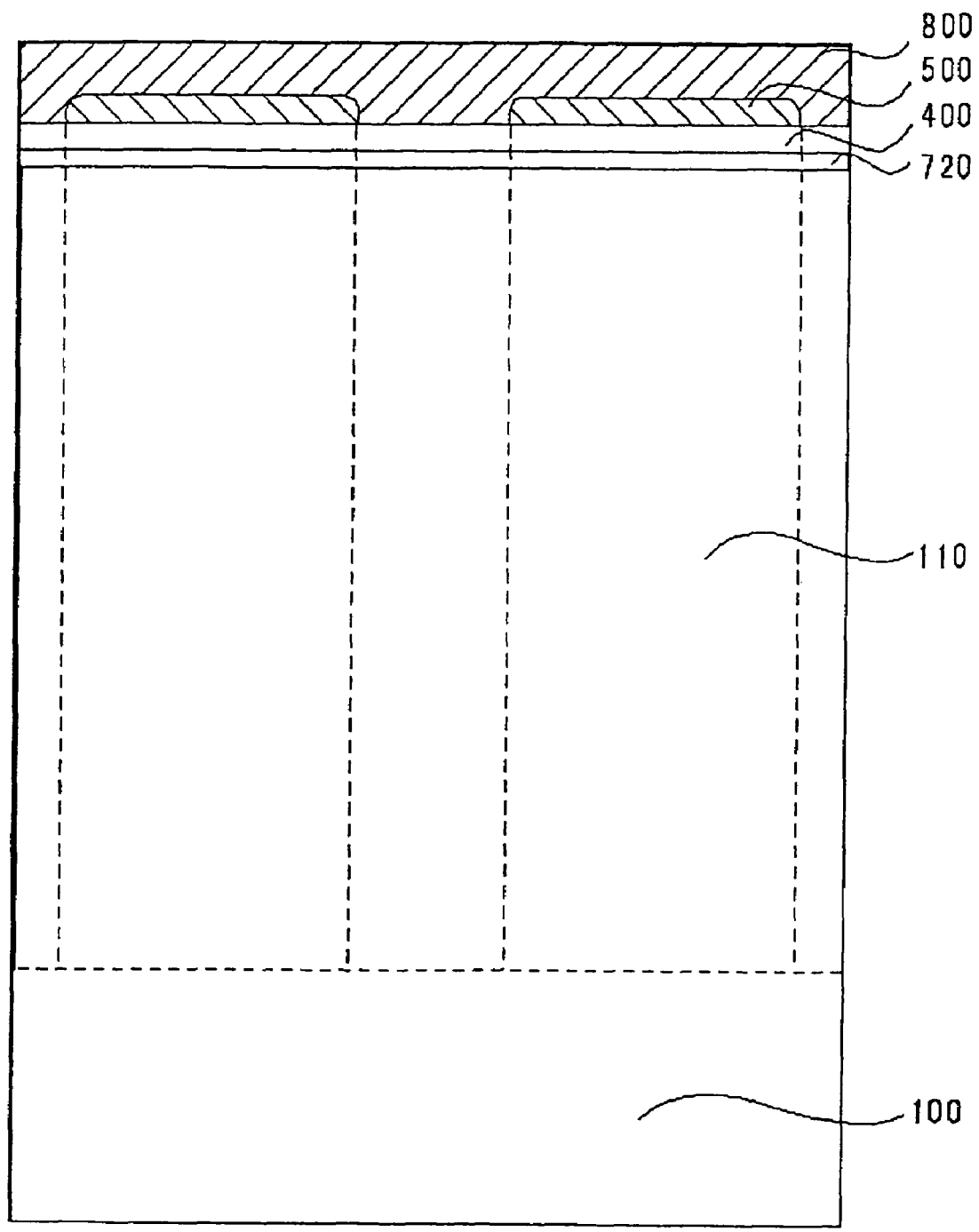
FIGS. 44 to 56 are cross sectional views of the semiconductor memory devices taken along line II-II' of FIGS. 31 to 43, respectively.
Figure 57:
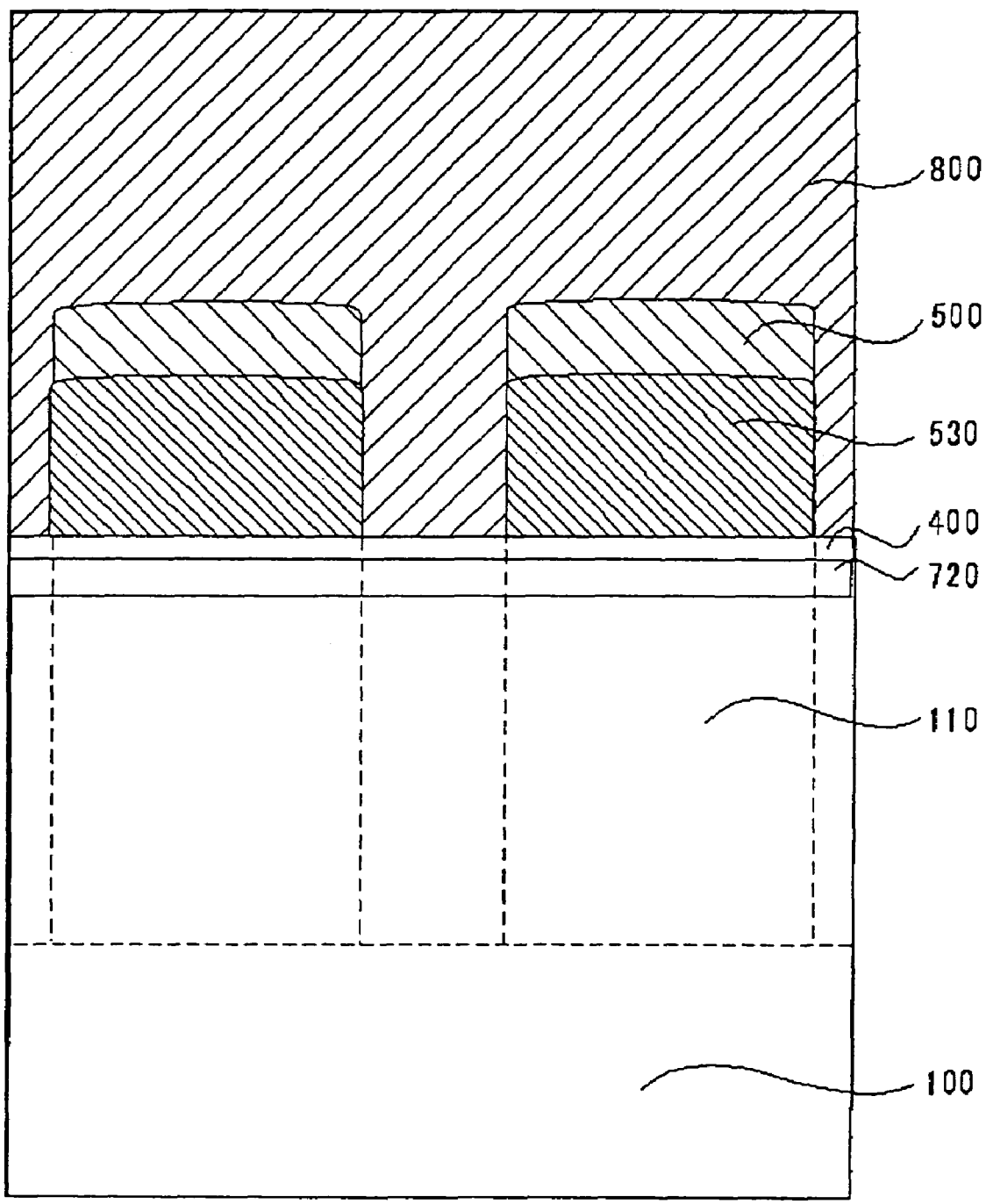
FIGS. 57 to 69 are cross sectional views of the semiconductor memory devices taken along line III-III' of FIGS. 31 to 43, respectively.

FIGS. 31, 44 and 57 show a semiconductor memory device according to the tenth embodiment and, in this case, at least one or more protruding semiconductor layers 110 of which the forms in a cross section in the horizontal direction relative to the p-type silicon substrate 100 are of bands in form and which have four steps are aligned in a memory cell. In the tenth embodiment, the configuration of the memory array other than the above described portions of the configuration is substantially the same as in the first embodiment. Here, the number of steps of a protruding semiconductor layer 110 is not limited as long as the formation of memory cells having desired functions is possible.

Figure 32:
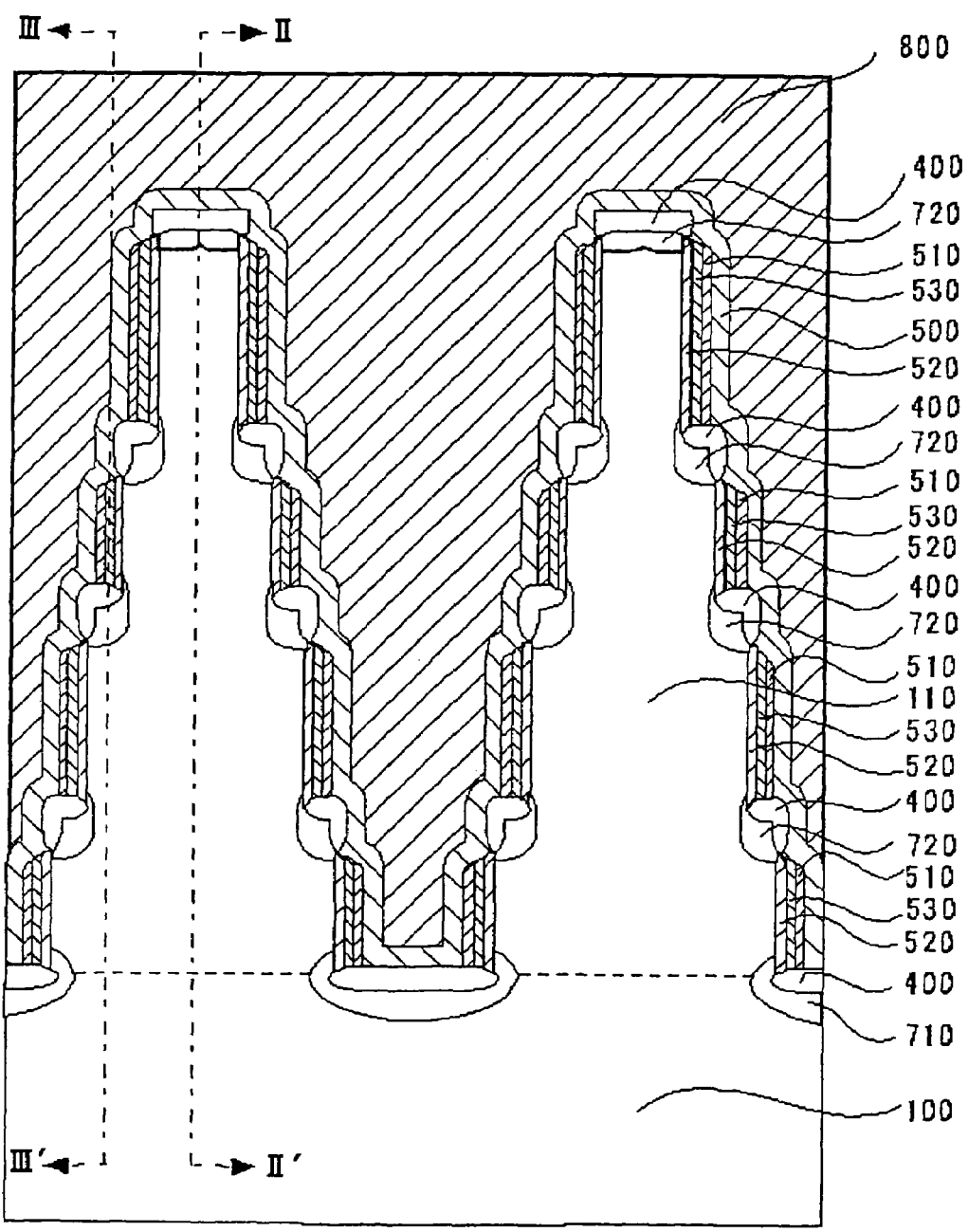
Figure 45:
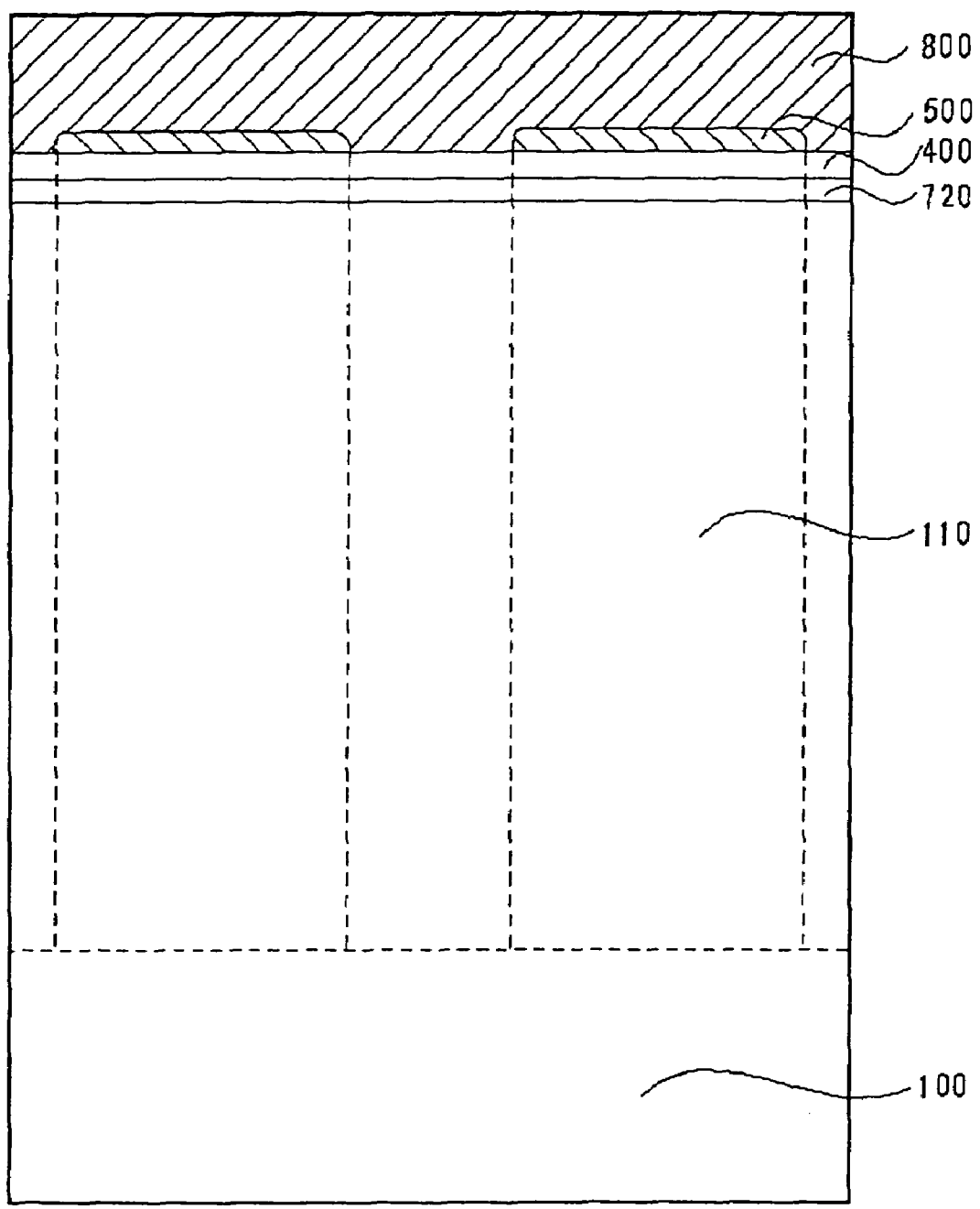
Figure 58:
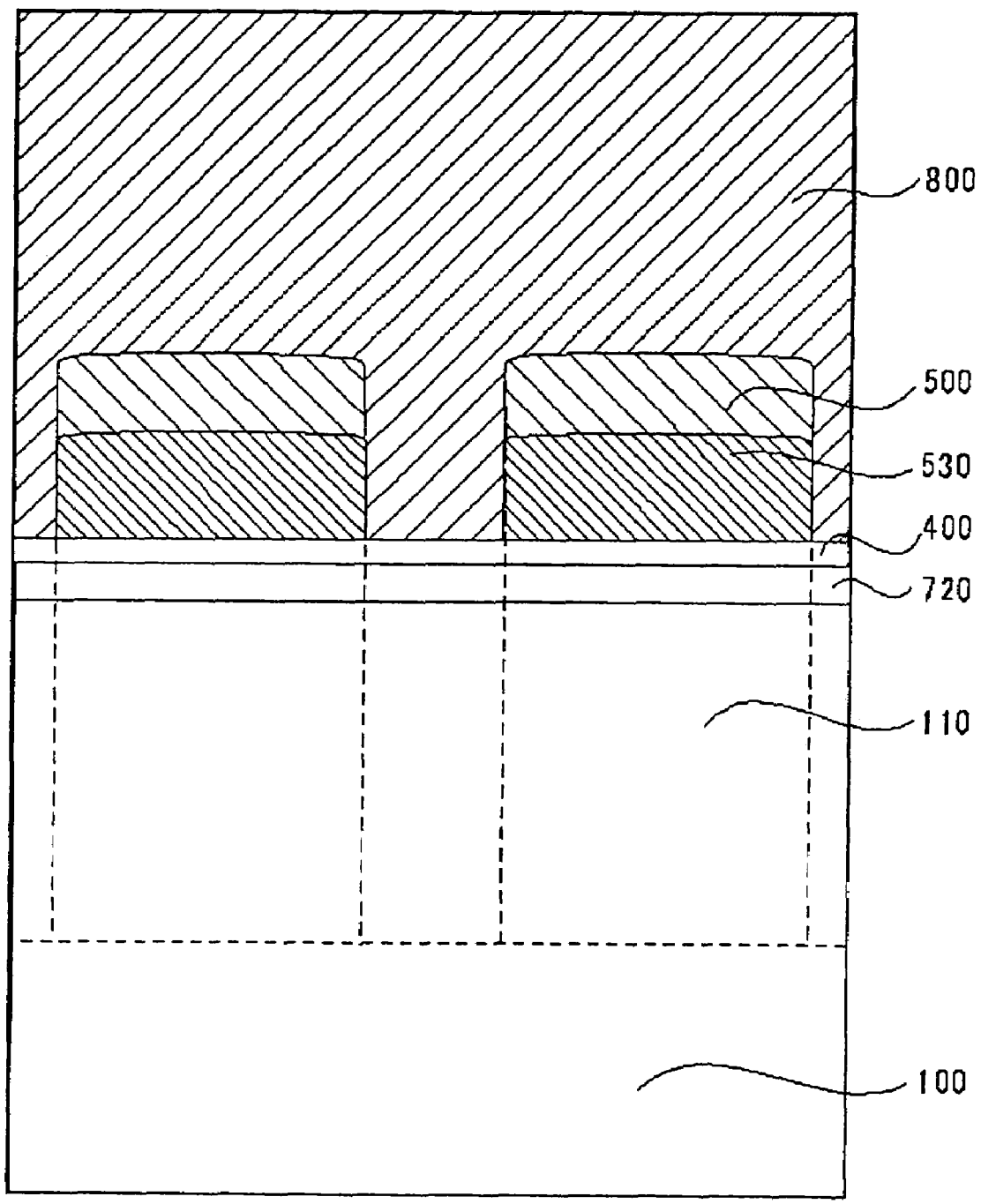

FIGS. 32, 45 and 58 show a semiconductor memory device according to the eleventh embodiment and in this case, the heights of the respective steps of a protruding semiconductor layer 110 differ from each other.

Figure 33:
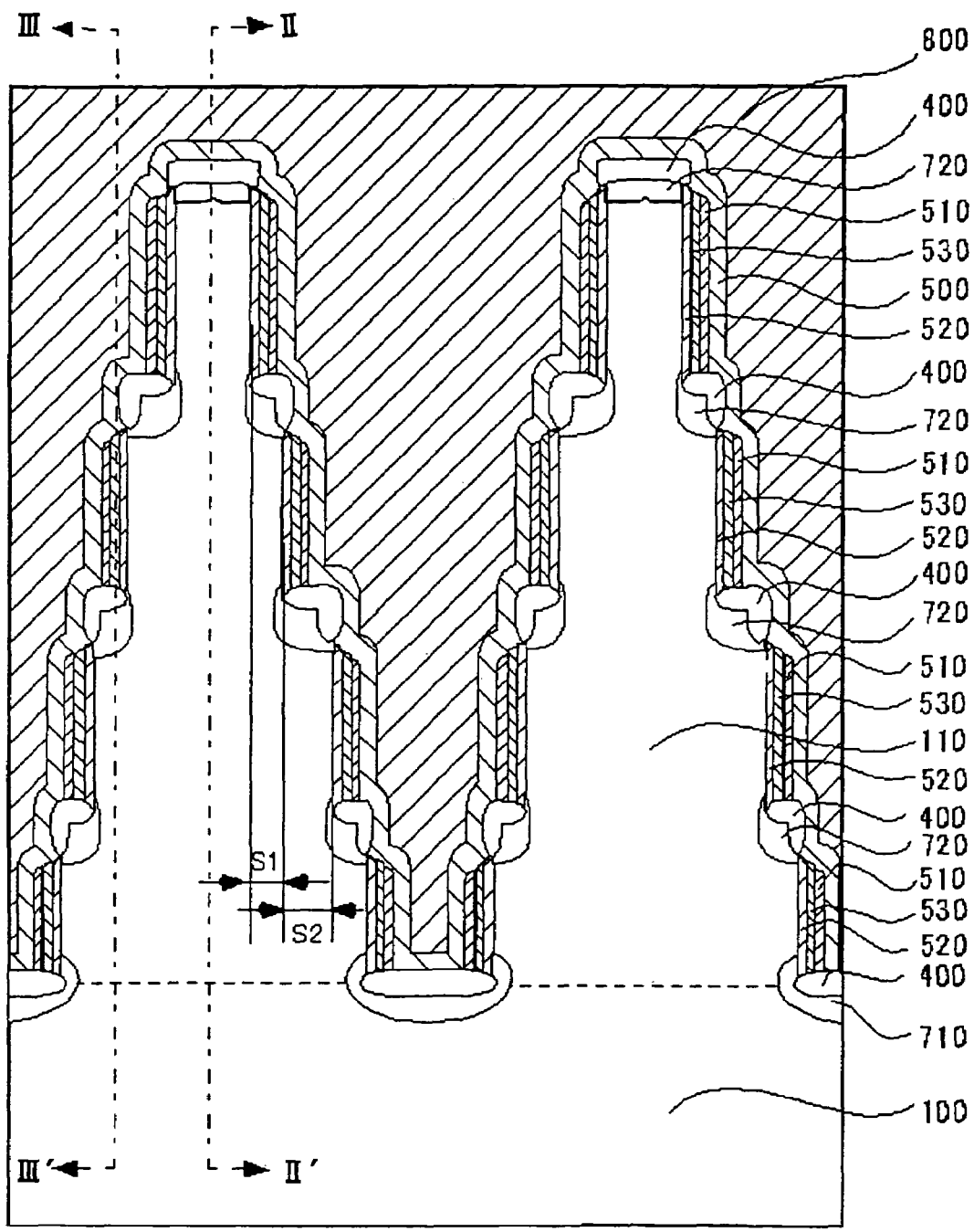
Figure 46:
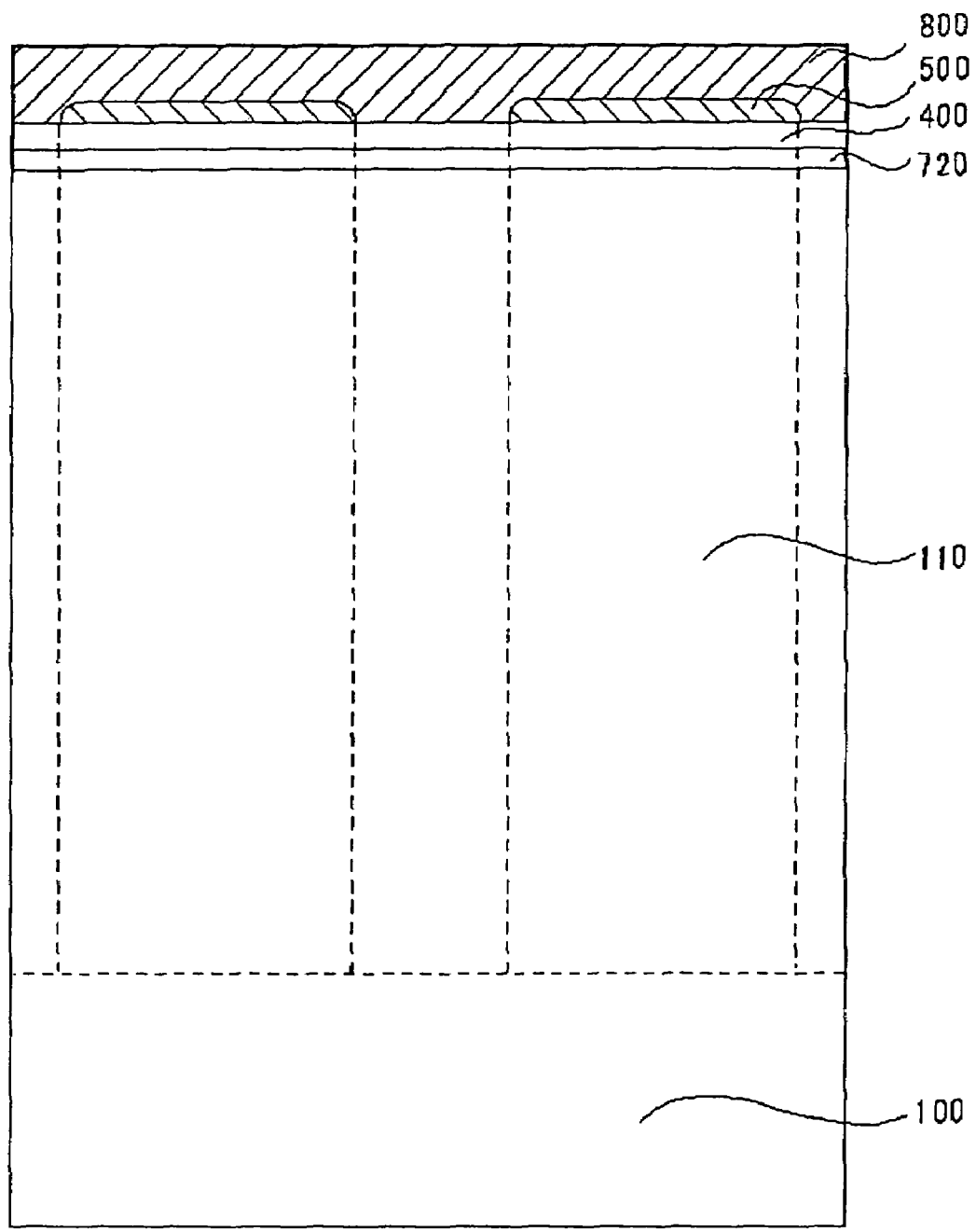
Figure 59:
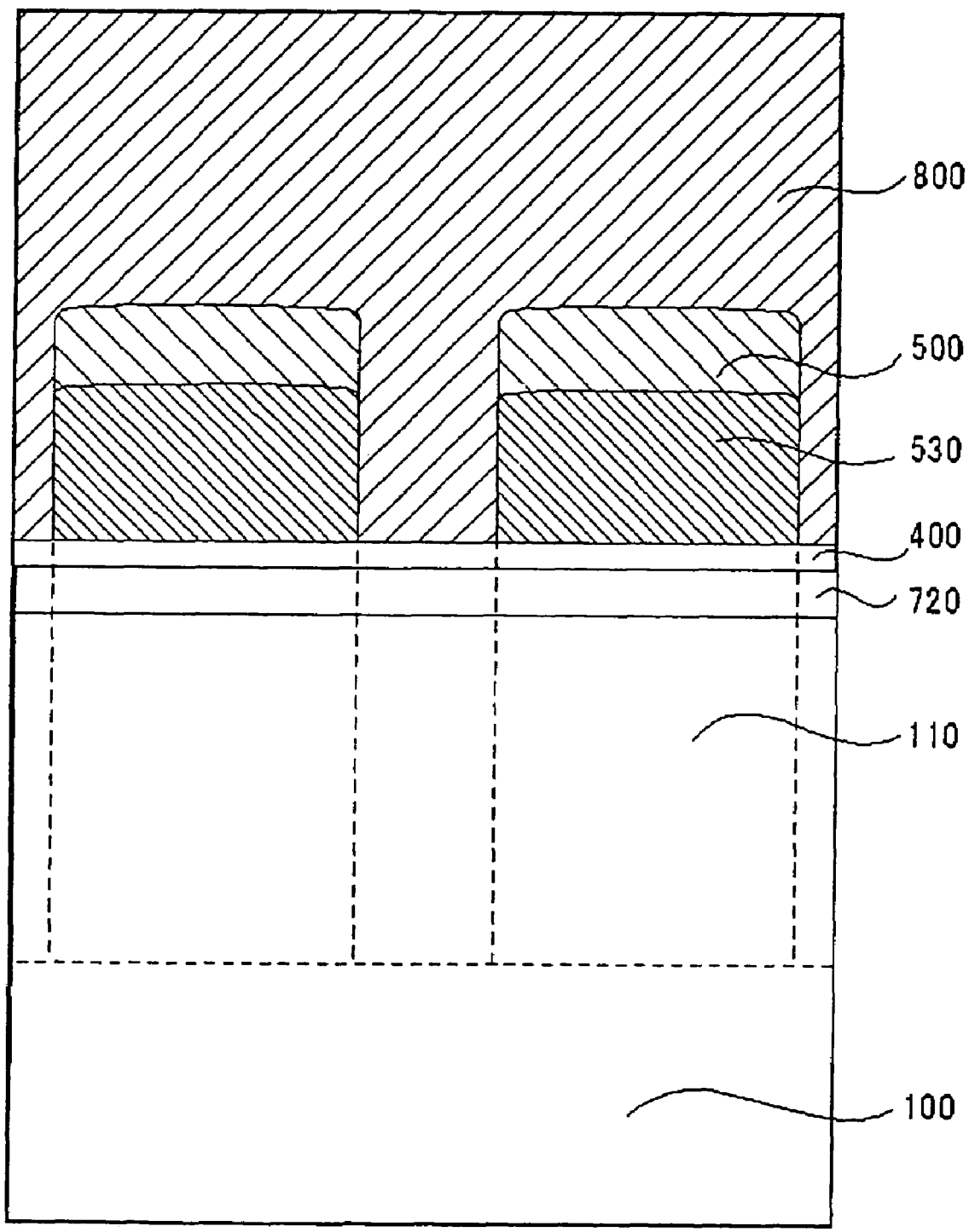

FIGS. 33, 46 and 59 show a semiconductor memory device according to the twelfth embodiment and, in this case, the widths of the respective steps of a protruding semiconductor layer 110 differ from each other. S1 and S2 shown in FIG. 33 indicate the widths of steps respectively. Here, the widths of the respective steps are not limited in regards to the sizes as long as it is possible for the memory cell to have desired functions and two or more widths of the respective steps may be equal to each other.

Figure 34:
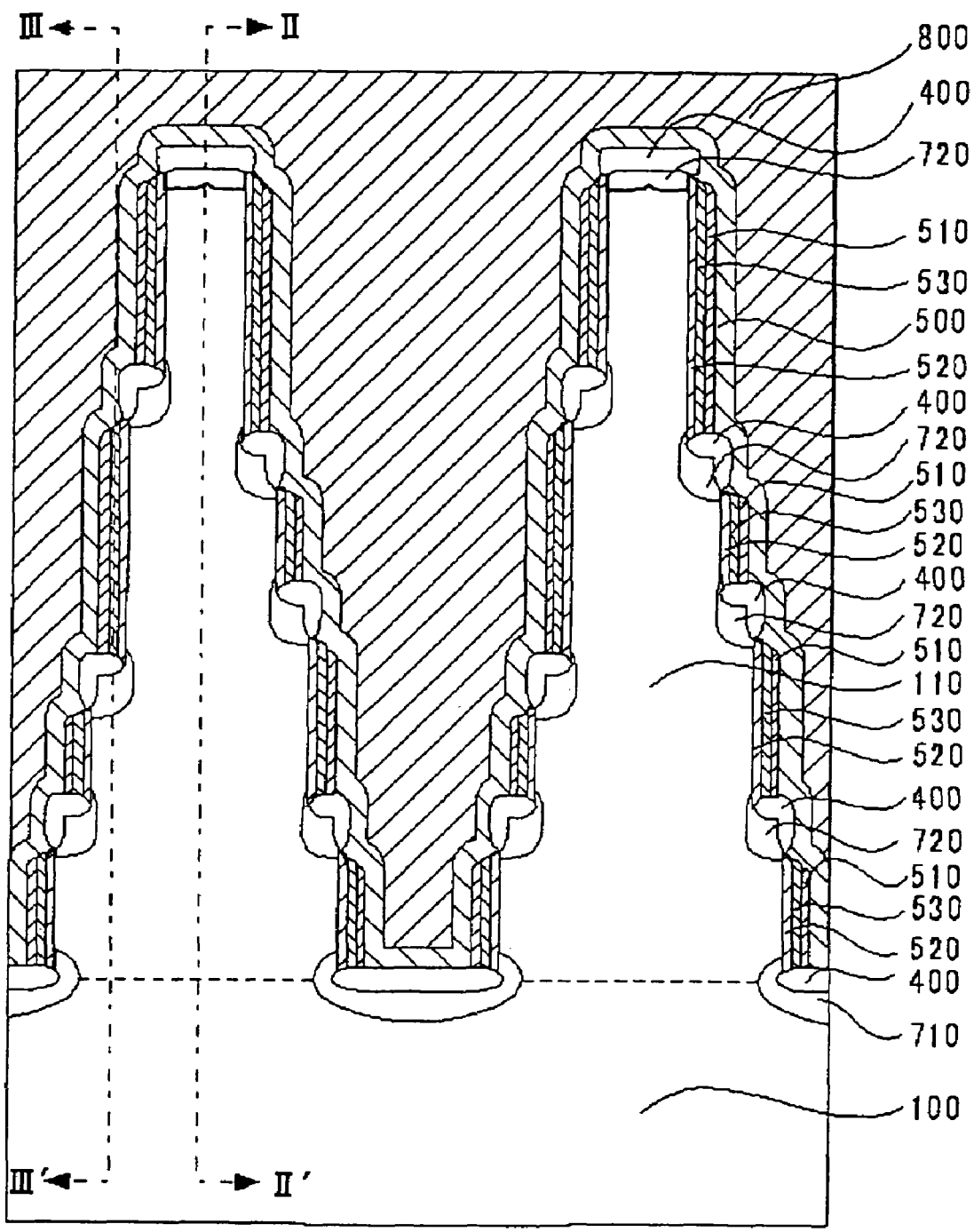
Figure 47:
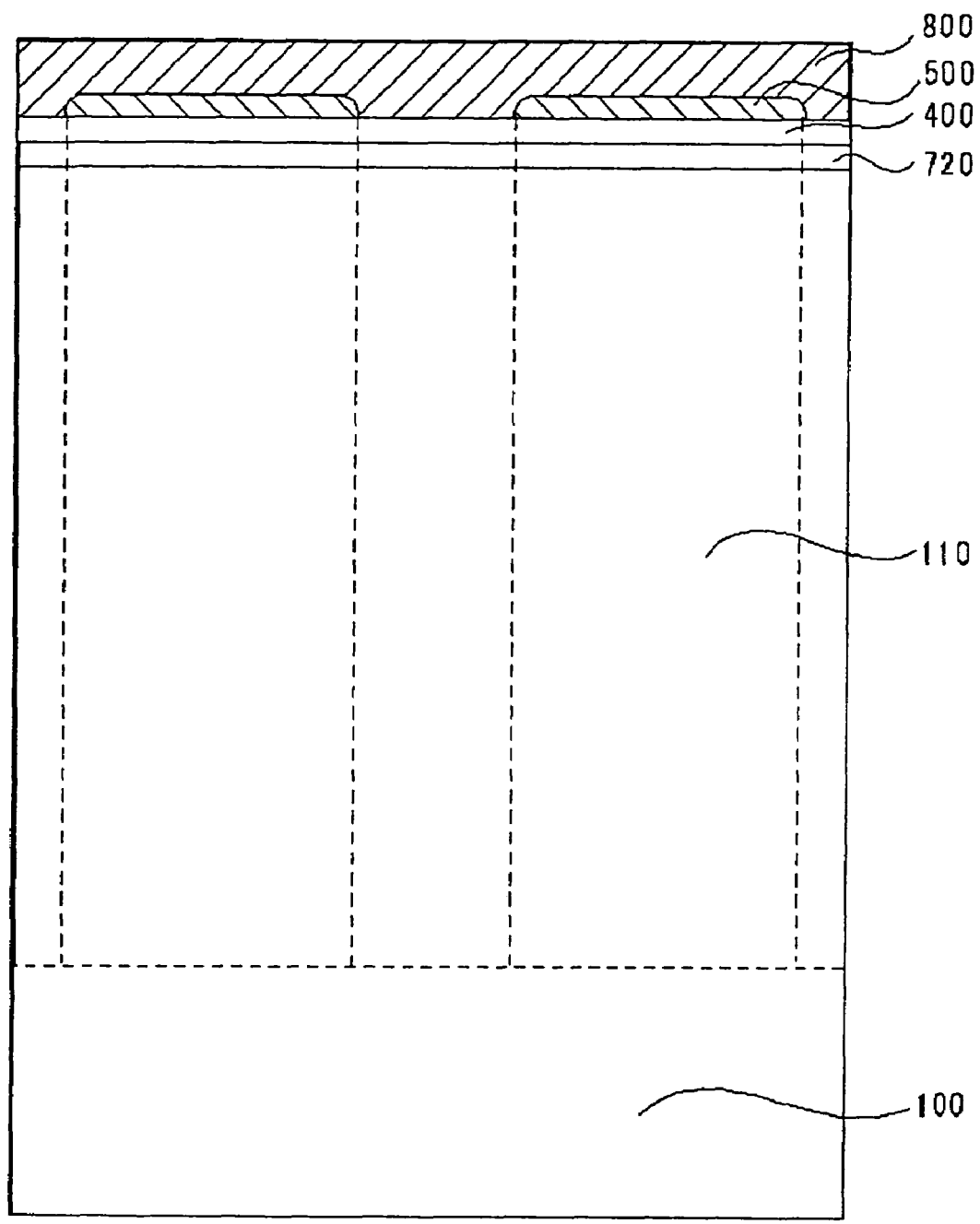
Figure 60:
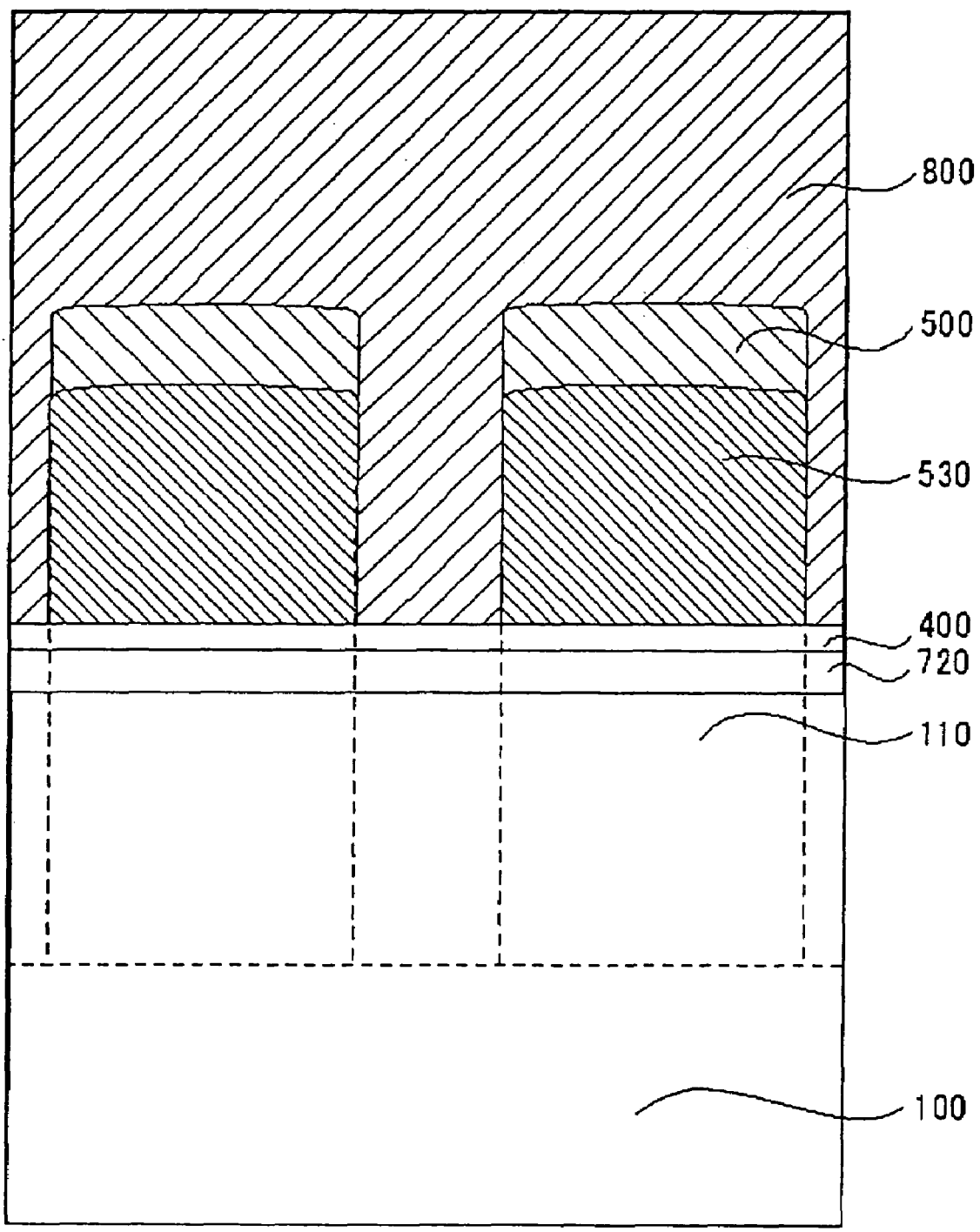

FIGS. 34, 47 and 60 show a semiconductor memory device according to the thirteenth embodiment and, in this case, the heights of the respective steps of a protruding semiconductor layer 110 are not uniform. Here, the heights of the respective steps are not limited in regards to the sizes as long as it is possible for the memory cell to have desired functions and two or more of the respective steps may have equal heights.

Figure 35:
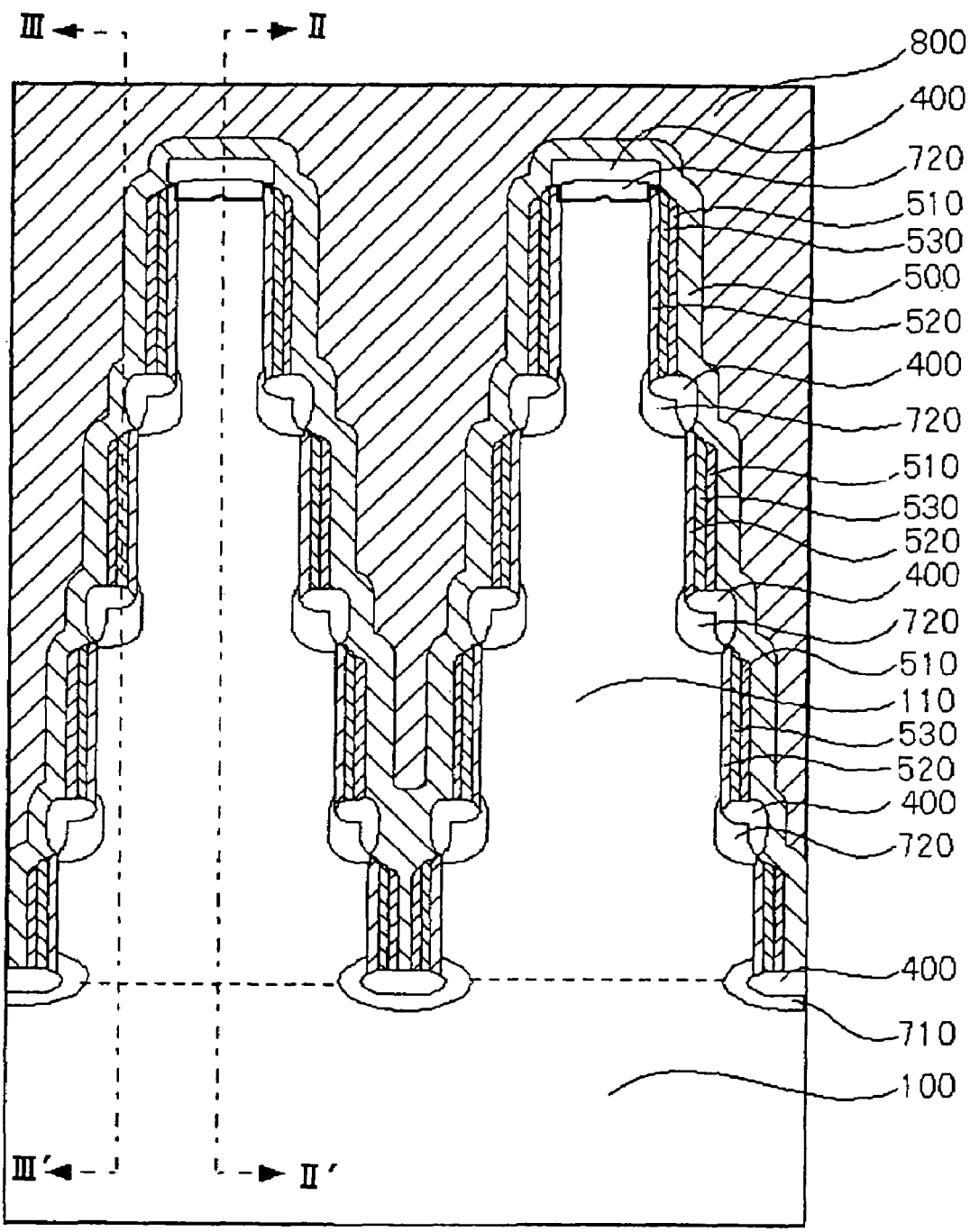
Figure 48:
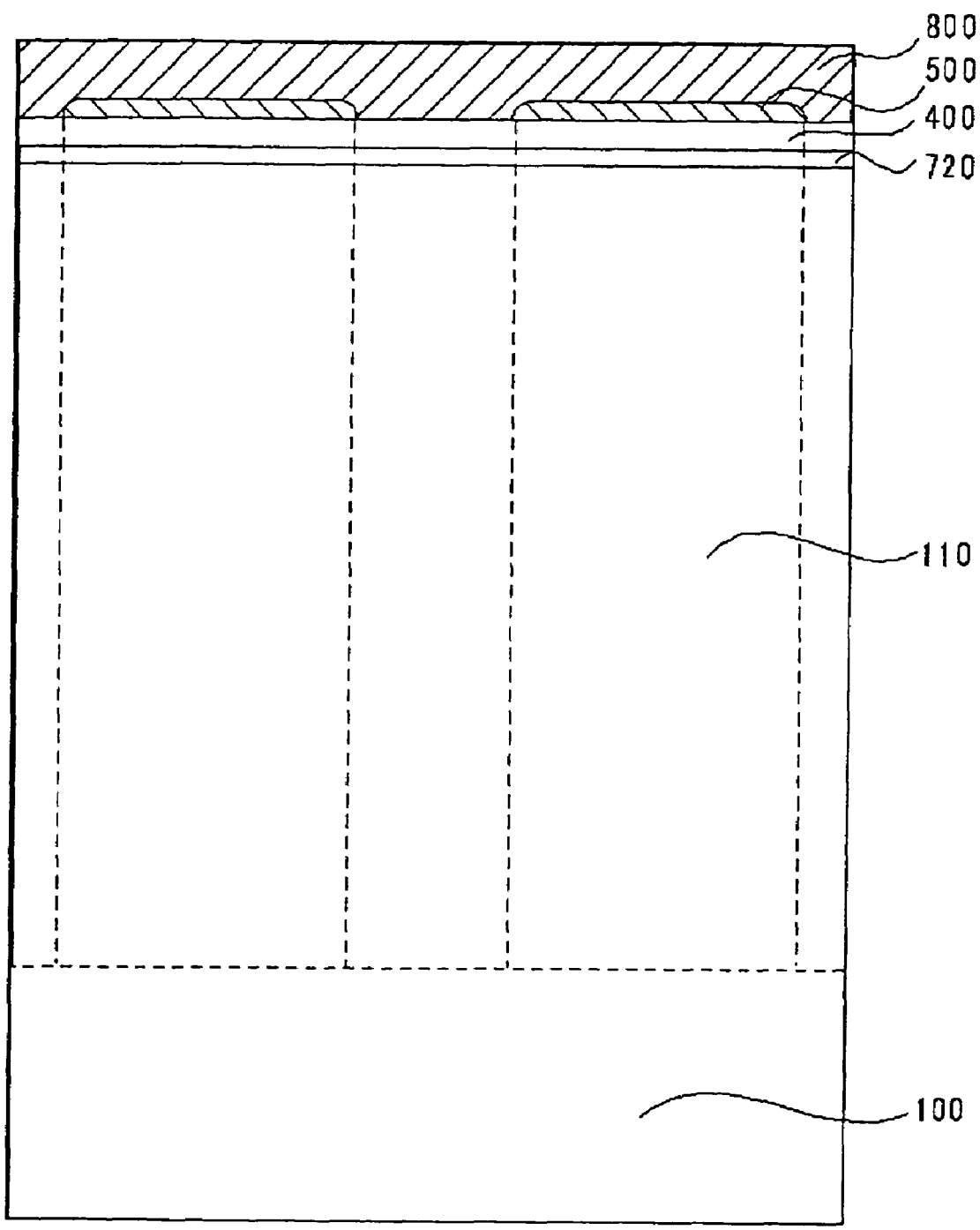
Figure 61:
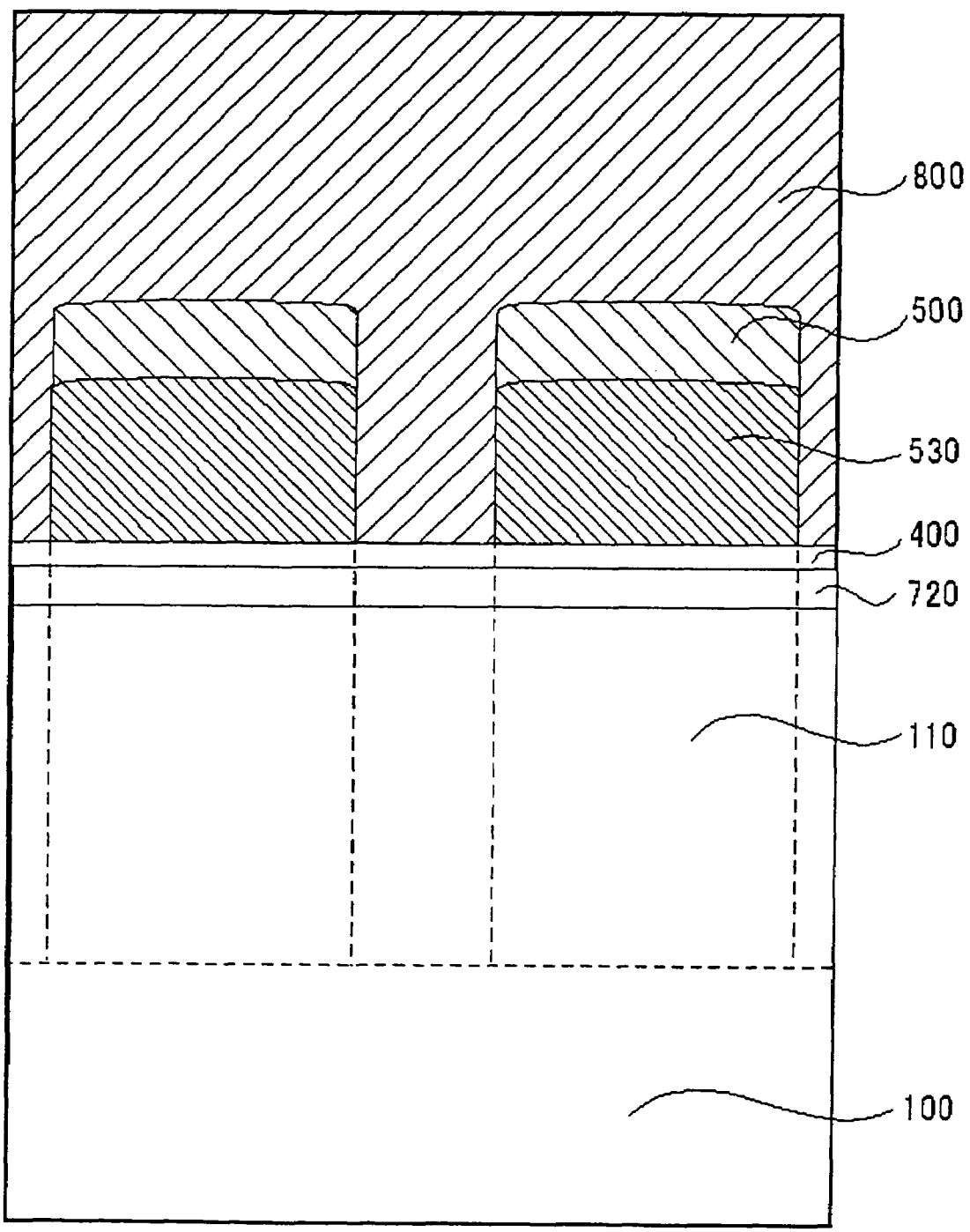

FIGS. 35, 48 and 61 show a semiconductor memory device according to the fourteenth embodiment and, in this case, the control gate 500 of the memory cells is filled in up to the depth of the corners of the steps that are closest to the silicon substrate 100 of a protruding semiconductor layer 110.

Figure 36:
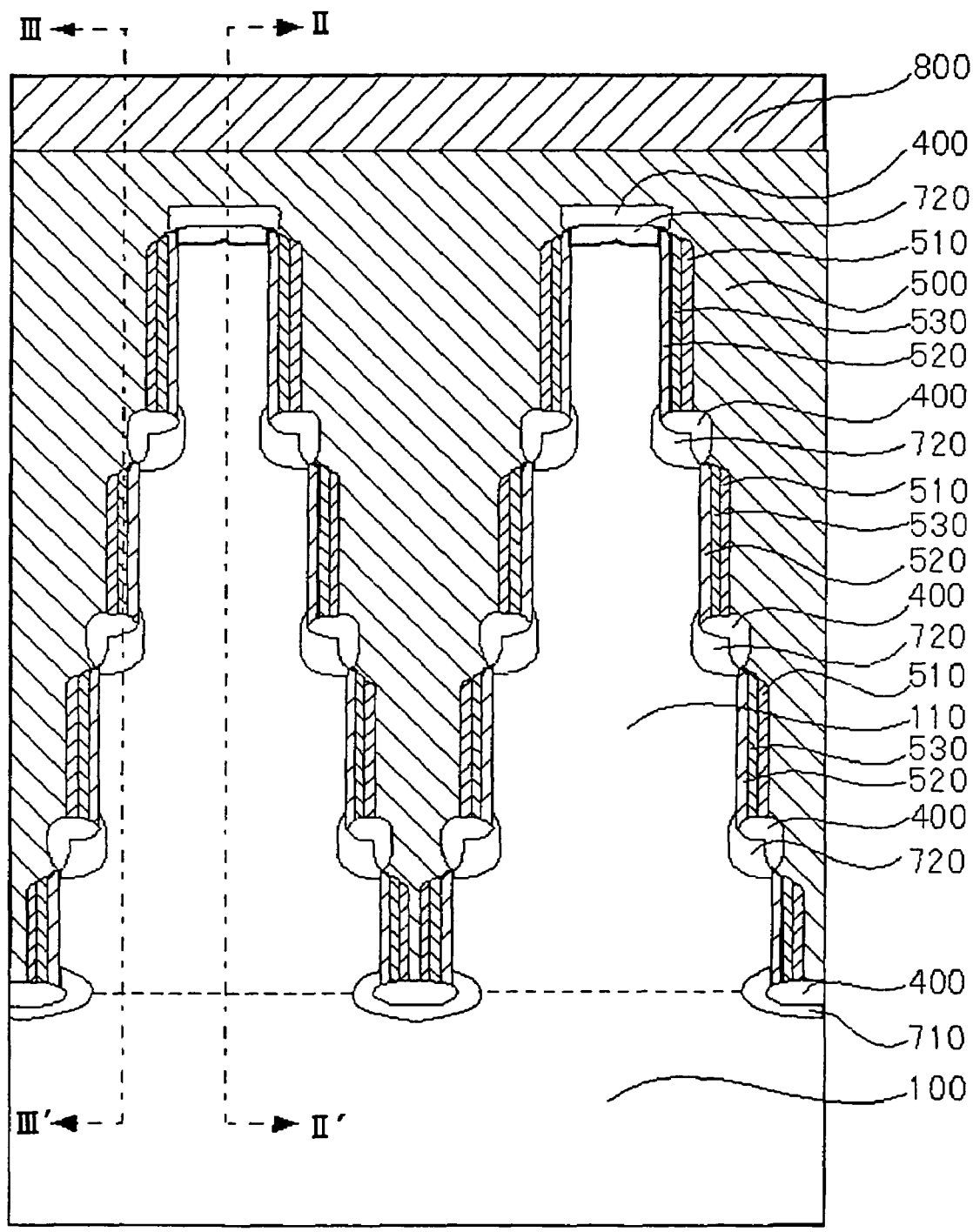
Figure 49:
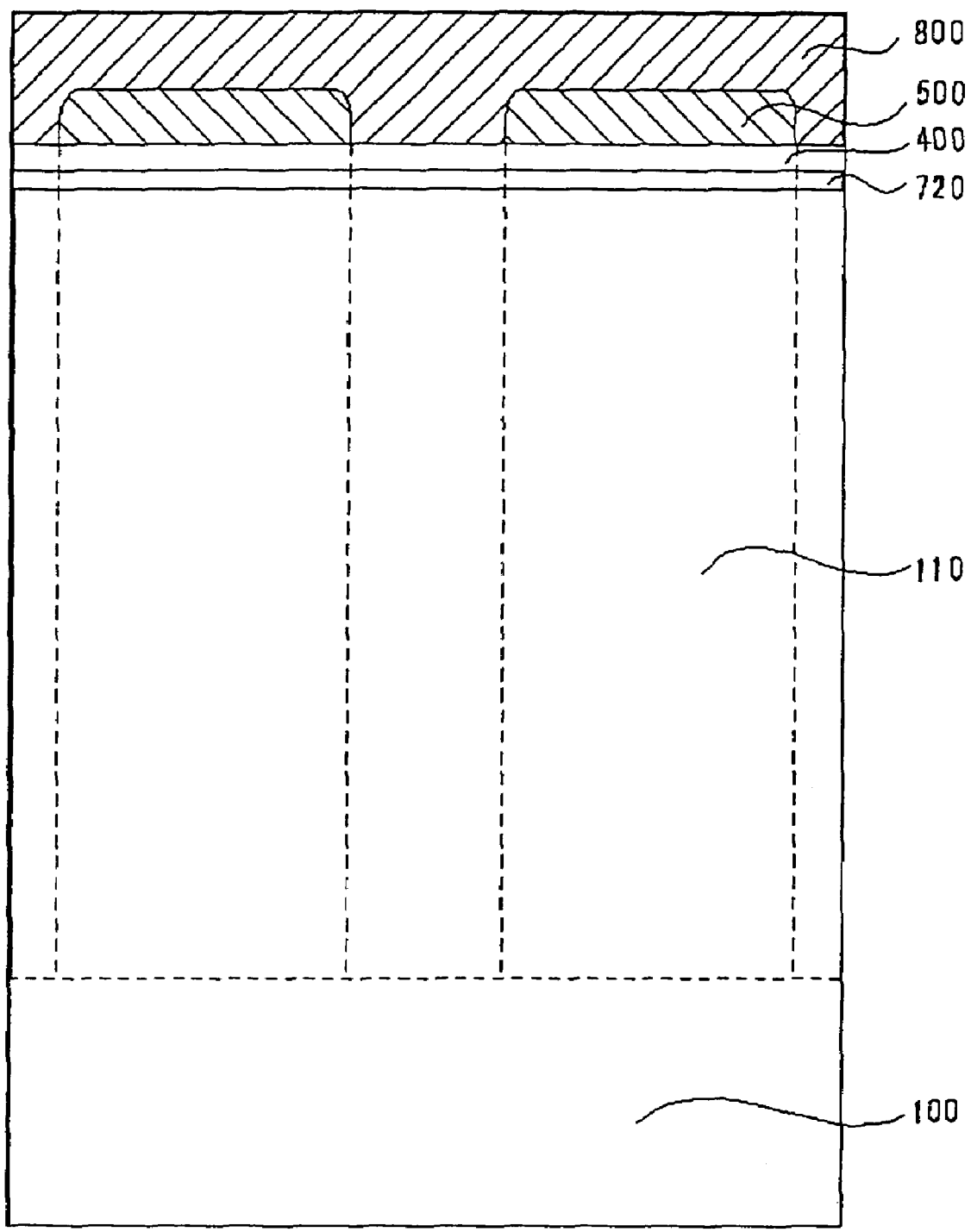
Figure 62:
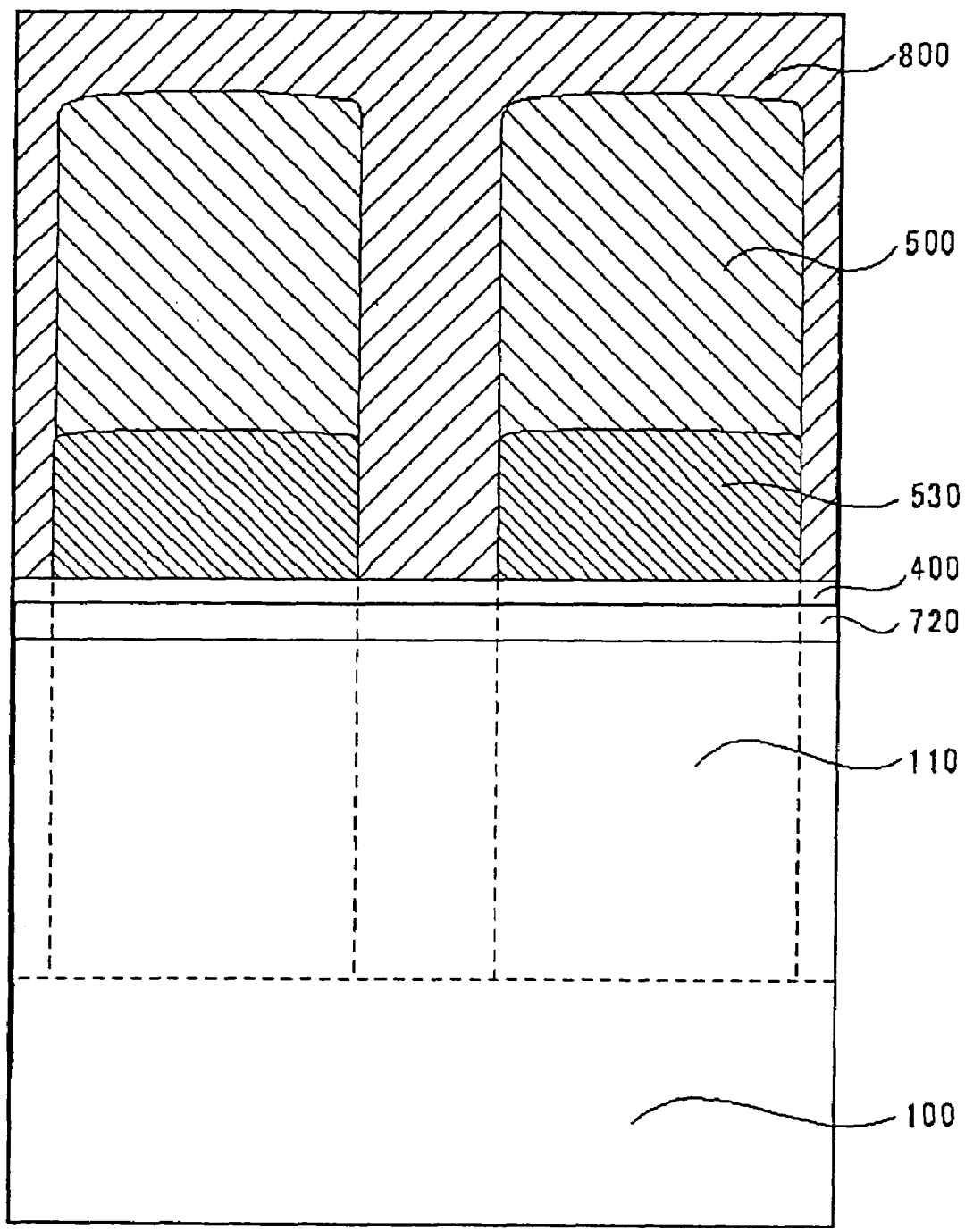

FIGS. 36, 49 and 62 show a semiconductor memory device according to the fifteenth embodiment and, in this case, the control gate 500 of the memory cell is filled in up to the entire depth of the protruding semiconductor layer 110. Here, the depth relative to the protruding semiconductor layer 110 of the control gate 500 that has been filled in is not limited as long as the memory cell has desired functions.

Figure 37:
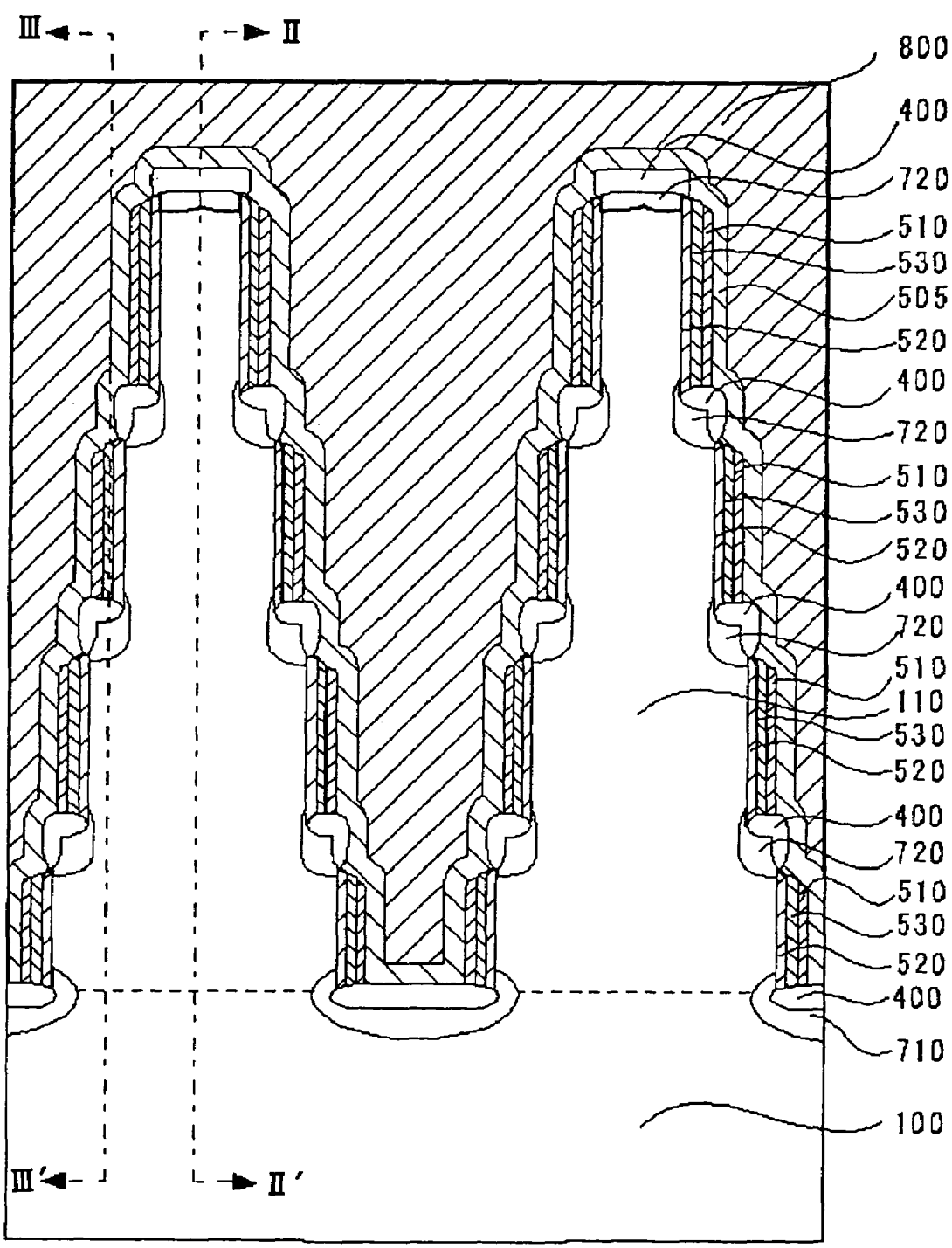
Figure 50:
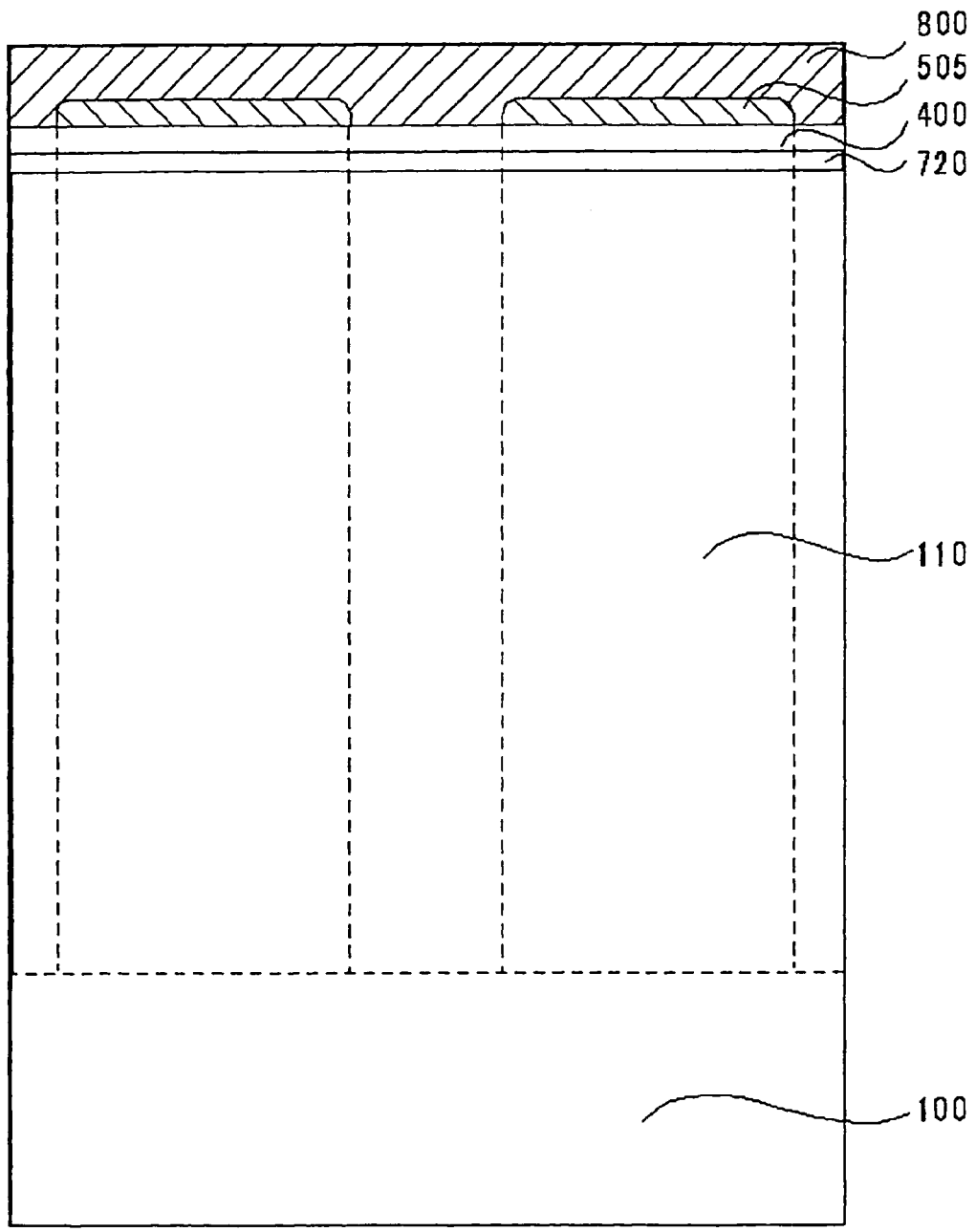
Figure 63:
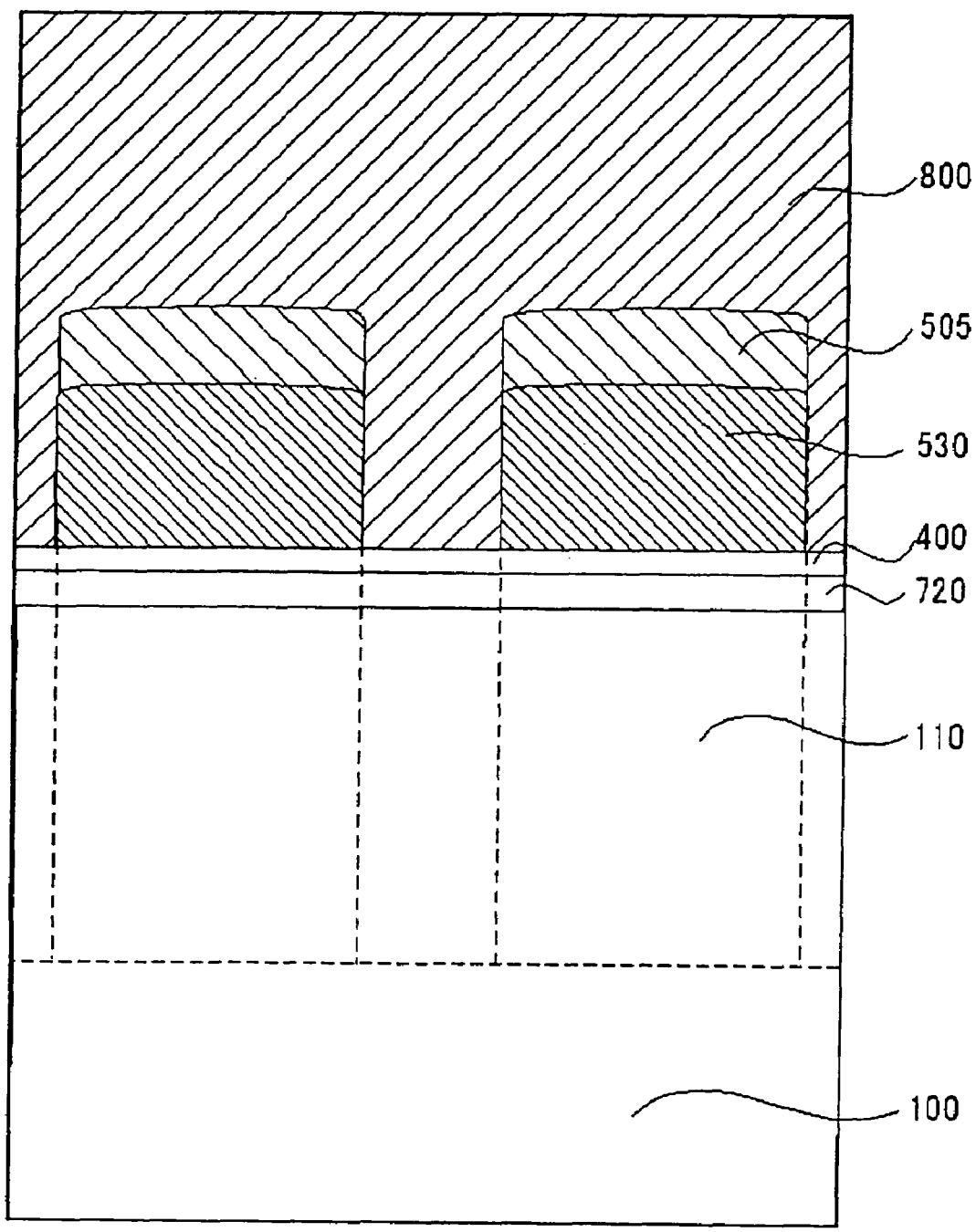

FIGS. 37, 50 and 63 show a semiconductor memory device according to the sixteenth embodiment and, in this case, a control gate 505 of the memory cells is formed of metal or alloy. Here, metals or alloys that include elements such as aluminum, tungsten or copper can be cited as the material for the control gate 505. It becomes possible to lower the resistance of word lines and the suppression of the wire delay becomes possible by using metal or alloy for the control gates.

Figure 38:
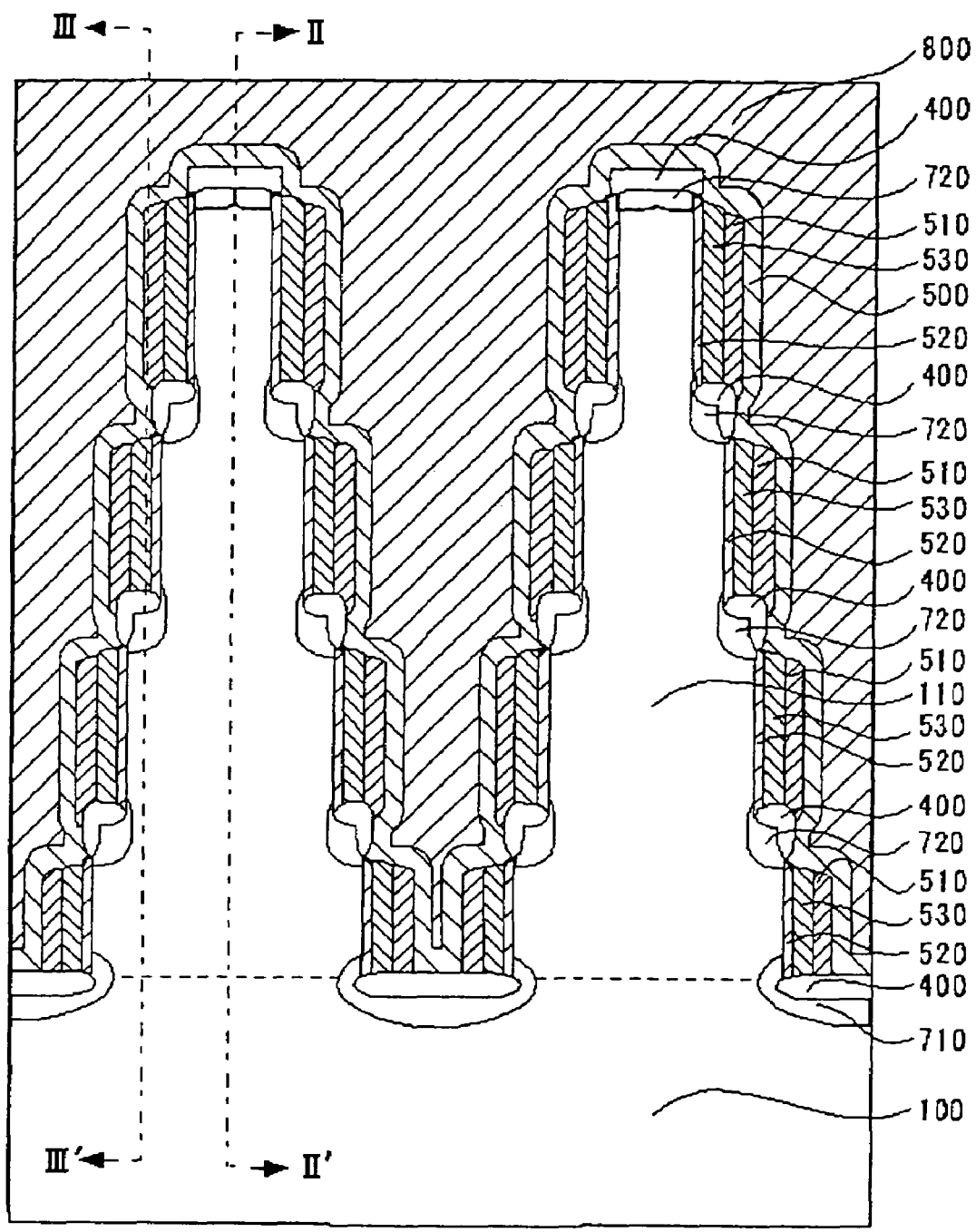
Figure 51:
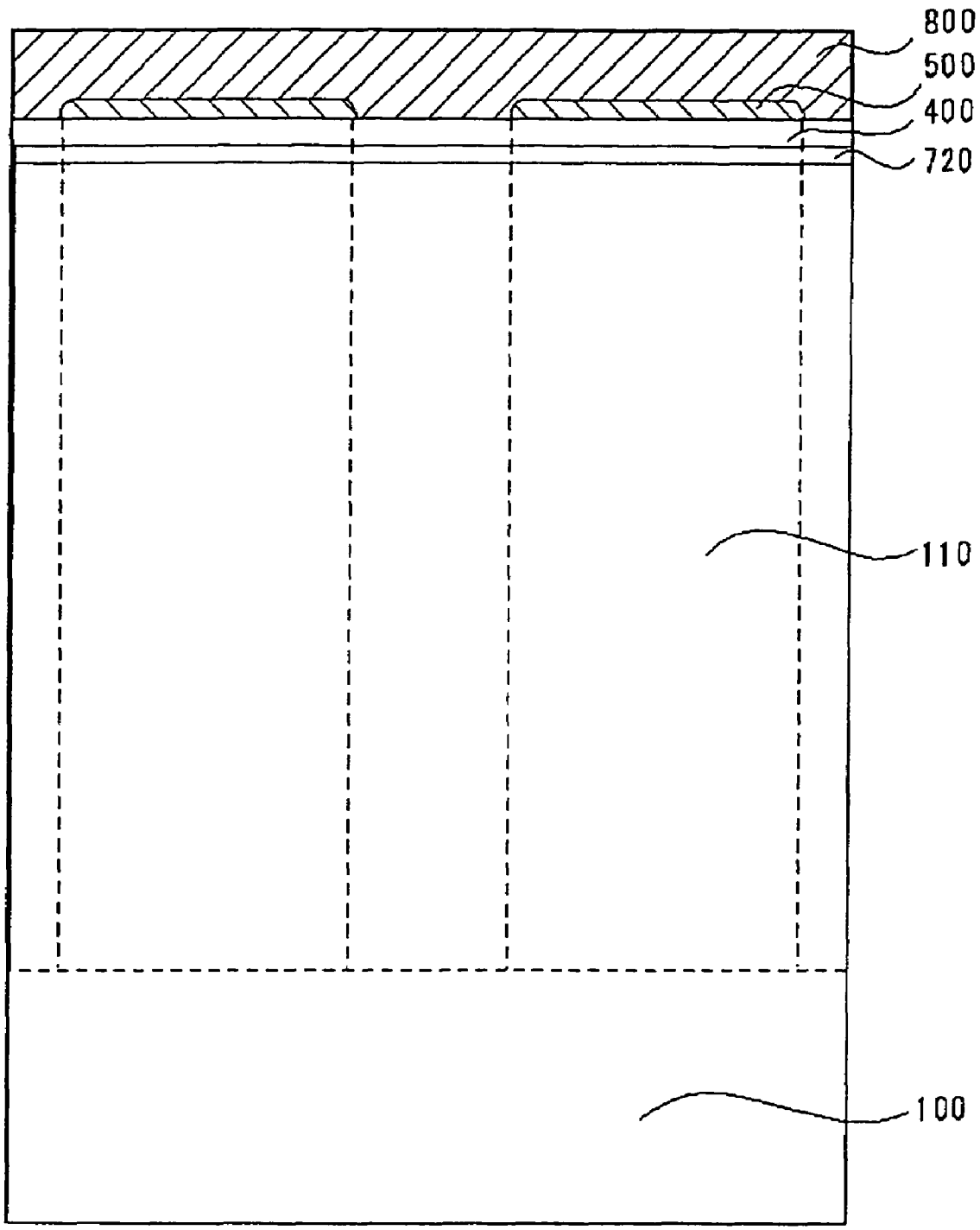
Figure 64:
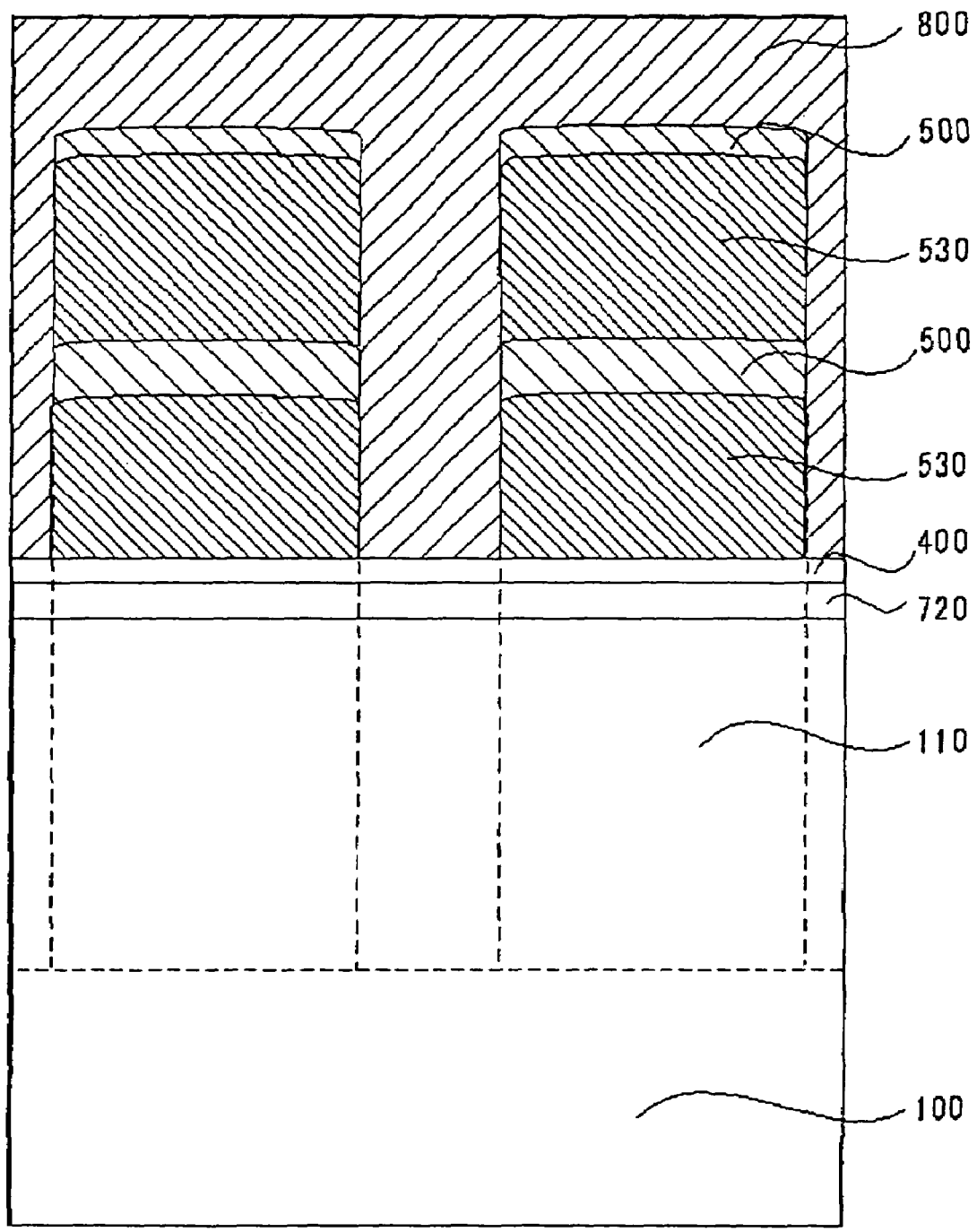

FIGS. 38, 51 and 64 show a semiconductor memory device according to the seventeenth embodiment and, in this case, the film thickness of the charge storage layer formed of silicon oxide film 520/silicon nitride film 530/silicon oxide film 510 becomes greater than the widths of the respective steps of a protruding semiconductor layer 110. The film thickness of the charge storage layer is not limited as long as it is possible for the charge storage layer to maintain or change the charge conditions in response to the condition. In addition, the respective film thicknesses of the silicon oxide film 520, the silicon nitride film 530, the silicon oxide film 510, and the control gate 500 of the respective steps may be the same or may differ from each other as long as the memory cell has desired functions.

Figure 39:
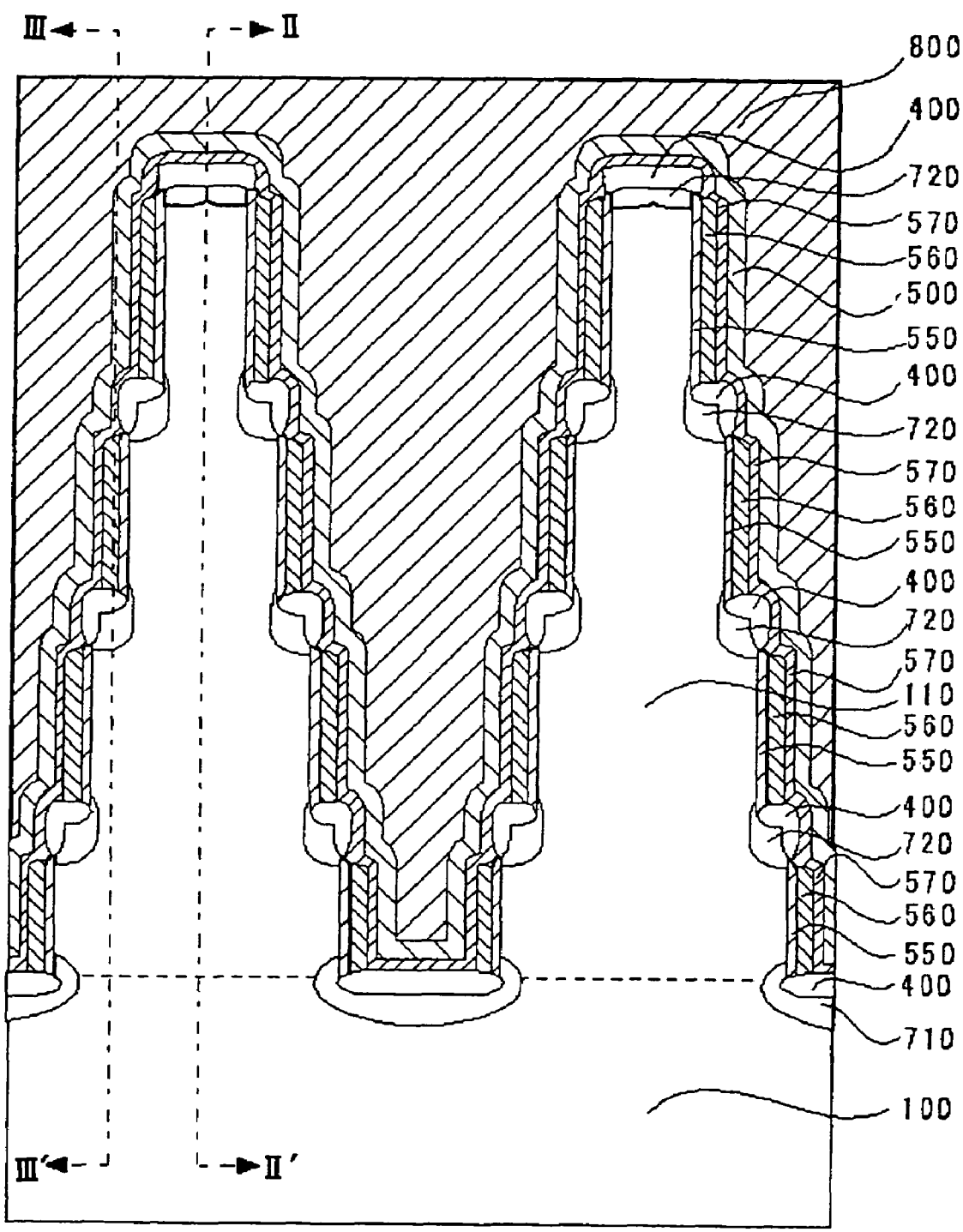
Figure 52:
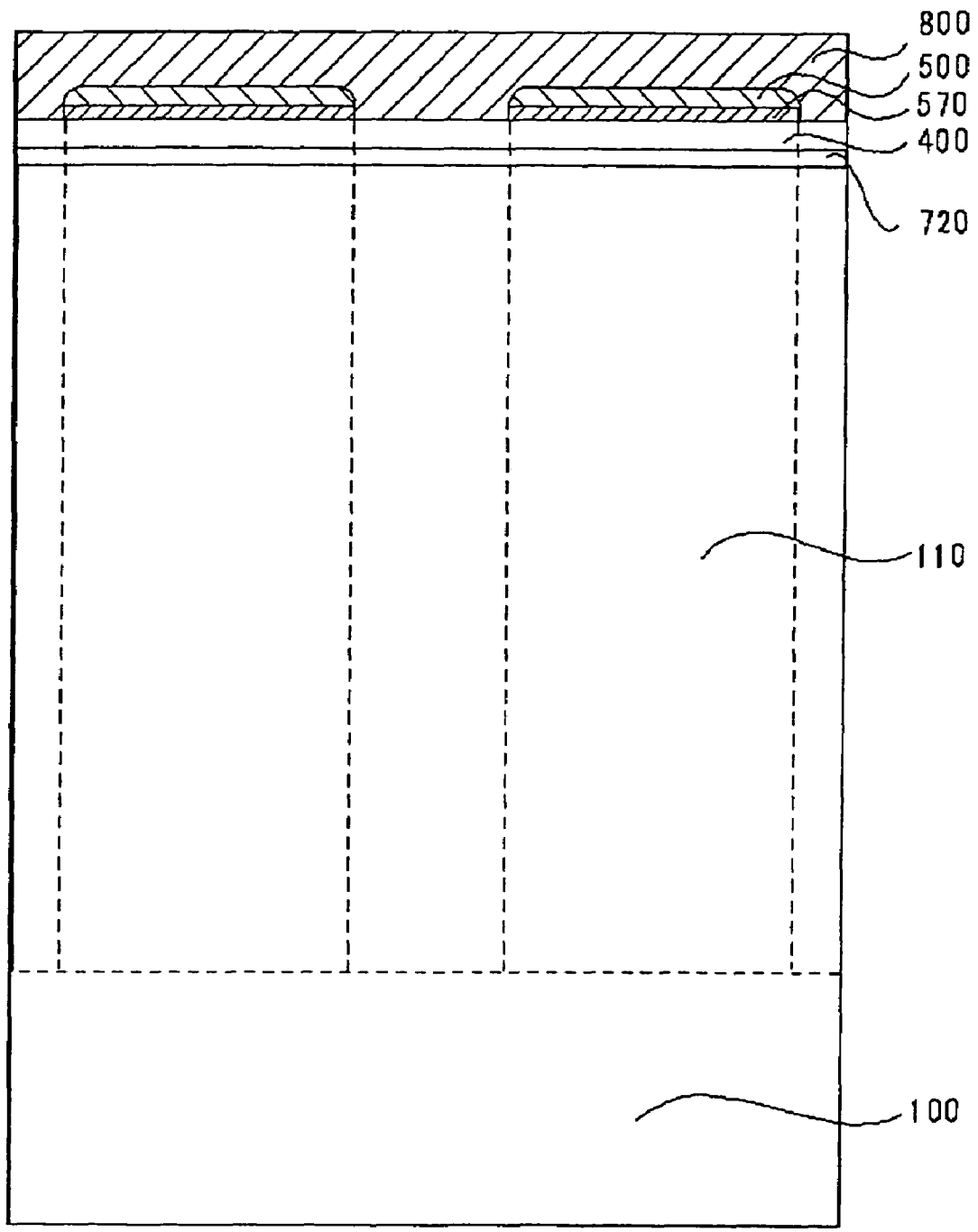
Figure 65:
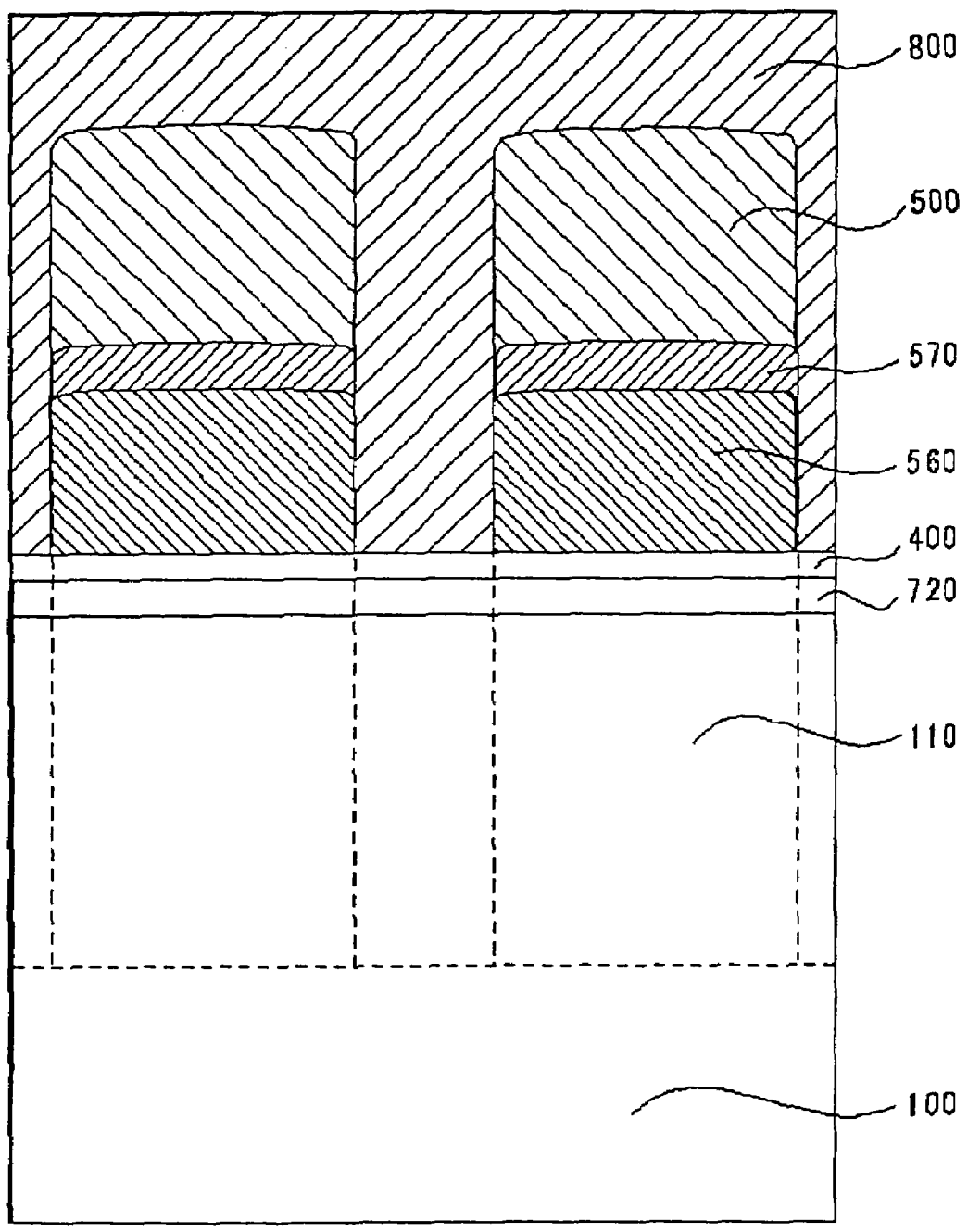

FIGS. 39, 52 and 65 show a semiconductor memory device according to the eighteenth embodiment and, in this case, floating gates are provided as the charge storage layer. That is, polycrystal silicon films 560 which are floating gates are placed on the surfaces of active regions of a protruding semiconductor layer 110 via tunnel oxide films 550 and, furthermore, the control gate 500 is placed on at least portions of such polycrystal films 560 via an interlayer insulating film 570, which is for example an ONO film. In this structure, polycrystal silicon has been divided into a plurality of, for example, at least two or more, regions so as to be floating gates and, thereby, multiple values of a memory cell becomes possible. Here, multiple values of a memory cell may be implemented by providing three or more types of threshold values.

Figure 40:
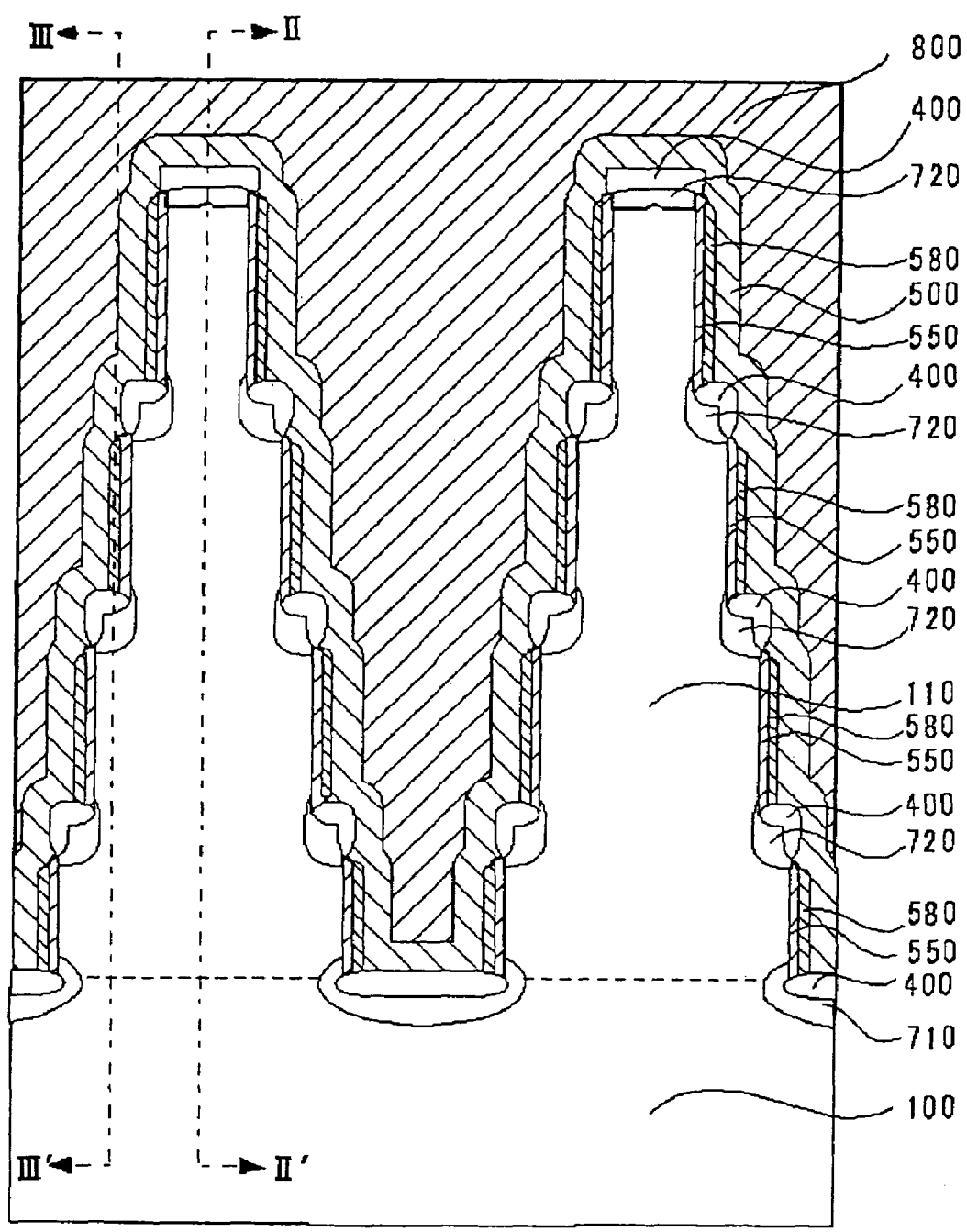
Figure 53:
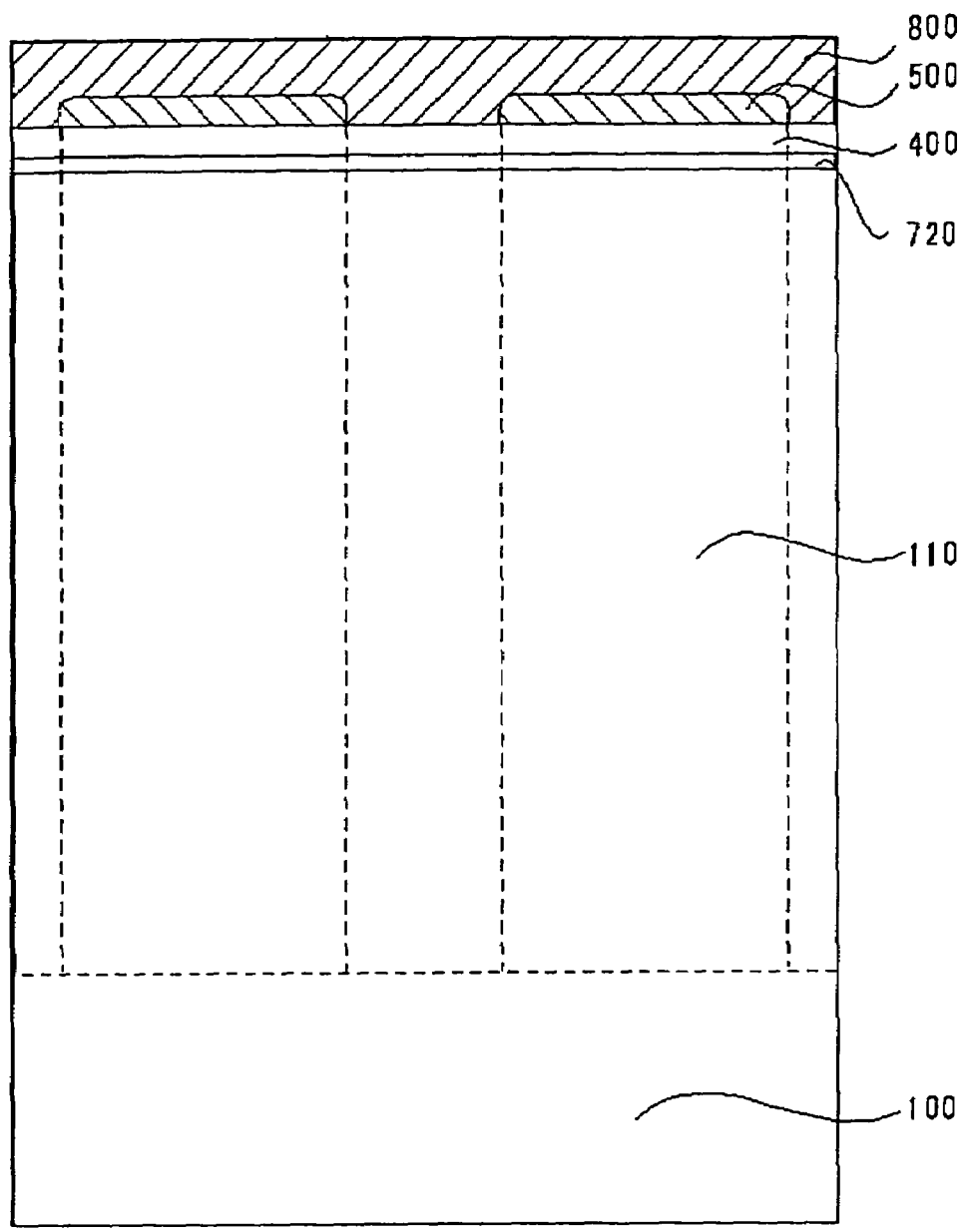
Figure 66:
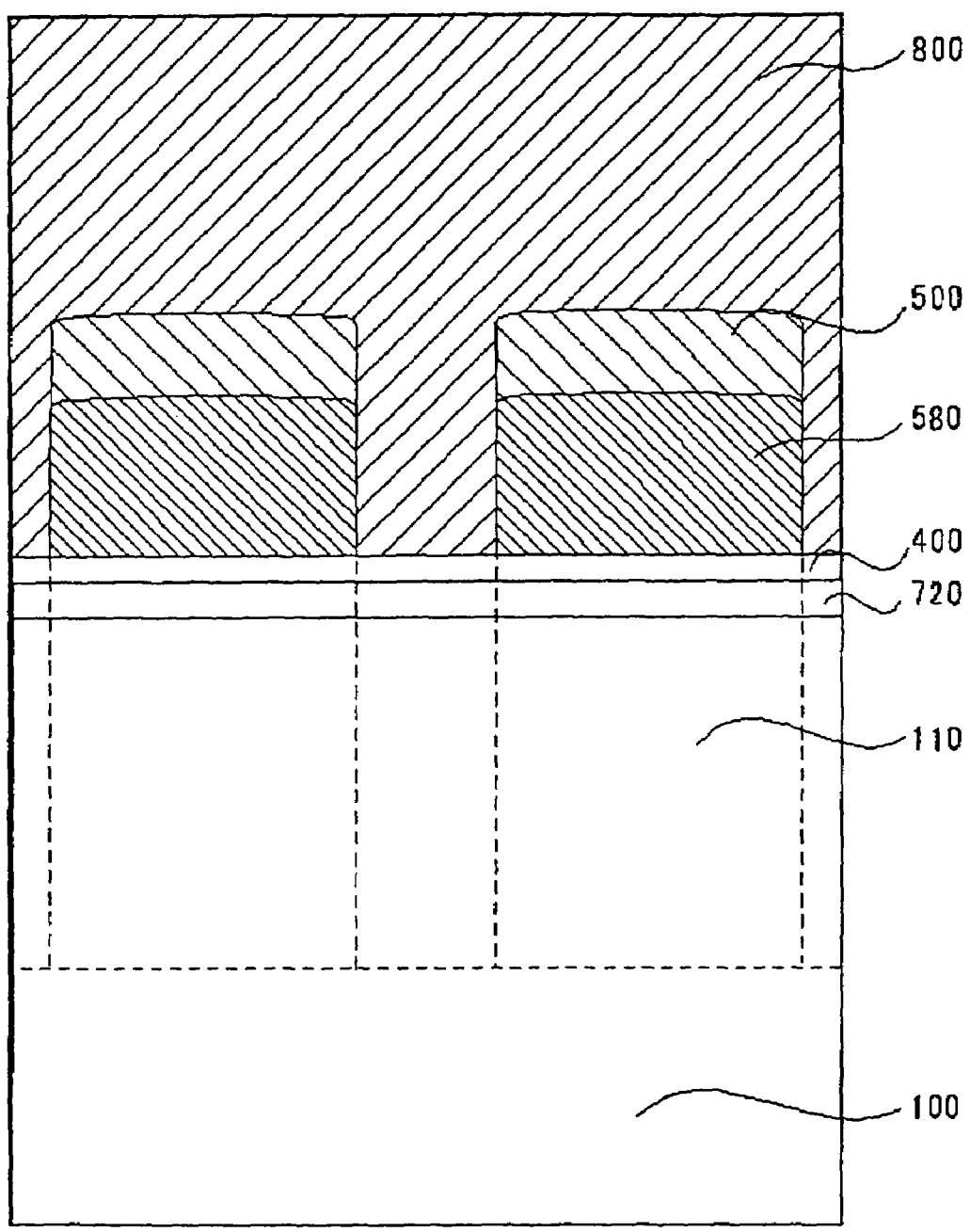

FIGS. 40, 53 and 66 show a semiconductor memory device according to the nineteenth embodiment and, in this case, at least one or more insulating films 580 that include nanocrystal silicon are provided as charge storage layers and then the control gate 500 is placed. In the structure where insulating films 580 that include nanocrystal silicon are used as the charge storage layers, though the distributions of the nanocrystal silicon in the insulating films are not limited as long as desired functions of the memory cells can be obtained, approximately uniform distributions in the insulating films are desirable.

Figure 41:
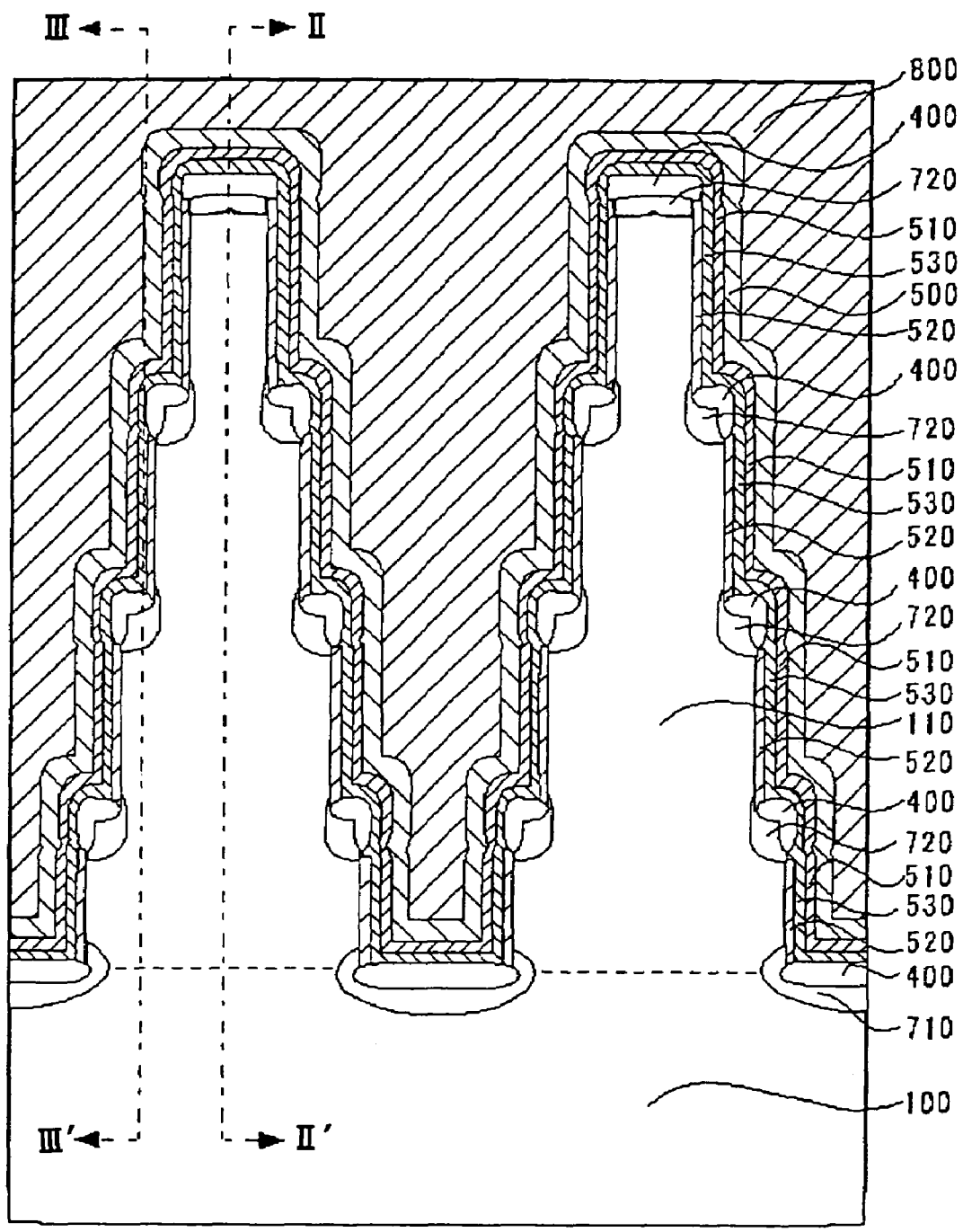
Figure 54:
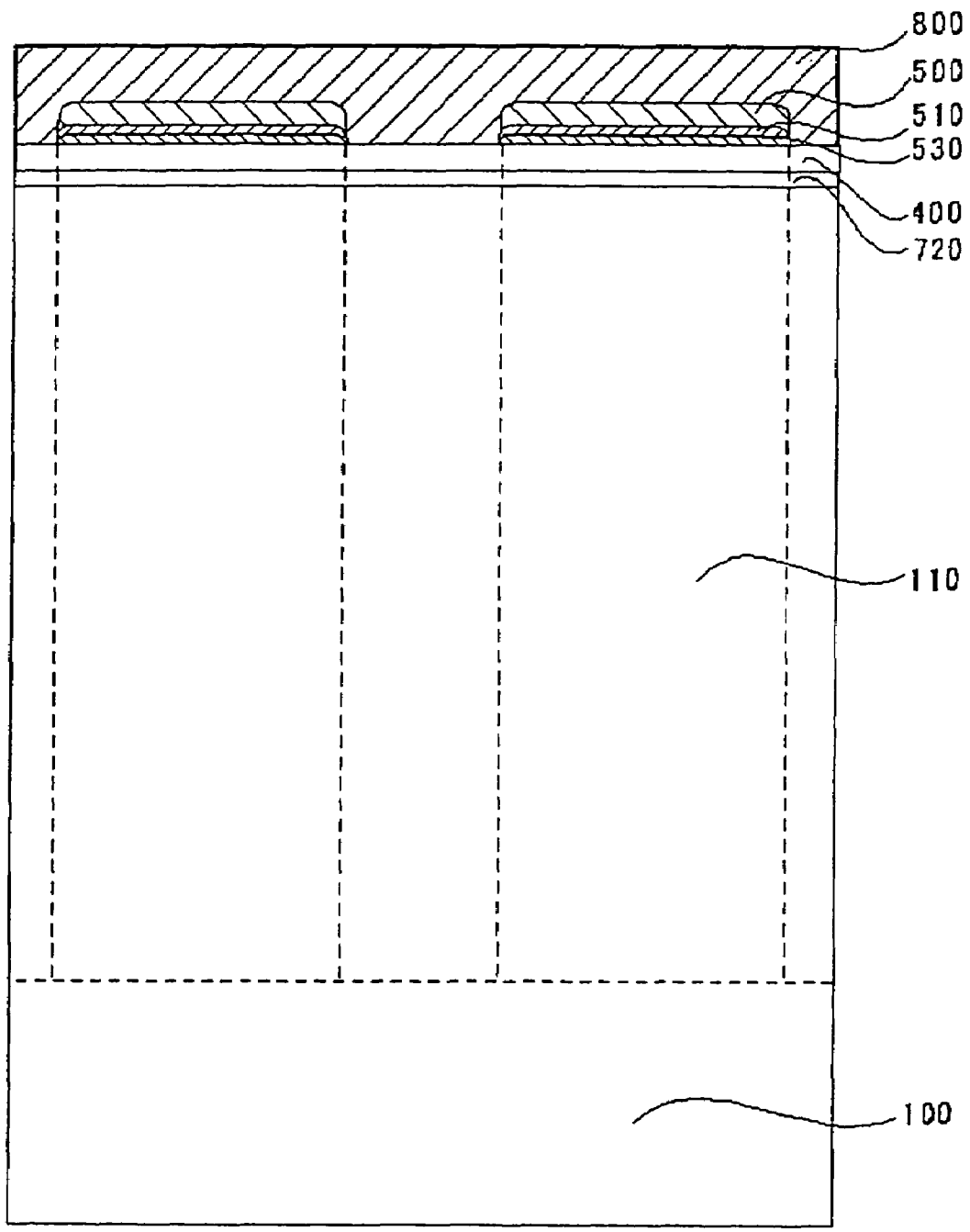
Figure 67:
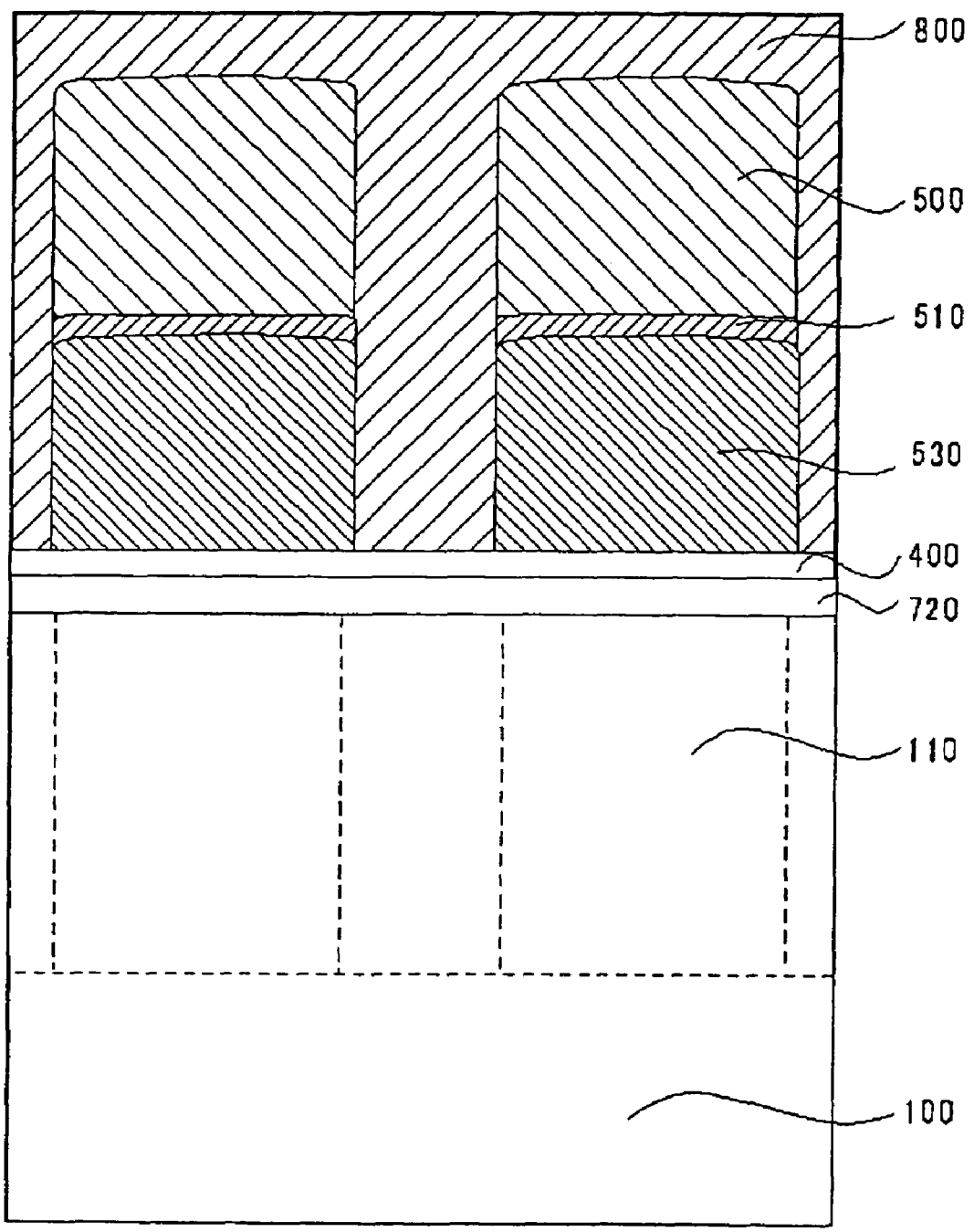

FIGS. 41, 54 and 67 show a semiconductor memory device according to the twentieth embodiment and, in this case, a silicon nitride film 530 and a silicon oxide film 510 are formed on the silicon oxide films 400, which are element isolation films, parallel to the word line direction, for example, parallel to the direction perpendicular to the direction in which the protruding semiconductor layers 110 extend.

Figure 42:
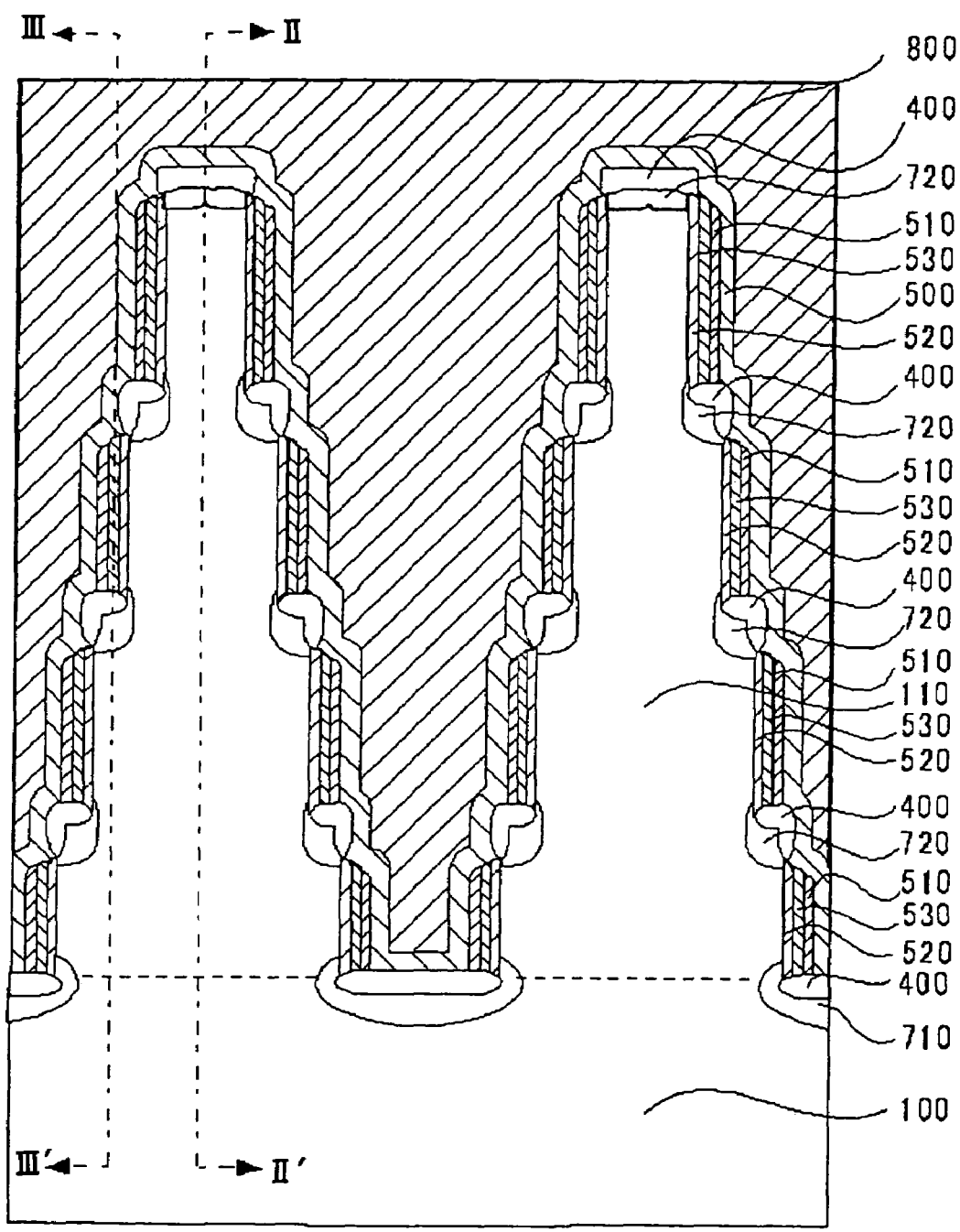
Figure 55:
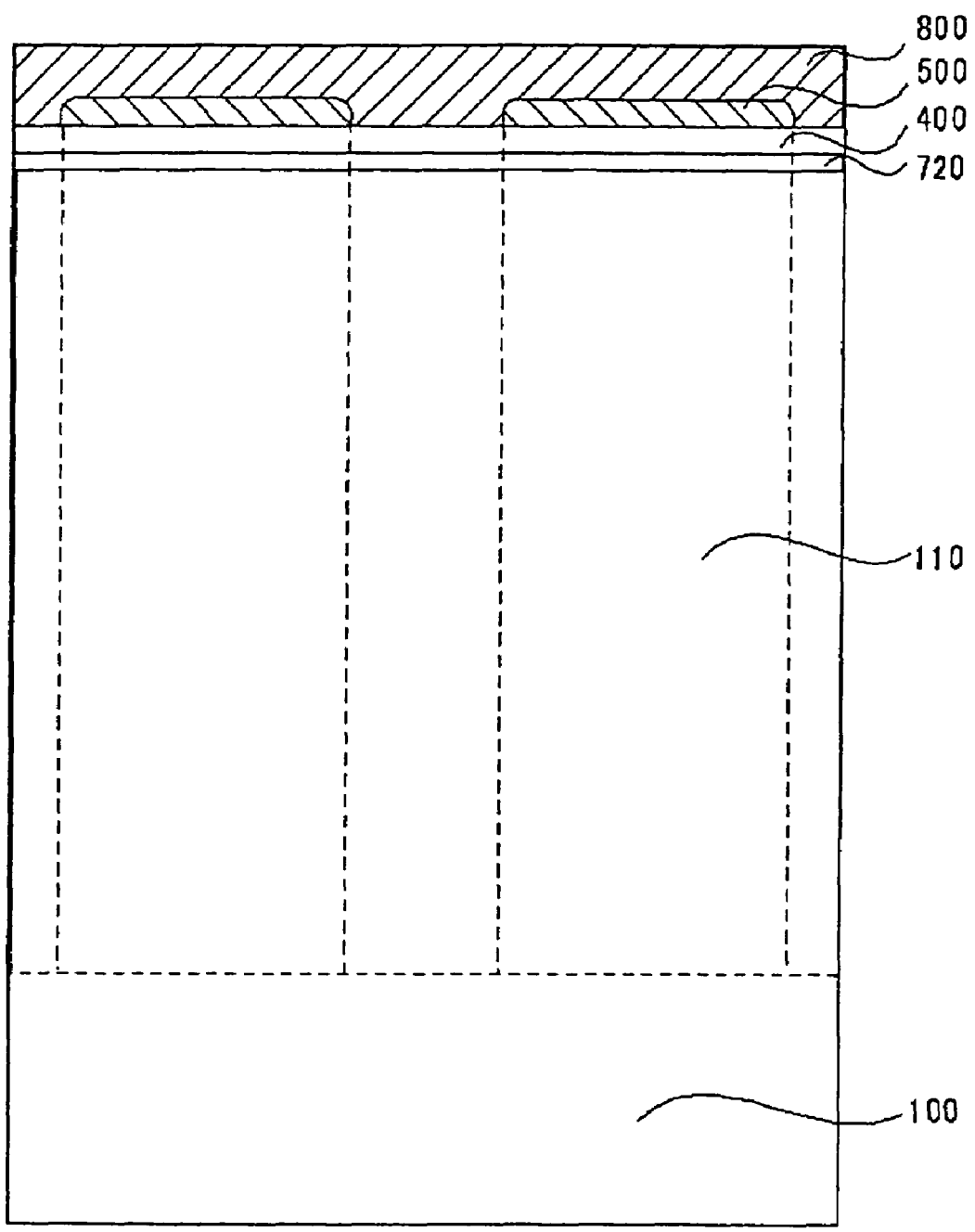
Figure 68:
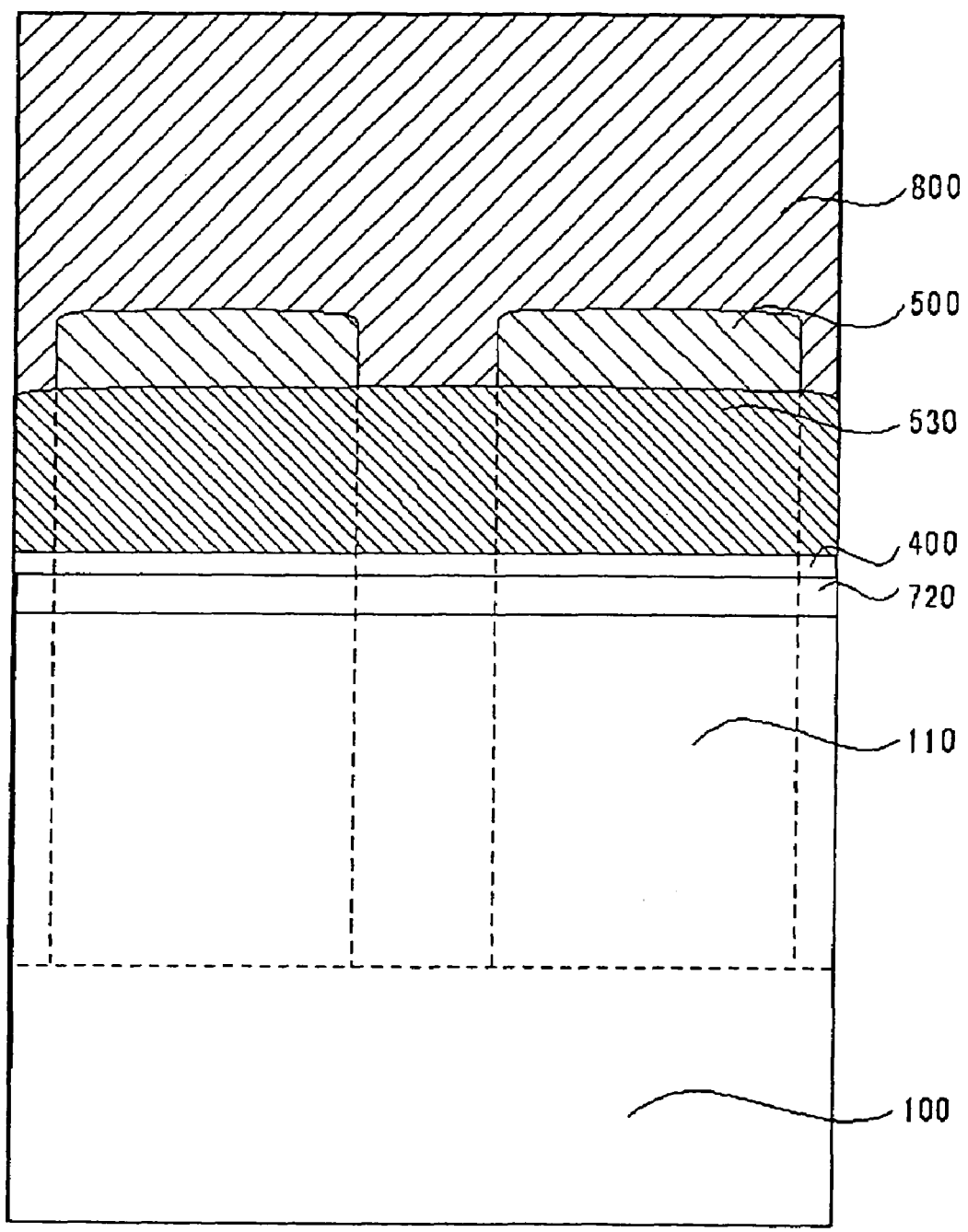

FIGS. 42, 55 and 68 show a semiconductor memory device according to the twenty-first embodiment and, in this case, the silicon nitride films 530 and the silicon oxide films 510 are formed parallel to the direction (bit line direction) in which the impurity diffusion layers 710, 720 and the protruding semiconductor layers 110 extend.

Figure 43:
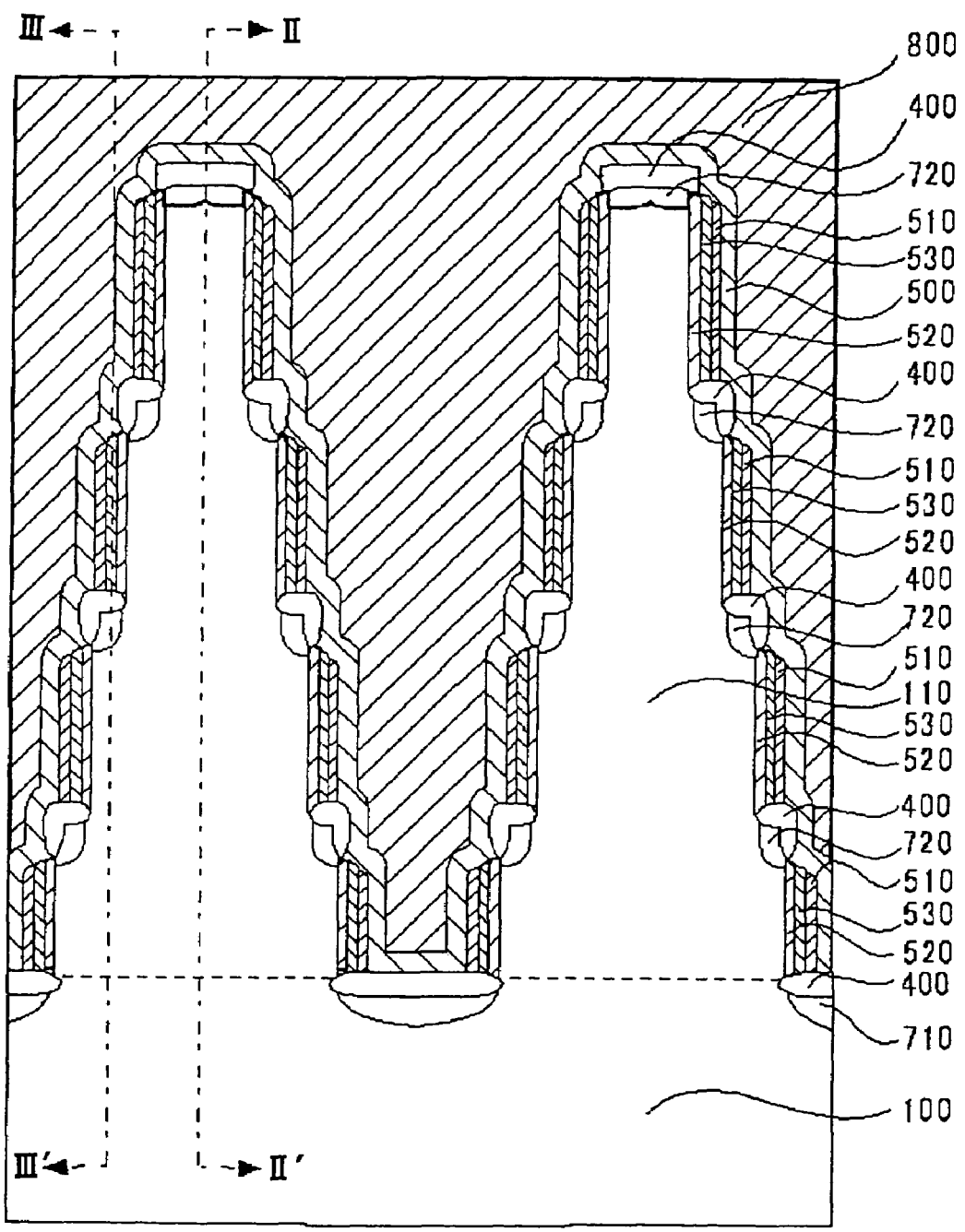
Figure 56:
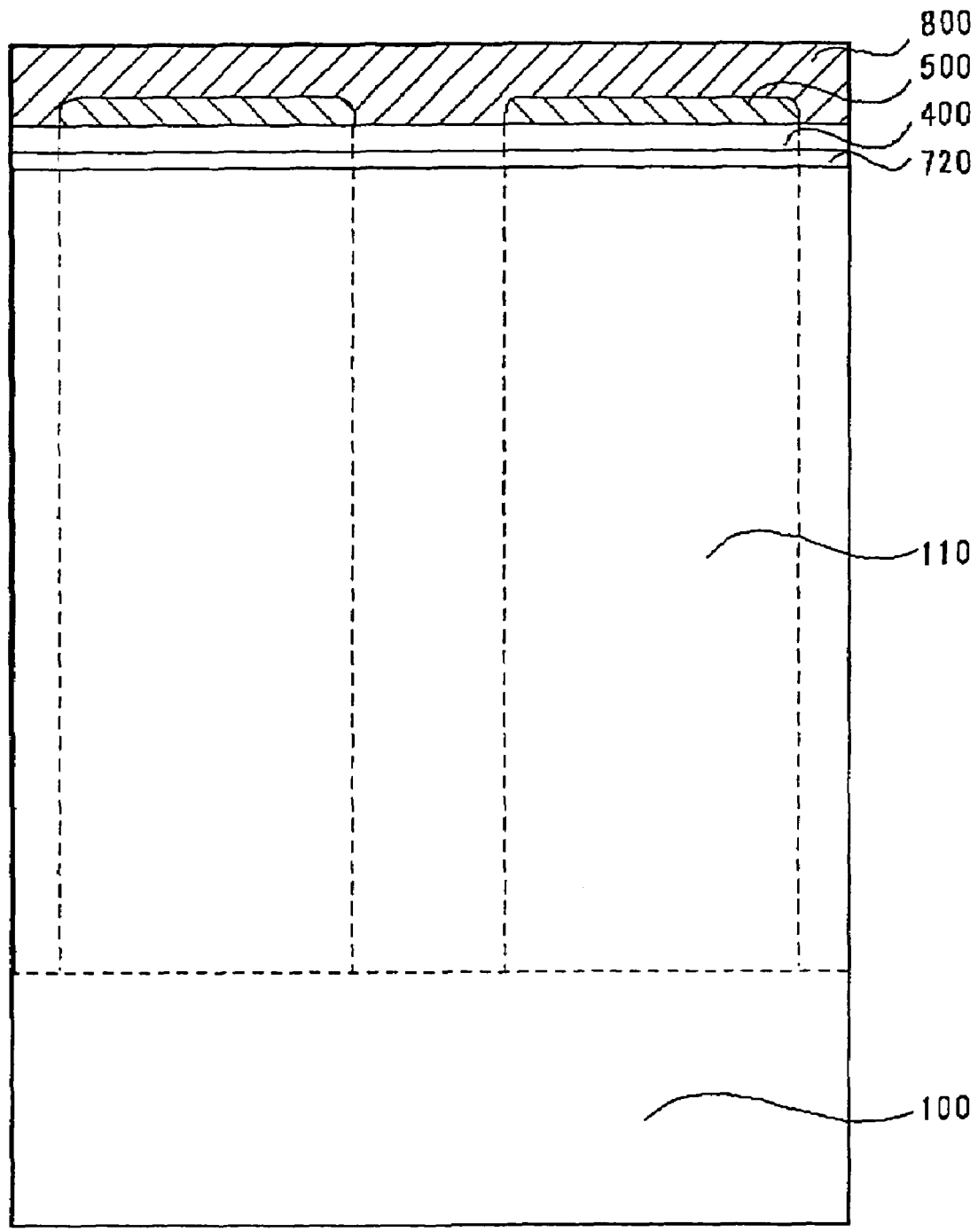
Figure 69:
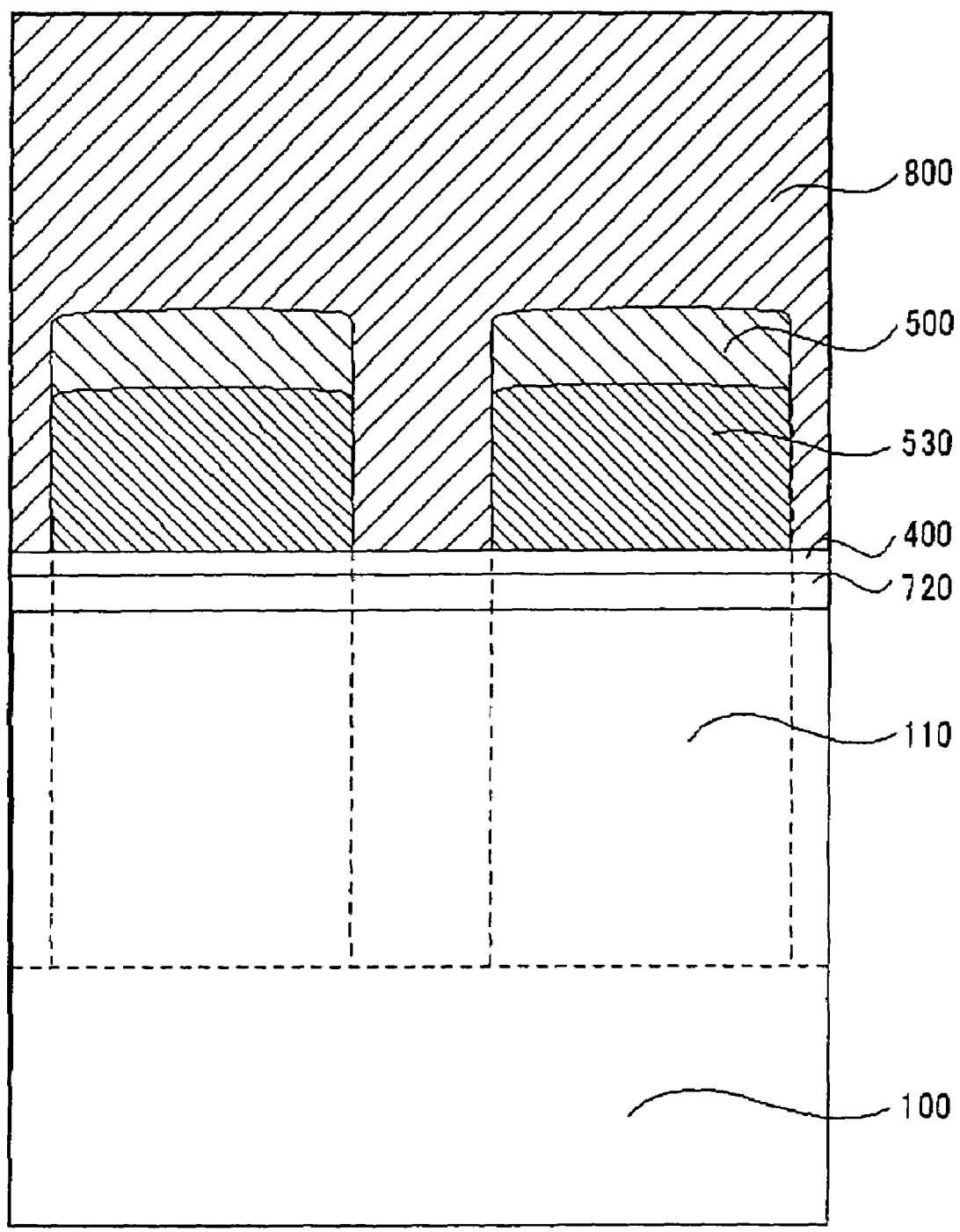

FIGS. 43, 56 and 69 show a semiconductor memory device according to the twenty-second embodiment and, in this case, the impurity diffusion layers 720 formed in the protruding semiconductor layers 110 and the impurity diffusion layers 710 formed in the silicon substrate 100 have offset structures relative to the charge storage layers.

In addition, in a semiconductor memory device according to the present invention, the crystal plane direction such as the (100) plane is used for at least one active region surface of a protruding semiconductor layer wherein charge storage layers are formed and, thereby, the mobility of electrons is great and the interface state density is small in comparison with the case where another plane direction is used so that the drive power can be increased and a high speed operation can be implemented.

Figure 70:
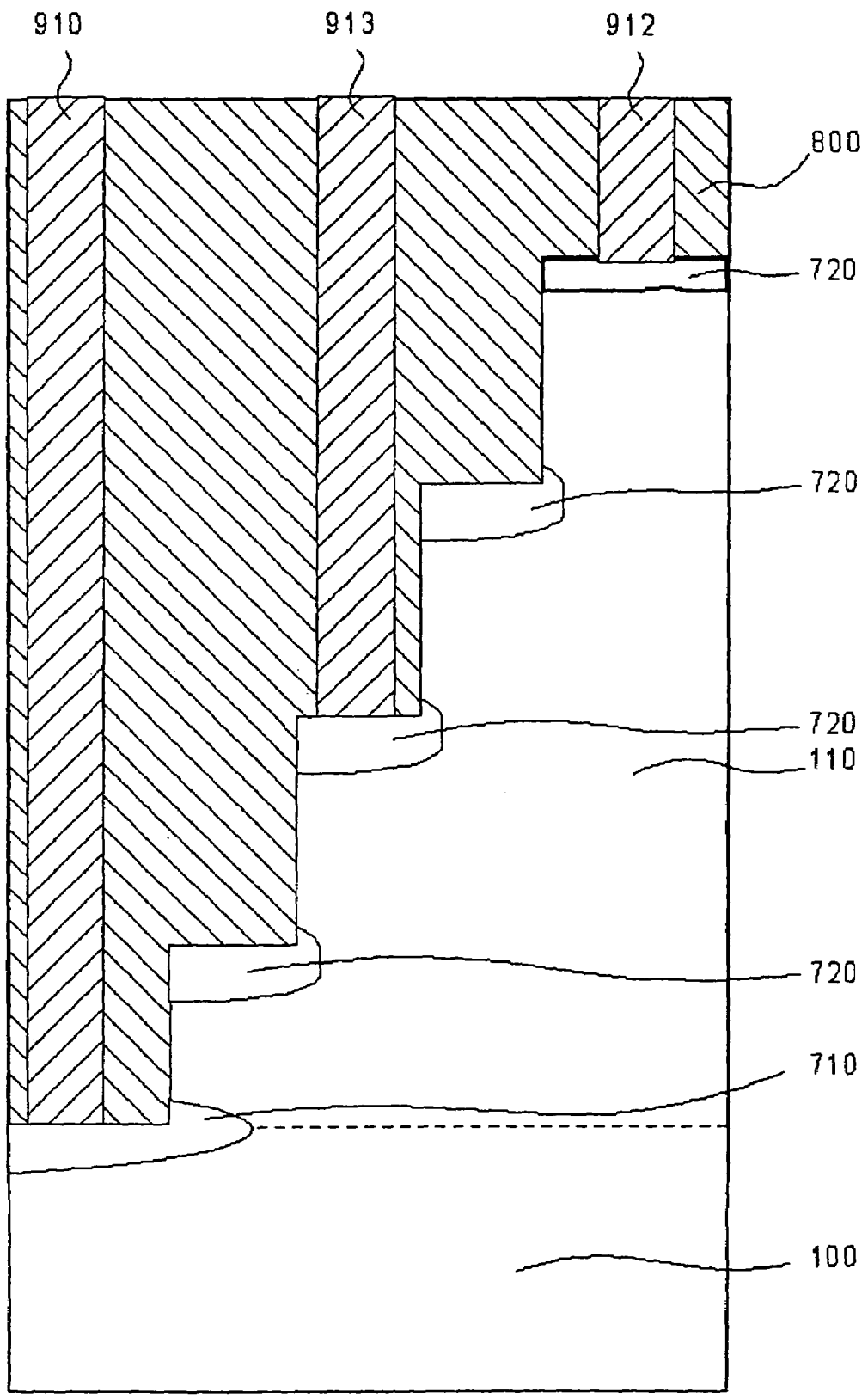
FIGS. 70 to 73 are cross sectional views through section II-II' of FIG. 29 showing first to fourth contact structures of the semiconductor memory device.
Figure 71:
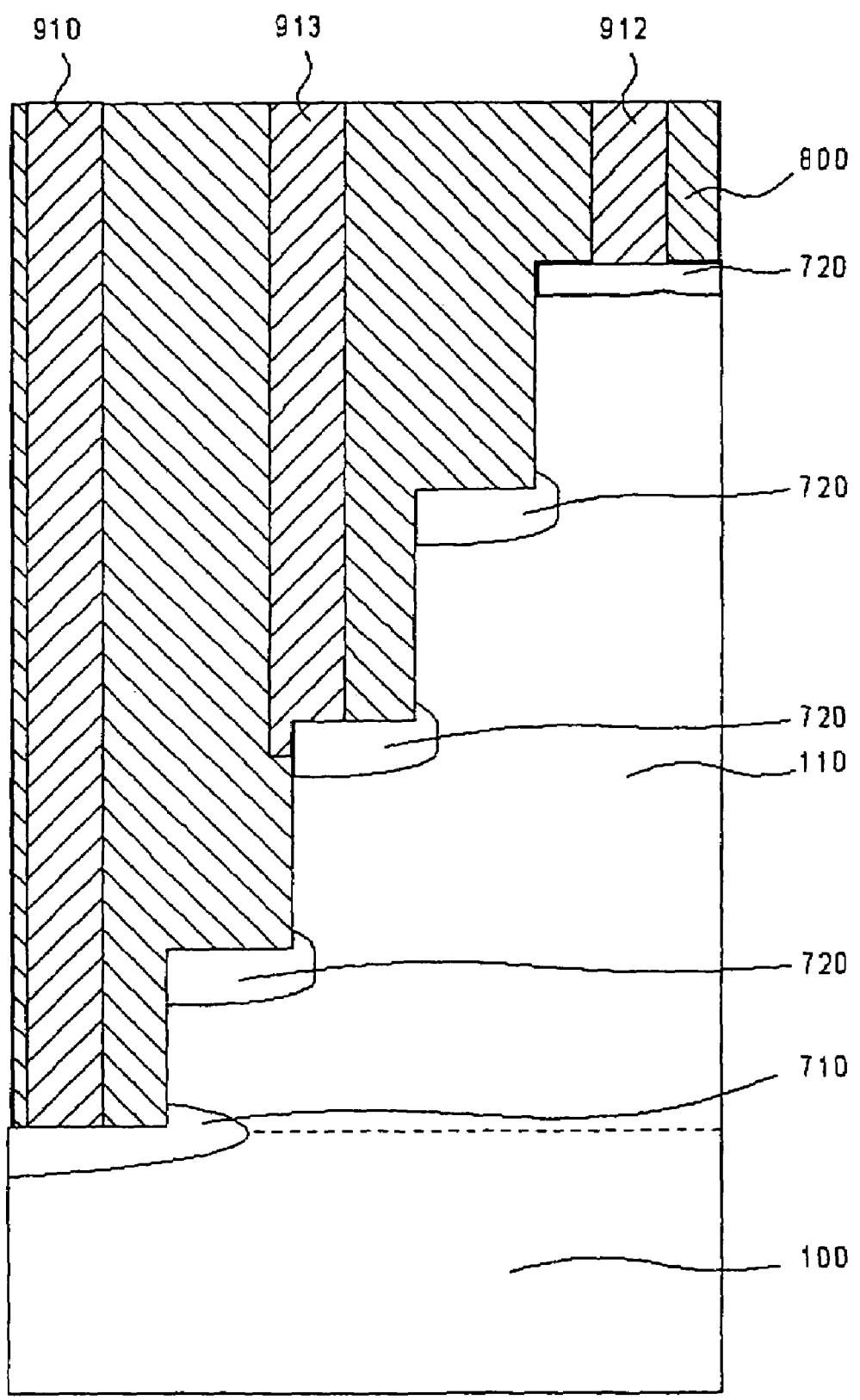
Figure 72:
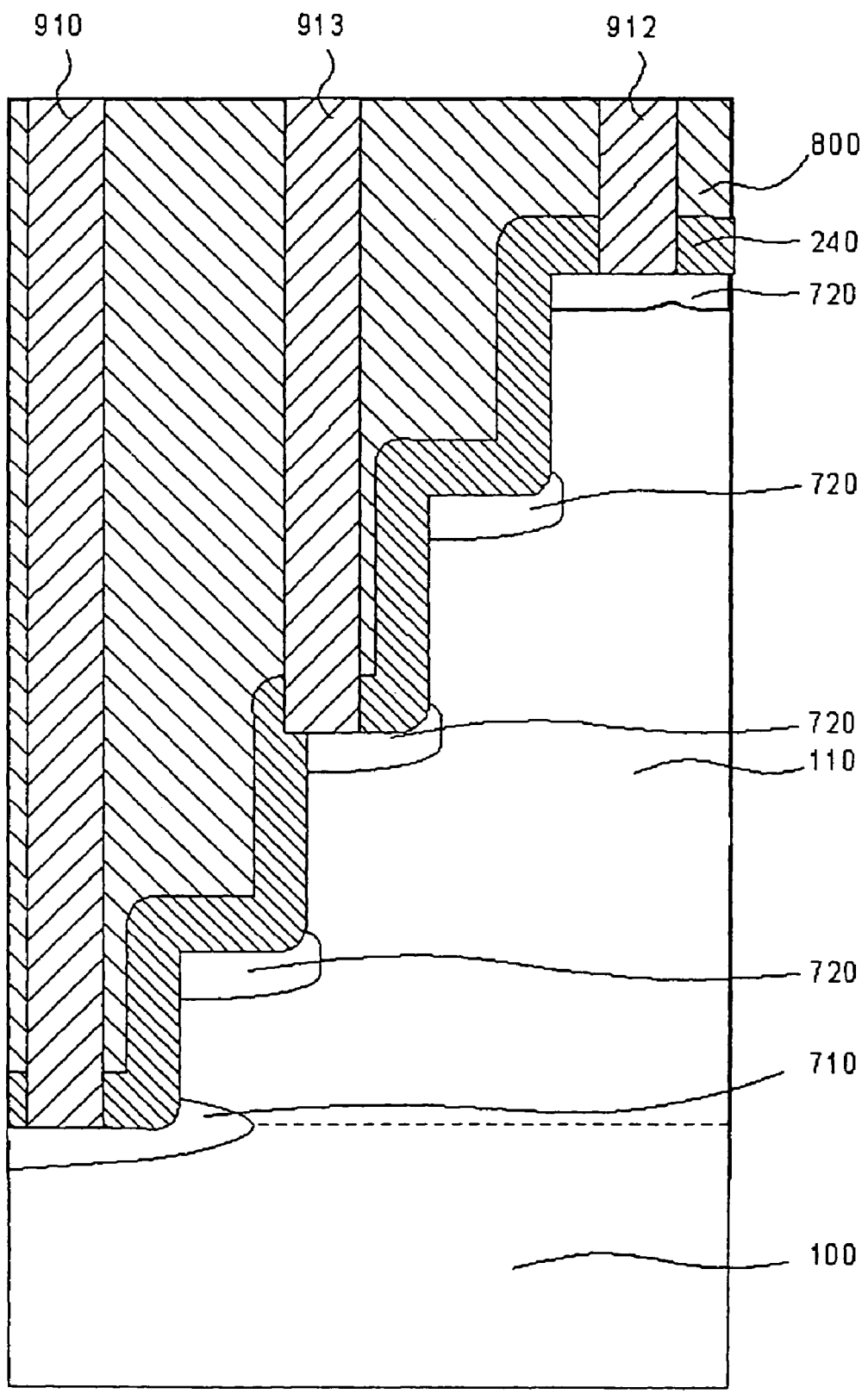

The memory array of FIG. 29 has contacts to the impurity diffusion layers 720 and 710 that become bit lines as shown in FIGS. 70 to 73 which are cross sectional views of the memory array along II-II' of FIG. 29. That is to say, as shown in FIG. 70, contacts 910, 912 and 913 may be connected to plane portions of the steps of a protruding semiconductor layer 110 or, as shown in FIG. 71, portions of those contacts may be formed at the corners of the steps. In addition, as shown in FIG. 72, an insulating film 240 is placed on the surface that includes the steps of a protruding semiconductor layer 110 so as to prevent the contacts from being short circuited to a region or an electrode other than the predetermined impurity diffusion layers. Though the material of the insulating film 240 is not limited as long as it is a material different from that of an interlayer insulating film 800, the material having a large selective ratio relative to the interlayer insulating film 800 is preferable because the insulating film 240 is used as an etching stopper. A silicon oxide film is used for the interlayer insulating film 800 and a silicon nitride film is used for the insulating film 240, for example, so that the etching conditions are adjusted and, thereby, the selective ratio of the interlayer insulating film 800 to the silicon nitride film can be set at a desired value at the time of the formation of the contacts.

Figure 73:
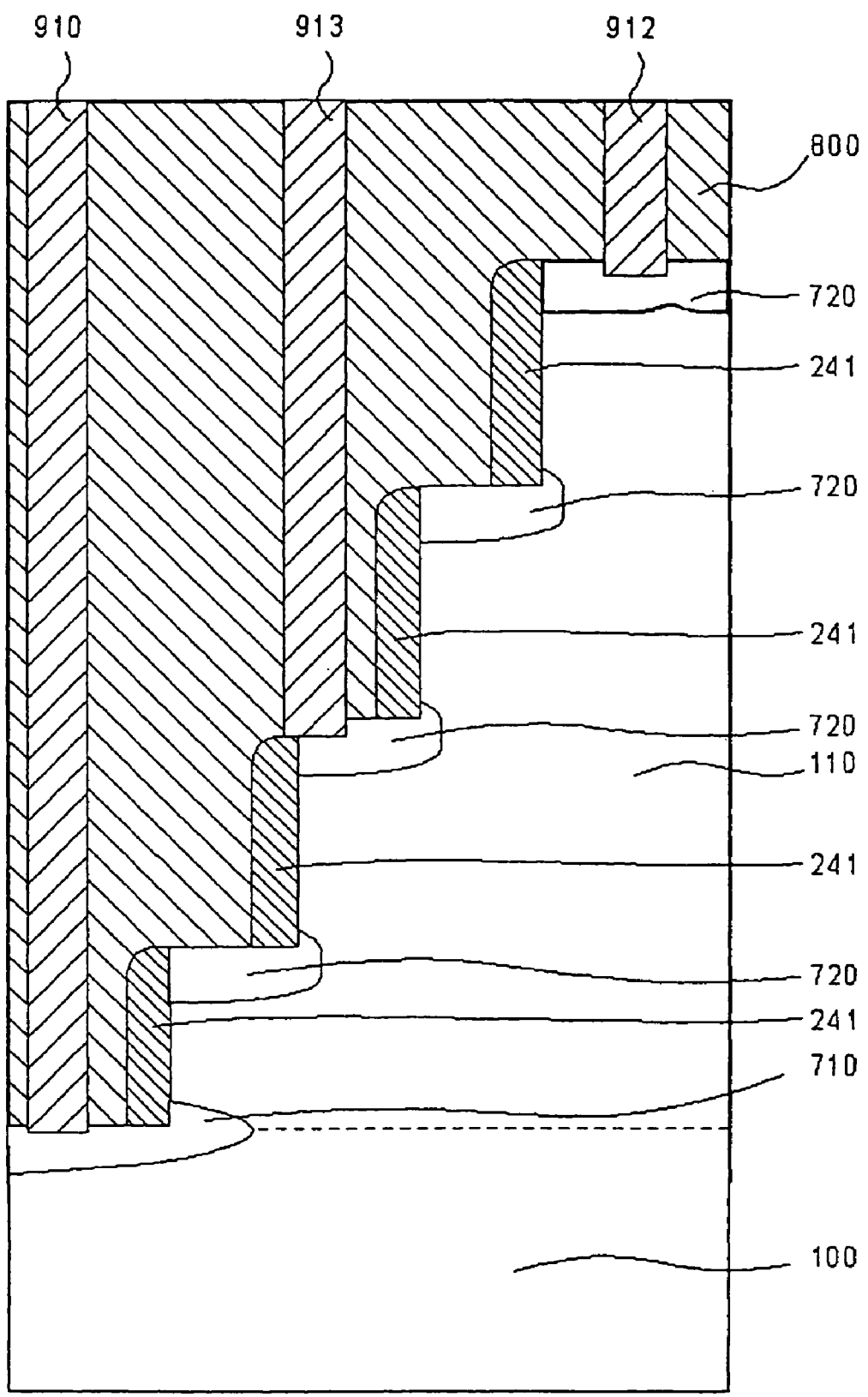

FIG. 73 shows an example of a case where side wall spacers are formed of insulating films 241 on the sides of a protruding semiconductor layer having a step structure. It is appropriate for the insulating films 241 to be made of a material different from that of the interlayer insulating film 800 because they are used as the stopper at the time of the formation of the contacts and a material having a large selective ratio relative to the interlayer insulating film 800 is preferable.

In the memory array of FIG. 29, the control gates 500 of the memory cells aligned in parallel are connected parallel to the direction in which the memory cells are connected in series so as to form word lines (WL(n), WL(n+1), . . . ) (n is an integer) as shown in FIGS. 74 and 75. In addition, impurities diffusion layers of the memory cells aligned in parallel are connected in the direction perpendicular to the direction in which memory cells are connected in series so as to form bit lines (BL(n), BL(n+1), . . . ). It is desirable for at least one end of each bit line to have a selection transistor so that the bit lines are arranged so as to be connected to the memory cells aligned in parallel in the configuration.

Such a semiconductor memory device has a memory function depending on the conditions of charges stored in charge storage layers. In the following, the theory of the memory cell operation will be described.

First, an example of read out of a semiconductor memory device having a charge storage layer made up of an ONO film and having memory cells with control gates as the first electrodes will be described.

Figure 76:
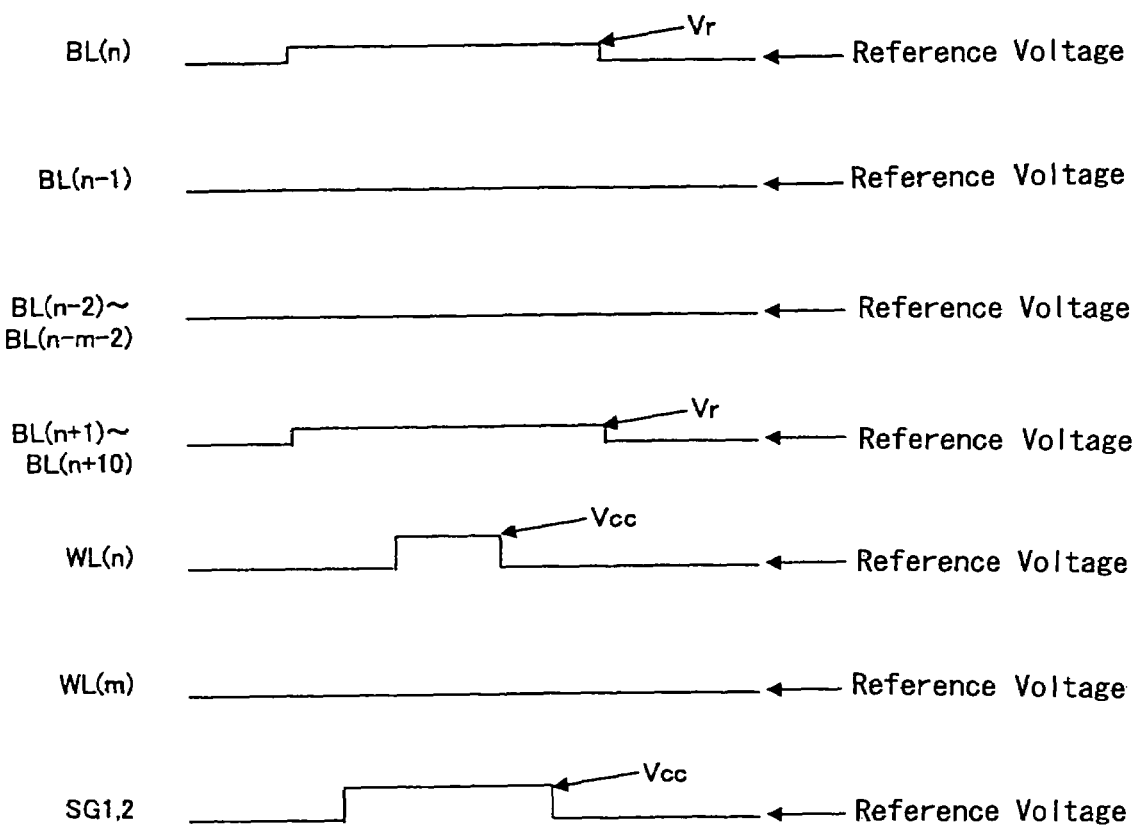
FIG. 76 is a timing chart showing a reading operation of the memory array shown in FIG. 74.

In the case wherein protruding semiconductor layers are formed of p-type semiconductor, as shown in the timing chart of FIG. 76, a read out voltage Vr, for example, 1.5 V, is applied to BL(n) and a reference voltage, for example, 0 V, is applied to BL(n−1) in order to read out the selected bit SB shown in FIG. 74. BL(n−2) to BL(n−m−2) are maintained at the same potential as BL(n−1) while BL(n+1) to BL(n+10) are maintained at the same potential as BL(n). Vcc, for example, 3 V is applied to word line WL(n) of the selected bit while the reference voltage is applied to word line WL(m) of a non-selected bit and Vcc is applied to SG1 and SG2. As result of this, it becomes possible to determine "0" or "1" of the selected bit depending on the existence of a current.

Here, determination of "0" or "1" (write in of data) is possible according to the above described read out method (below described read out and write in methods) for the read out (below described read out and write in) of a bit different from the selected bit. In addition, the above described read out (below described read out, write in and erasure) is possible in the case of memory cells formed of polycrystal silicon, nanocrystal silicon and the like in addition to the memory cells where the charge storage layers are formed of ONO films.

Next, an example of write in by means of hot electron injection will be described.

Figure 77:
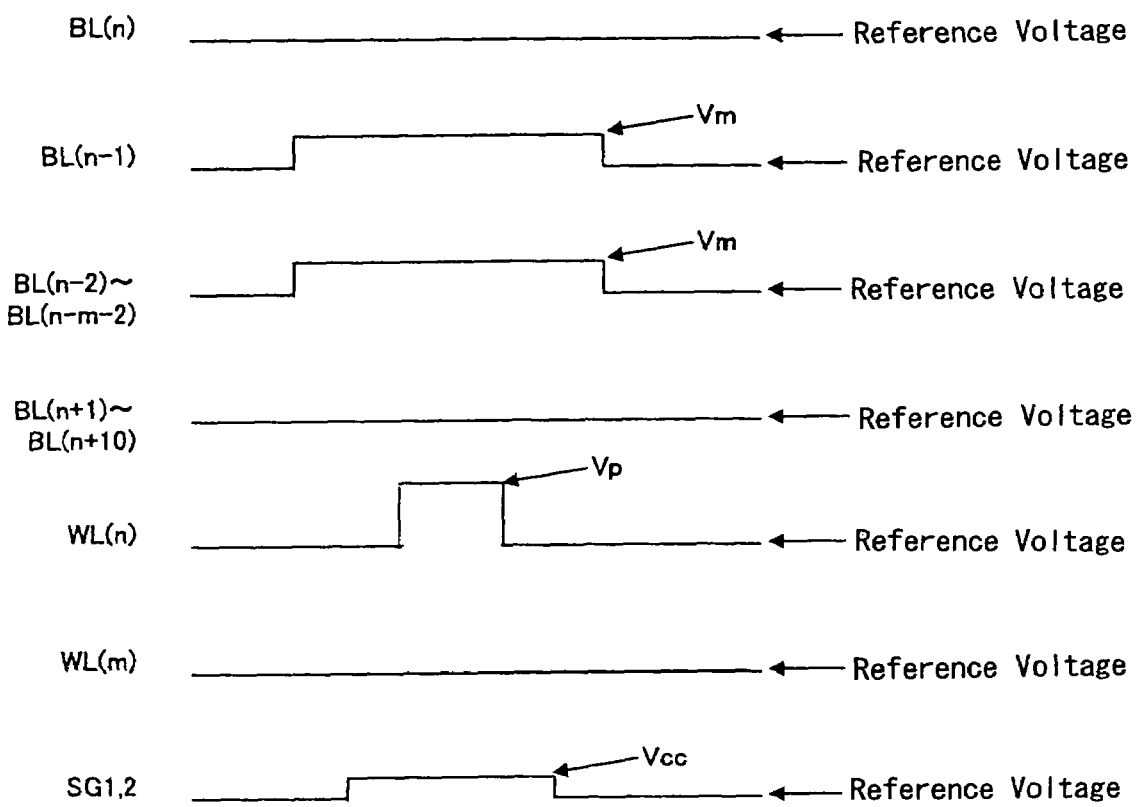
FIG. 77 is a timing chart showing a writing operation of the memory array shown in FIG. 74.

In the case where protruding semiconductor layers are formed of p-type semiconductor, for example, as shown in the timing chart of FIG. 77, the reference voltage, for example, 0 V is applied to BL(n) and middle voltage Vm, for example, 4.5 V is applied to BL(n−1) in order to carry out write in on the selected bit, for example, shown in FIG. 74. BL(n−2) to BL(n−m−2) are maintained at the same potential as BL(n−1) while BL(n+1) to BL(n+10) are maintained at the same potential as BL(n). High voltage Vp, for example, 9 V is applied to WL(n) which is the word line of the selected bit and the reference voltage is applied to WL(m) which is a word line of a non-selected bit and Vcc, for example, 3 V is applied to SG1 and SG2. As a result of this, write in of data becomes possible.

Here, means for changing the conditions of a charge in a charge storage layer is not limited to the hot electron injection as long as it is possible to change the conditions of the charge in the charge storage layer and for example, Fowler-Nordheim tunneling current (hereinafter referred to as F-N tunnel current), direct tunnel current, Poole-Frenkel current and the like may be used. Furthermore, the above described write in is not limited to the injection of electrons into a charge storage layer but rather, may be carried out by releasing electrons from the charge storage layer or by injecting holes into the charge storage layer and in such a case, it becomes possible to use, for example, hot hole injection, F-N tunnel current, direct tunnel current, Poole-Frenkel current and the like. The above description can be applied in the same manner to the below described write in method.

Furthermore, an example of erasure by means of hot hole injection will be described below.

Figure 78:
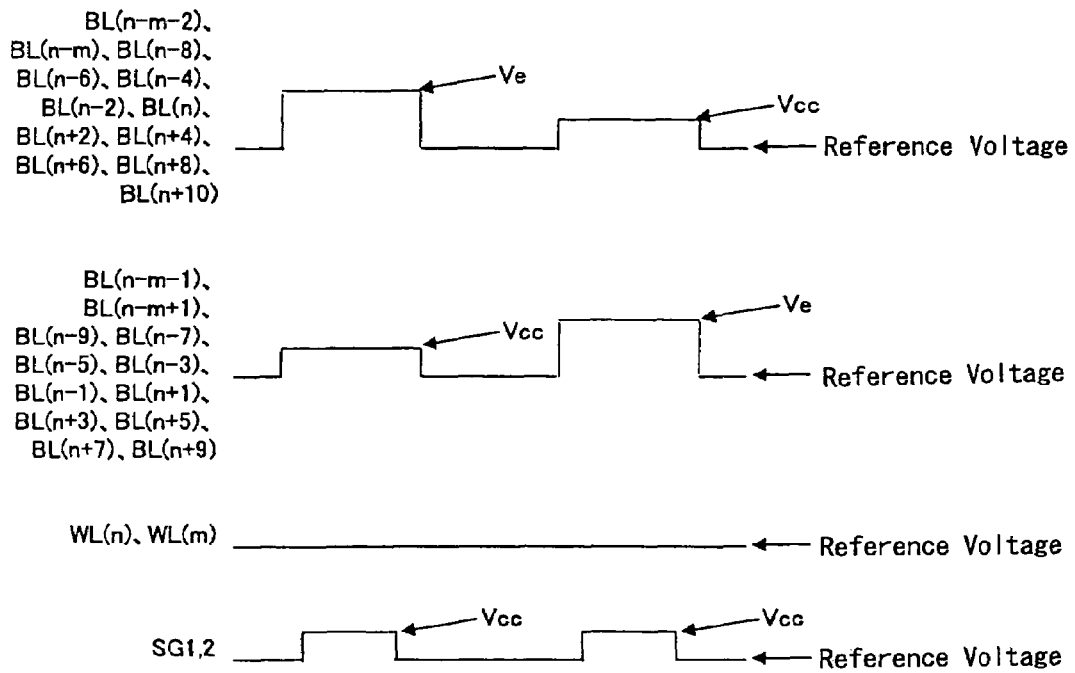
FIG. 78 is a timing chart showing an erasure operation of the memory array shown in FIG. 74.

In the case wherein protruding semiconductor layers are formed of, for example, p-type semiconductor, as shown in the timing chart of FIG. 78, a high voltage Ve, for example, 9 V is applied to BL(n−m−2), BL(n−m), BL(n−8), BL(n−6), BL(n−4), BL(n−2), BL(n), BL(n+2), BL(n+4), BL(n+6), BL(n+8) and BL(n+10), Vcc, for example, 3 V is applied to BL(n−m−1), BL(n−m+1), BL(n−9), BL(n−7), BL(n−5), BL(n−3), BL(n−1), BL(n+1), BL(n+3), BL(n+5), BL(n+7) and BL(n+9), and the reference voltage, for example, 0 V is applied to WL(n) and WL(m), and Vcc is applied to SG1 and SG2 in order to carry out the collective erasure of all the memory cells shown in FIG. 74.

Next, Vcc is applied to BL(n−m−2), BL(n−m), BL(n−8), BL(n−6), BL(n−4), BL(n−2), BL(n), BL(n+2), BL(n+4), BL(n+6), BL(n+8) and BL(n+10), high voltage Ve is applied to BL(n−m−1), BL(n−m+1), BL(n−9), BL(n−7), BL(n−5), BL(n−3), BL(n−1), BL(n+1), BL(n+3), BL(n+5), BL(n+7) and BL(n+9), the reference voltage is applied to WL(n) and WL(m), and Vcc is applied to SG1 and SG2. As a result of this, erasure of data becomes possible.

Here, F-N tunnel current may be used for the erasure by applying a high voltage to a word line and by maintaining a bit line at the reference potential or by maintaining the substrate at the reference potential so as to float the bit lines and in this manner the means for changing the conditions of a charge in the charge storage layer is not limited as long as it is possible. For example, direct tunnel current, Poole-Frenkel current and the like may be used. In addition, the above described erasure may be carried out by injecting electrons into the charge storage layer instead of releasing electrons from the charge storage layer or by injecting holes into the charge storage layer and in such cases the erasure becomes possible by using hot electron injection, F-N tunnel current, direct tunnel current, Poole-Frenkel current and the like. The above description can be applied in the same manner to the below described erasure.

In addition, an example of read out of a semiconductor memory device will be described wherein the impurity diffusion layer 720 formed in a protruding semiconductor layer 110 and the impurity diffusion layer 710 formed in the silicon substrate 100 have a offset structure relative to the charge storage layer in each memory cell, as shown in FIG. 43 and the like, in the memory cell array of FIG. 29.

Figure 79:
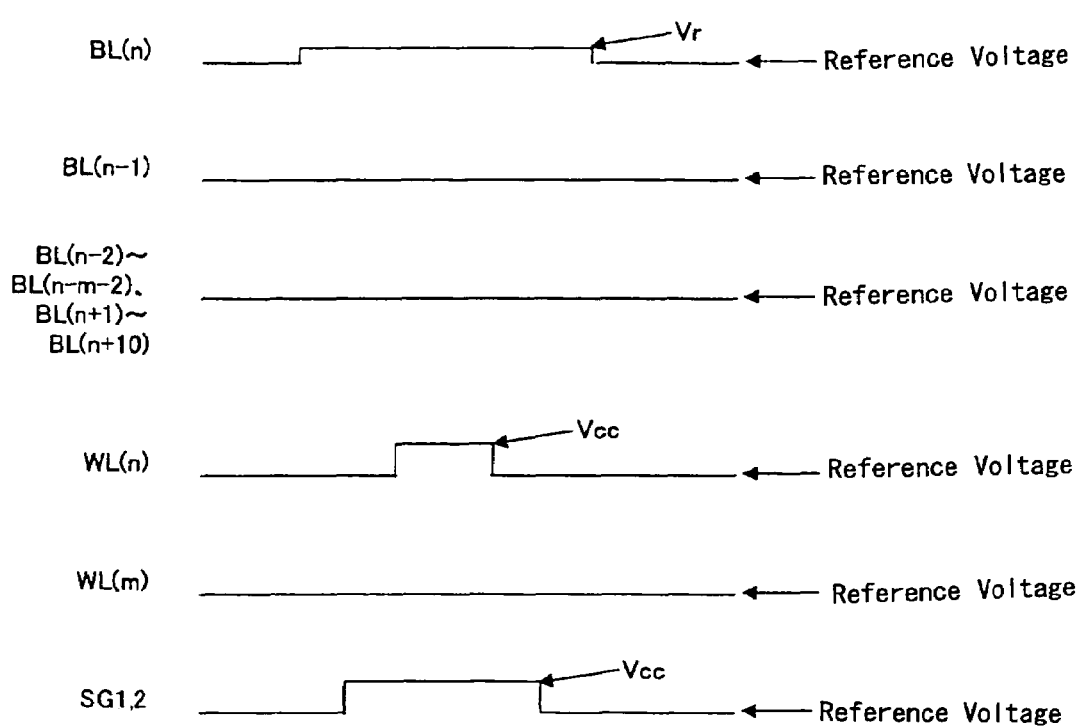
FIG. 79 is a timing chart showing a reading operation of the memory array shown in FIG. 75.

In the case where the protruding semiconductor layers are formed of p-type semiconductor, for example, as shown in the timing chart of FIG. 79, a read out voltage Vr, for example, 1.5 V is applied to BL(n) that becomes the drain of the selected cell and the reference voltage, for example 0 V is applied to BL(n−1) that becomes the source of the selected cell in order to read out the selected bit SB shown in FIG. 75. The reference voltage is applied to BL(n+1) to BL(n+10) and BL(n−2) to BL(n−m−2), Vcc, for example 3 V is applied to word line WL(n) of the selected bit, the reference voltage is applied to a word line WL(m) of a non-selected bit, and Vcc is applied to SG1 and SG2. As a result of this, determination of "0" and "1" of the selected bit line becomes possible due to the existence of a current.

As described above, read out voltage Vr is applied to the bit line that becomes the drain of the selected cell while other bit lines are maintained at the reference voltage and, thereby a reduction in the power consumption becomes possible.

Next, an example of write in by means of hot electron injection will be described.

Figure 80:
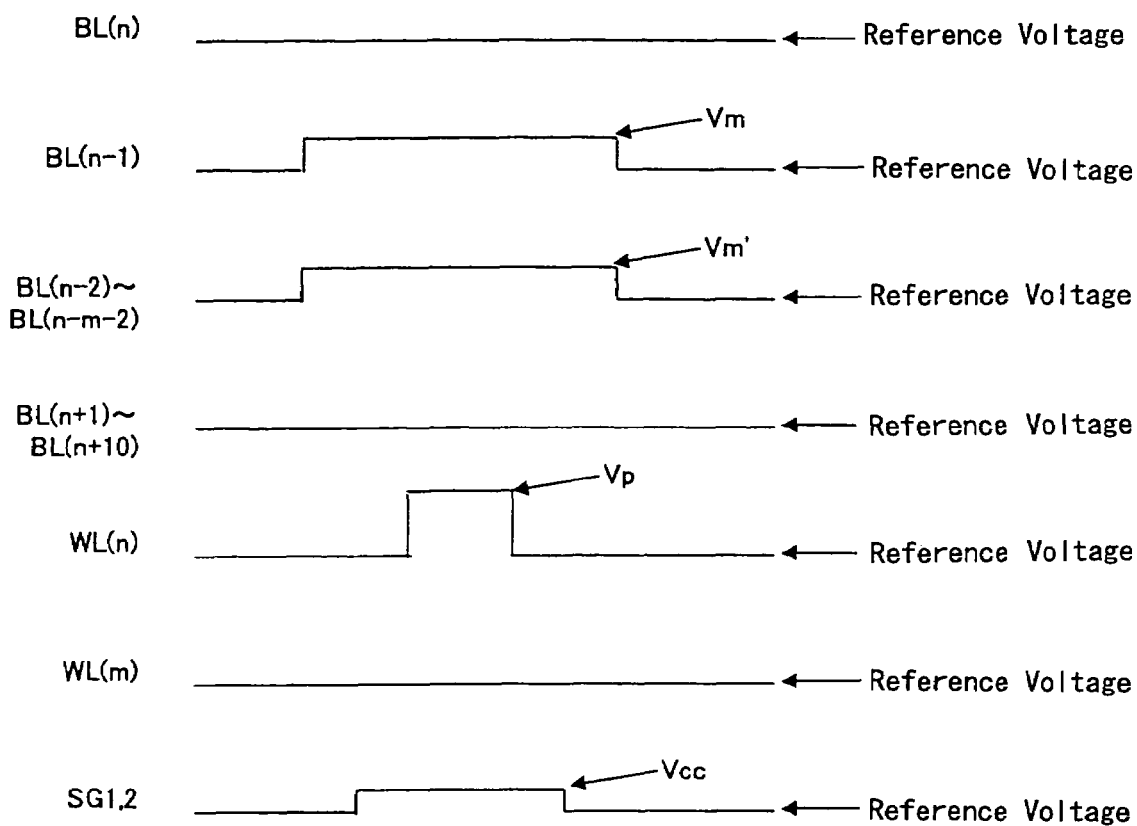
FIG. 80 is a timing chart showing a writing operation of the memory array shown in FIG. 75.

In the case where the protruding semiconductor layers are formed of p-type semiconductor, for example, as shown in the timing chart of FIG. 80 the reference voltage, for example, 0 V is applied to BL(n) and a middle voltage Vm, for example, 4.5 V is applied to BL(n−1) in order to write in the selected bit shown in FIG. 75. A middle voltage Vm', for example 4.5 V, is applied to BL(n−2) to BL(n−m−2), the same voltage that is applied to BL(n) is applied to BL(n+1) to BL(n+10), a high voltage Vp, for example 9 V, is applied to WL(n) which is the word line of the selected bit, the reference voltage is applied to WL(m) which are word lines of non-selected bits, and Vcc, for example 3 V, is applied to SG1 and SG2. As a result of this, data write-in becomes possible.

Next, an example of erasure by means of hot hole injection will be described.

Figure 81:
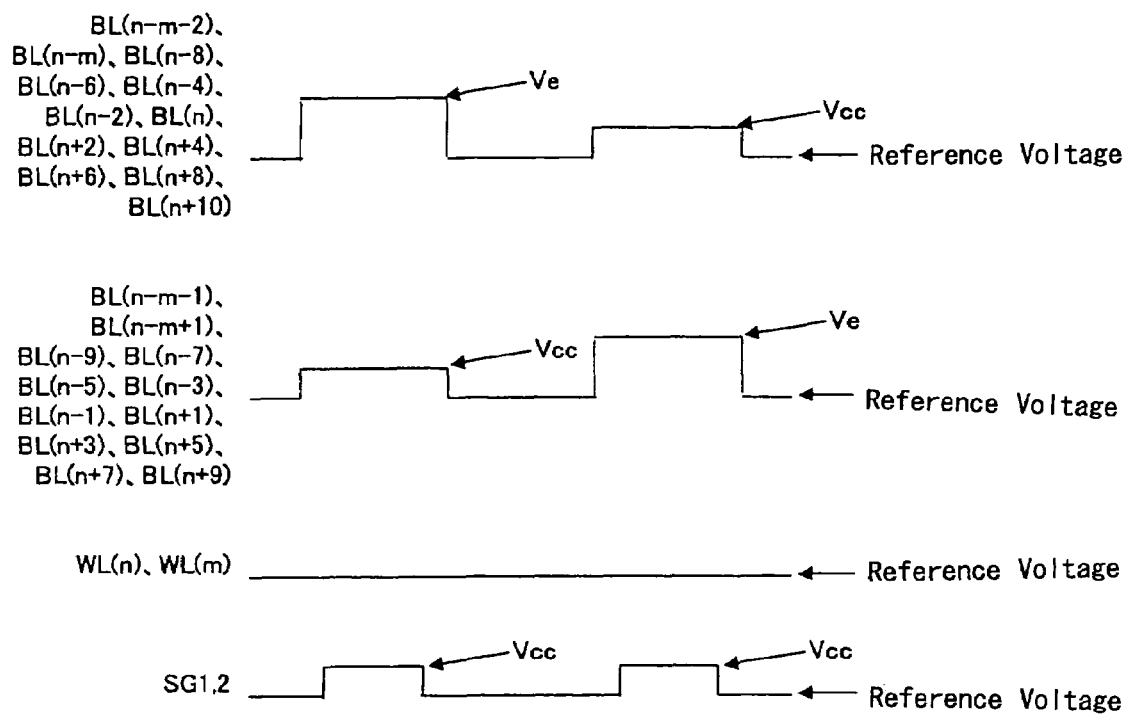
FIG. 81 is a timing chart showing an erasure operation of the memory array shown in FIG. 75.

In the case where the protruding semiconductor layers are formed of p-type semiconductor, for example, as shown in the timing chart of FIG. 81, a high voltage Ve, for example 9 V, is applied to BL(n−m−2), BL(n−m), BL(n−8), BL(n−6), BL(n−4), BL(n−2), BL(n), BL(n+2), BL(n+4), BL(n+6), BL(n+8) and BL(n+10), Vcc, for example 3 V, is applied to BL(n−m−1), BL(n−m+1), BL(n−9), BL(n−7), BL(n−5), BL(n−3), BL(n−1), BL(n+1), BL(n+3), BL(n+5), BL(n+7) and BL(n+9), the reference voltage, for example 0 V, is applied to WL(n) and WL(m), and Vcc is applied to SG1 and SG2 in order to carry out a collective erasure of all the memory cells shown in FIG. 75.

Next, Vcc is applied to BL(n−m−2), BL(n−m), BL(n−8), BL(n−6), BL(n−4), BL(n−2), BL(n), BL(n+2), BL(n+4), BL(n+6), BL(n+8) and BL(n+10), high voltage Ve is applied to BL(n−m−1), BL(n−m+1), BL(n−9), BL(n−7), BL(n−5), BL(n−3), BL(n−1), BL(n+1), BL(n+3), BL(n+5), BL(n+7) and BL(n+9), the reference voltage is applied to WL(n) and WL(m), and Vcc is applied to SG1 and SG2. As a result of this, erasure of data becomes possible.

Figure 82:
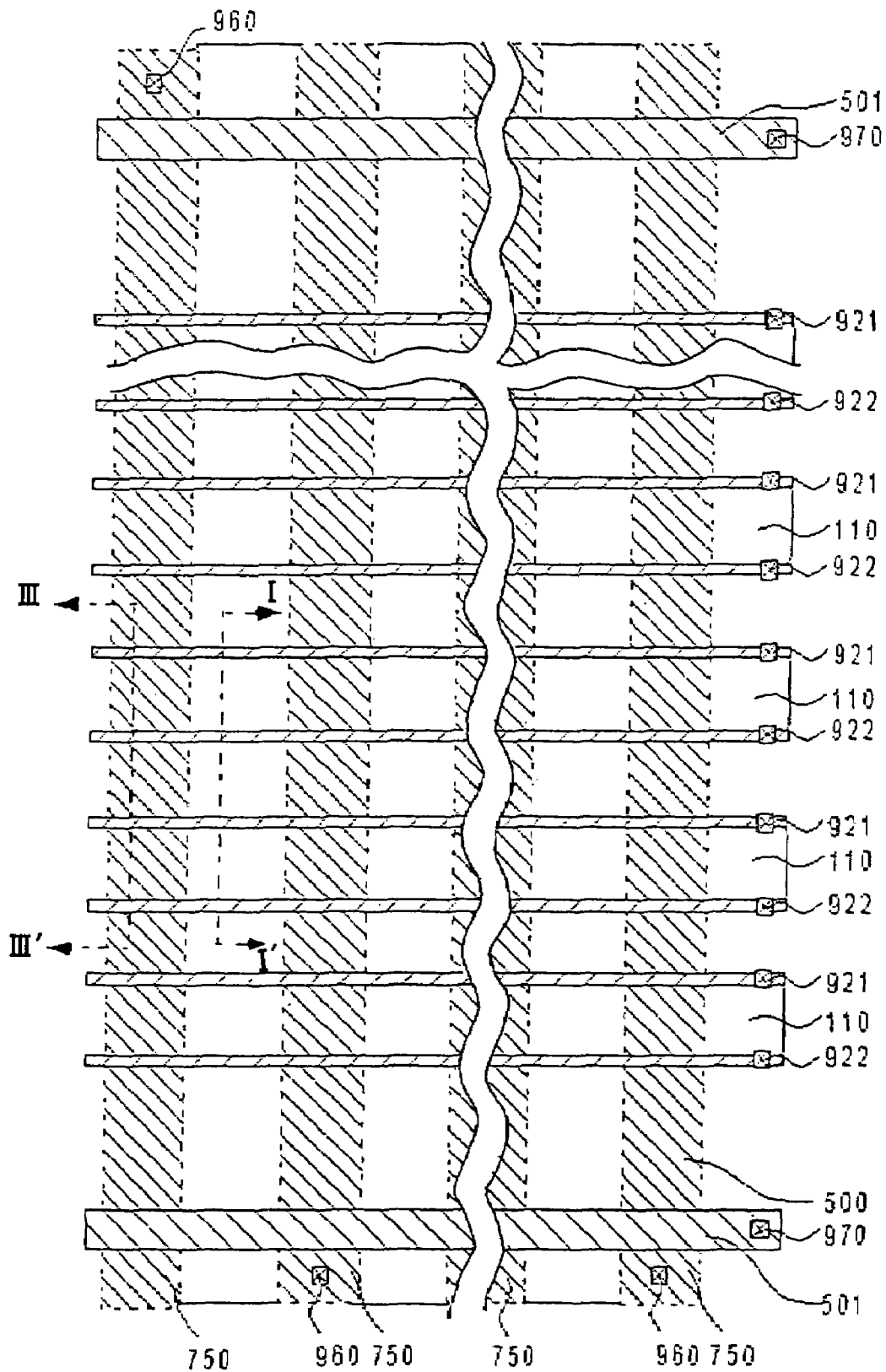
FIG. 82 is a plan view showing a memory array of the semiconductor memory device according to a twenty-third embodiment of the present invention.

FIG. 82 is a plan view showing a memory array of the semiconductor memory device according to a twenty-third embodiment of the present invention.

Figure 83:
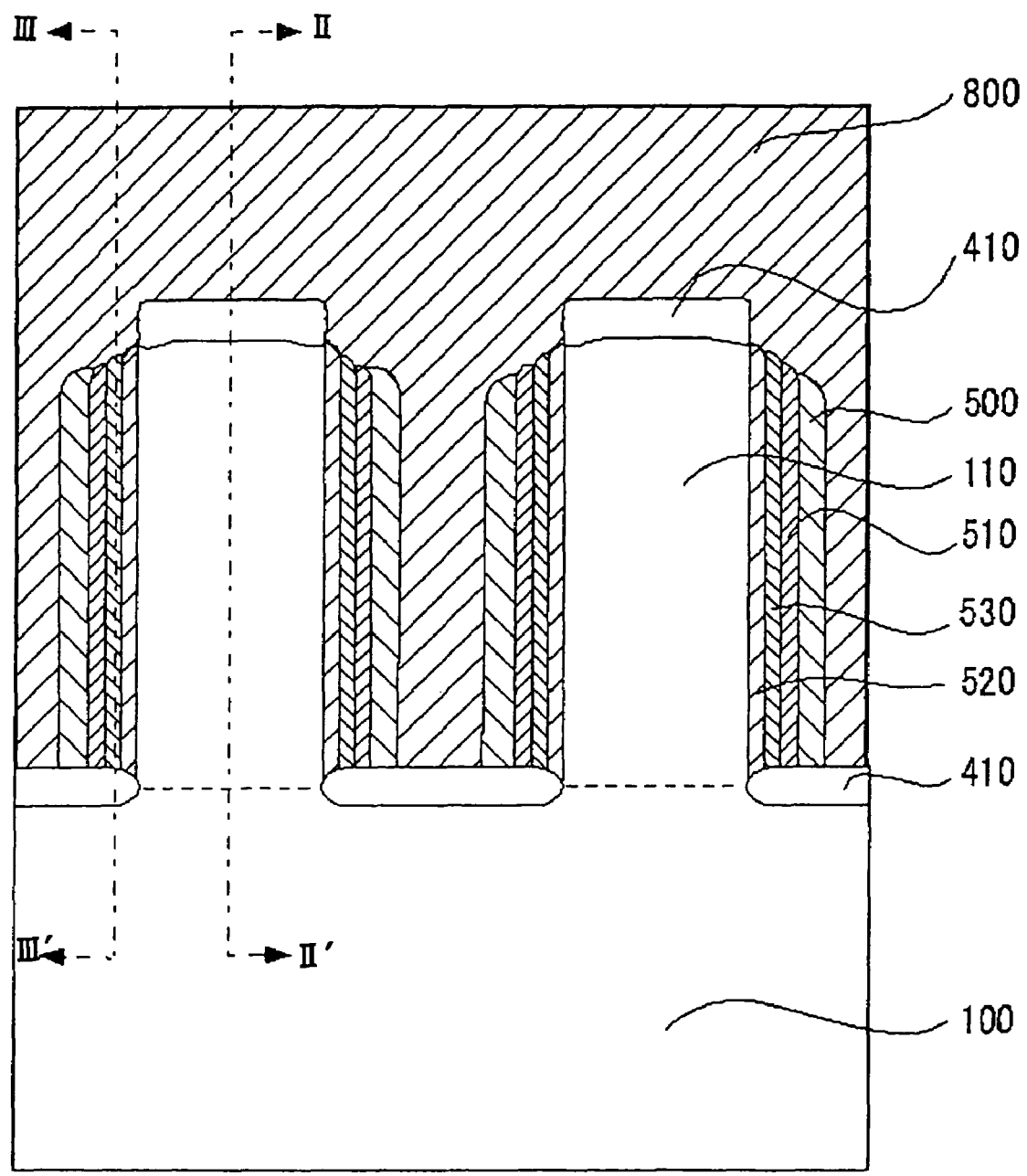
FIG. 83 is a cross sectional view of the semiconductor memory device taken along line I-I' of FIG. 82.
Figure 84:
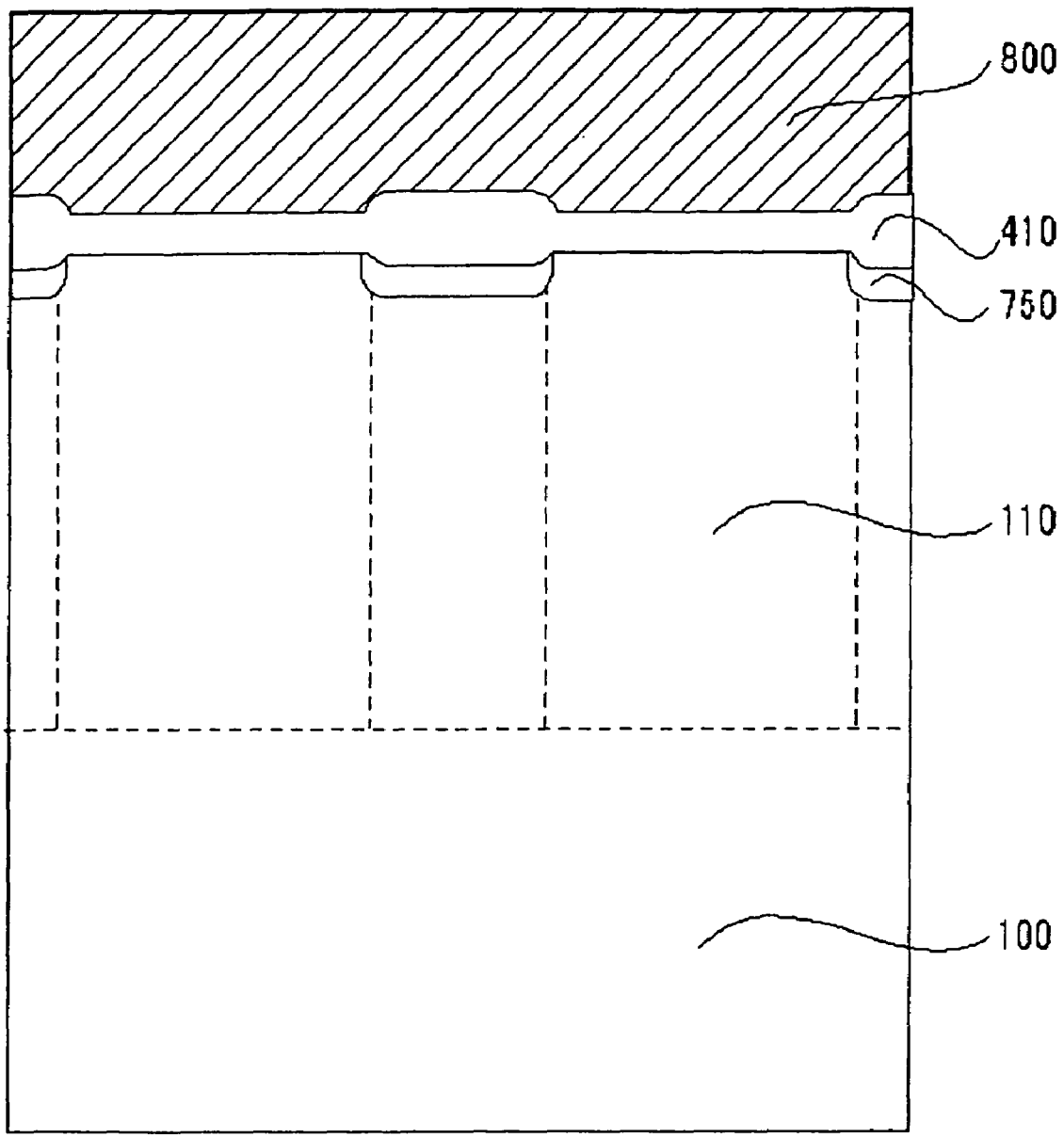
FIG. 84 is a cross sectional view of the semiconductor memory device taken along line II-II' of FIG. 83.
Figure 85:
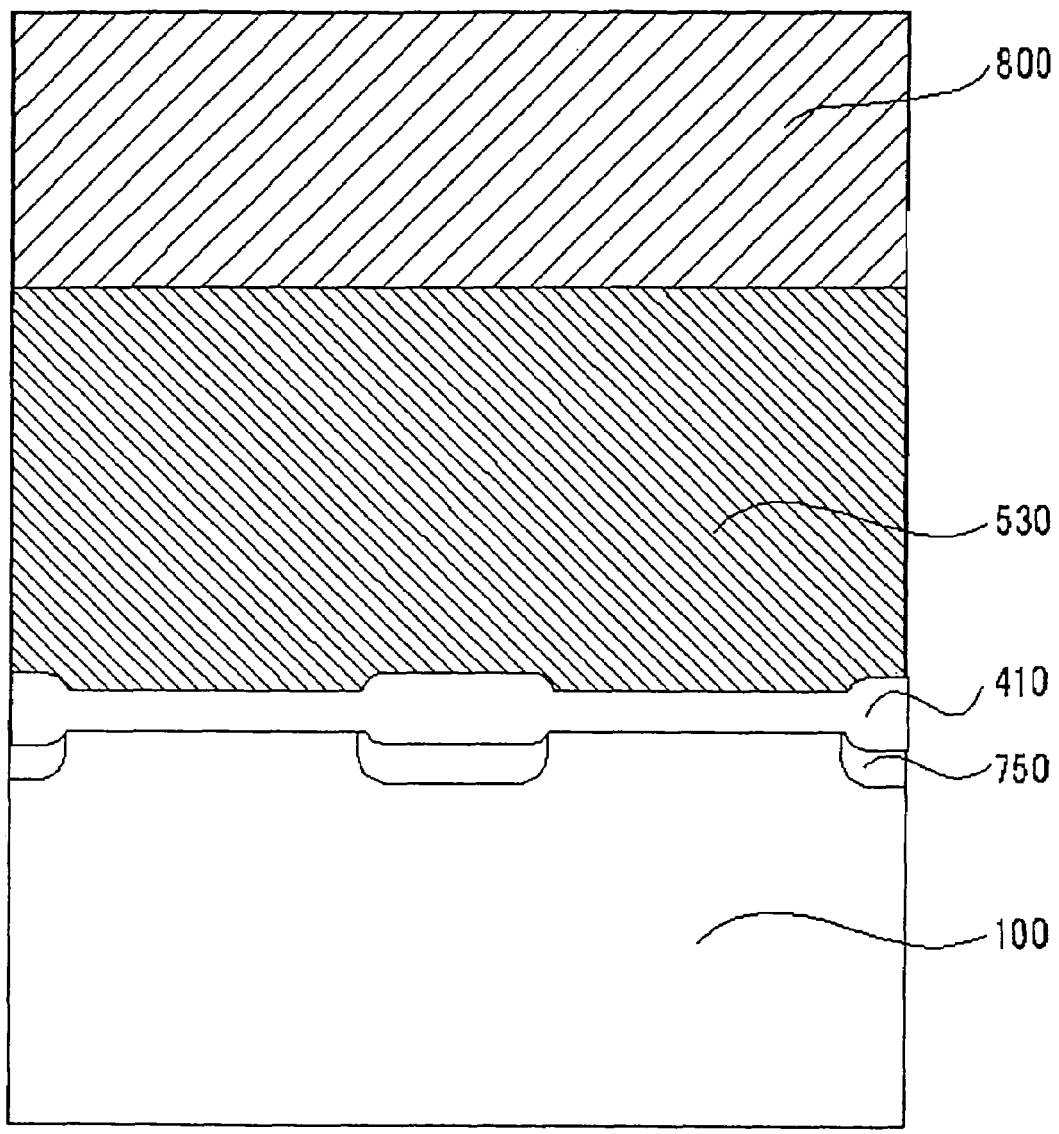
FIG. 85 is a cross sectional view of the semiconductor memory device taken along line III-III' of FIG. 83.
Figure 86:
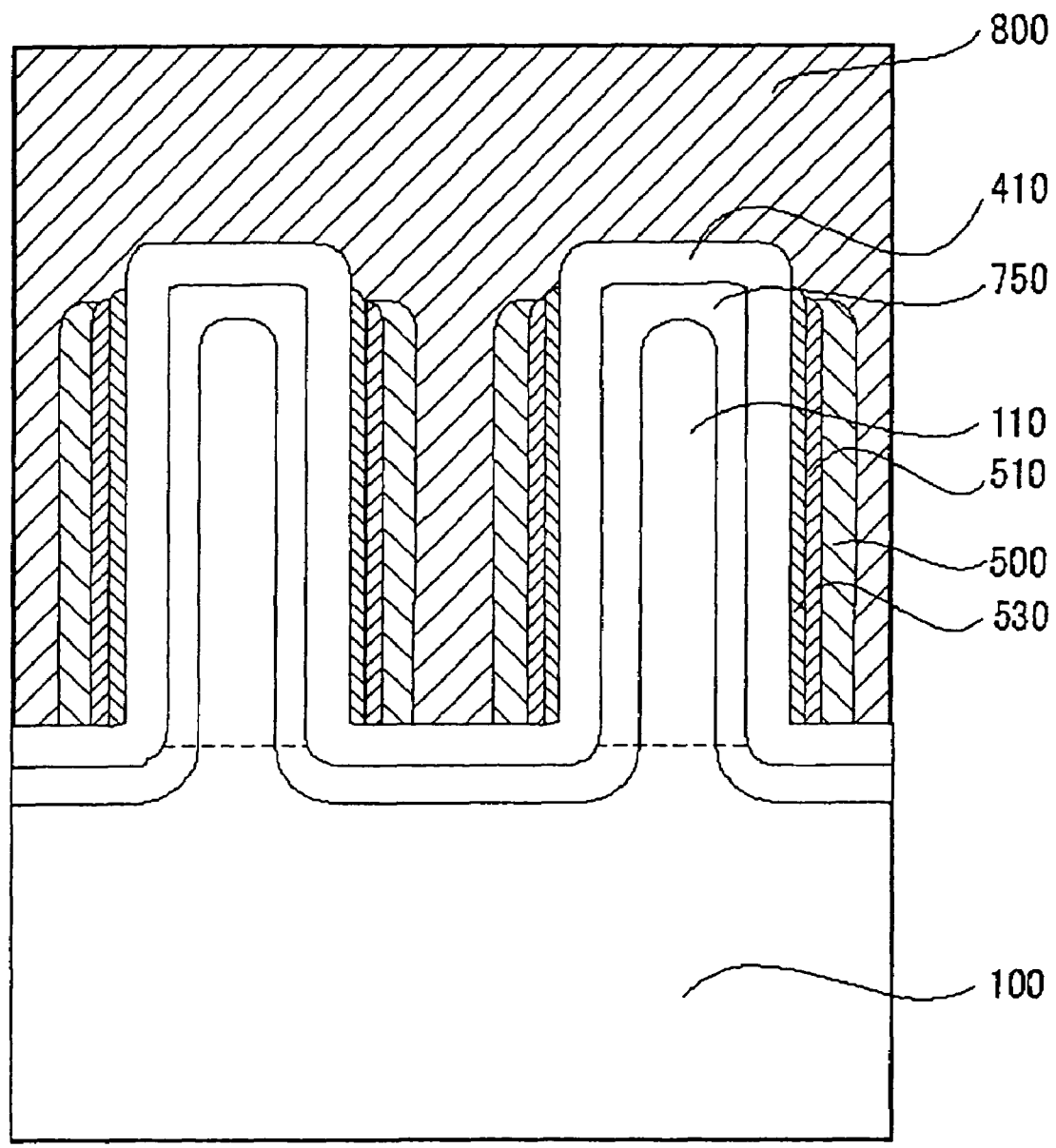
FIG. 86 is a cross sectional view of the semiconductor memory device taken along line III-III' of FIG. 82.

FIGS. 83 and 86 are cross sectional views of the memory array along I-I' and III-III' of FIG. 82, respectively. In addition, FIGS. 84 and 85 are cross sectional views of the memory array along II-II' and III-III' of FIG. 83, respectively.

At least one or more protruding semiconductor layers 110, of which the cross sections in the horizontal direction relative to the p-type silicon substrate 100 are bands in form, for example, are placed parallel to each other as shown in FIGS. 83 to 86.

In one memory cell, a surface of a protruding semiconductor layer 110 is used as an active region surface, a control gate 500 is formed on this active region surface via a charge storage layer made of silicon oxide film 520/silicon nitride film 530/silicon oxide film 510 (ONO film), and furthermore, an impurity diffusion layer 750 is formed on the upper surface of the protruding semiconductor layer 110, and thereby the memory cell is formed.

A plurality of memory cells is placed in series parallel to the direction in which the protruding semiconductor layers 110 extend via the impurity diffusion layer 750 formed on the upper surface of the protruding semiconductor layers 110, and the control gates 500 are formed parallel to the direction in which the protruding semiconductor layers 110 extend. A silicon oxide film 410 is formed on the impurity diffusion layer 750 as an element isolation film. In addition, the silicon oxide films 410 are formed, as at least one or more element isolation films, between memory cells in the direction perpendicular to the direction in which memory cells are connected in series.

Figure 87:
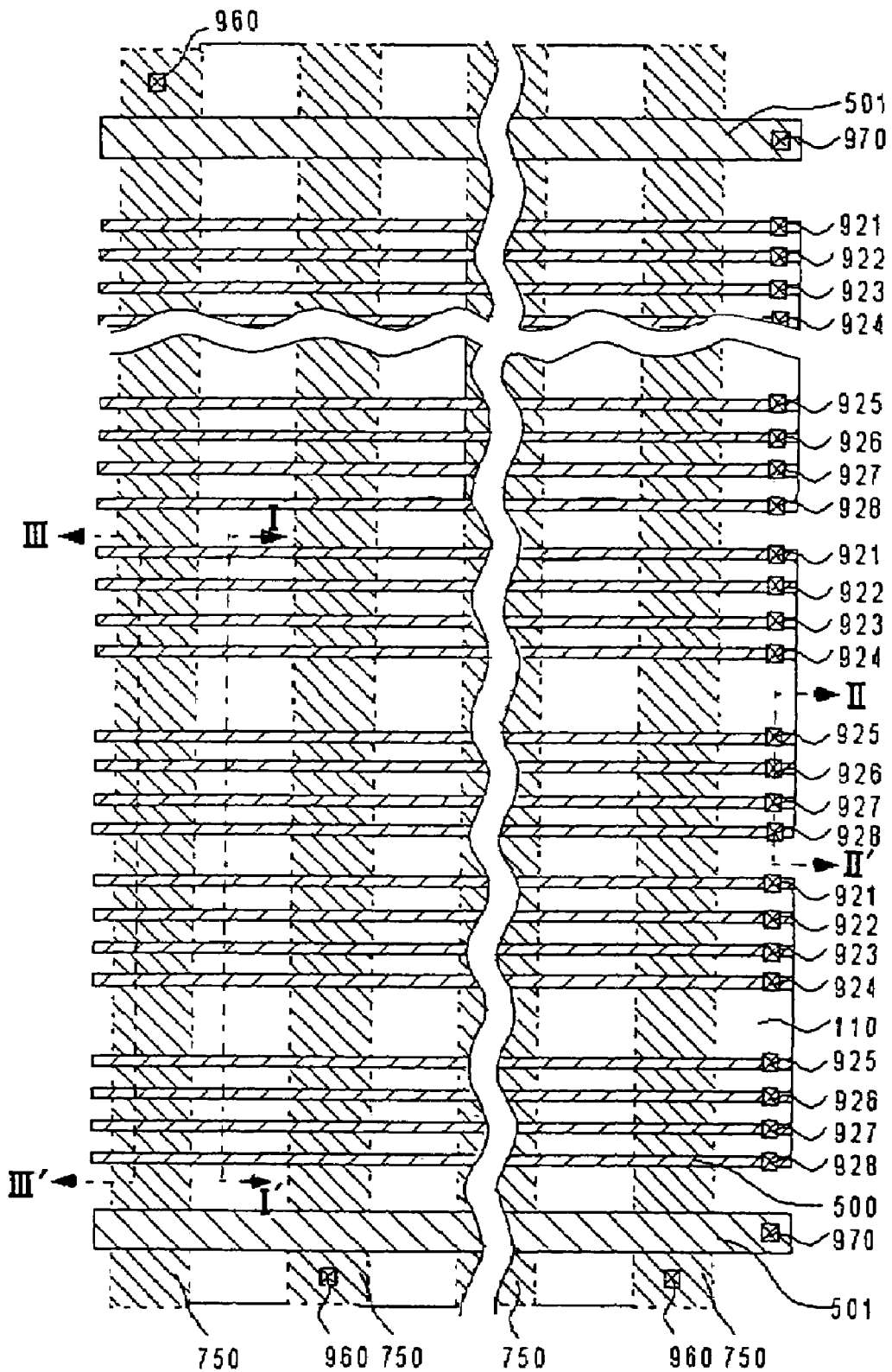
FIG. 87 is a plan view showing a memory array of the semiconductor memory device according to twenty-fourth and twenty-fifth embodiments of the present invention.
Figure 99:
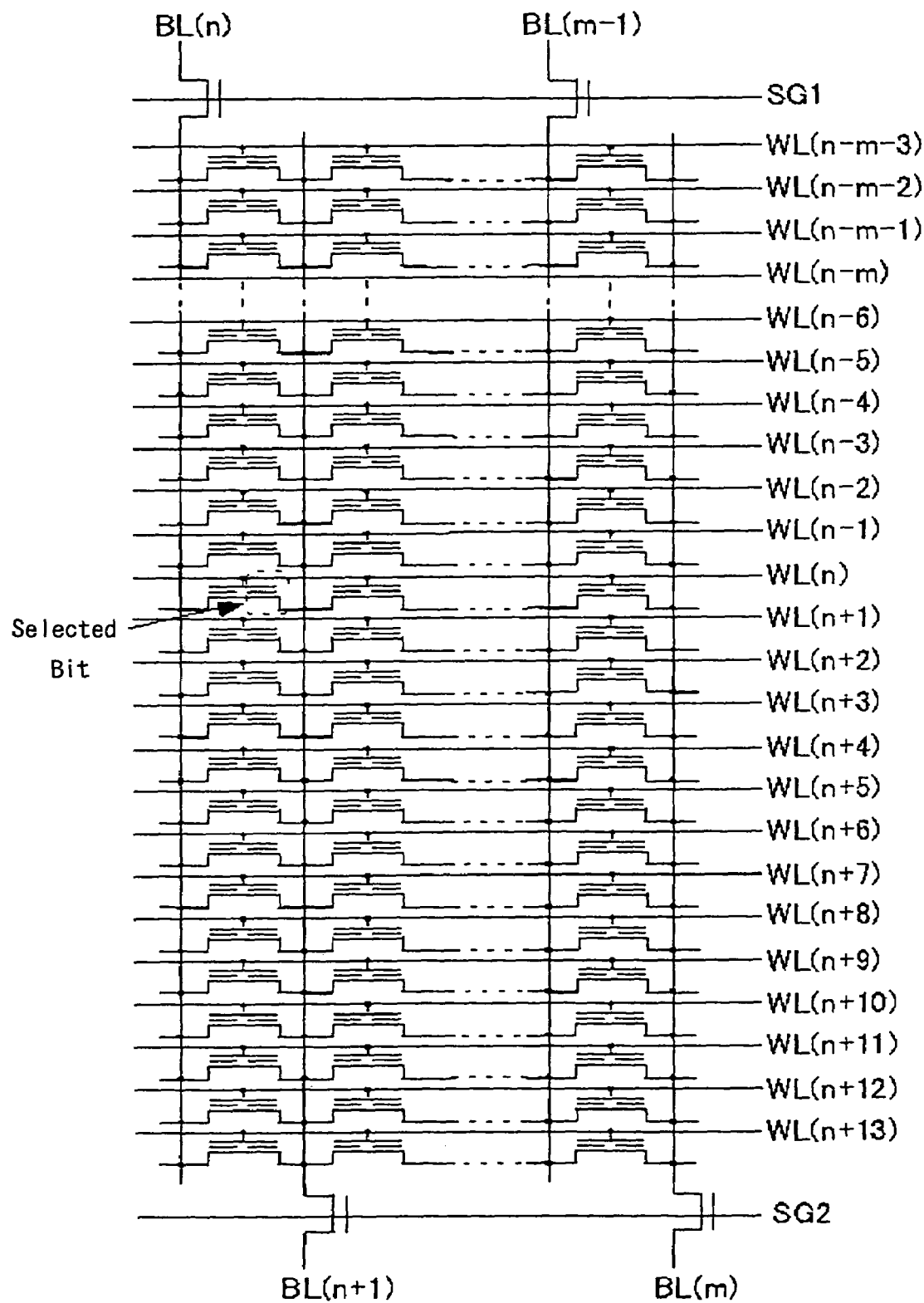
FIG. 99 is an equivalent circuit diagram of the memory array shown in FIG. 87.

FIG. 87 is a plan view showing a memory array of the semiconductor memory device according to twenty-fourth and twenty-fifth embodiments of the present invention, and an equivalent circuit diagram of the memory array shown in FIG. 87 is shown in FIG. 99.

Figure 88:
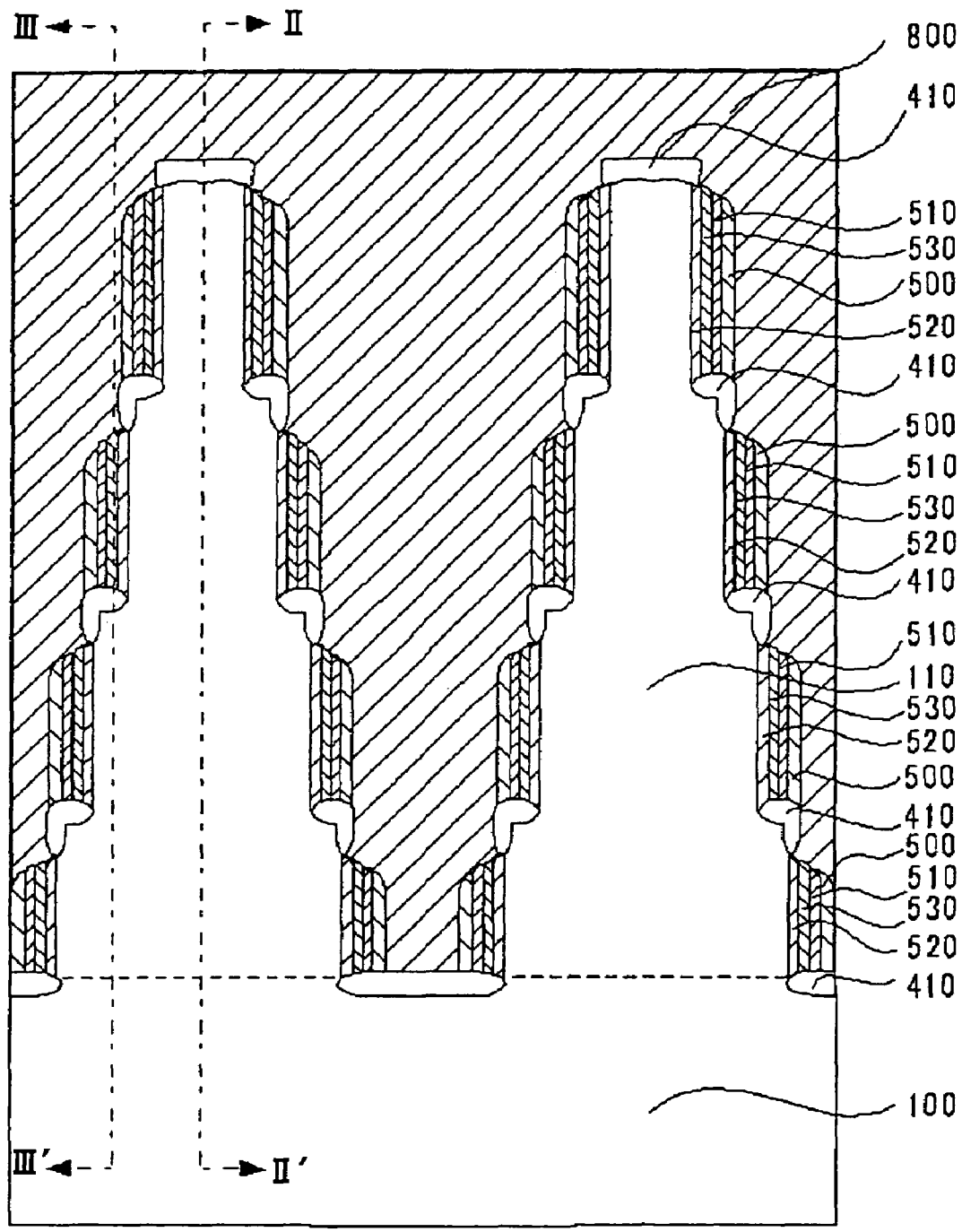
FIGS. 88 and 89 are cross sectional views through section I-I' of FIG. 87 showing the semiconductor memory devices according to the twenty-fourth and twenty-fifth embodiments, respectively.
Figure 89:
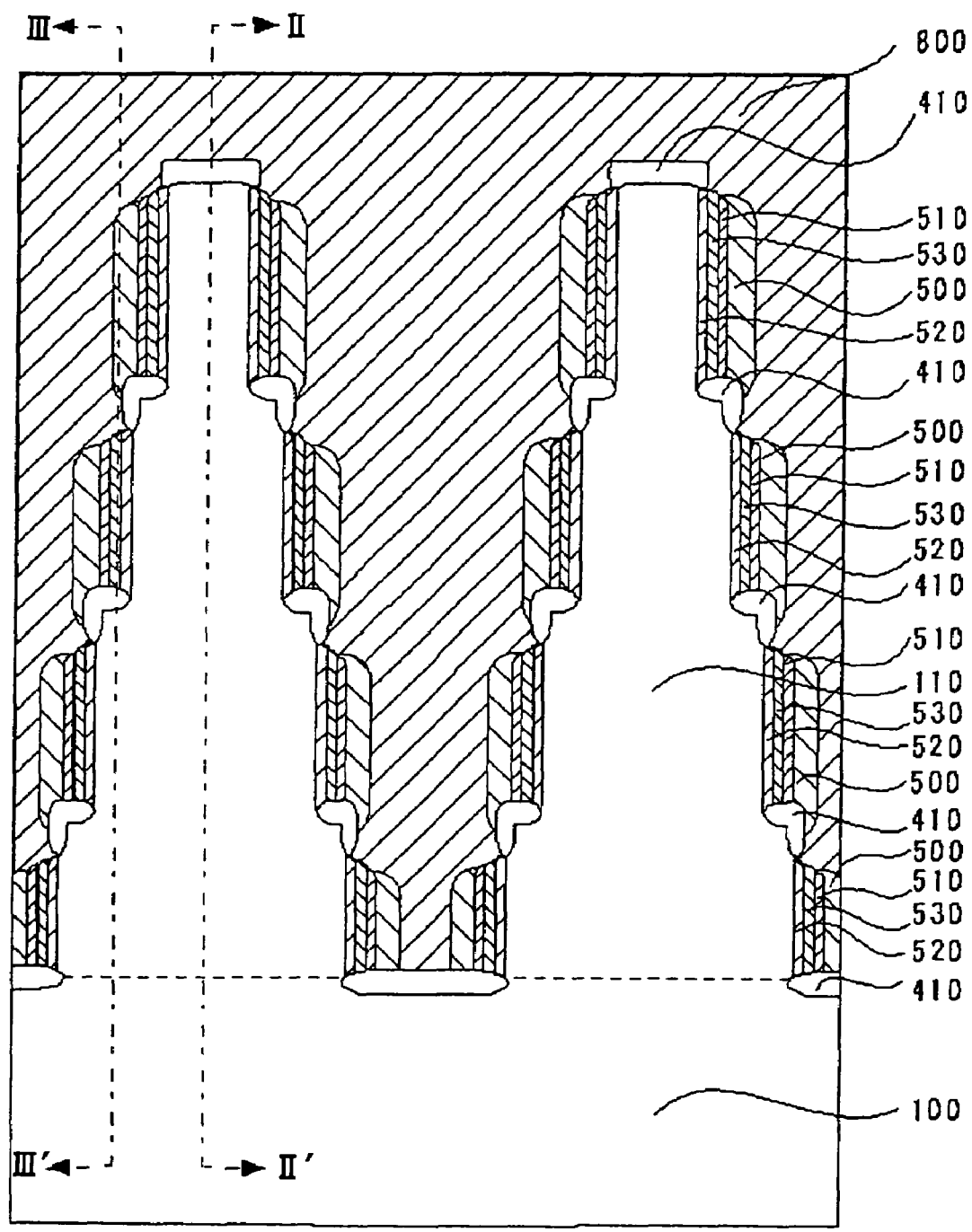
Figure 90:
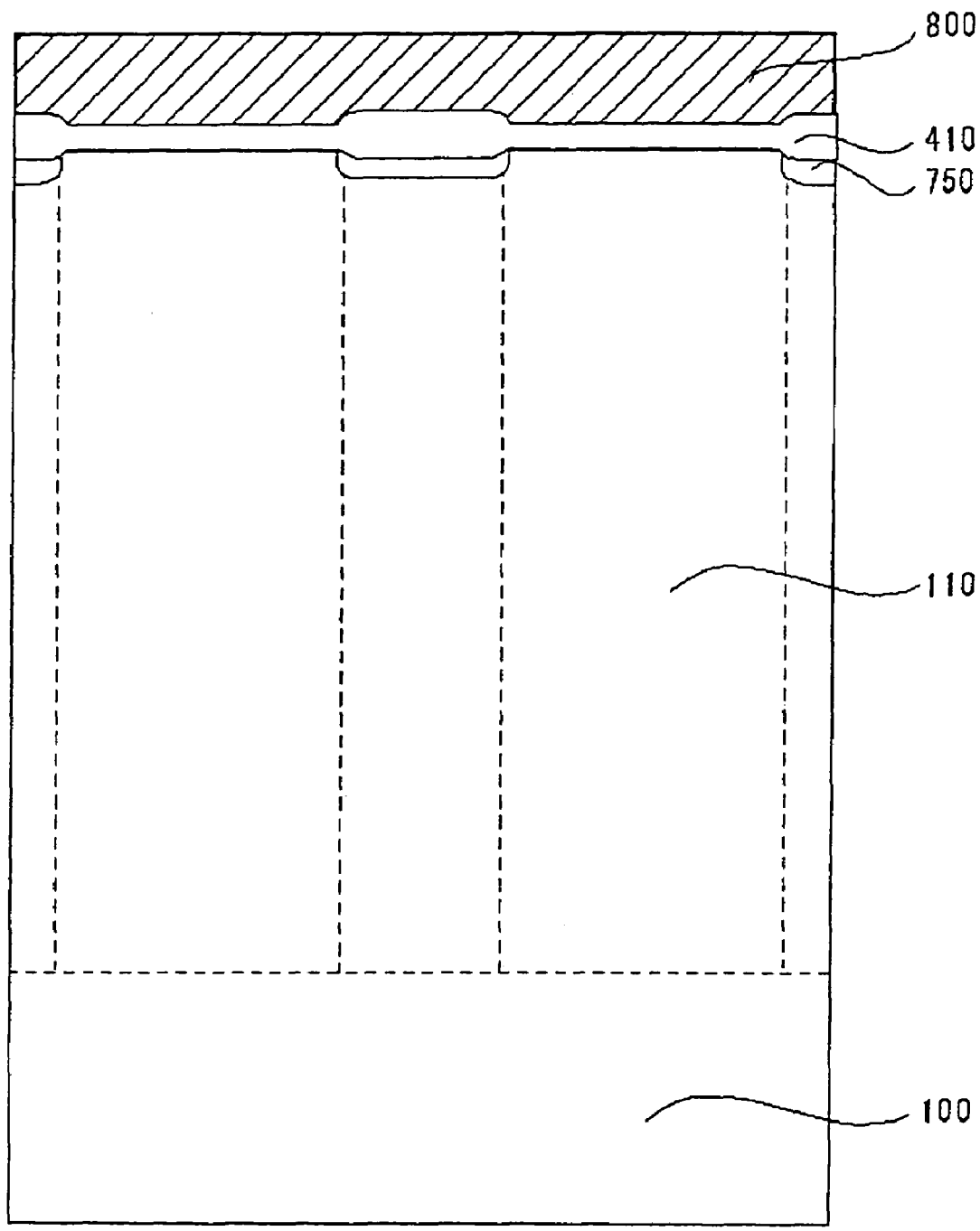
FIGS. 90 and 91 are cross sectional views of the semiconductor memory devices taken along line II-II' of FIGS. 88 and 89, respectively.
Figure 91:
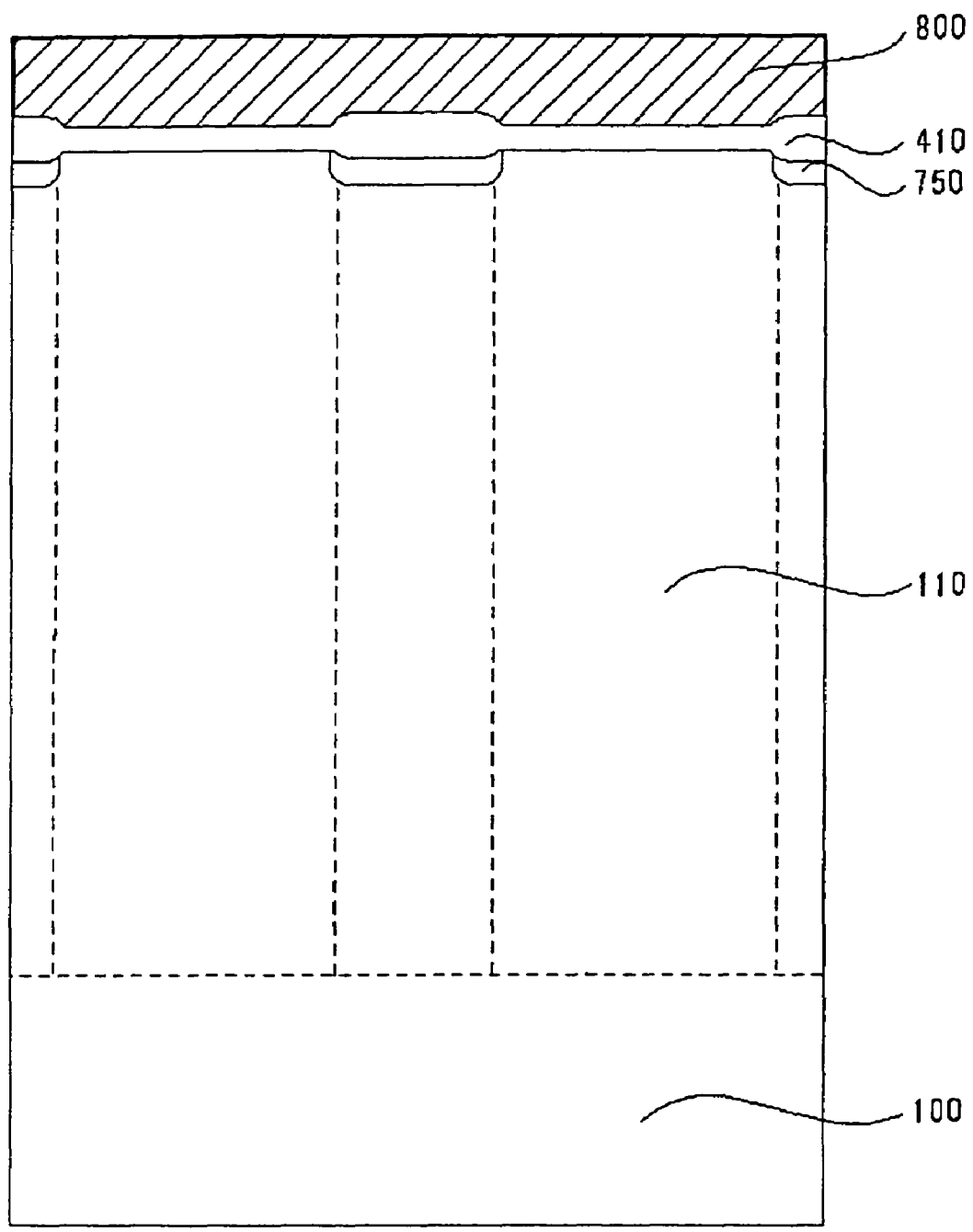
Figure 92:
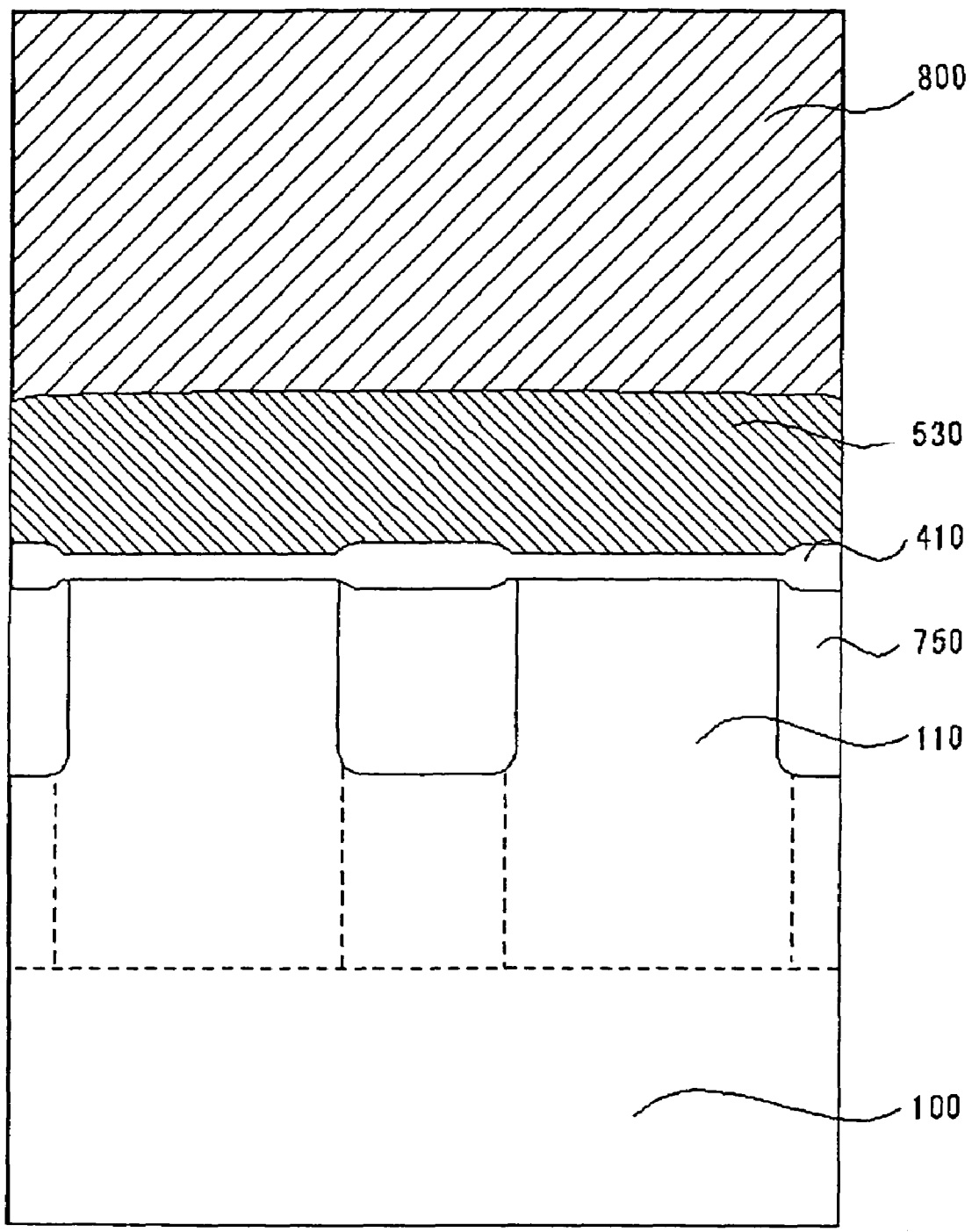
FIGS. 92 and 93 are cross sectional views of the semiconductor memory devices taken along line III-III' of FIGS. 88 and 89, respectively.
Figure 93:
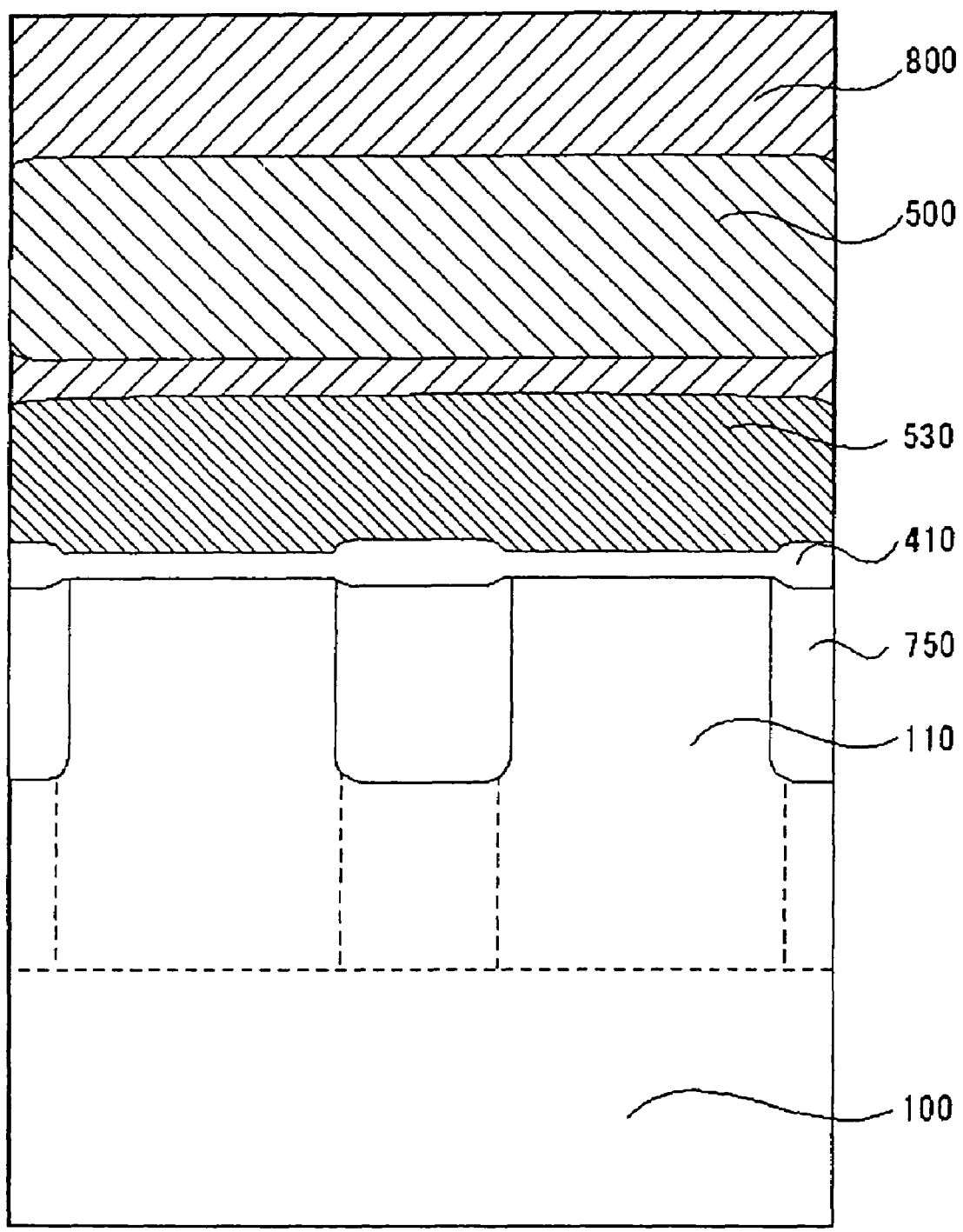
Figure 94:
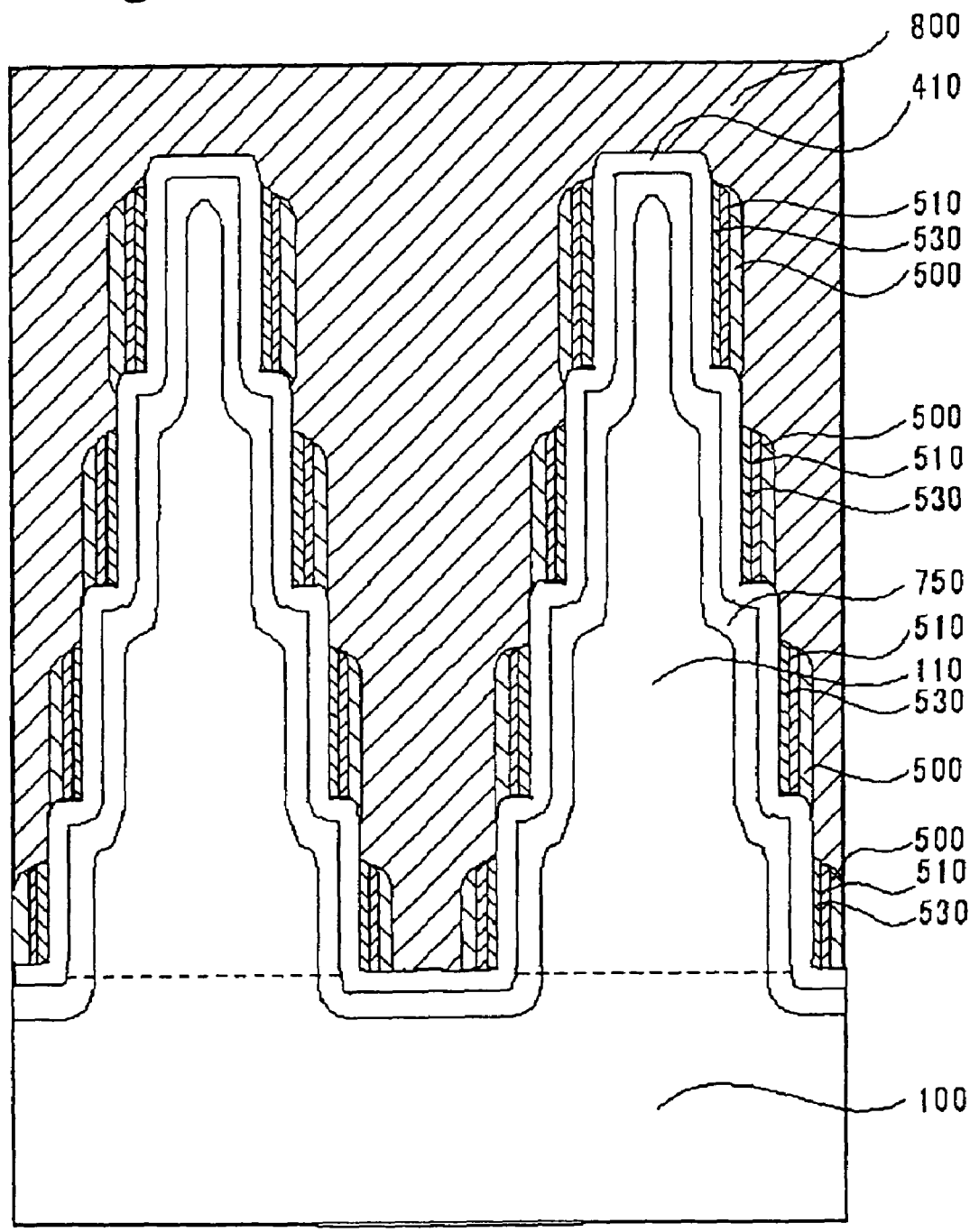
FIGS. 94 and 95 are cross sectional views through section III-III' of FIG. 87 showing the semiconductor memory devices according to the twenty-fourth and twenty-fifth embodiments, respectively.
Figure 95:
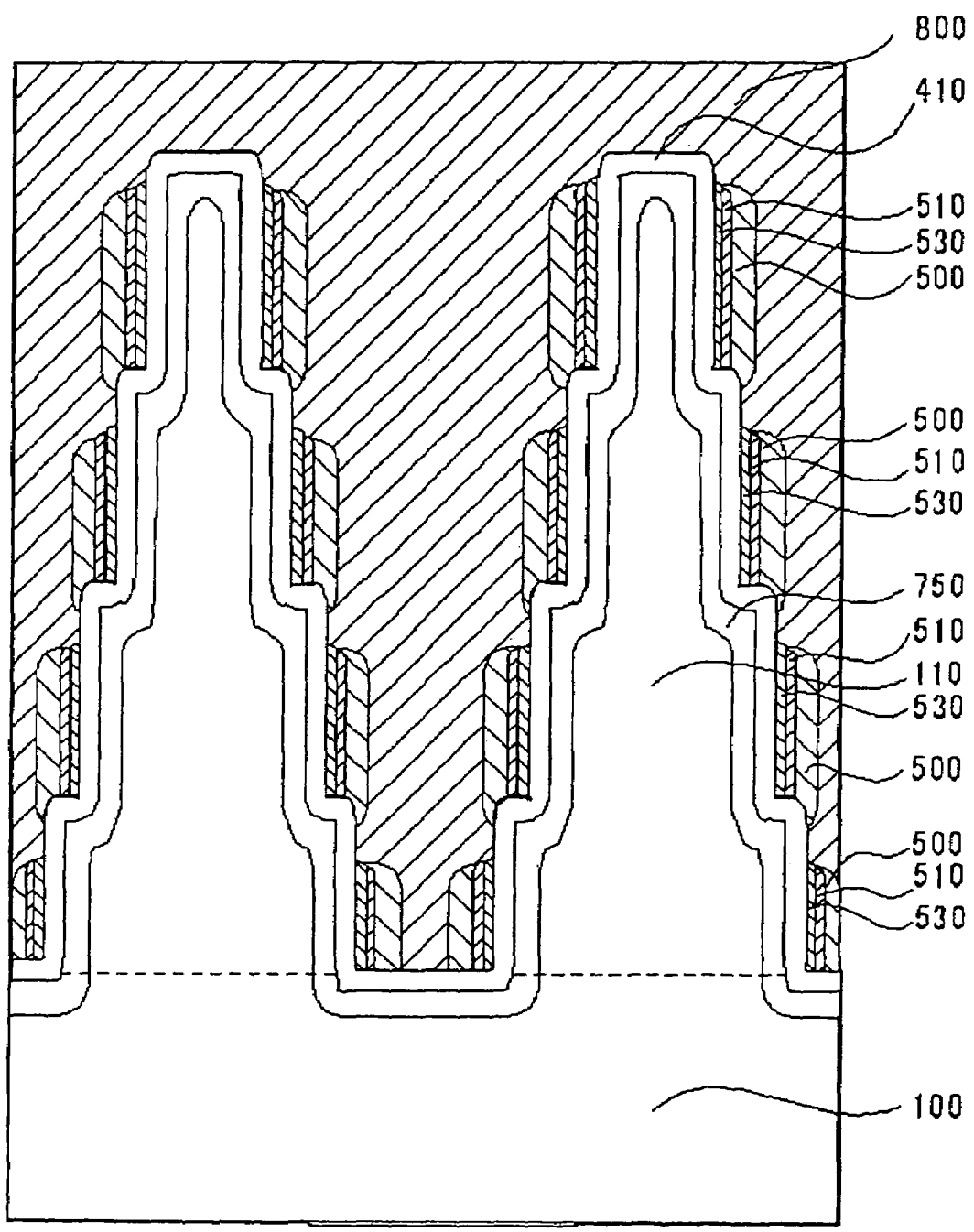

This memory array is essentially the same as the memory array of the third embodiment, except for that at least one or more protruding semiconductor layers 110, having four steps, of which the cross sections in the horizontal direction relative to the p-type silicon substrate 100 are band in form, are placed parallel to each other as shown in, for example, FIGS. 88 and 89. Here, the number and the forms of the steps are not limited as long as the formation of memory cells having desired functions is possible.

The width of the control gates 500 is equal to or smaller than the width of the respective steps of the protruding semiconductor layers 110 in the semiconductor memory device of the twenty-fourth embodiment shown in FIG. 88.

The width of the control gates 500 is greater than the width of the respective steps of the protruding semiconductor layers 110 in the semiconductor memory device of the twenty-fourth embodiment shown in FIG. 89. Here, the film thickness of the control gates 500 is not limited as long as the control gates 500 allow the memory cells to have desired functions.

Here, the respective constitutional features of the above described embodiments may be combined in a variety of manners as long as the memory cells have desired functions.

Figure 96:
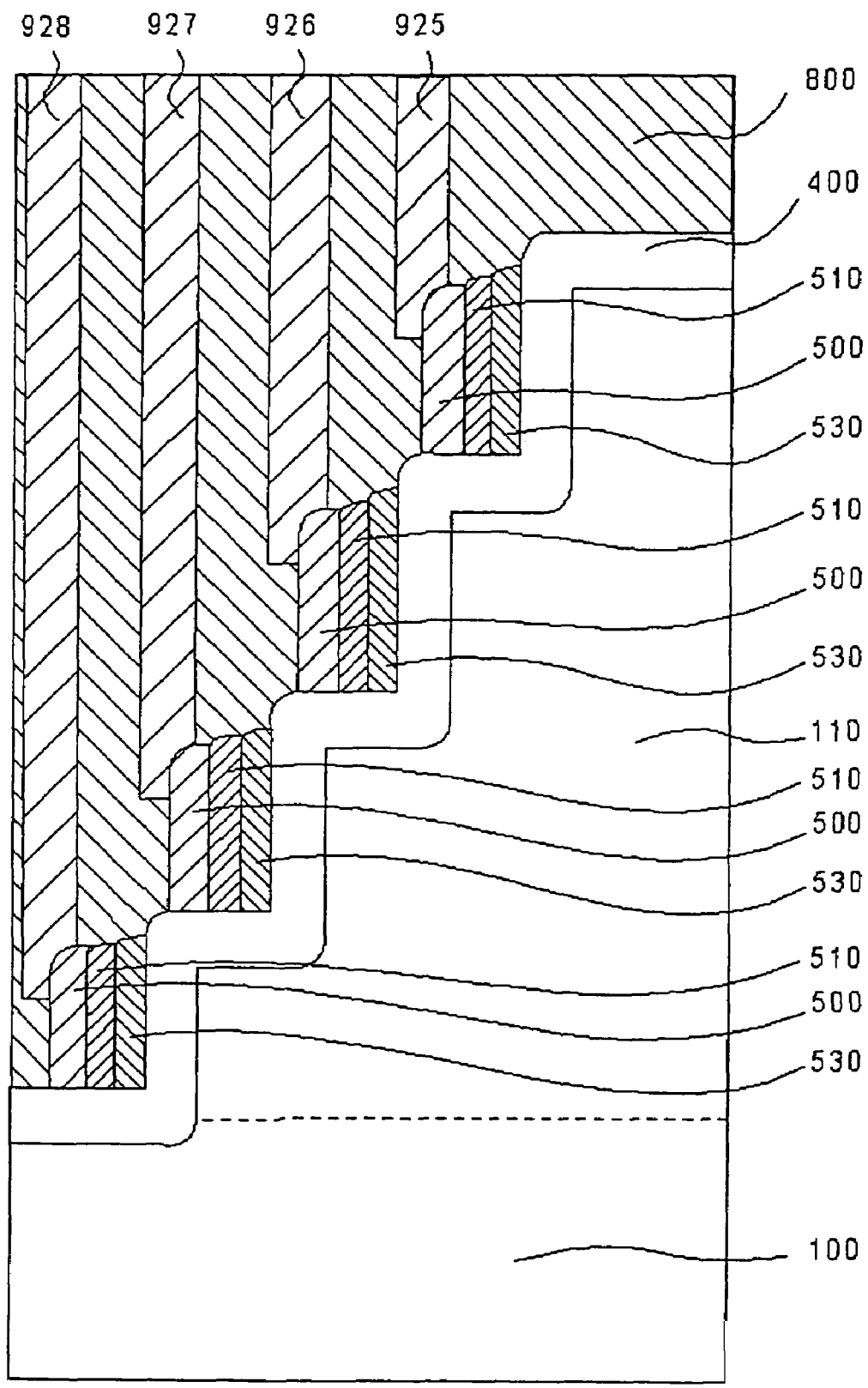
FIGS. 96 to 98 are cross sectional views through section II-II' of FIG. 87 showing first to third contact structures of the semiconductor memory device.
Figure 97:
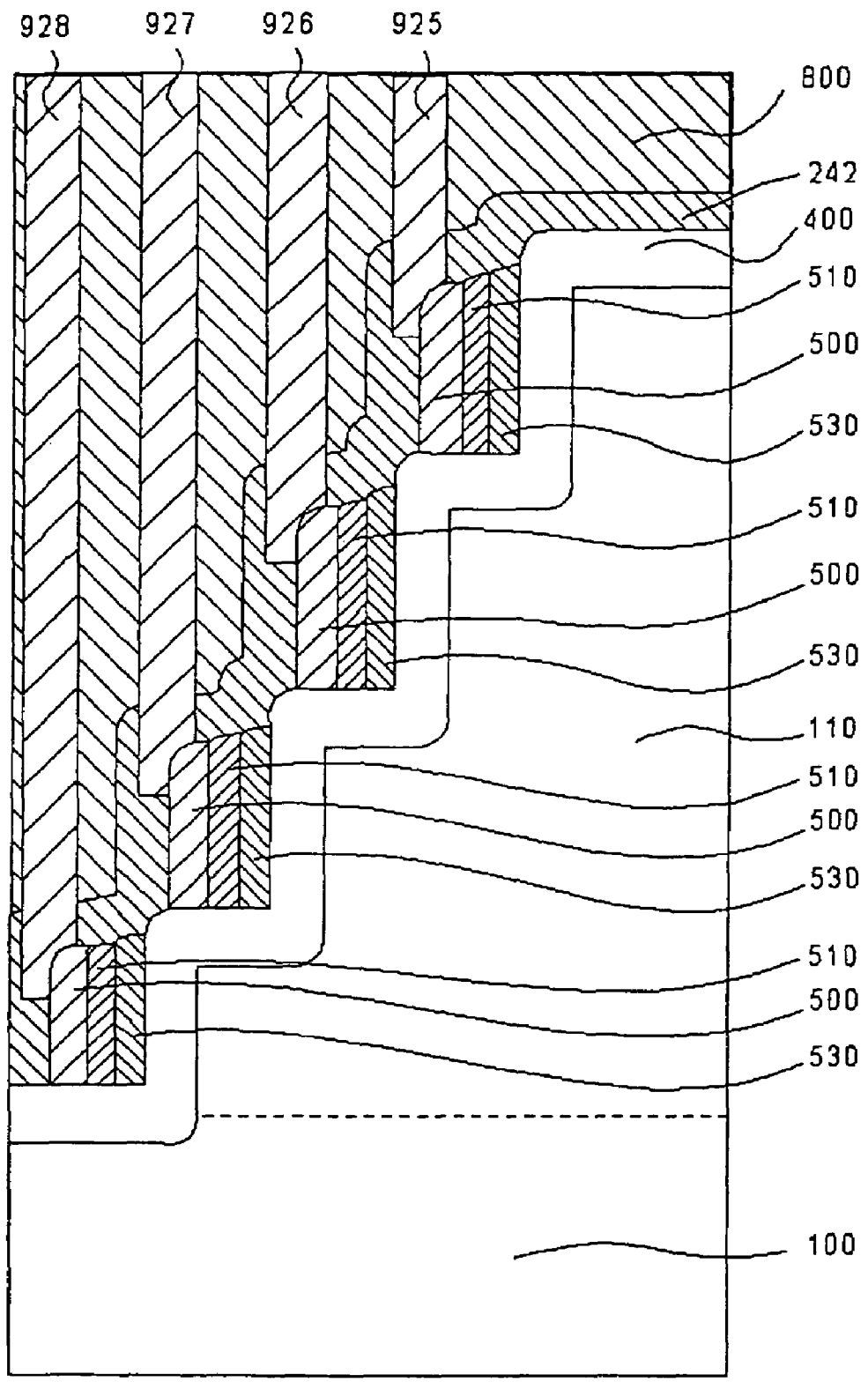
Figure 98:
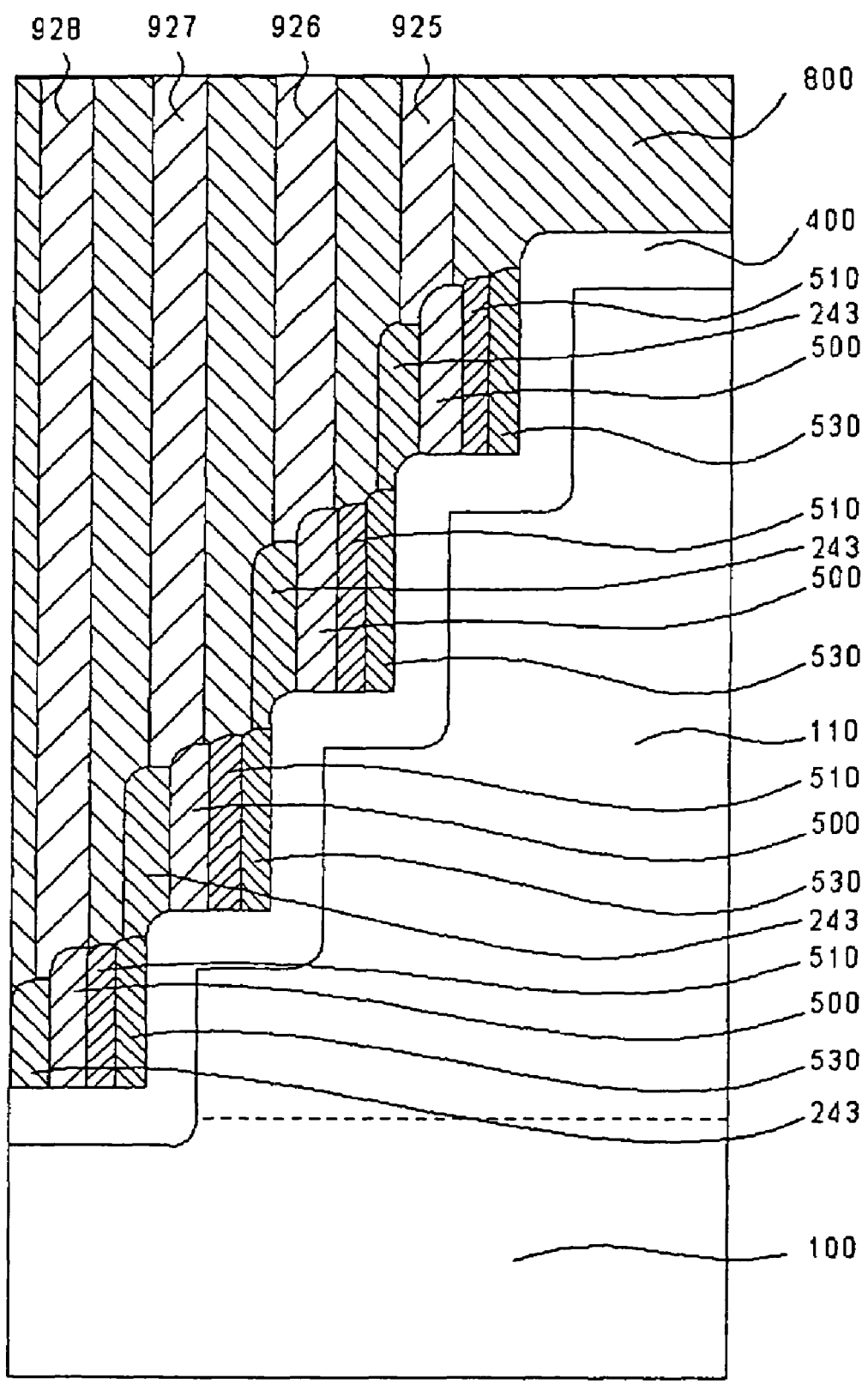

In the memory array of FIG. 87, contacts 925 to 928 are connected to the control gates 500 that become word lines as shown in FIG. 96, which is a cross sectional view of the memory array along II-II' of FIG. 87. In addition, as shown in FIG. 97, an insulating film 242 may be placed on the surface of a protruding semiconductor layer 110 that includes steps so that the contacts are prevented from being short circuited in a region or an electrode other than the predetermined impurity diffusion layers. The insulating film 242 can be formed in the same manner as the above described insulating film 240. FIG. 98 shows an example of the case wherein side wall spaces are formed of an insulating film 243 on the sides of protruding semiconductor layers having a step structure. The insulating film 243 can also be formed in the same manner as insulating film 240.

In the memory array of FIG. 87 the control gates 500 of the aligned memory cells are connected parallel to the direction in which the memory cells are connected in series so as to form word lines (WL(n), WL(n+1), . . . ) (n is an integer) as shown in FIG. 99. In addition, impurity diffusion layers of the aligned memory cells are connected in the direction perpendicular to the direction in which the memory cells are connected in series so as to form bit lines (BL(n), BL(n+1), . . . ). It is desirable for at least one end of a bit line to have a selection transistor so that the selection transistor is formed to be placed and connected to the aligned memory cells.

Such a semiconductor memory device has a memory function based on the conditions of a charge stored in a charge storage layer. In the following, the theory of the operation of the memory cells will be described.

First, an example of read out of a semiconductor memory device having memory cells which have a charge storage layer made of an ONO film and a control gate as the first electrode will be described below.

Figure 100:
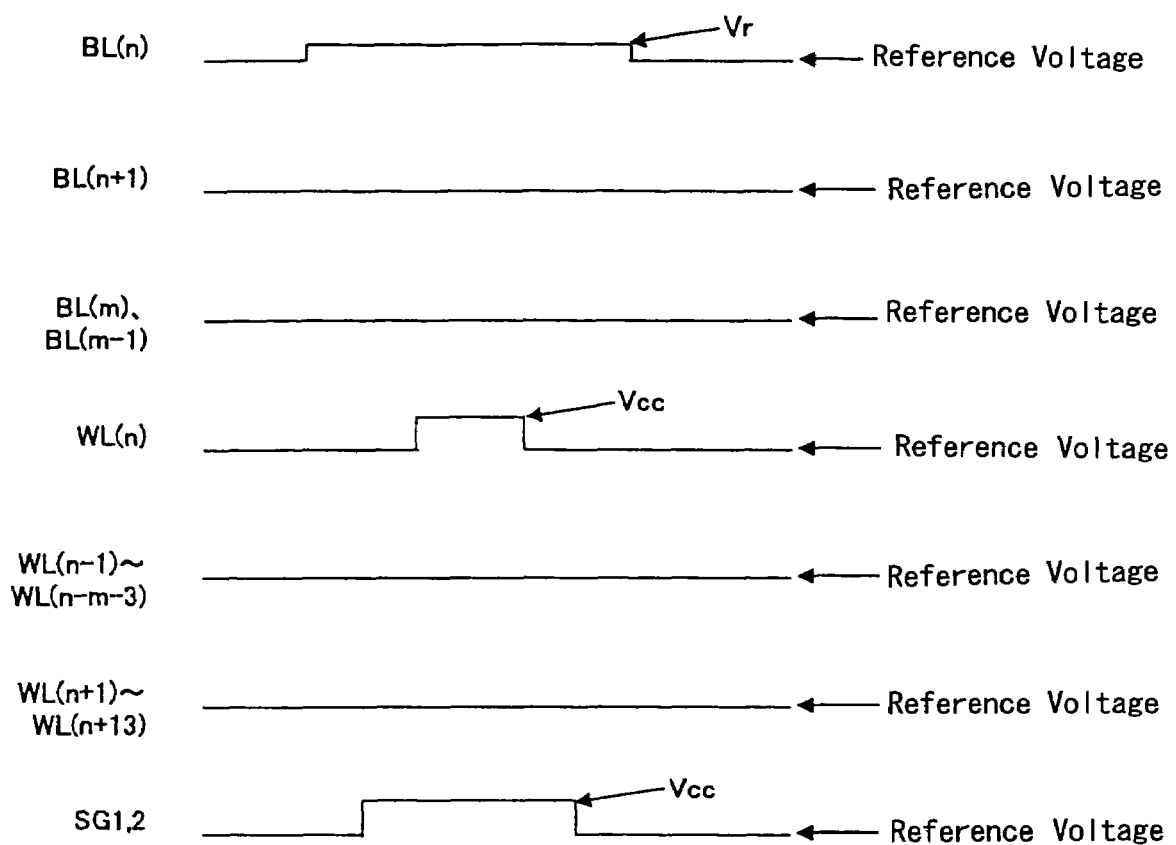
FIG. 100 is a timing chart showing a reading operation of the memory array shown in FIG. 99.

In the case where the protruding semiconductor layers are formed of p-type semiconductor, for example, as shown in the timing chart of FIG. 100, a read out voltage Vr, for example, 1.5 V is applied to BL(n), the reference voltage, for example, 0 V is applied to BL(n+1), and BL(m) and BL(m−1) are maintained at the same potential as BL(n+1), Vcc, for example 3 V, is applied to WL(n) which is the word line of the selected bit, the reference voltage is applied to WL(n−1) to WL(n−m−3) and WL(n+1) to WL(n+13) which are word lines of the non-selected bits, and Vcc is applied to SG1 and SG2, in order to read out the selected bit SB, for example, shown in FIG. 99. As a result of this, the determination "0" or "1" of the selected bit due to the existence of a current becomes possible.

Next, an example of write in by means of hot electron injection will be described.

Figure 101:
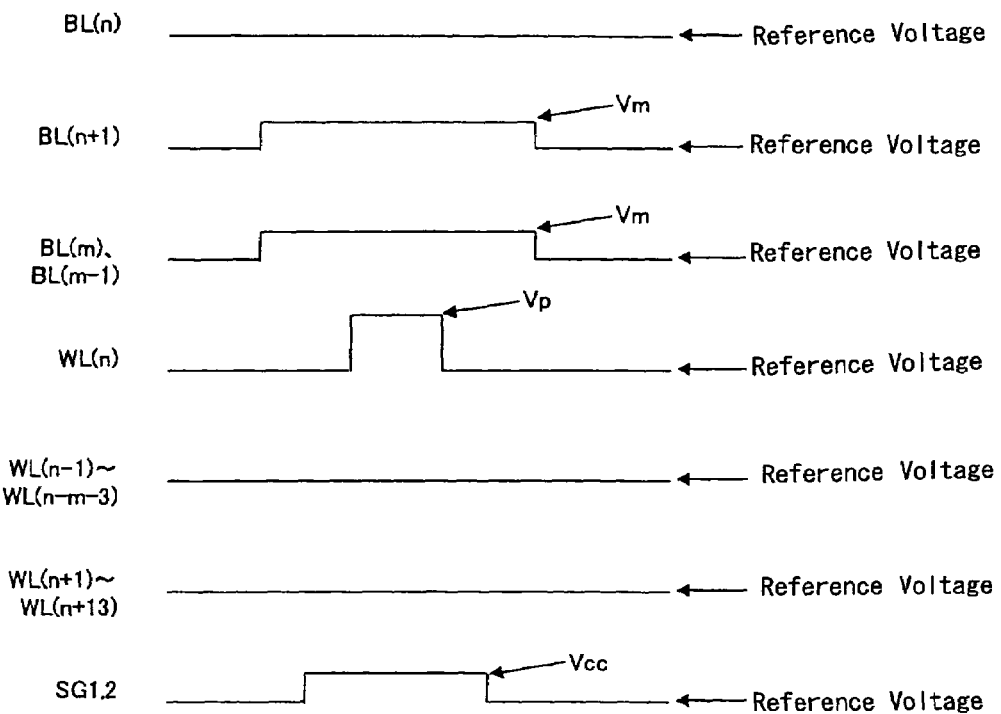
FIG. 101 is a timing chart showing a writing operation of the memory array shown in FIG. 99.

In the case where the protruding semiconductor layers are formed of p-type semiconductor, for example, as shown in the timing chart of FIG. 101, the reference voltage, for example, 0 V is applied to BL(n), a middle voltage Vm, for example, 4.5 V is applied to BL(n+1), BL(m) and BL(m−1) are maintained at the same potential as BL(n+1), a high voltage Vp, for example 9 V, is applied to WL(n) which is the word line of the selected bit, the reference voltage is applied to WL(n−1) to WL(n−m−3) and WL(n+1) to WL(n+13) which are word lines of the non-selected bits, and Vcc, for example 3 V, is applied to SG1 and SG2, in order to write in the selected bit, for example, shown in FIG. 99. As a result of this, write in of the data becomes possible.

Furthermore, an example of the erasure operation due to hot hole injection will be described.

Figure 102:
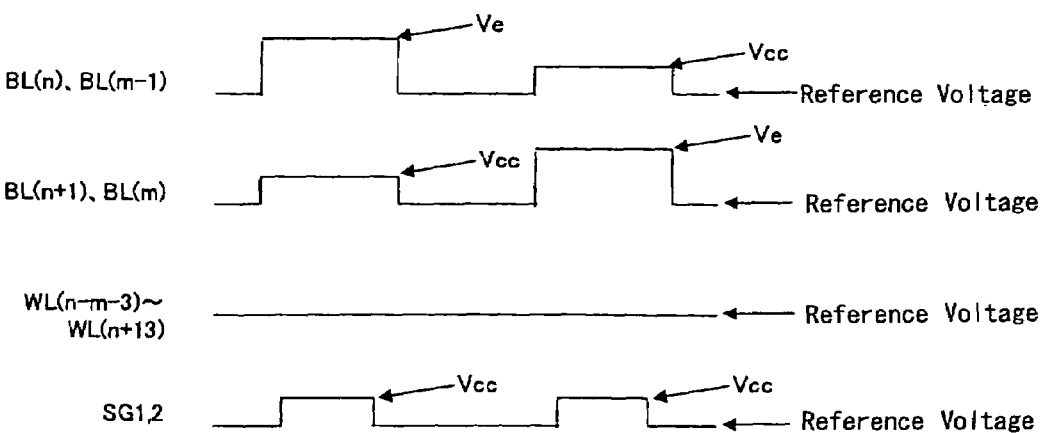
FIG. 102 is a timing chart showing an erasure operation of the memory array shown in FIG. 99.

In the case where the protruding semiconductor layers are formed of p-type semiconductor, for example, as shown in the timing chart of FIG. 102, a high voltage Ve, for example 9 V, is applied to BL(n) and BL(m−1), Vcc, for example 3 V, is applied to BL(n+1) and BL(m), the reference voltage, for example 0 V, is applied to WL(n−m−3) to WL(n+13) and Vcc is applied to SG1 and SG2, in order to carry out a collective erasure of all the memory cells shown in FIG. 99.

Next, Vcc is applied to BL(n) and BL(m−1), high voltage Ve is applied to BL(n+1) and BL(m), the reference voltage is applied to WL(n−m−3) to WL(n+13) and Vcc is applied to SG1 and SG2. As a result of this, erasure of data becomes possible.

Next, a manufacturing method 1 for a semiconductor memory device (the tenth to twenty-second embodiments) according to the present invention will be described.

According to the manufacturing method for a semiconductor memory device, a semiconductor substrate is processed to be in wall form having at least one or more steps, and thereby, protruding semiconductor layers are formed. Then, at least one or more surfaces of these protruding semiconductor layers are defined as active region surfaces and impurity diffusion layers are formed in portions of or the entirety of the upper portions of these protruding semiconductor layers as well as in the semiconductor substrate in a self-aligned manner. Next, charge storage layers made of ONO films are simultaneously formed on the respective active region surfaces and control gates (word lines) are formed so as to be aligned parallel to the direction in which memory cells are connected in series so that the memory cells are placed in matrix form.

In the following, the drawings are referred to for the description.

Figure 120:
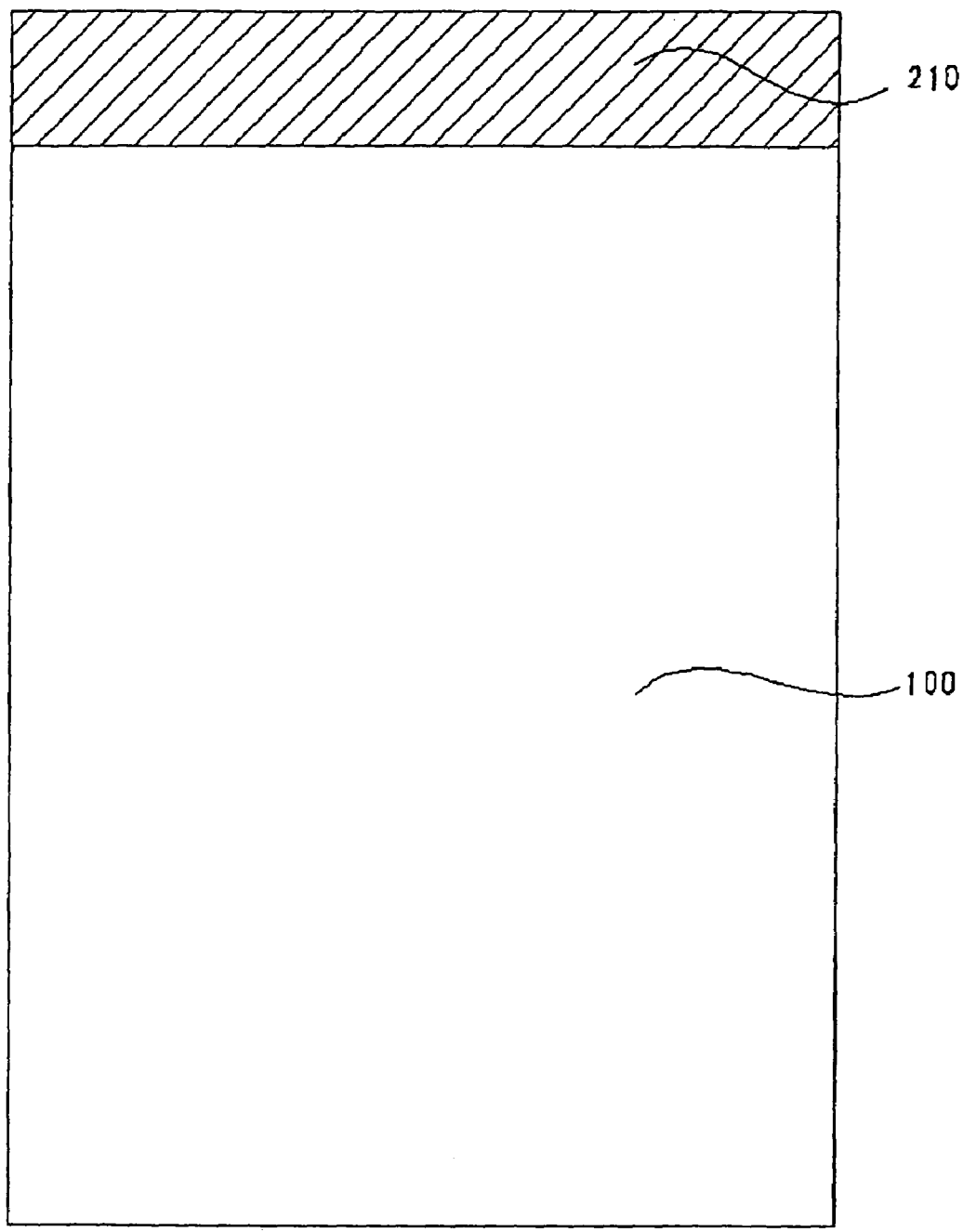
FIGS. 120 to 136 are cross sectional views of the semiconductor memory device taken along line II-II' of FIGS. 103 to 119, respectively.

First, a silicon oxide film 210, which is the first insulating film that becomes a mask layer, is deposited on the surface of a p-type silicon substrate 100, which is the semiconductor substrate, so as to have a thickness of 200 to 2000 nm, and then the silicon oxide film 210 is etched by means of reactive ion etching (see FIGS. 103 and 120) by using the resist (not shown) that has been patterned by means of a known photolithographic technology as a mask. The material of the first insulating film is not limited in particular as long as it is a material which is either not etched or of which the etching rate is lower than that of silicon at the time of the reactive etching of the silicon substrate, and an insulating film such as a silicon nitride film, or a single layer or multiple layered film of a conductive film may be used.

Figure 104:
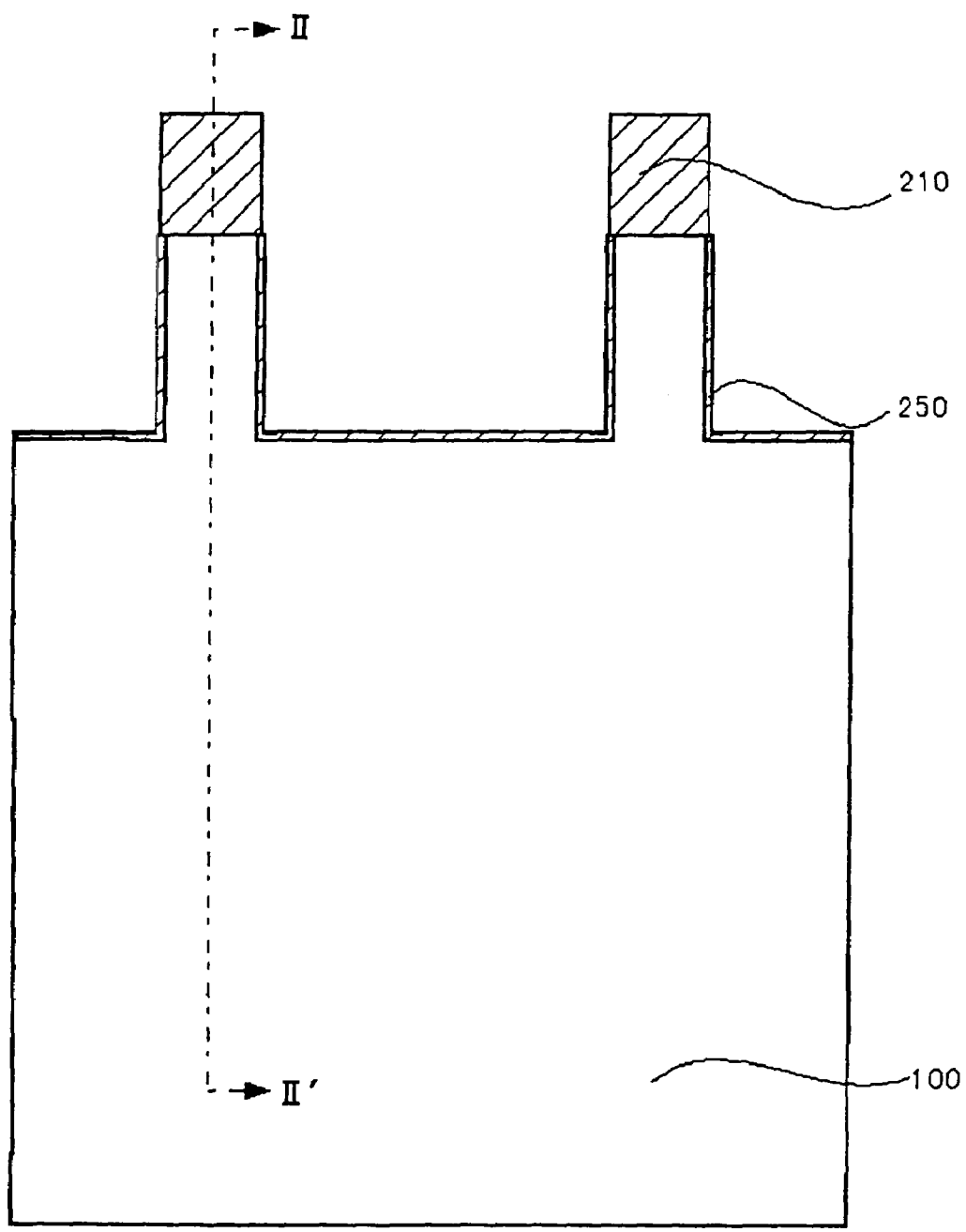
FIGS. 104 to 119 are diagrams for explaining succeeding steps of the manufacturing method 1.
Figure 121:
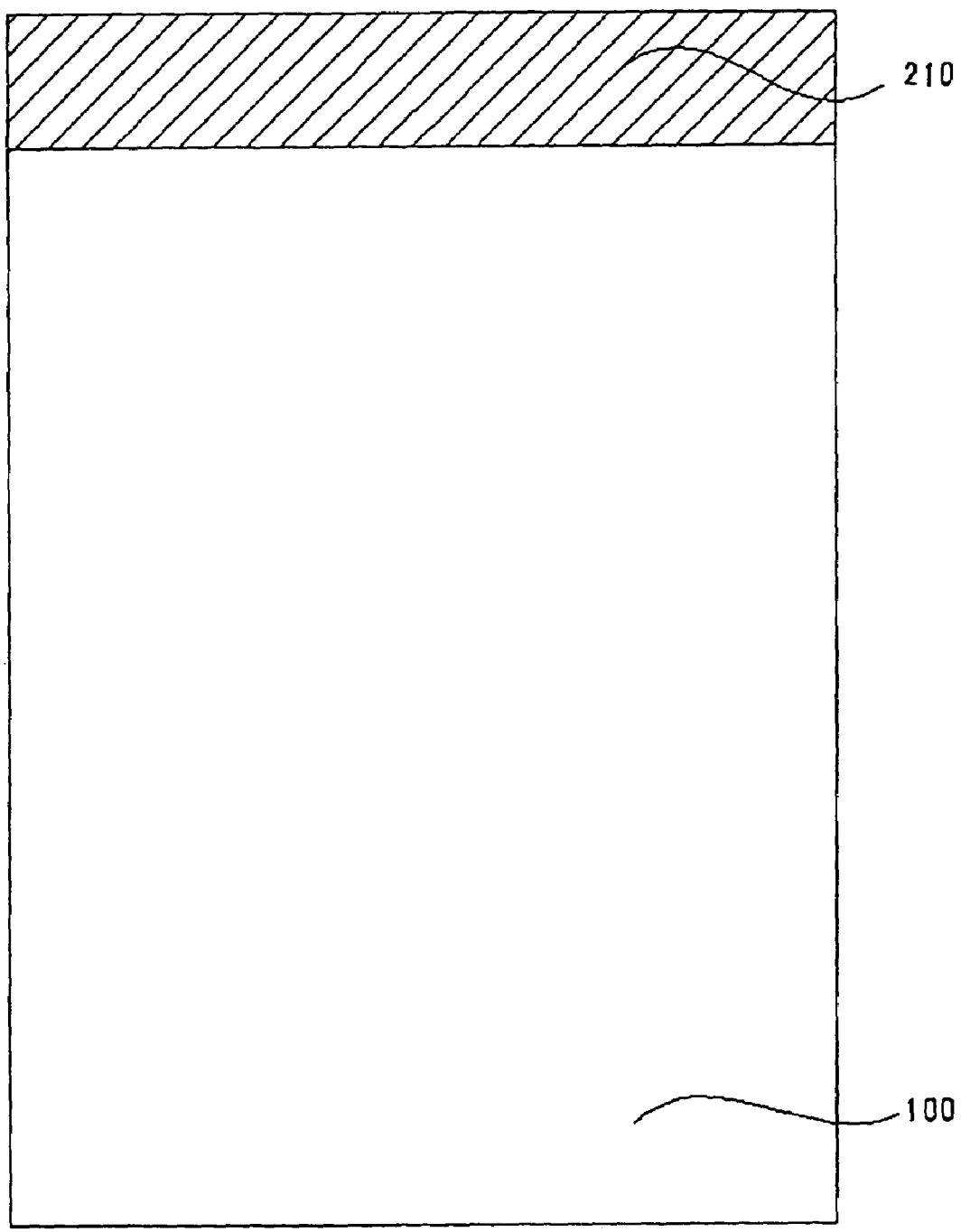

The obtained silicon oxide film 210 is used as a mask so that the silicon substrate 100 is etched by 50 to 5000 nm by means of reactive ion etching, and after that, the exposed portions of the silicon substrate 100 are thermally oxidized so as to form a silicon oxide film 250 with a thickness of 5 to 100 nm, which becomes the second insulating film (FIGS. 104 and 121).

Figure 105:
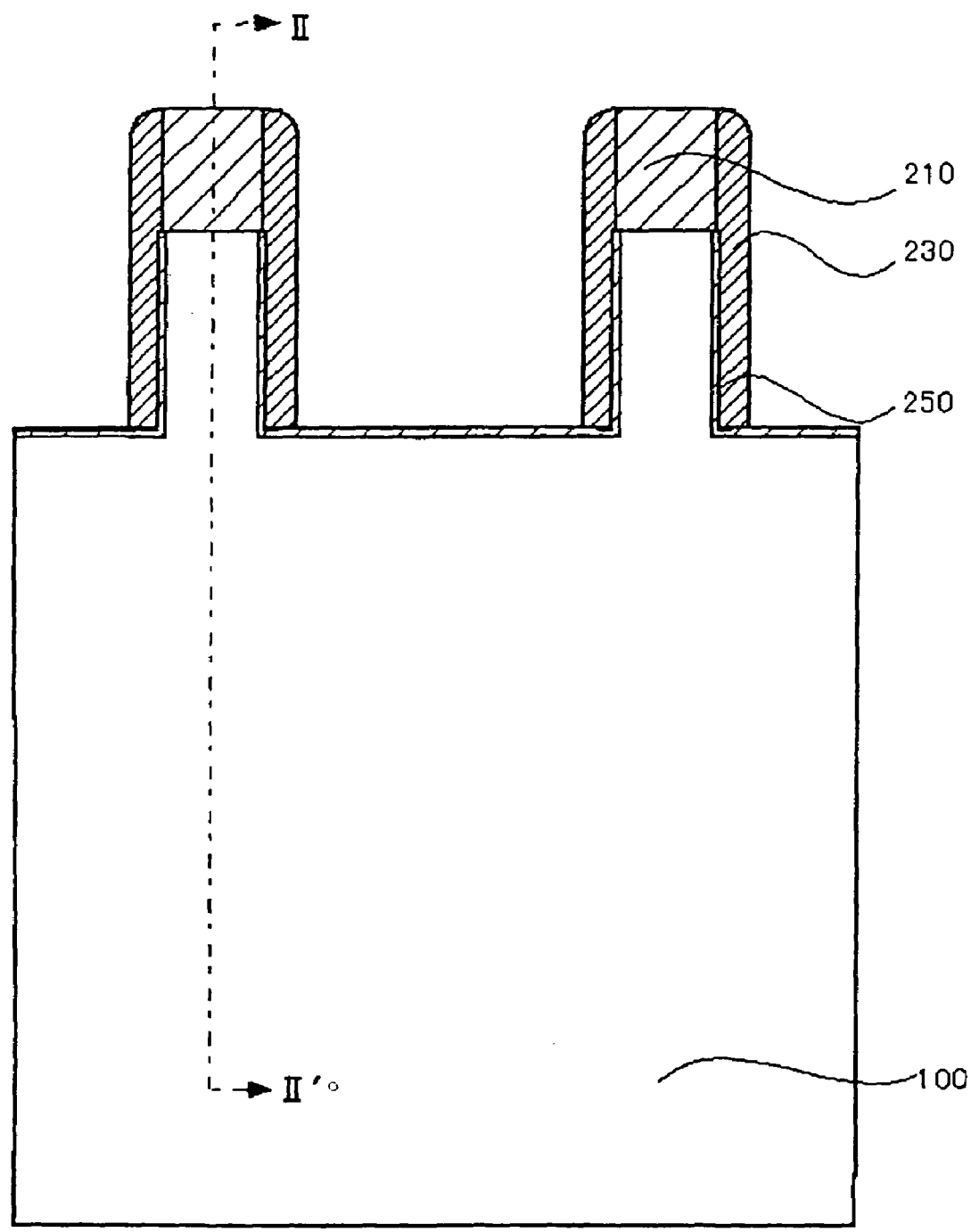
Figure 122:
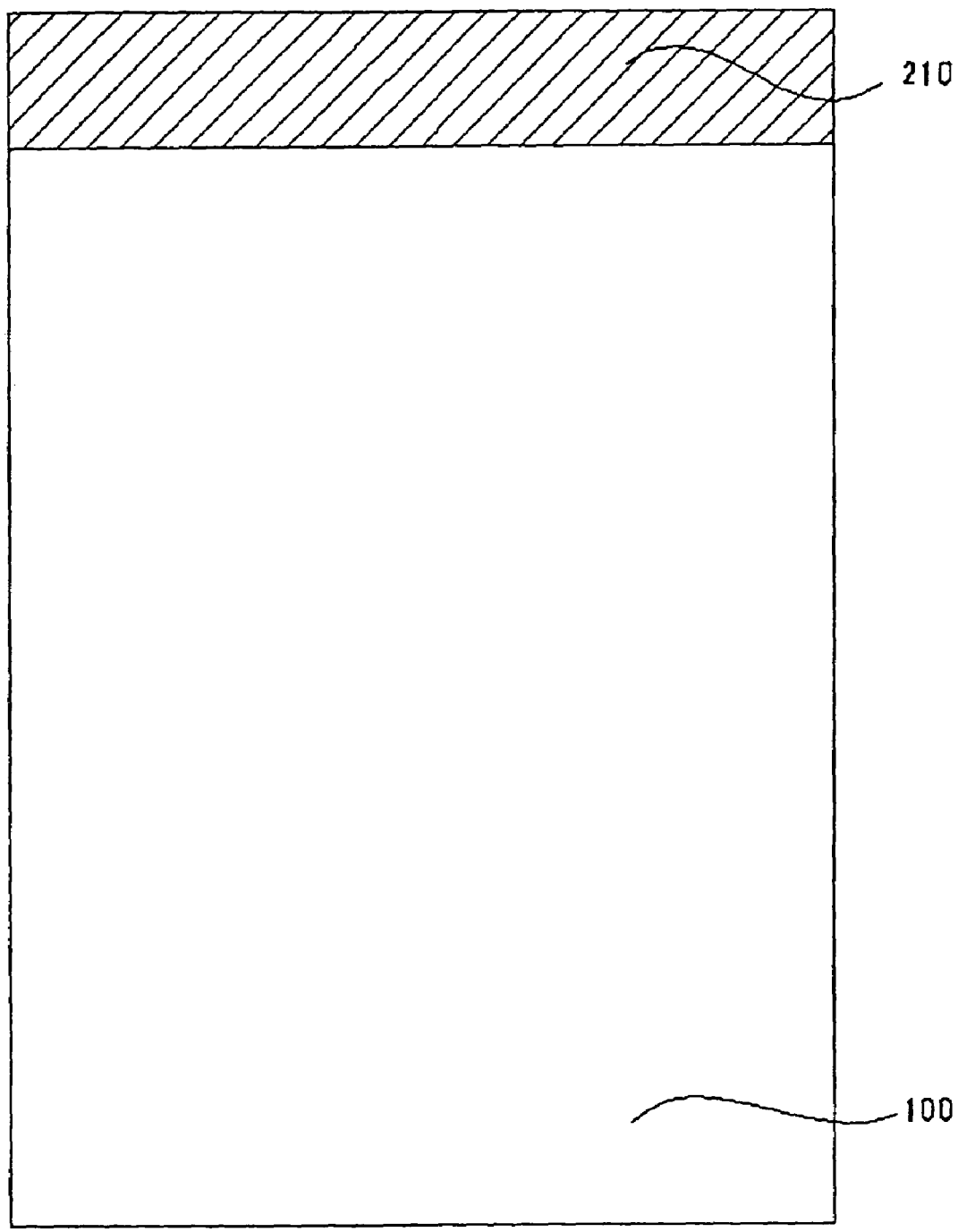

Next, a silicon nitride film 230, which is the third insulating film, is deposited to have a thickness of 10 to 1000 nm, and after that, the silicon nitride film 230 is processed, by means of anisotropic etching, to form sidewall spacers which are placed on the sides of the silicon oxide films 210 and the silicon substrate 100, which has been processed to form walls, via the silicon oxide films 250 (FIGS. 105 and 122).

Figure 106:
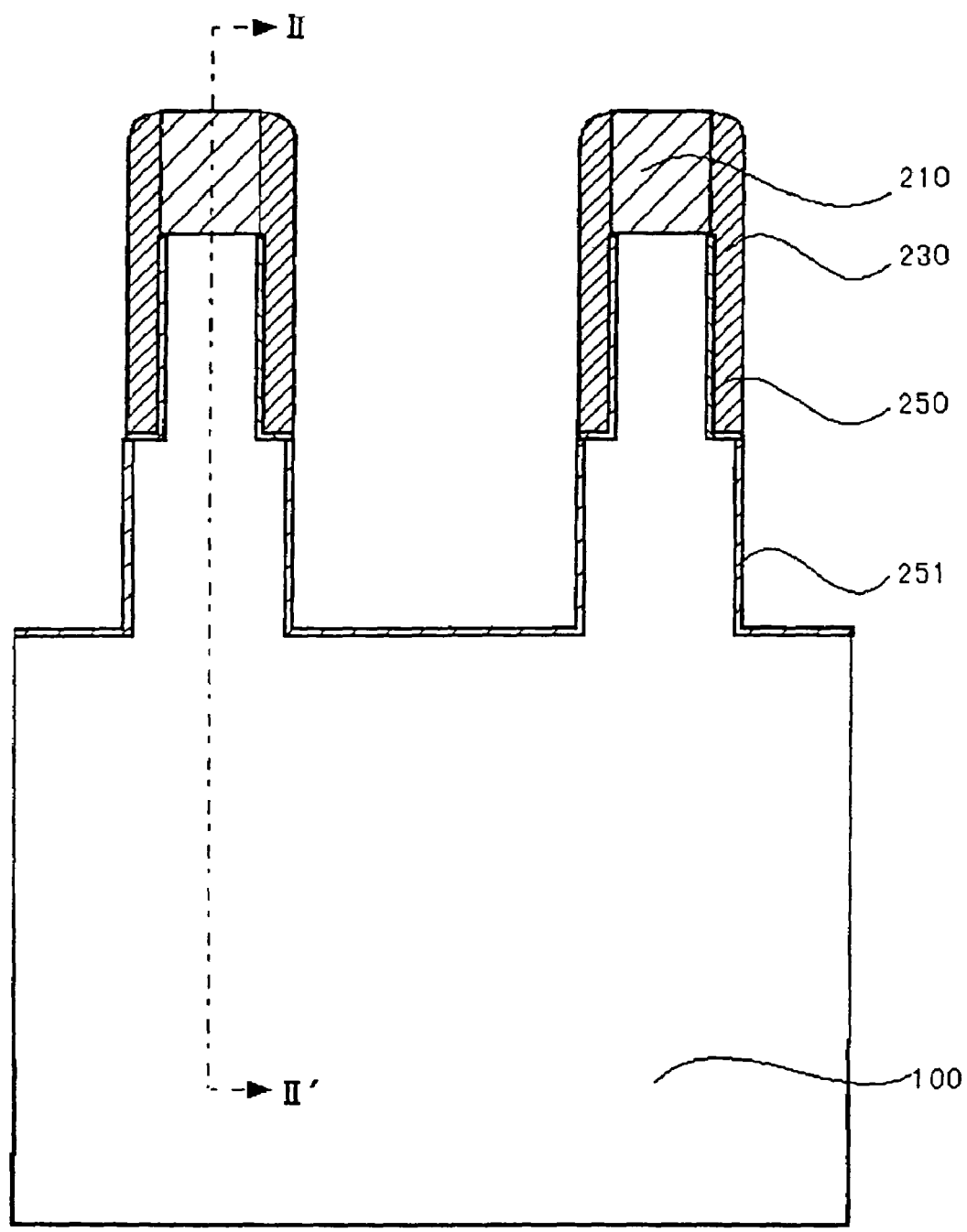
Figure 123:
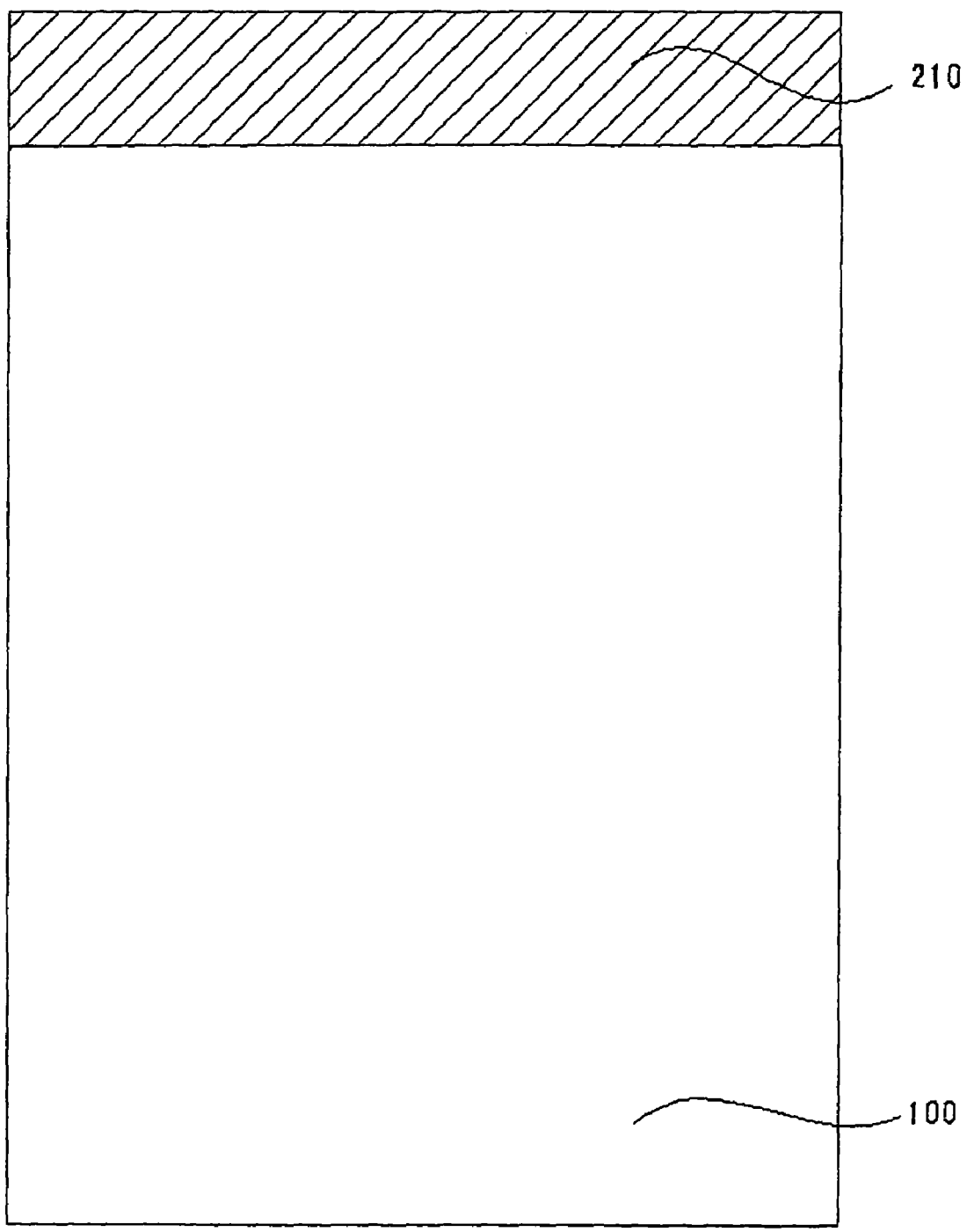

Subsequently, the silicon nitride films 230 are used as a mask so as to remove the silicon oxide films 250 by means of reactive ion etching and then the exposed silicon substrate 100 is etched by 50 to 5000 nm, and thereby, the silicon substrate 100 is processed to form walls. After that, thermal oxidation is carried out on the exposed portions of the silicon substrate 100 so that a silicon oxide film 251, which becomes the second insulating film, is formed to have a thickness of 5 to 100 nm (FIGS. 106 and 123).

Next, a silicon nitride film 231, which is the third insulating film, is deposited to have a thickness of 10 to 1000 nm, and after that, the silicon nitride film 231 is processed, by means of anisotropic etching, to form side wall spacers which are placed on the sides of the silicon oxide films 210, the silicon nitride films 230 and the silicon substrate 100, which has been processed to form walls, via the silicon oxide films 251.

Figure 107:
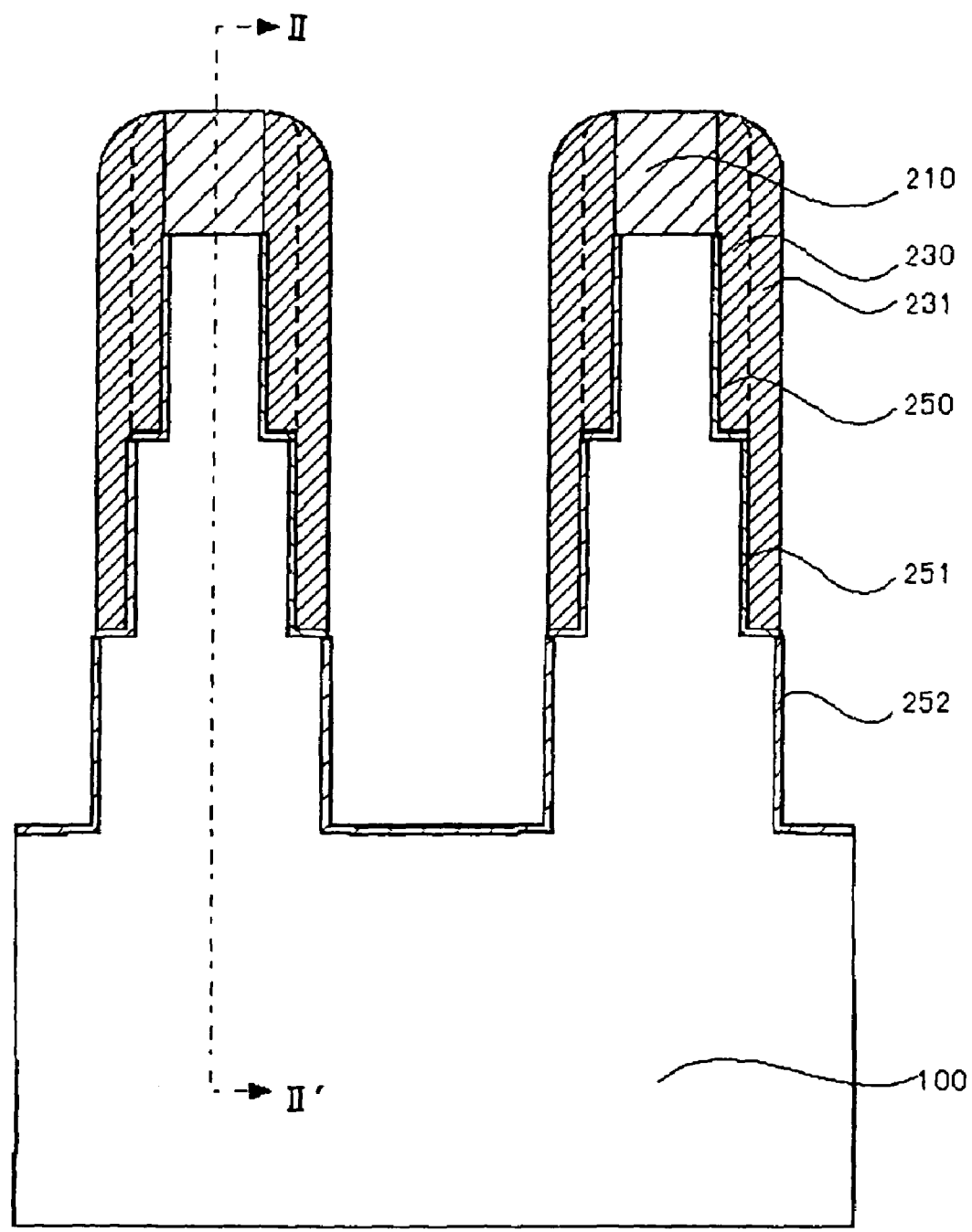
Figure 124:
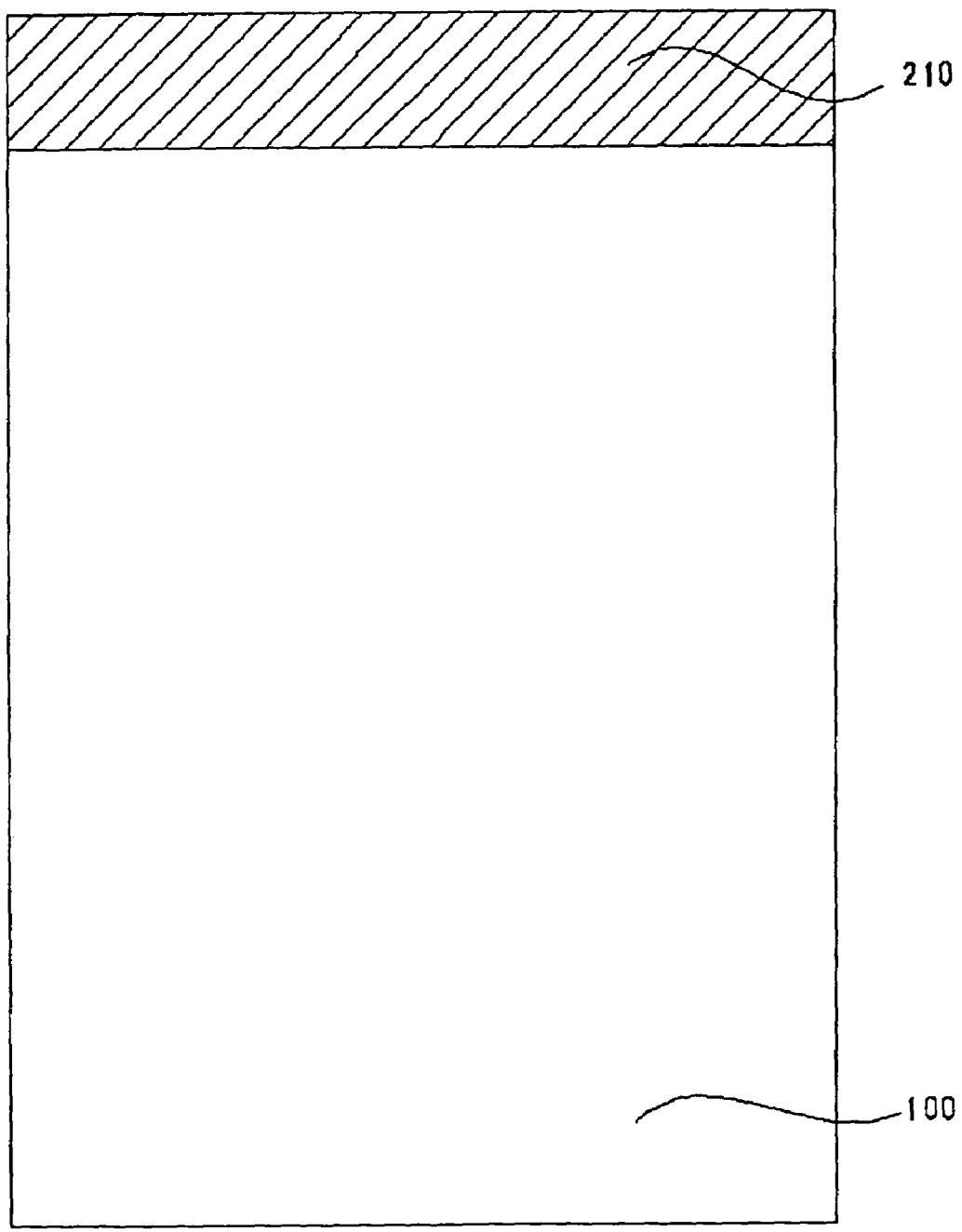

Subsequently, the silicon nitride films 231 are used as a mask to remove the silicon oxide films 251 by means of reactive ion etching and then the exposed silicon substrate 100 is etched by 50 to 5000 nm, and thereby, the silicon substrate 100 is processed to form walls. After that, thermal oxidation is carried out on the exposed portions of the silicon substrate 100, and thereby, a silicon oxide film 252, which becomes the second insulating film, is formed to have a thickness of 5 to 100 nm (FIGS. 107 and 124).

Next, a silicon nitride film 232, which is the third insulating film, is deposited to have a thickness of 10 to 1000 nm, and after that, the silicon nitride film 232 is processed, by means of anisotropic etching, to form side wall spacers which are placed on the sides of the silicon oxide films 210, the silicon nitride films 231 and the silicon substrate 100, which has been processed to form walls, via the silicon oxide films 252.

Subsequently, the silicon nitride films 232 are used as a mask to remove the silicon oxide films 252 by means of reactive ion etching and then the exposed silicon substrate 100 is etched by 50 to 5000 nm, and thereby, the silicon substrate 100 is processed to form walls.

According to the above described process, the silicon substrate 100 is processed to form walls having steps, which are a plurality of separate protruding semiconductor layers 110.

Figure 108:
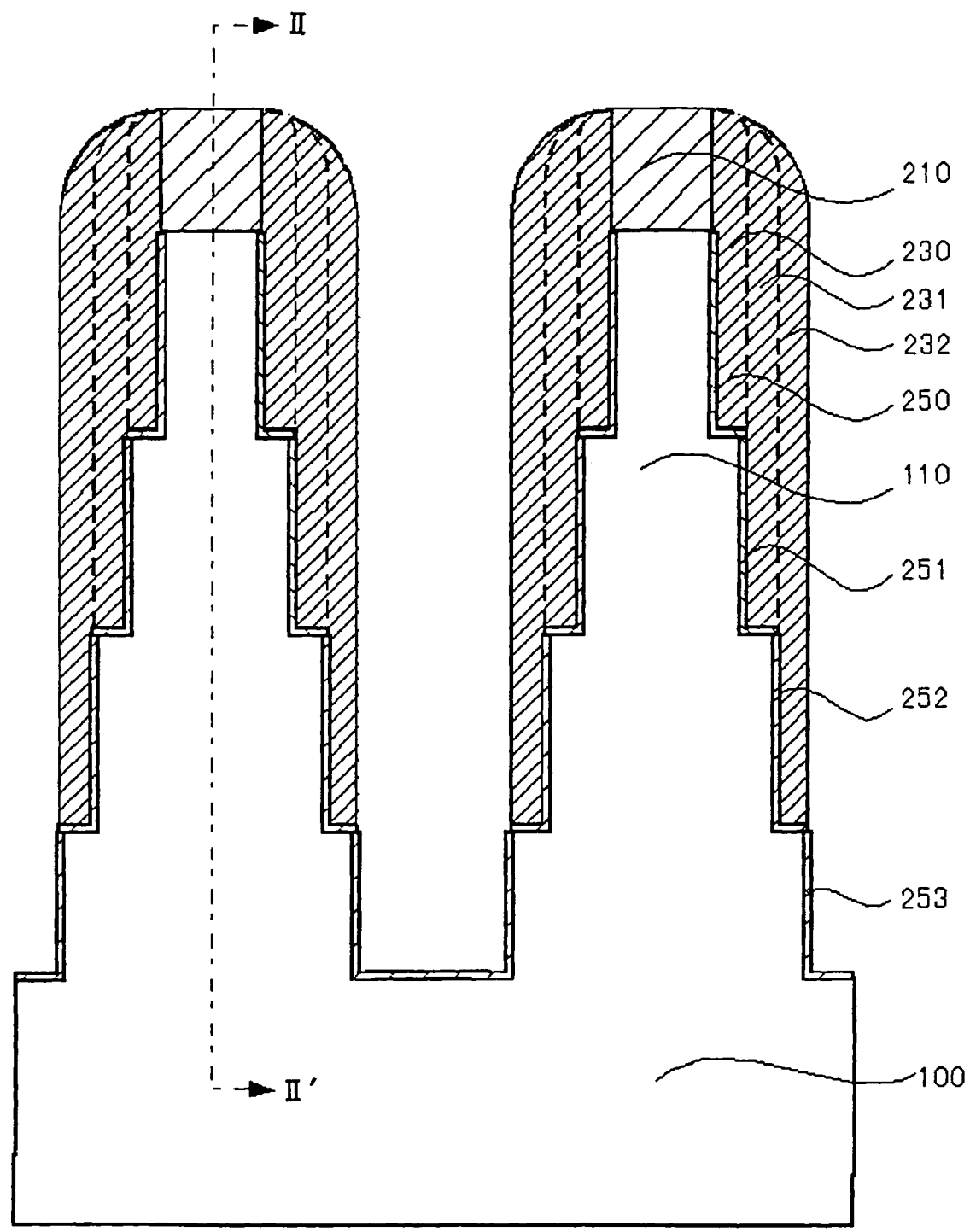
Figure 125:
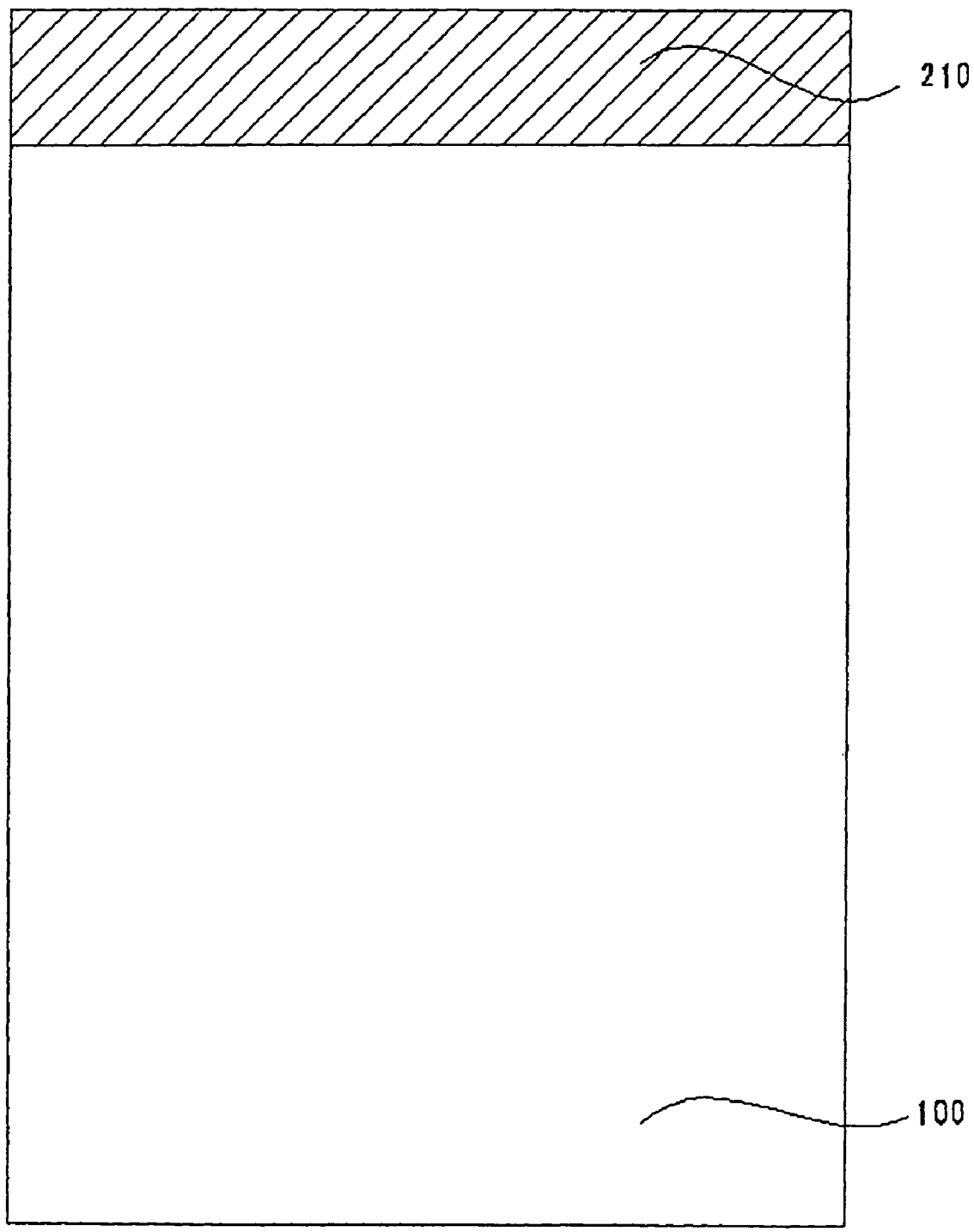

After that, thermal oxidation is carried out on the exposed portions of the silicon substrate 100, and thereby, a silicon oxide film 253 which is the second insulating film is formed to have a thickness of 5 to 100 nm (FIGS. 108 and 125). Here, the second insulating film may be formed by means of the CVD method, or may be formed as a single layer or multiple layer of an insulating film such as a silicon nitride film. In addition, the silicon oxide film 253, which is the second insulating film, may not necessarily be formed.

Figure 109:
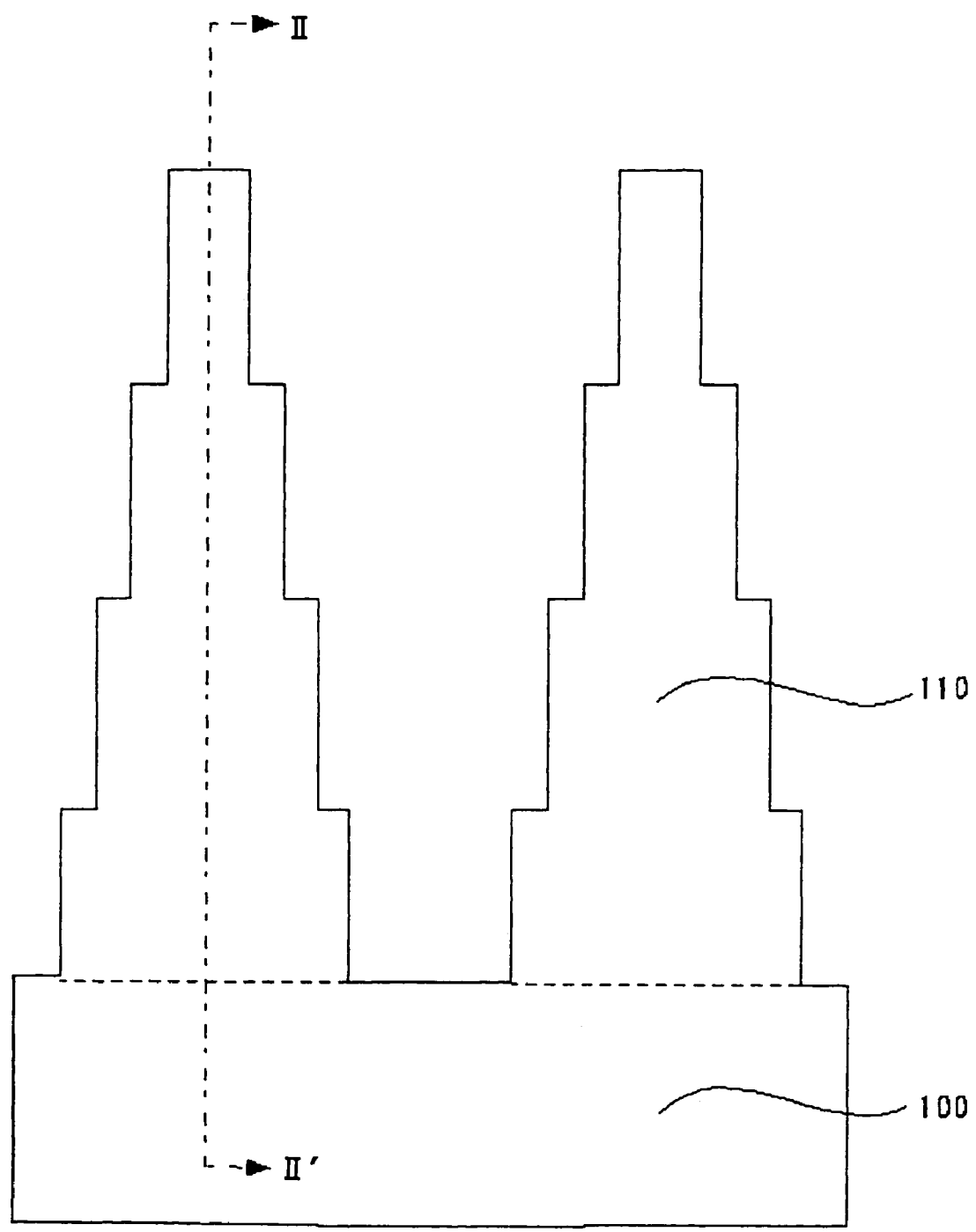
Figure 126:
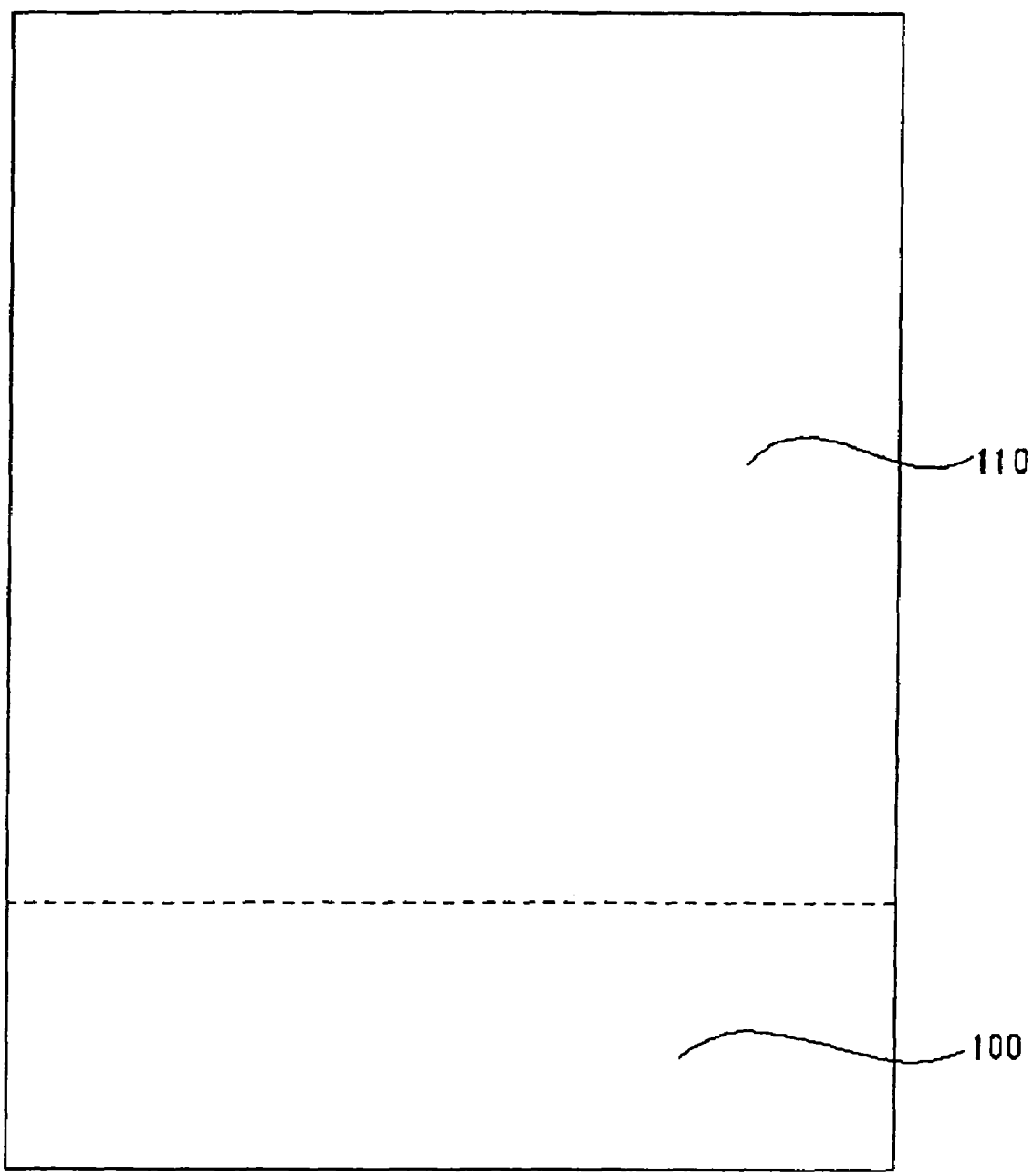

Subsequently, the silicon nitride films 230, 231 and 232 as well as the silicon oxide films 250, 251, 252 and 253 are selectively removed by means of isotropic etching (FIGS. 109 and 126).

Figure 110:
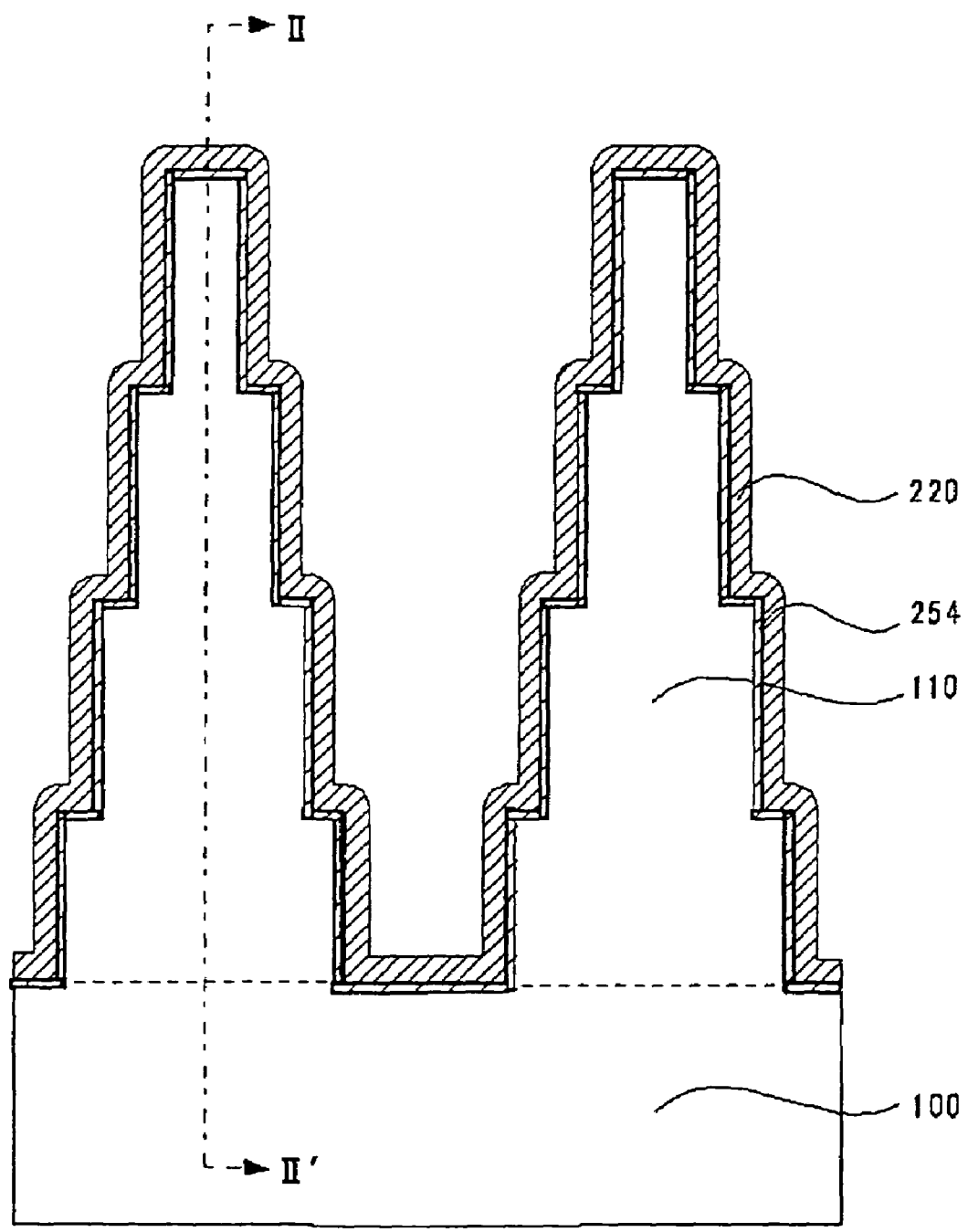
Figure 127:
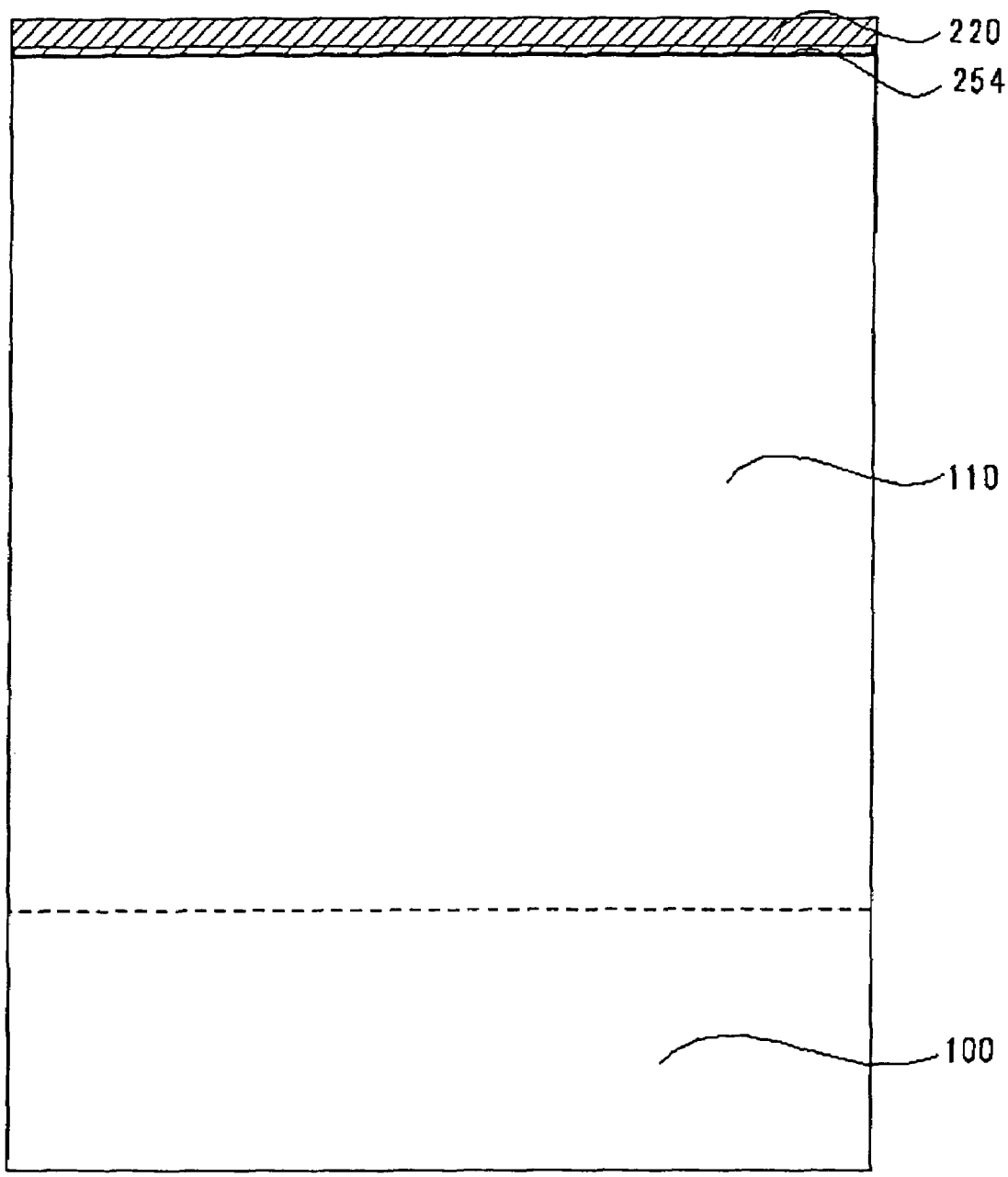

The obtained silicon substrate 100 is thermally oxidized so as to form a silicon oxide film 254 with a thickness of 5 to 100 nm, which is the fourth insulating film, and on top of that a silicon nitride film 220, which is the fifth insulating film, is deposited to have a thickness of 10 to 1000 nm (FIGS. 110 and 127).

Figure 111:
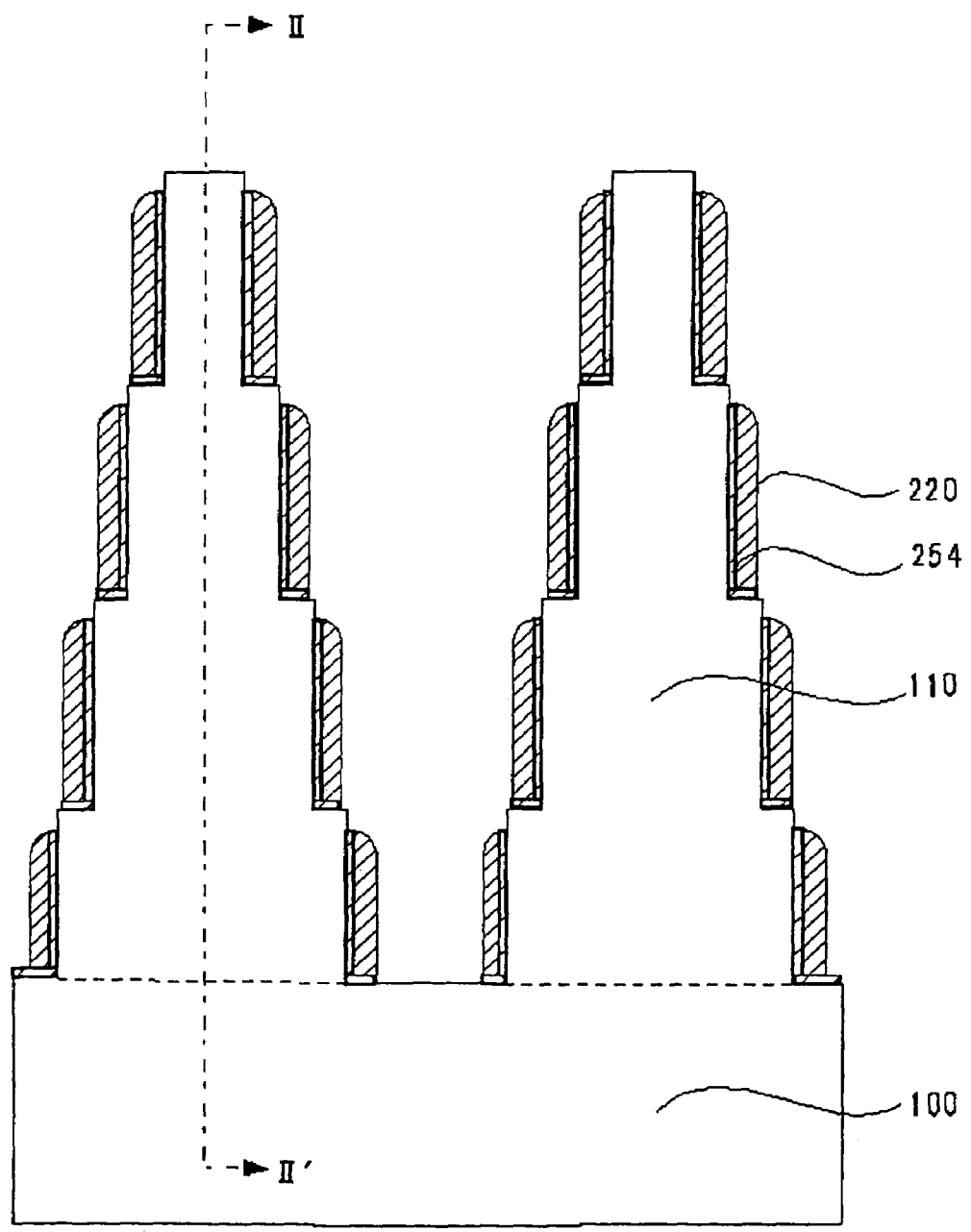
Figure 128:
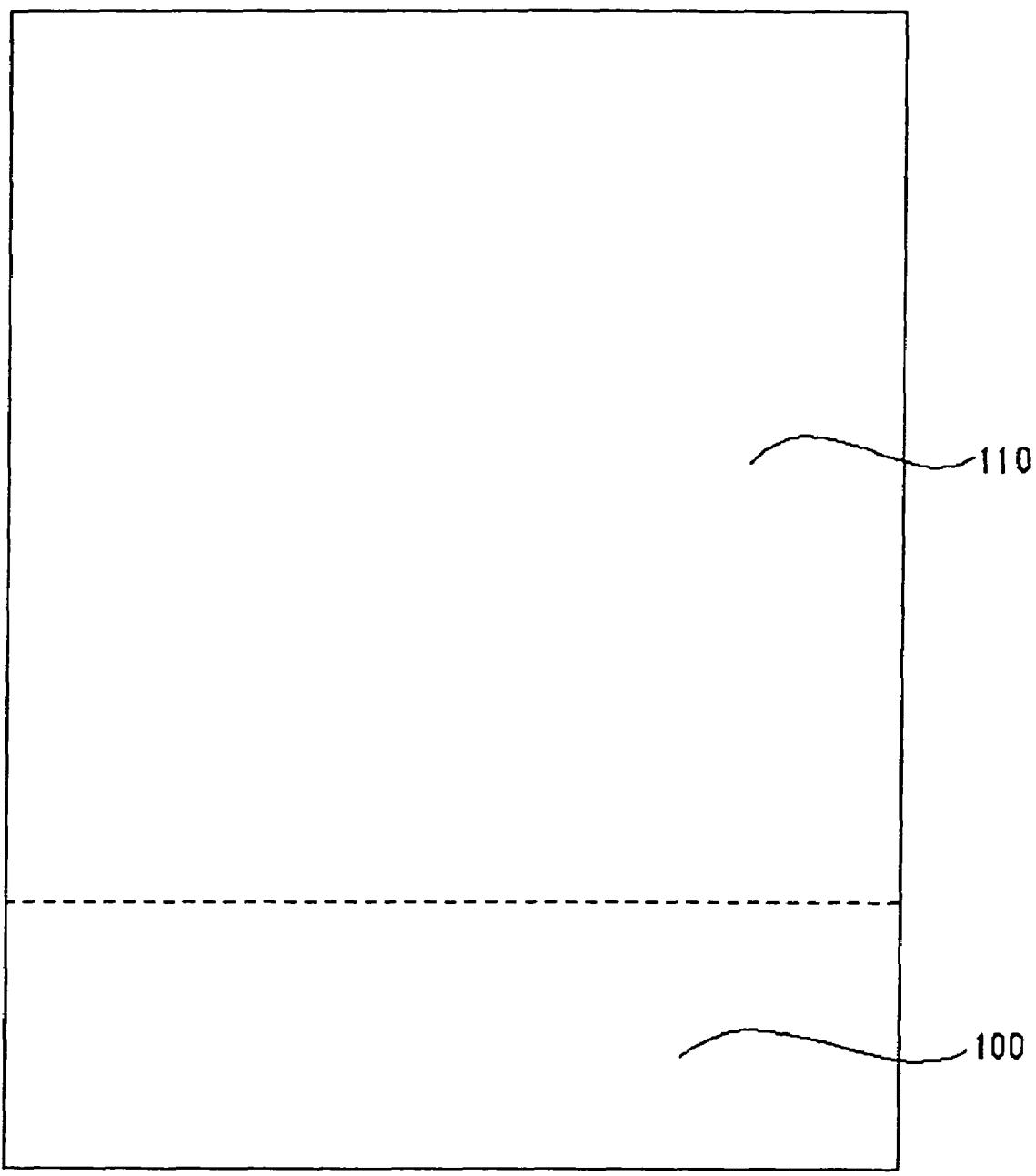

After that, the silicon nitride film 220 is processed, by means of anisotropic etching, to form side wall spacers that are placed on the sides of the silicon substrate 100, which has been processed to form walls (FIGS. 111 and 128).

Figure 112:
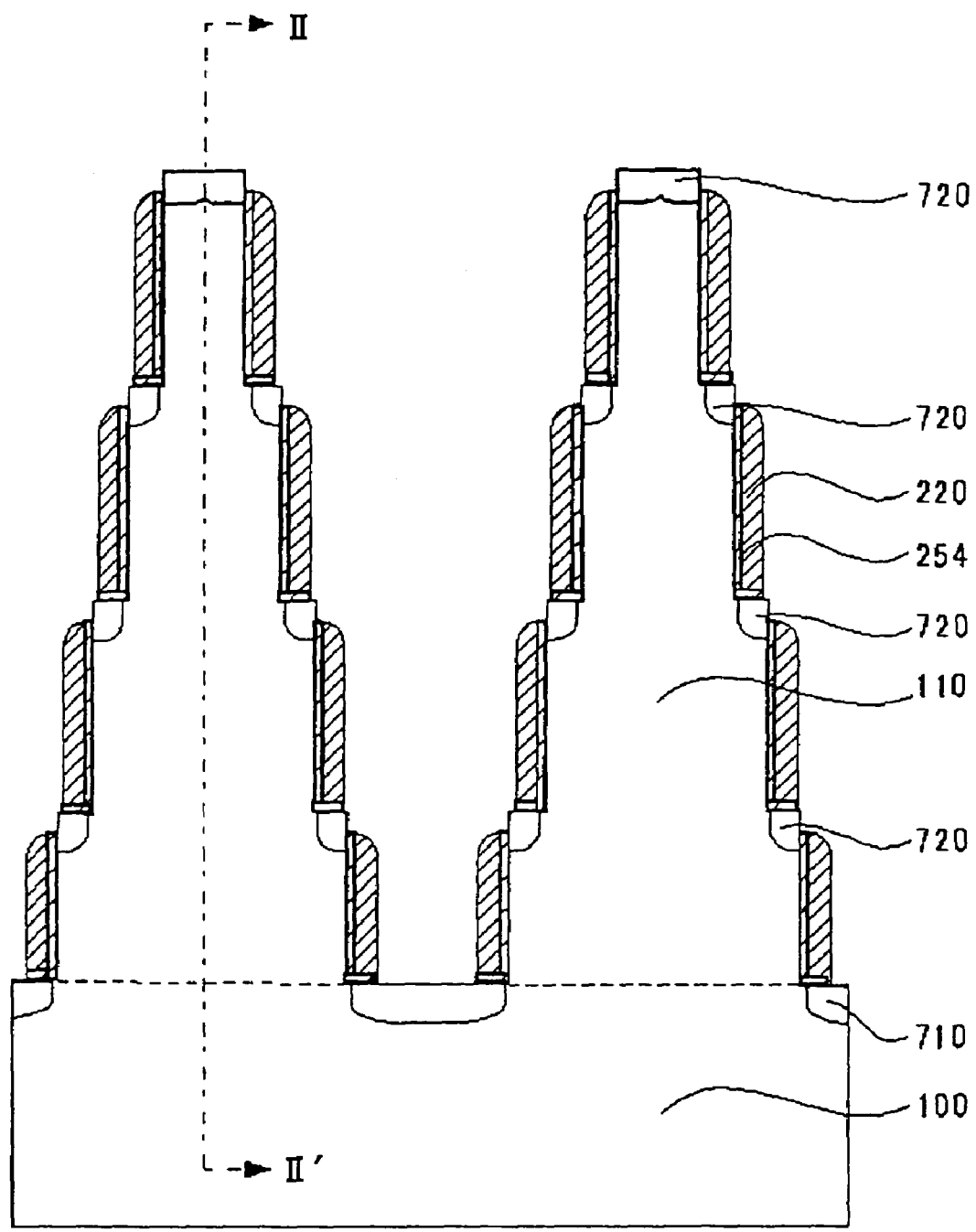
Figure 129:
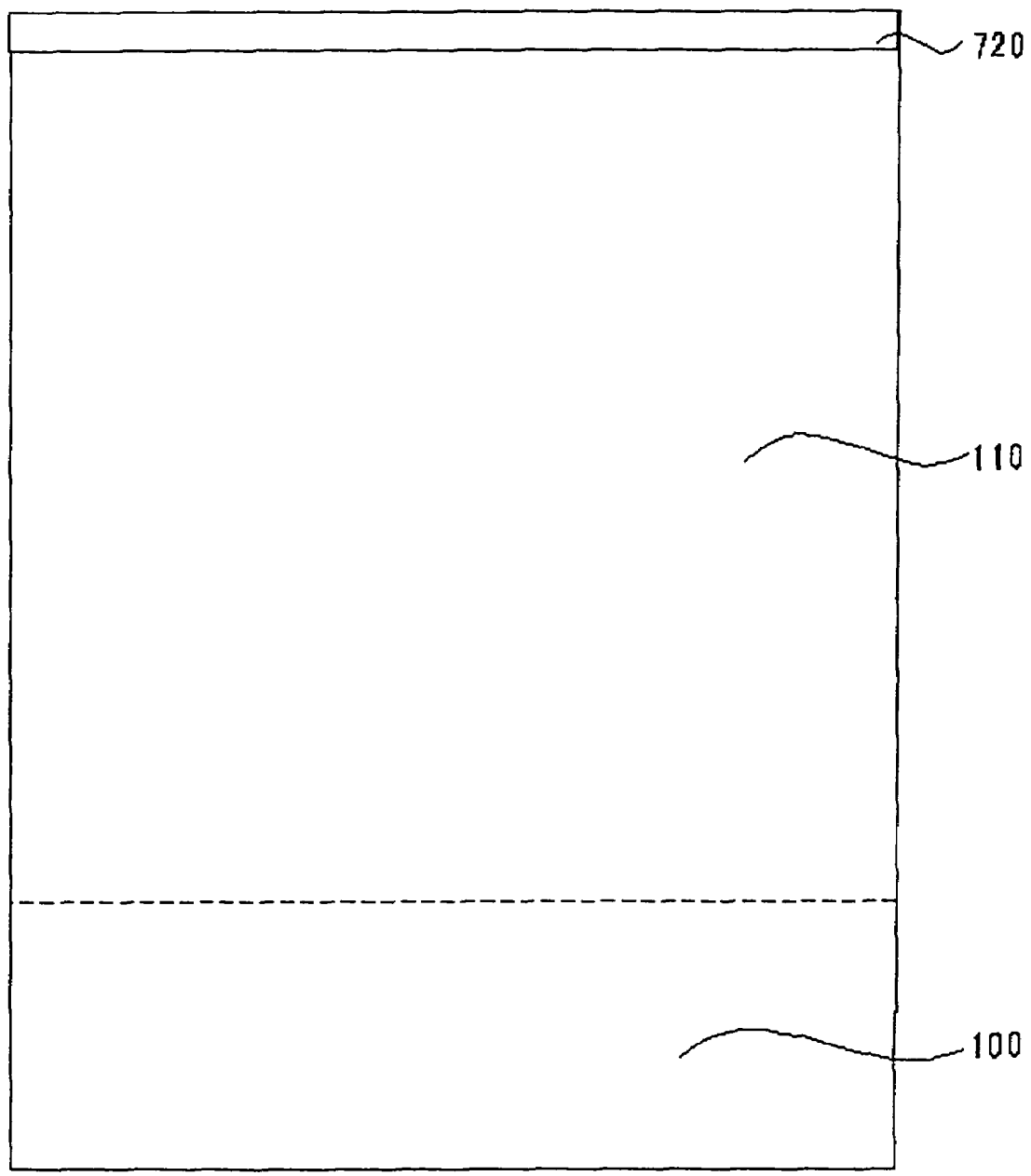

Subsequently, impurities are introduced into portions of or the entirety of the upper portions and the corners of the protruding semiconductor layers 110 as well as into the silicon substrate 100 so as to form n-type impurity diffusion layers 720 and 710 (FIGS. 112 and 129). This impurity introduction can be carried out by implanting ions of arsenic or phosphorus with injection energy of 5 to 100 keV in the direction perpendicular to the substrate with an inclination of 0° to 7°, so that the dose becomes approximately $1\times10^{12}$/cm$^2$ to $1\times10^{17}$/cm$^2$.

Figure 113:
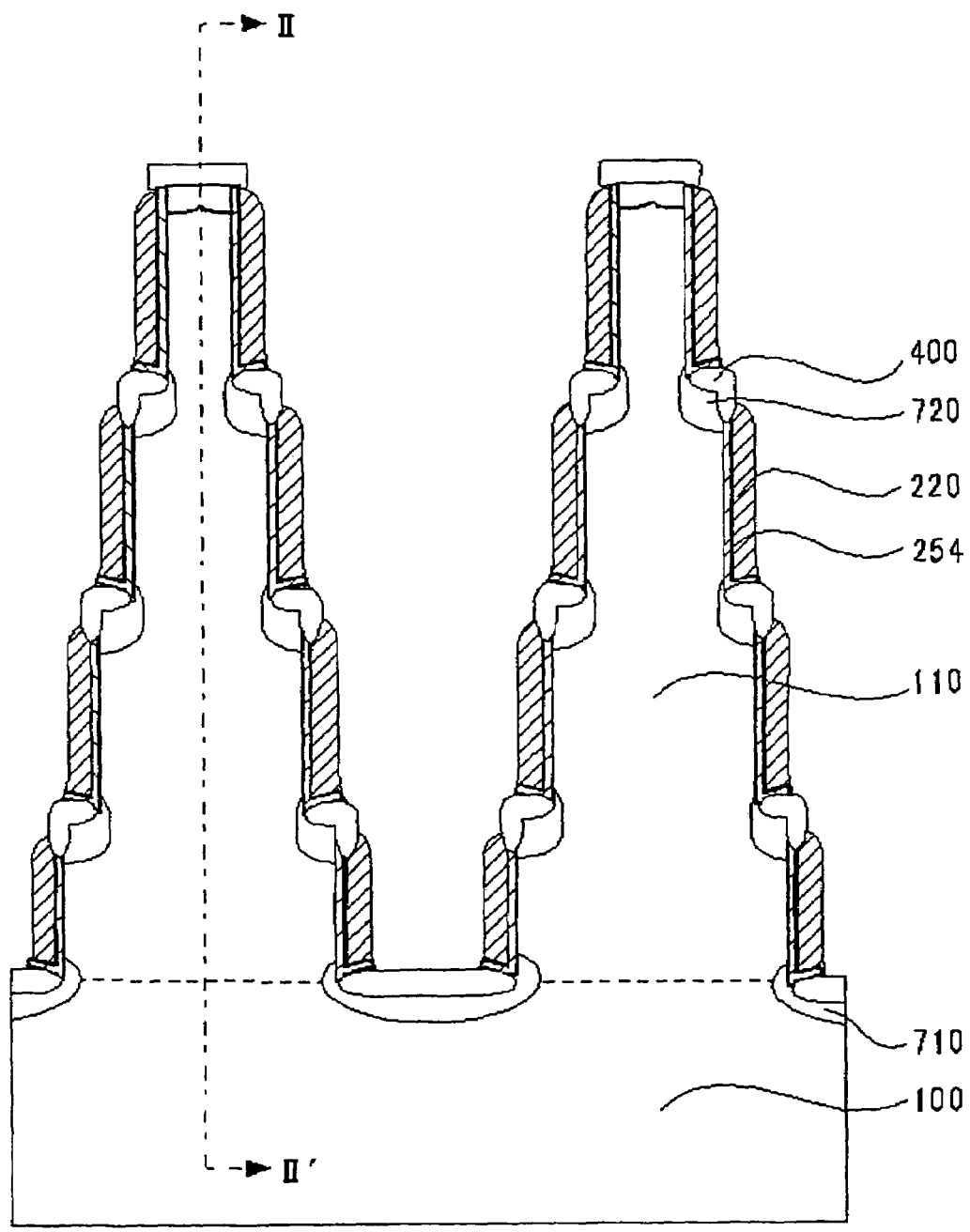
Figure 130:
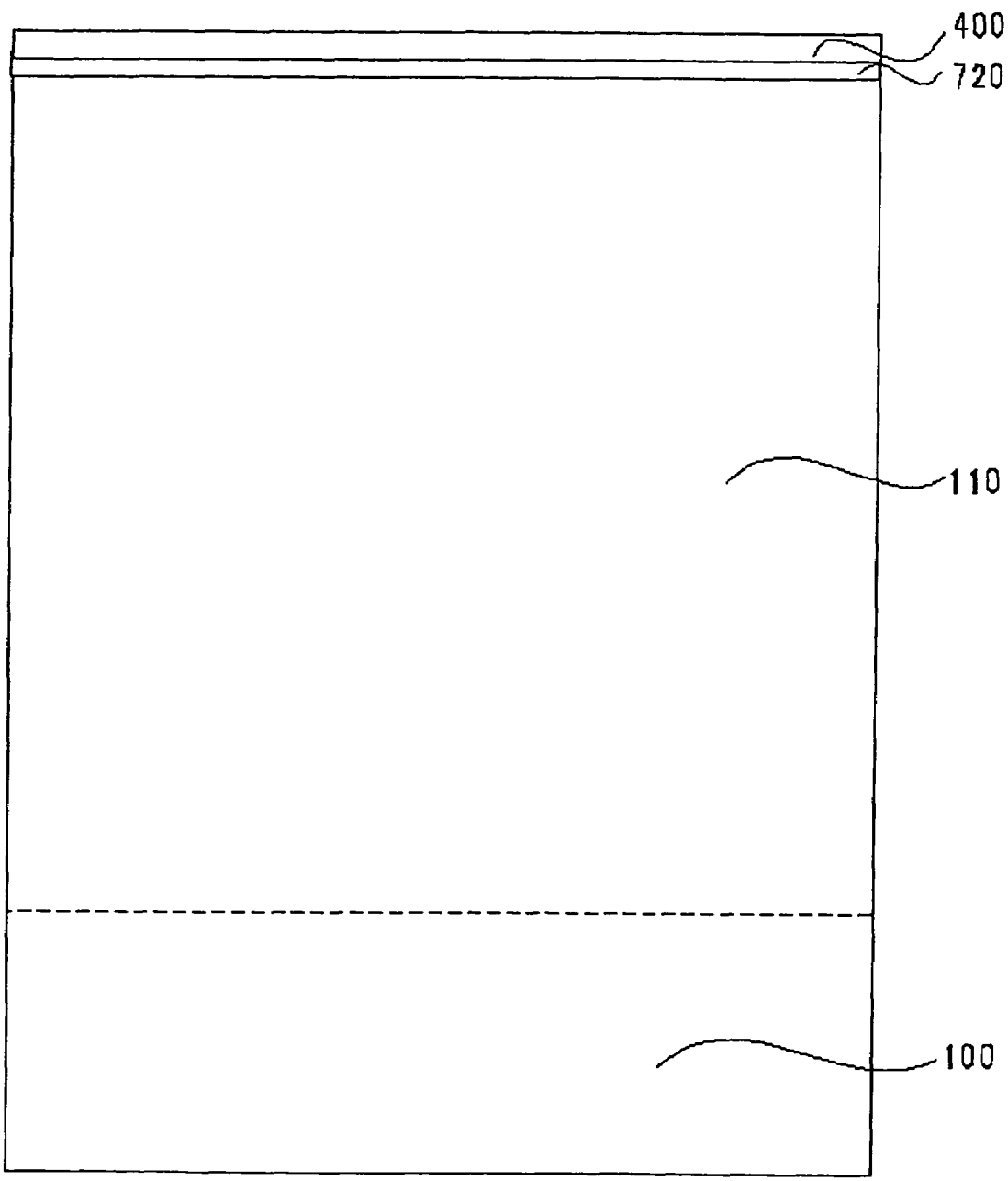

After that, a silicon oxide film 400, which is the sixth insulating film, is formed on portions of or the entirety of the upper portions of and corners of protruding semiconductor layers 110 as well as on the surface of the silicon substrate 100, according to the thermal oxidation method, so as to have a thickness of 10 to 500 nm as an element isolation film (FIGS. 113 and 130). Here, the element isolation film may be formed according to any method, such as the CVD method.

Figure 114:
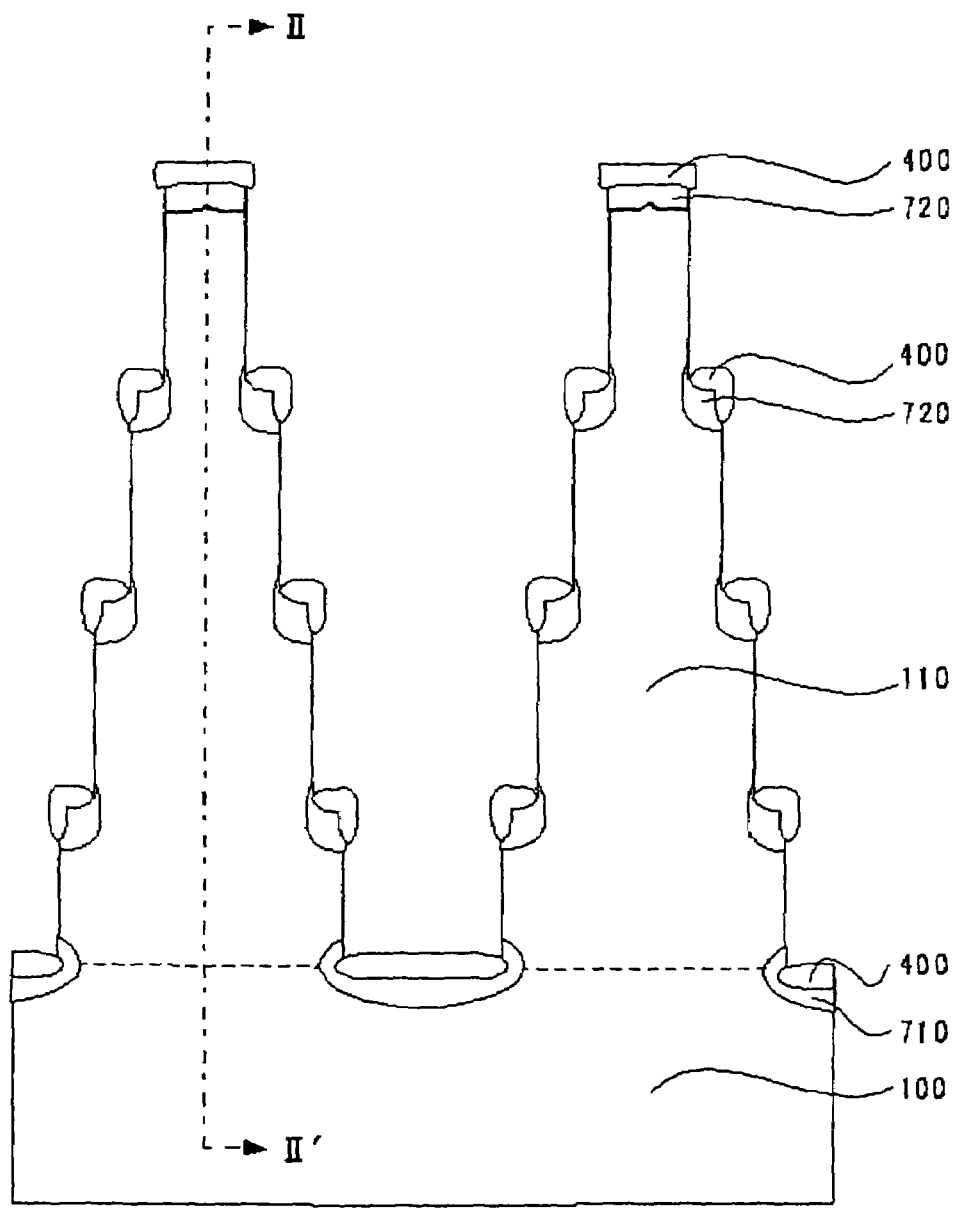
Figure 131:
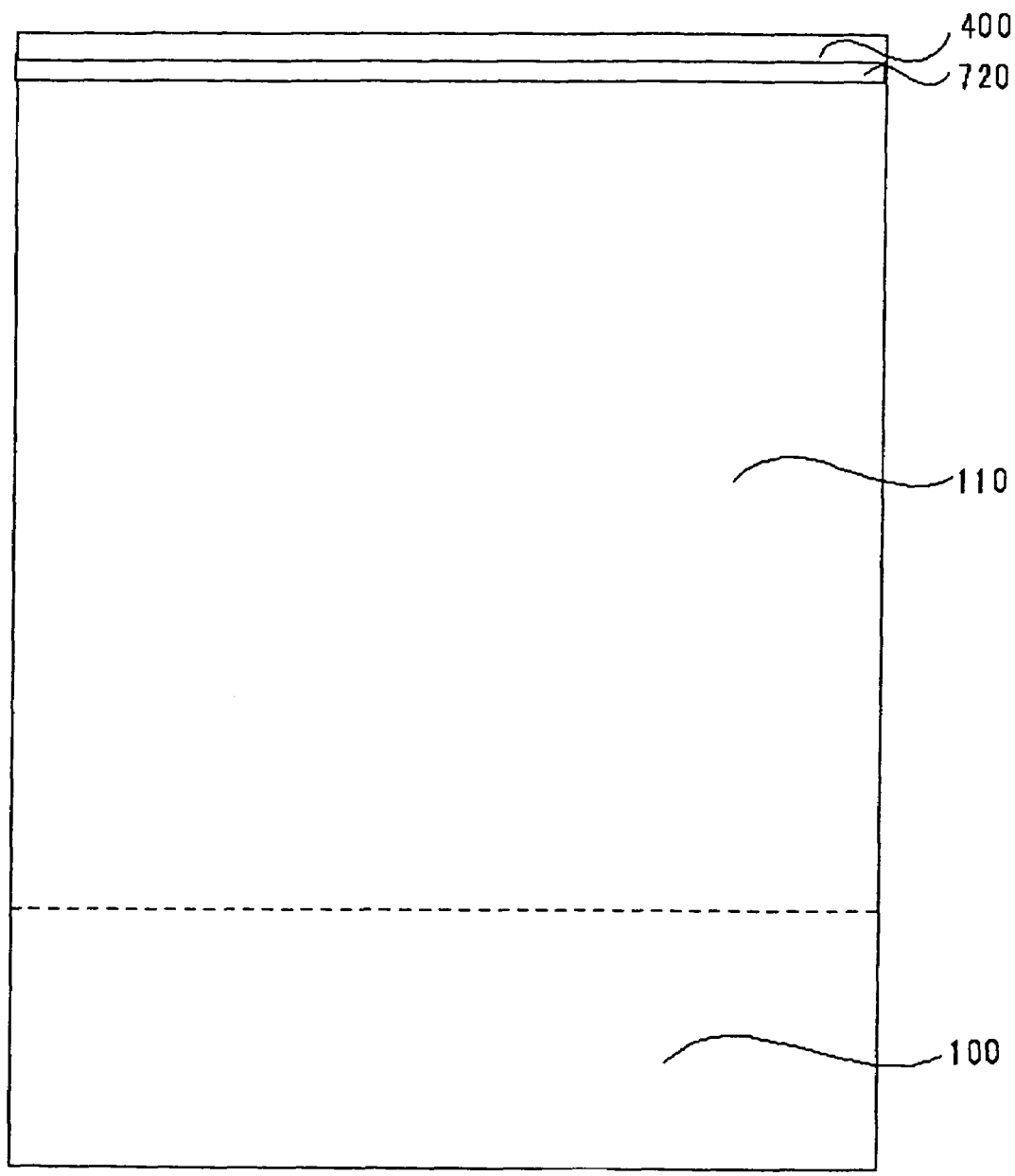

Next, the silicon nitride film 220 are selectively removed to a memory cells forming region by means of isotropic etching (FIGS. 114 and 131) so as to the plurality of memory cells are aligned to a longitudinal direction of a side surface of the steps of the protruding semiconductor layers 110. A channel ion implantation into the sides of each protruding semiconductor layer 110 is carried out by utilizing an inclined ion implantation if necessary. This channel ion implantation can be carried out in the direction perpendicular to the substrate with an inclination of 5° to 45° with an implantation energy of from 5 to 100 keV so that a dose of boron becomes approximately $1 \times 10^{11}/cm^2$ to $1 \times 10^{13}/cm^2$. It is preferable to carry out a channel ion implantation in multiple directions relative to the protruding semiconductor layers 110 in order to make the surface impurity concentration uniform. In place of the channel ion implantation, an oxide film that includes boron may be deposited by means of the CVD method so as to utilize the diffusion of boron from this oxide film. Here, the introduction of the impurity into the protruding semiconductor layers 110 may be carried out before the formation of the protruding semiconductor layers 110, and the means and the time thereof are not limited as long as the distribution of the impurity concentration becomes the same as those according to these methods.

Figure 115:
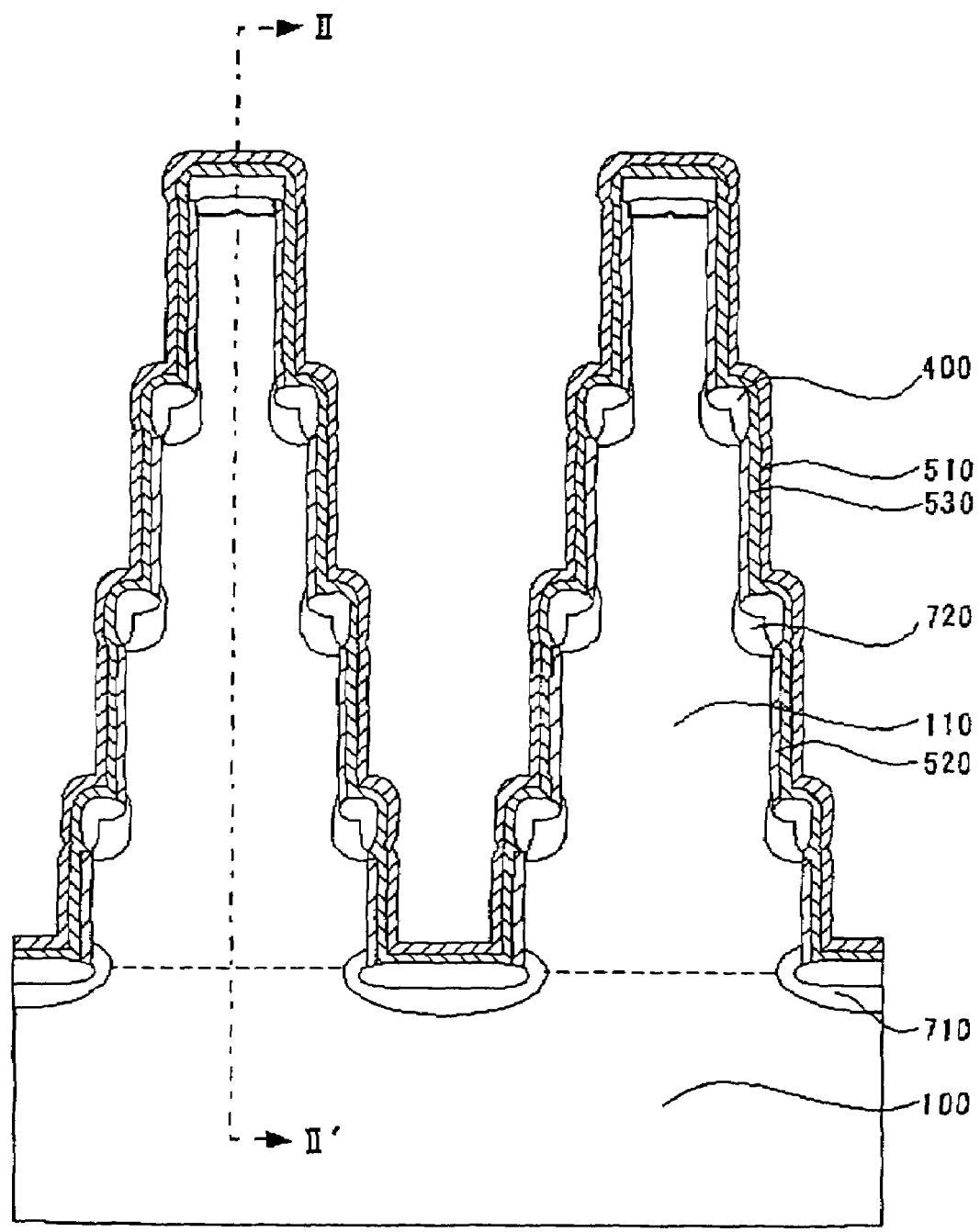
Figure 132:
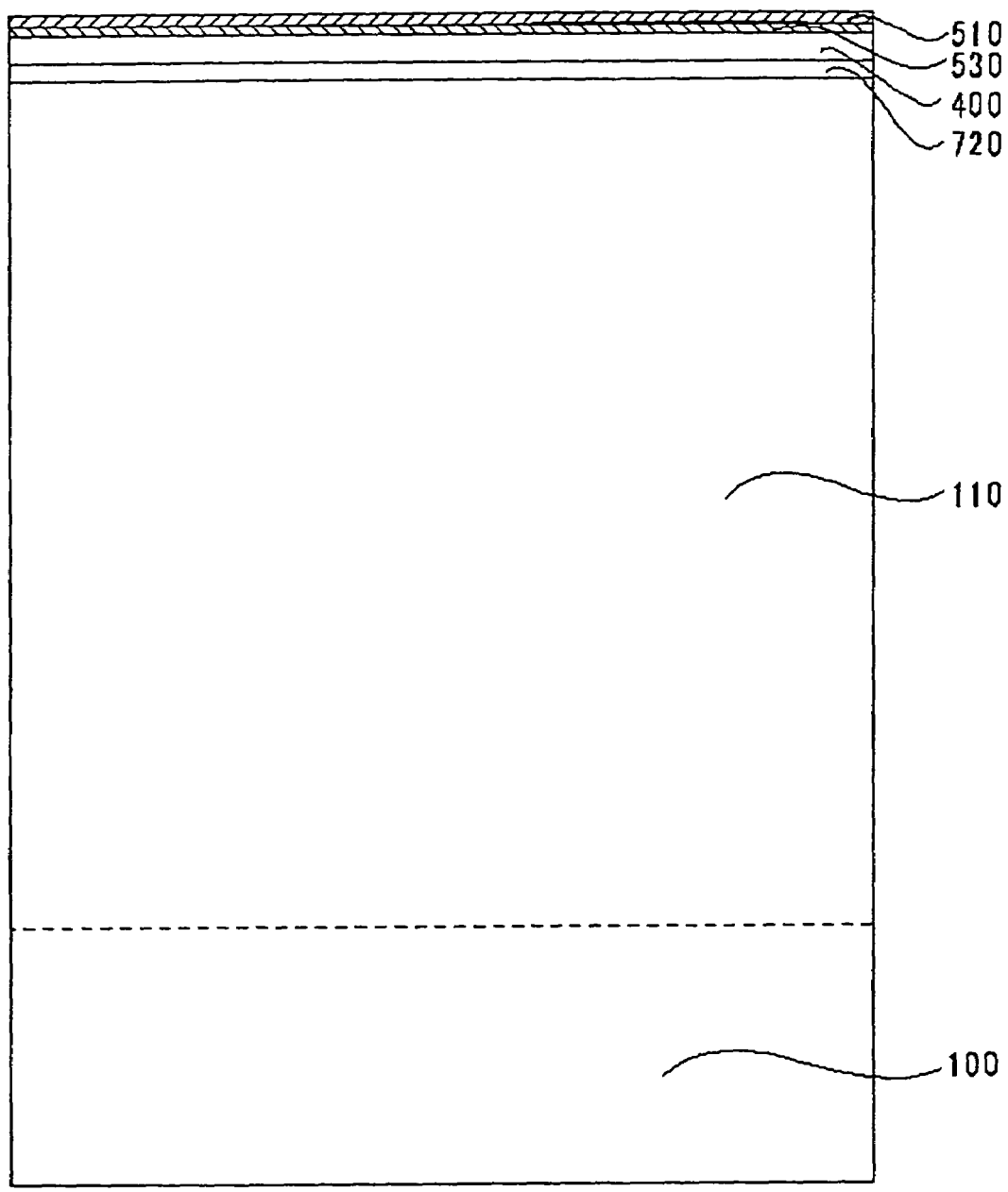

Subsequently, a silicon oxide film 520, which is the seventh insulating film, is formed as a tunnel oxide film so as to have a thickness of approximately 10 nm around the periphery of each protruding semiconductor layer 110 using the thermal oxidation method. On top of this, a silicon nitride film 530 is deposited as the eighth insulating film so as to have a thickness of from approximately 5 to 100 nm, and furthermore a silicon oxide film 510 is deposited as the ninth insulating film so as to have a thickness of from 5 to 100 nm (FIGS. 115 and 132).

Figure 116:
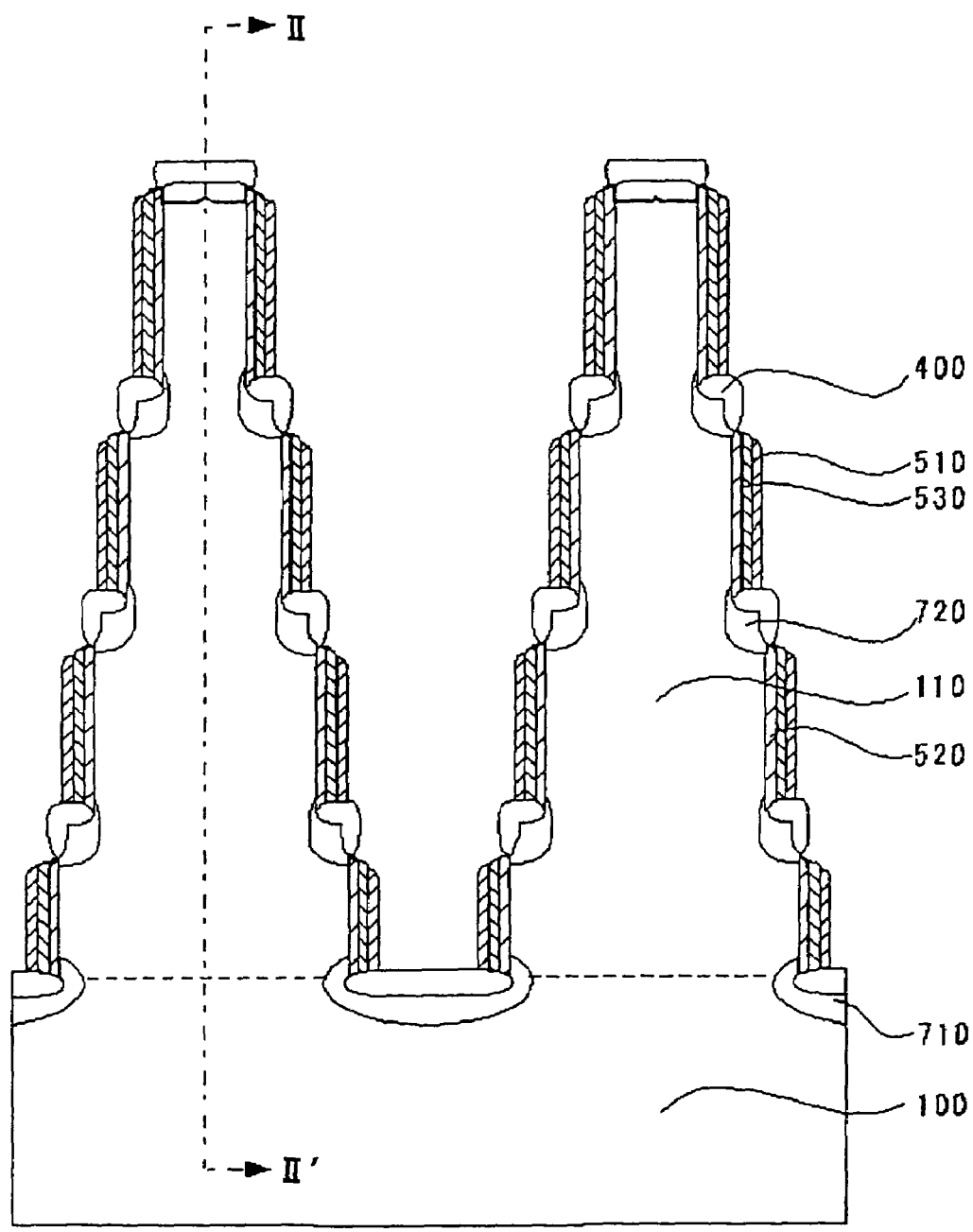
Figure 133:
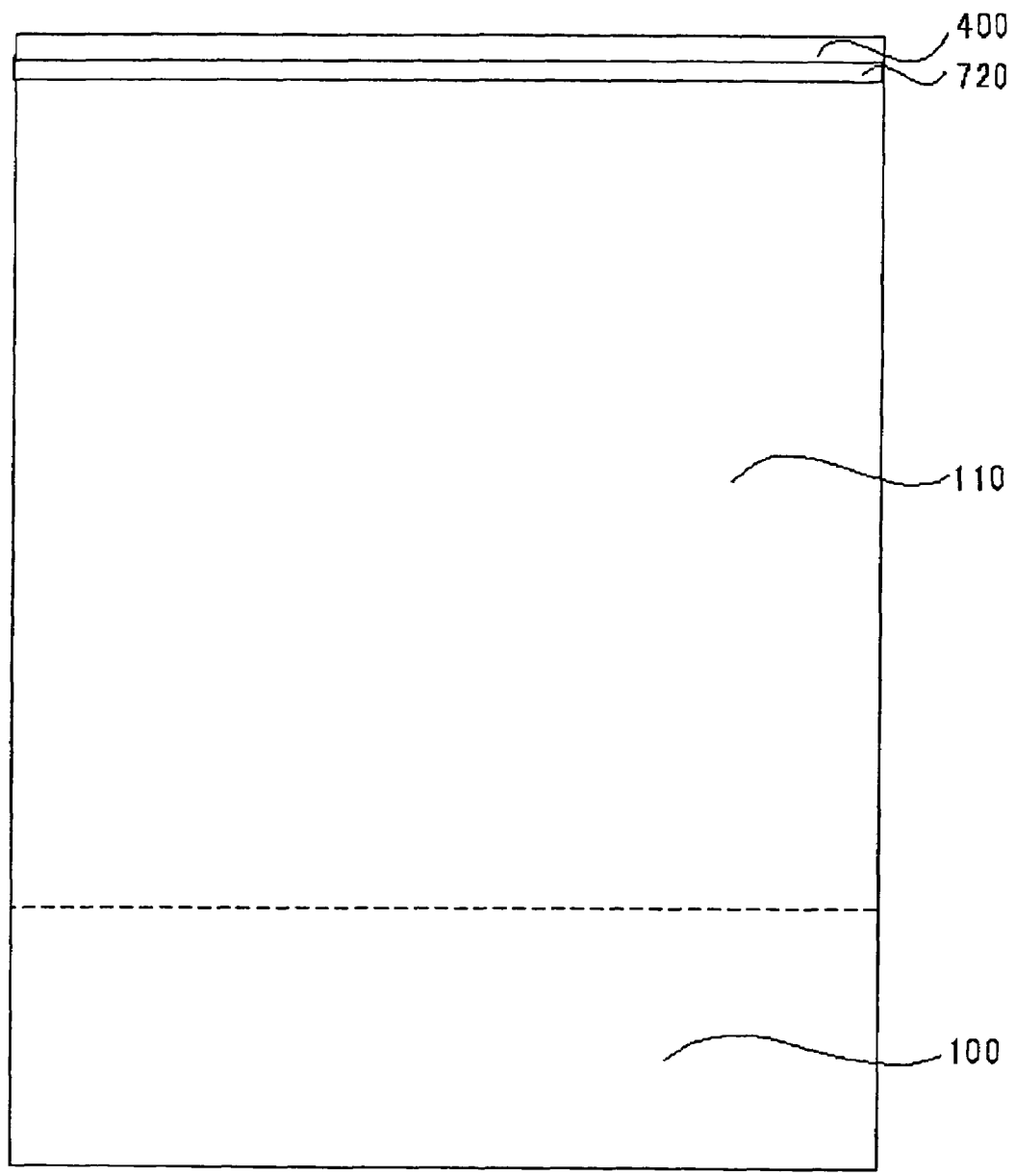

Next, the silicon oxide film 510 and the silicon nitride film 530 are etched by means of reactive ion etching so as to be collectively separated to form side wall spacers (FIGS. 116 and 133).

Here, it is not necessary to process the silicon nitride film 530 and the silicon oxide film 510 to form side wall spacers, and furthermore they may be etched to form side wall spacers separately and sequentially.

Figure 117:
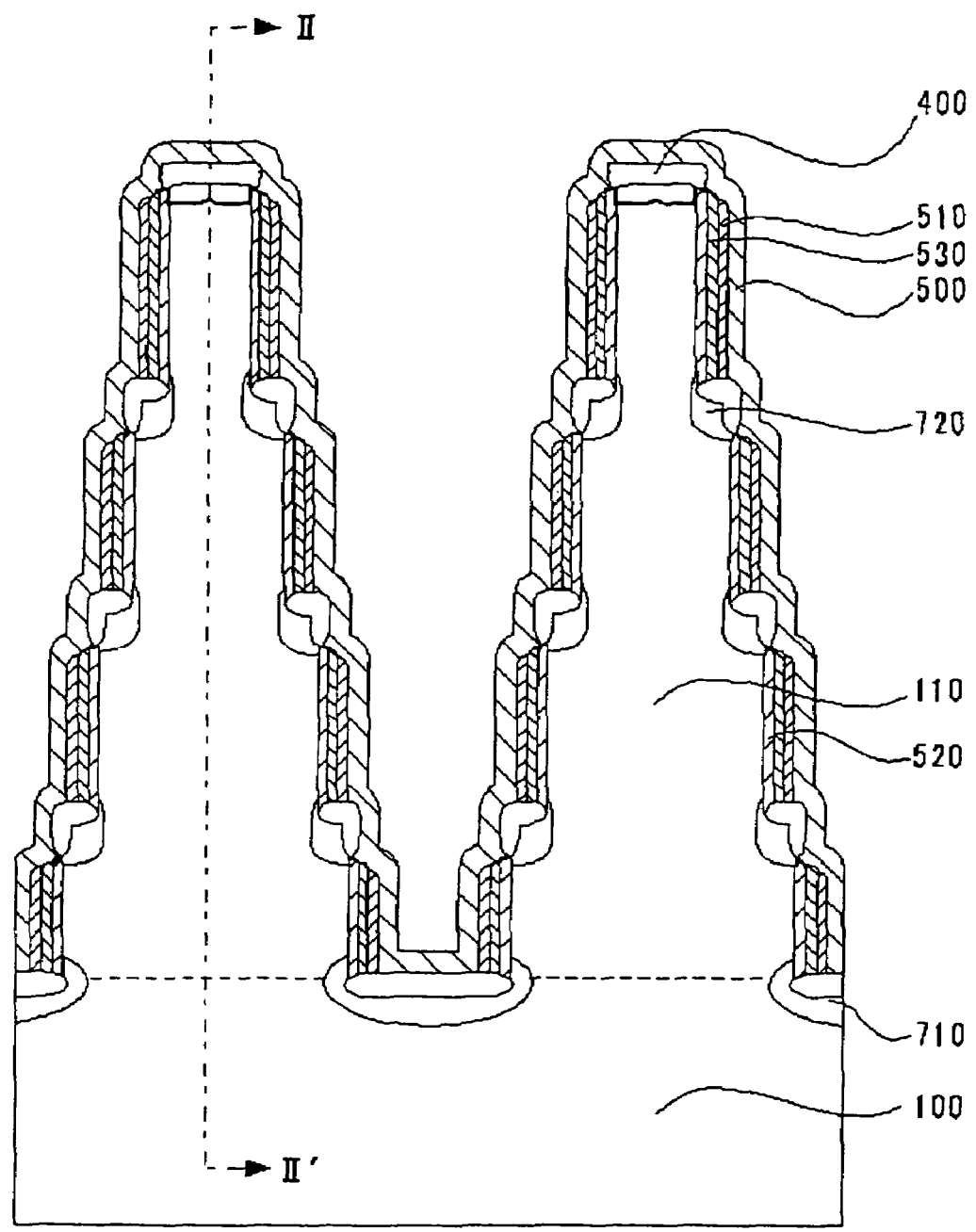
Figure 134:
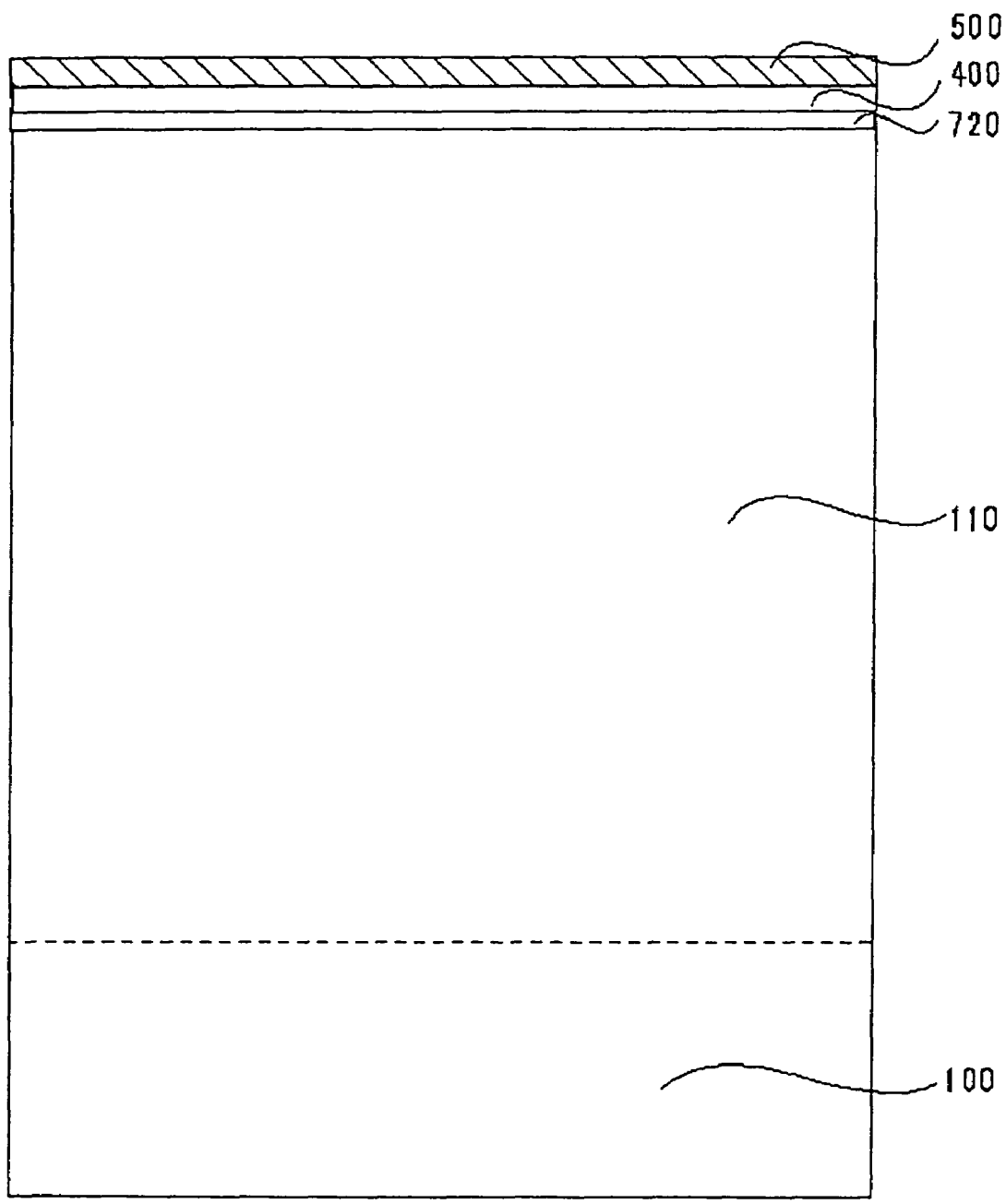

Subsequently, a polycrystal silicon film (control gate 500), which is the first conductive film, is deposited to have a thickness of from approximately 20 to 200 nm (FIGS. 117 and 134). After that, impurities are introduced into the polycrystal silicon film. This impurity introduction can be carried out in the same manner as those for the impurity diffusion layers 720 and 710 by appropriately adjusting the impurity concentration. In addition, the impurity introduction may be carried out in other manners such as solid phase diffusion or an in-situ manner at the time of the deposition of the polycrystal silicon.

Figure 118:
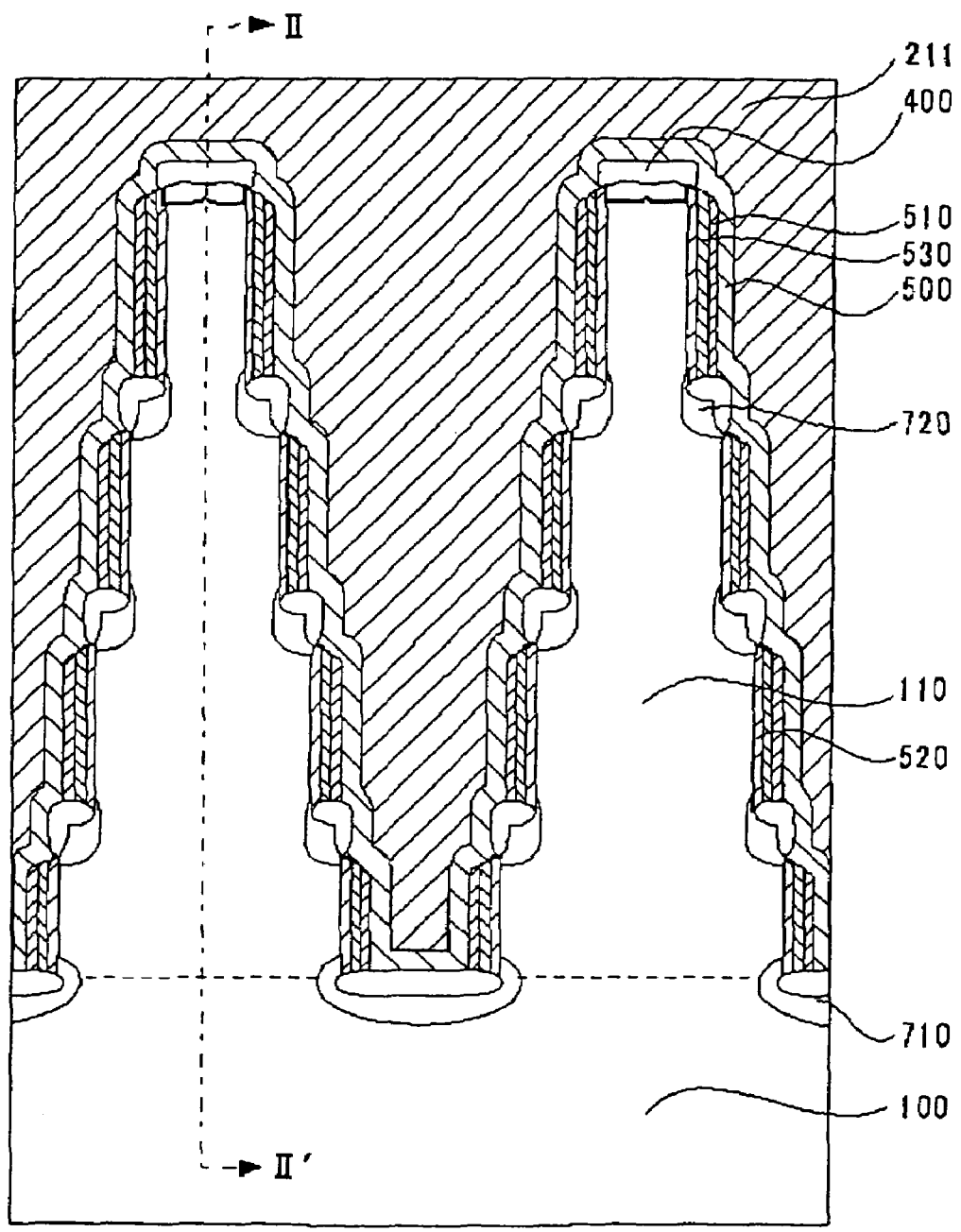
Figure 119:
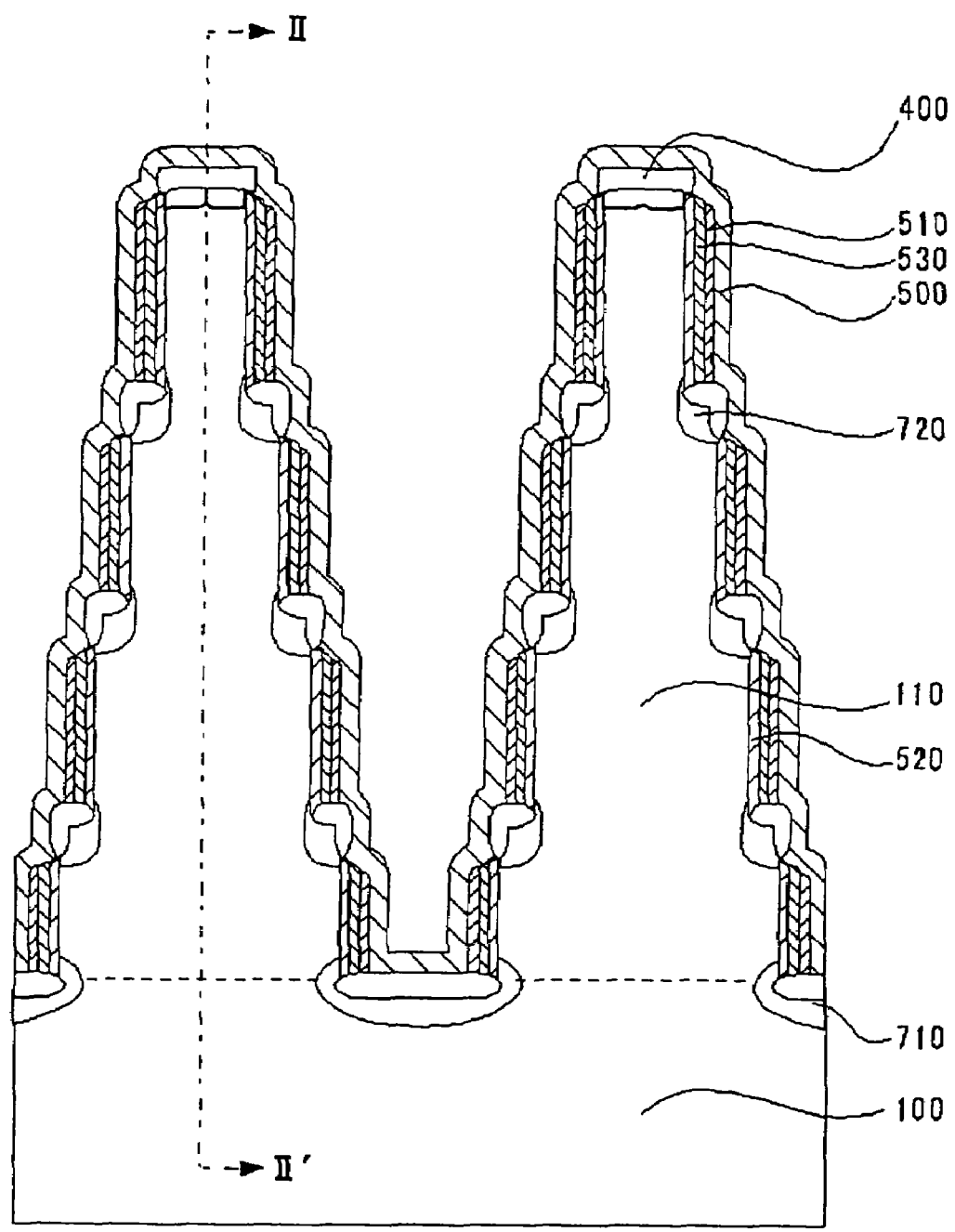
Figure 135:
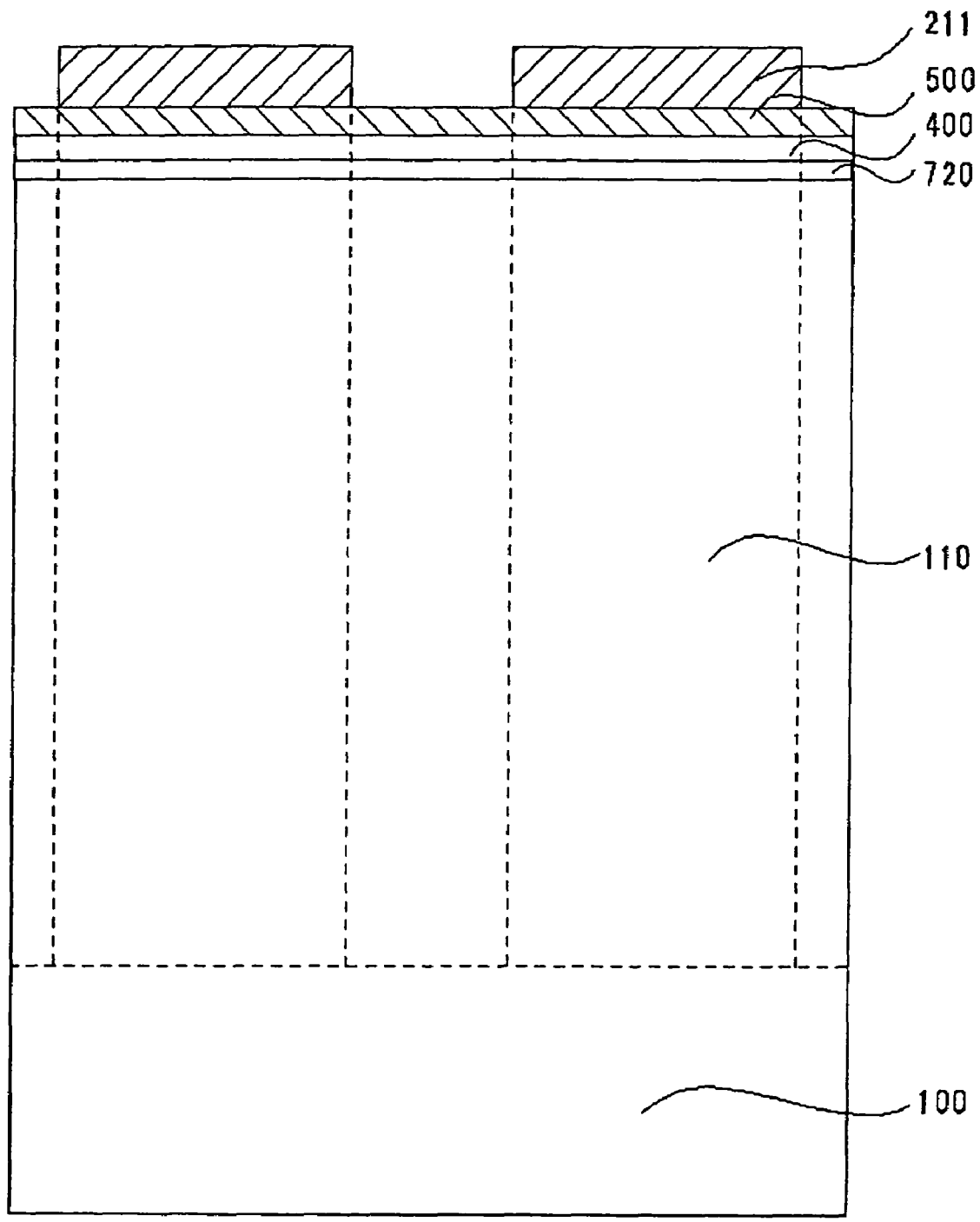
Figure 136:
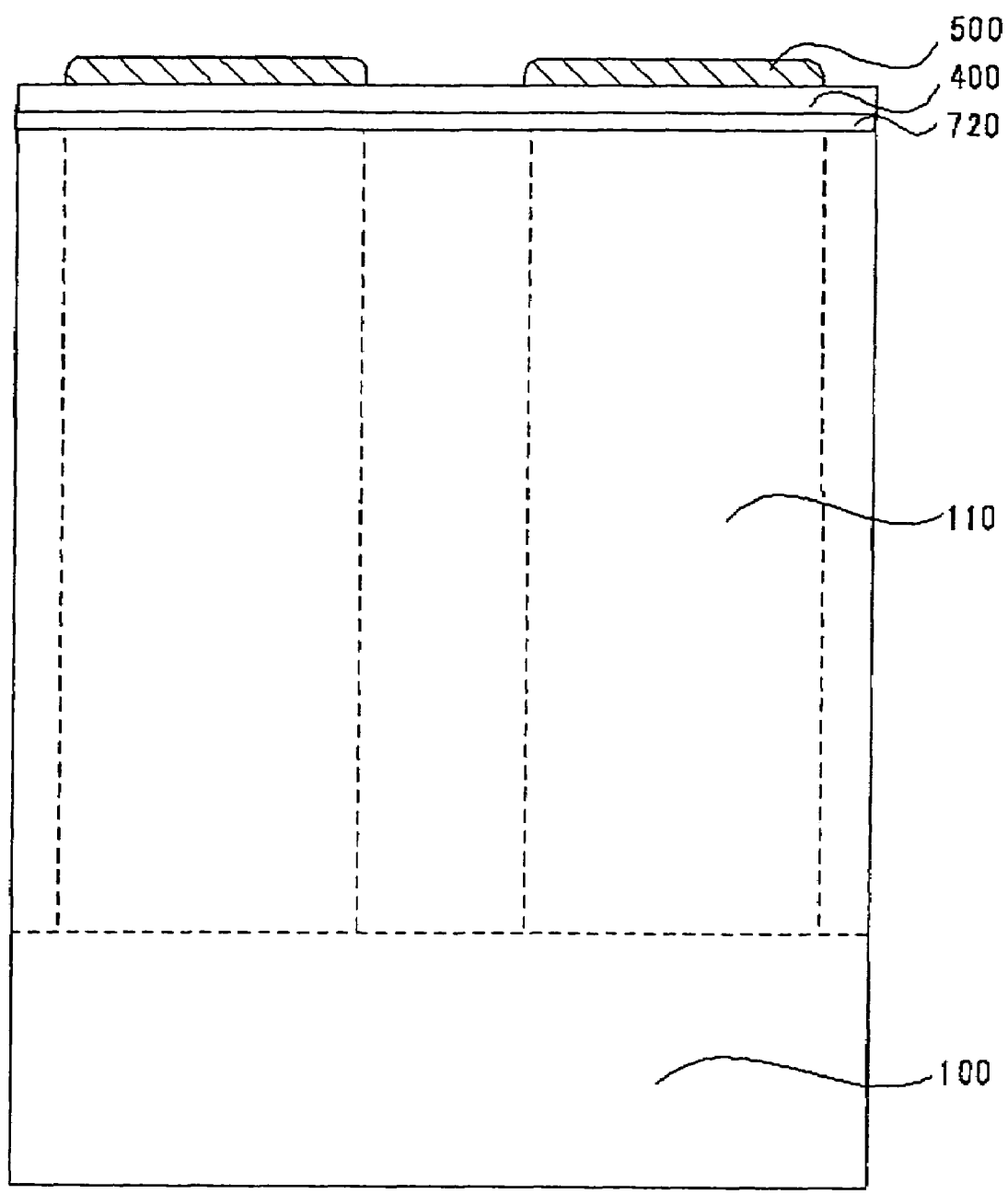

Next, a resist 211 that has been patterned according to a known photolithographic technology is used as a mask (FIGS. 118 and 135), so that the polycrystal silicon film is etched by means of reactive ion etching, and thereby, control gates 500 (word lines) are obtained (FIGS. 119 and 136).

Subsequently, the resist 211 is used as a mask or the control gates 500 are used as a hard mask after the removal of resist 211 so that the silicon oxide film 510 and subsequently, the silicon nitride film 530 are etched by means of reactive ion etching. Here, it is not necessary to etch the silicon oxide film 510 and the silicon nitride film 530.

After that, an interlayer insulator film is formed where contact halls and metal wires are created according to a known technology, and thereby, the semiconductor memory device is completed.

Here, the semiconductor substrate, which was a silicon substrate, may be made of element semiconductors such as germanium in addition to silicon, or compound semiconductors such as SiGe, GaAs, and the like. In addition, a p-type or an n-type single well may be formed in the semiconductor substrate, or a multiple well of different or same conductivity types such as double well, triple well and the like may be formed. In such a case, it is preferable for the well to include protruding semiconductor layers. Thus, a semiconductor memory device may be formed within such a well, or the conductivity types of the silicon substrate and the impurity diffusion layers may be the opposite conductivity types. In addition, though in the above description the silicon nitride films 230, 231 and 232 are processed to form side wall spacers so that these side wall spacers are used as an etching mask of the silicon substrate 100 in order to process the protruding semiconductor layers 110 into step form, an insulating film or a conductive film is filled in a manner where only the end portions of the protruding semiconductor layers 110 are exposed so that thermal oxidation or isotropic etching is carried out on these exposed portions, for example, and thereby, the end portions of the protruding semiconductor layers 110 are tapered and then this process may be repeated so as to form steps in the protruding semiconductor layers 110. Here, a silicon oxide film, a polycrystal silicon film, a silicon nitride film or a layered film of these may be deposited in desired trenches, and isotropic etching is carried out from the top surface of the semiconductor substrate so that the film is directly filled into these trenches or the film may be indirectly filled in by means of, for example, the resist etch back method. These methods can be applied to the following manufacturing methods.

Figure 103:
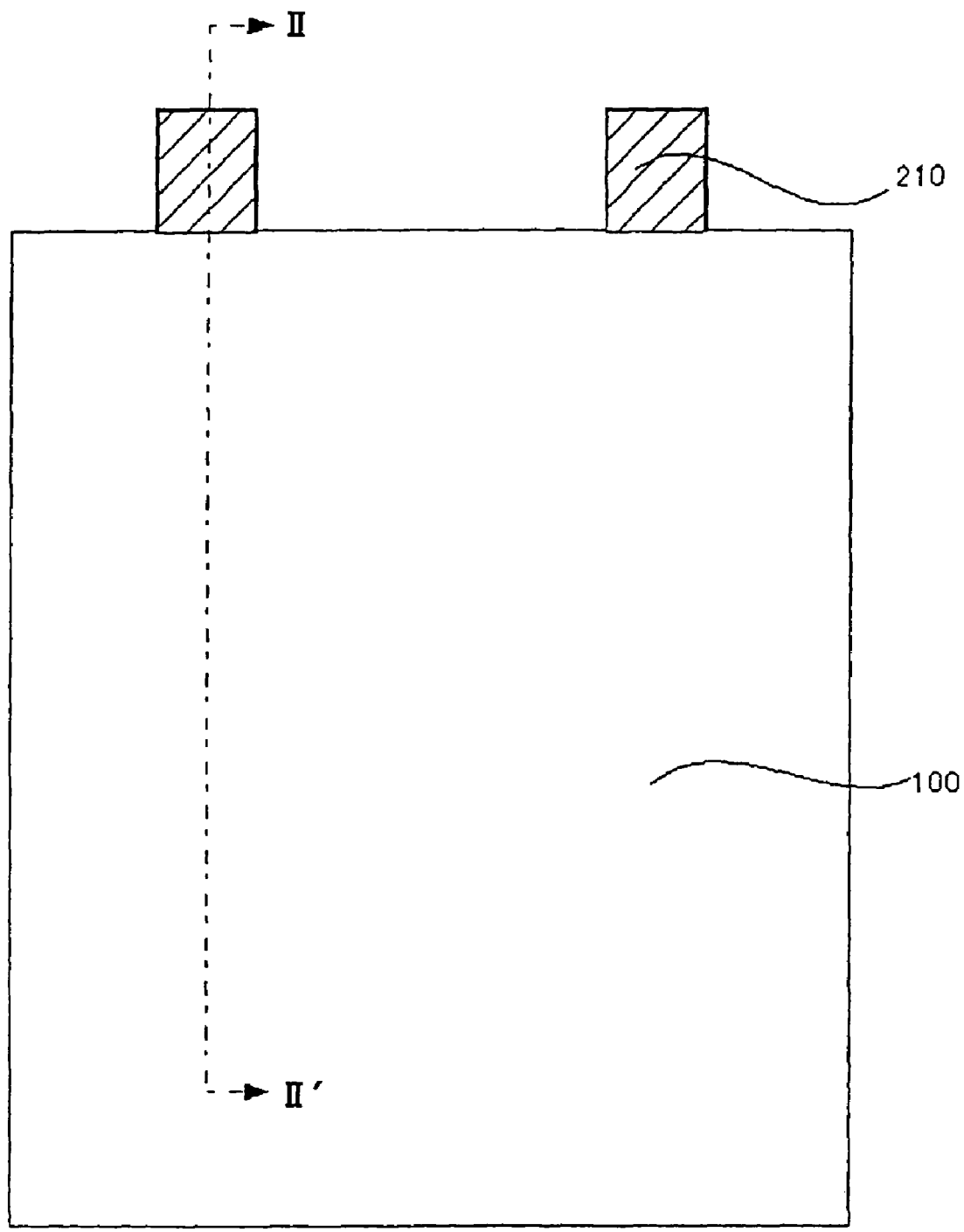
FIG. 103 is a diagram for explaining a step of a manufacturing method 1 of the semiconductor memory device of the present invention as seen at section I-I' of FIG. 29.

Though the above description shows a case where the semiconductor memory device has protruding semiconductor layers formed in step form with a plurality of steps, the protruding semiconductor layers may have one step. A manufacturing method in this case will be described below. First, a silicon oxide film 210 is deposited as the first insulating film to become a mask layer on the surface of a p-type silicon substrate 100, which is a semiconductor substrate, as shown in FIG. 103, and then, the silicon oxide film 210 is etched by means of reactive ion etching using a resist (not shown) that has been patterned by means of a known photolithographic technology as a mask.

Next, the obtained silicon oxide film 210 is used as a mask so as to etch silicon substrate 100 by means of reactive ion etching, and thereby, protrusions are formed and then the silicon oxide film 210 is selectively removed. After that, thermal oxidation is carried out on the exposed portions of the silicon substrate 100, and thereby, a silicon oxide film 250, which becomes the second insulating film, is formed (see FIG. 104).

Next, a silicon nitride film is deposited as the third insulating film on the silicon substrate. After that, the silicon nitride film is processed by means of anisotropic etching to form side wall spacers which are placed on the sides of the silicon oxide film and the silicon substrate that has been processed into the protrusions via a silicon oxide film. Here, the processes of the deposition of a silicon nitride film and of the formation of the side wall spacers from the silicon nitride film by means of anisotropic etching may be omitted.

After that, in the same manner according to the method as described in reference to FIGS. 112 to 118, impurities of the second conductivity type is introduced into portions of or the entirety of the corners of protruding semiconductor layers with one step in a self-aligned manner relative to the above described side wall spacers. After the removal of the side wall spacers, a charge storage layer is formed so as to cover the sides of the above described protruding semiconductor layers, and then, the first conductive film is formed so as to cover the charge storage layer, and thereby, a plurality of memory cells is formed of charge storage layers, control gates and n-type impurity diffusion layers formed in portions of the protruding semiconductor layers, on the surfaces of the protruding semiconductor layers that have been formed in the semiconductor substrate.

Next, a manufacturing method 2 for a semiconductor memory device in the case where control gates (word lines) are placed parallel to the protruding semiconductor layers will be described.

Figure 137:
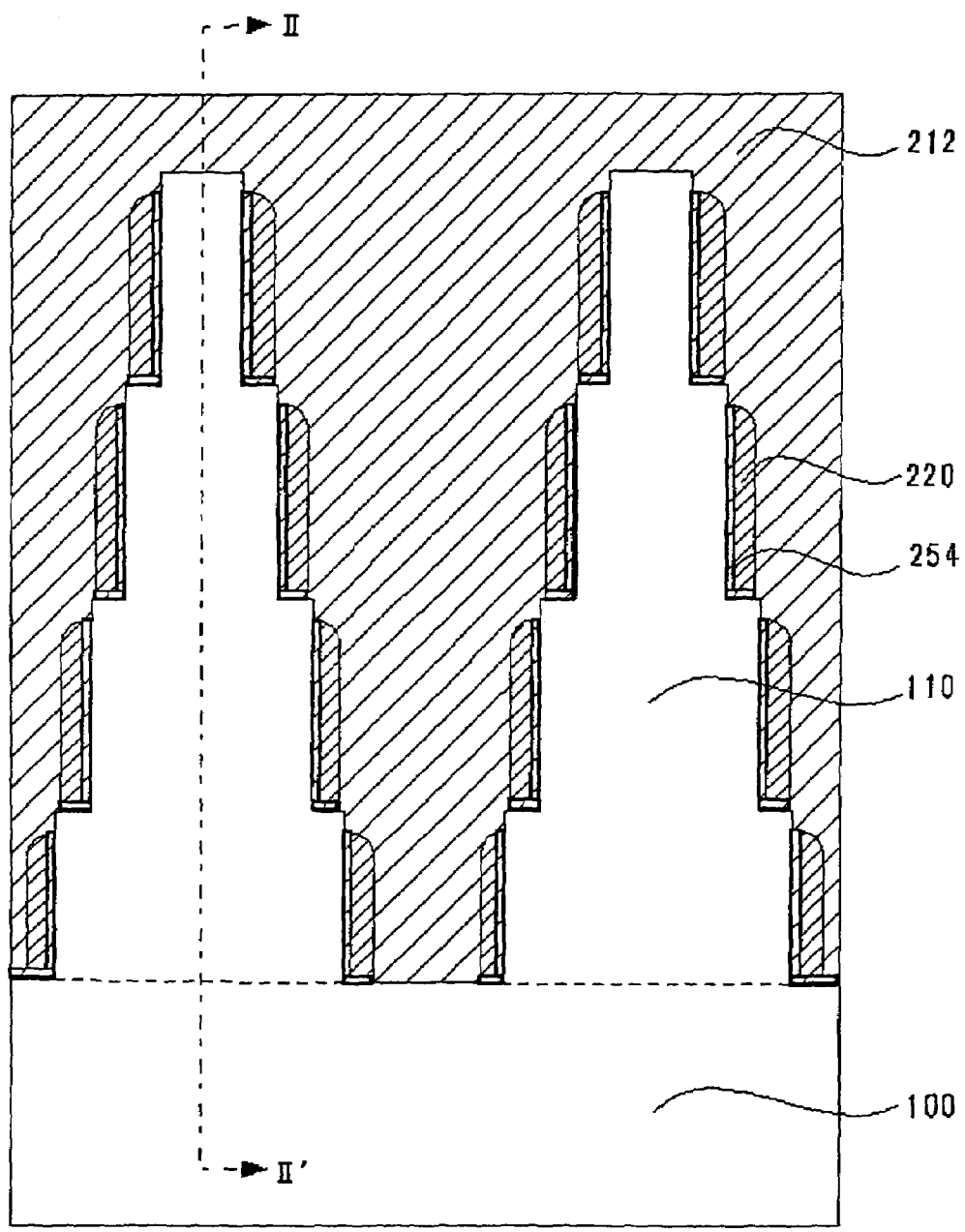
FIG. 137 is a diagram for explaining a step of a manufacturing method 2 of the semiconductor memory device of the present invention as seen at section I-I' of FIG. 87.
Figure 138:
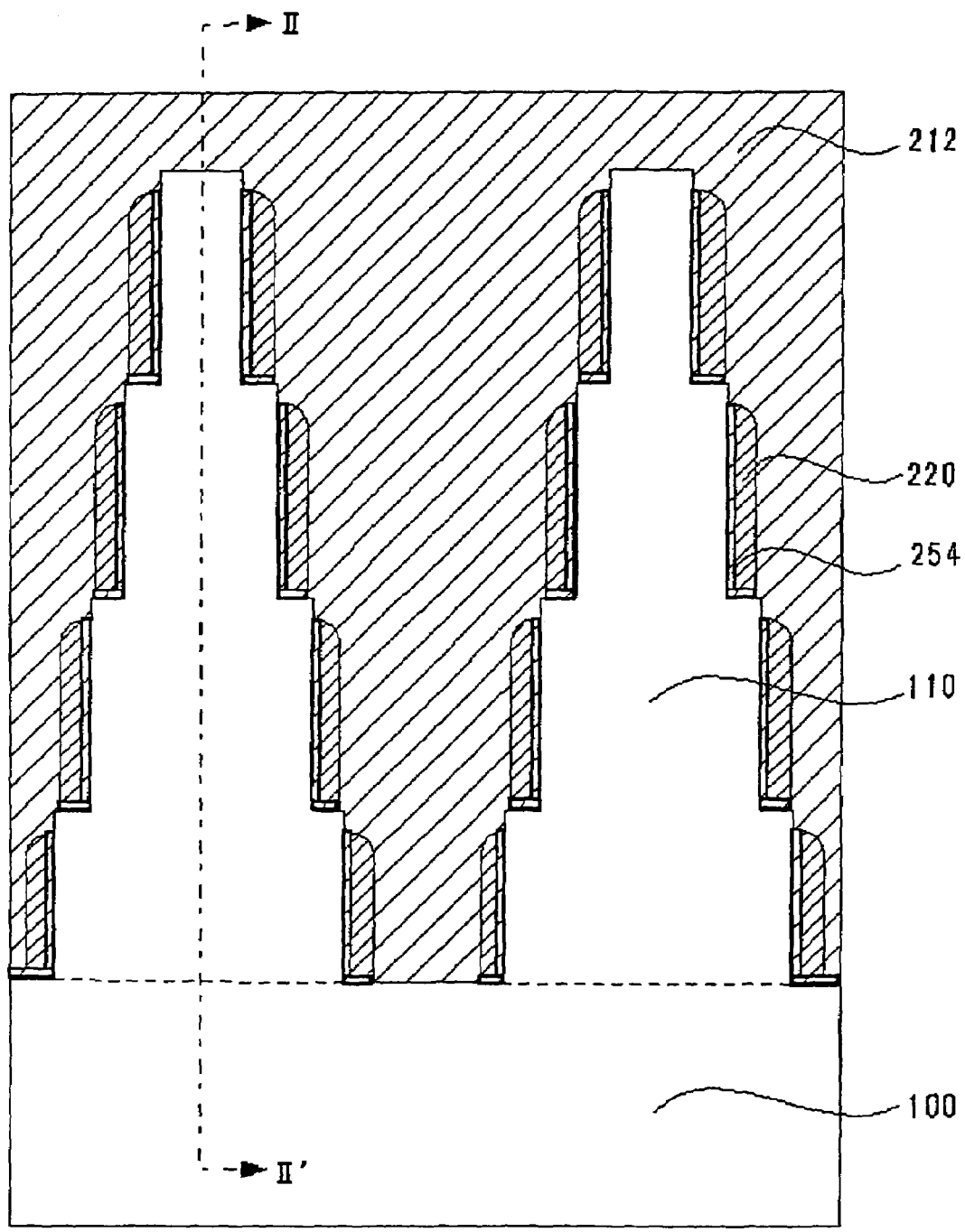
FIGS. 138 to 143 are diagrams for explaining succeeding steps of the manufacturing method 2.
Figure 144:
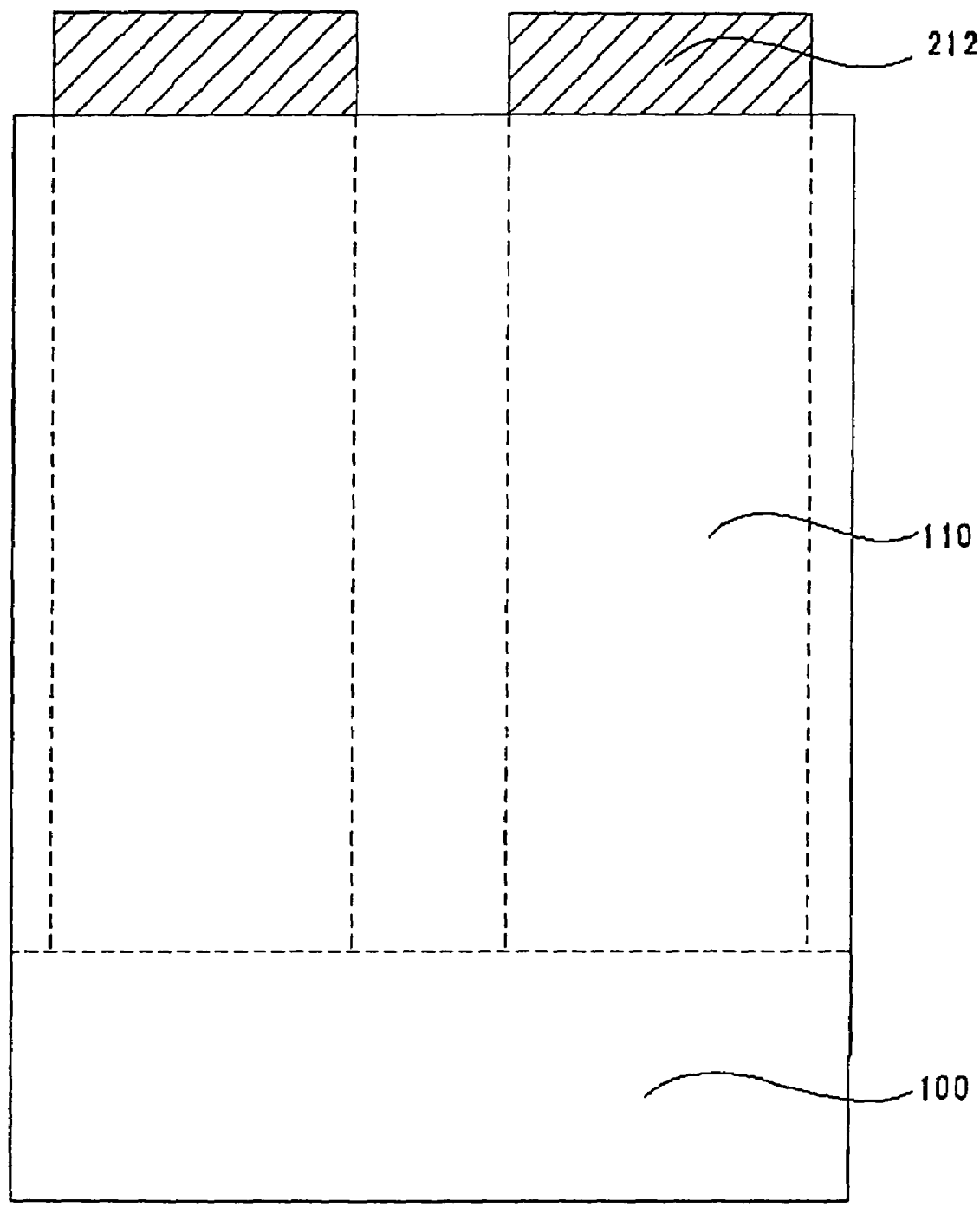
FIGS. 144 to 150 are cross sectional views of the semiconductor memory device taken along line II-II' of FIGS. 137 to 143, respectively.
Figure 145:
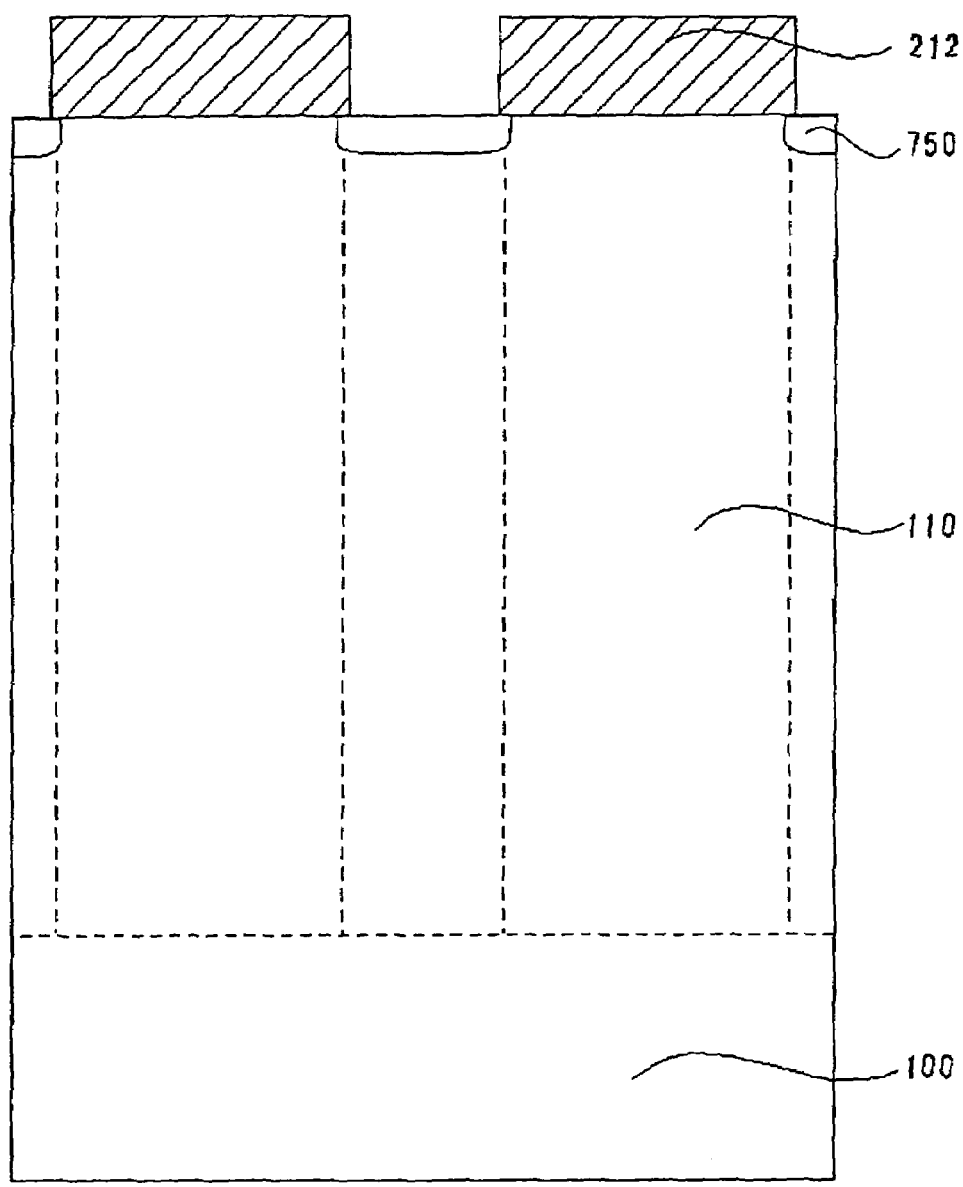

According to this manufacturing method, as described in reference to FIGS. 111 and 128, a silicon nitride film 220, which is the fifth insulating film, is placed in side wall spacer form on the sides of the silicon substrate 100 that has been processed to have a wall form. After that, a resist 212 that has been patterned by means of a known photolithographic technology is used as a mask (FIGS. 137 and 144) so that the silicon nitride film 220 is selectively etched by means of, for example, isotropic etching, and thereby, n-type impurity diffusion layers 750 that become bit lines are formed in the portions of the protruding semiconductor layers in the same manner as the manufacturing method 1 (FIGS. 138 and 145).

Figure 139:
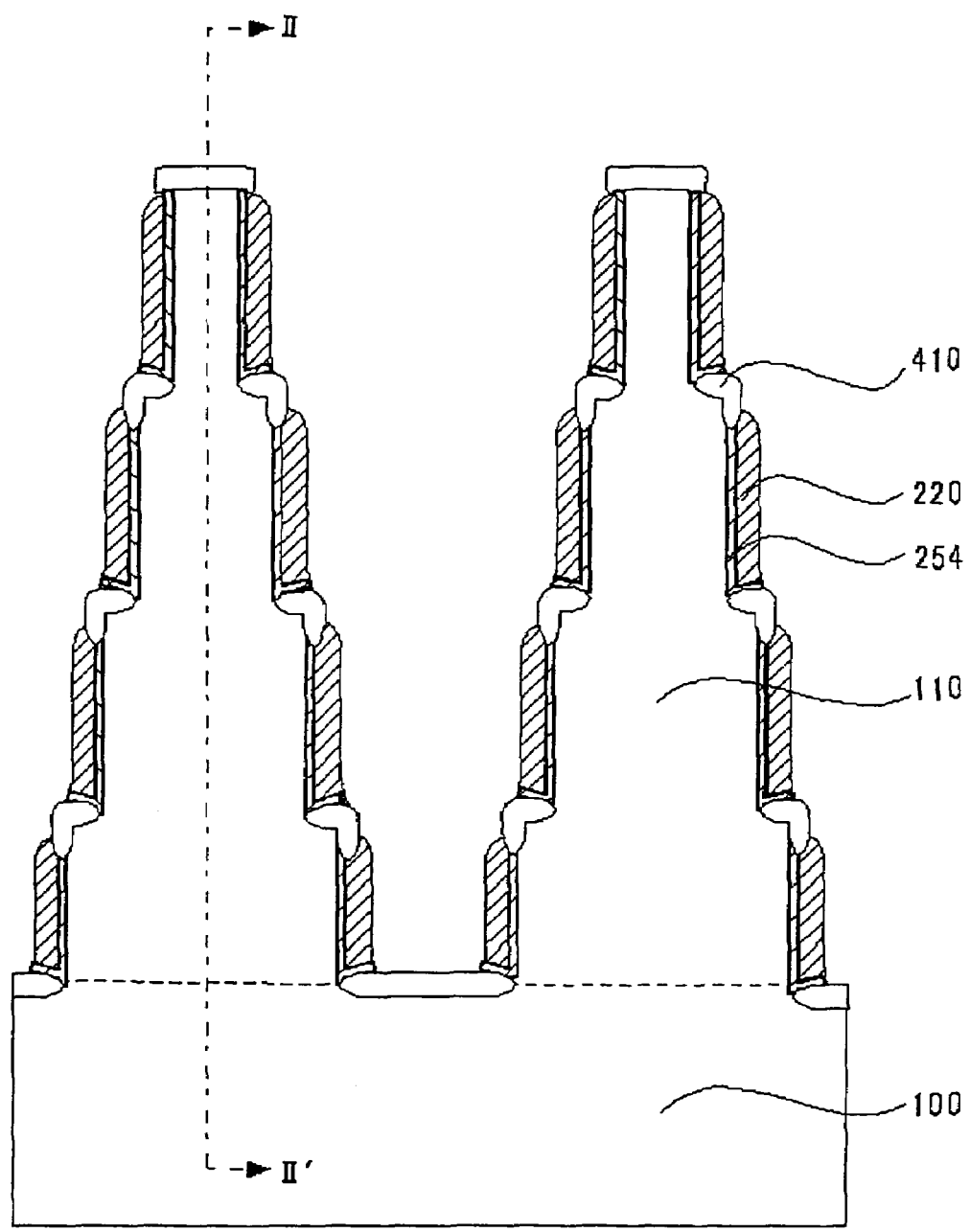
Figure 146:
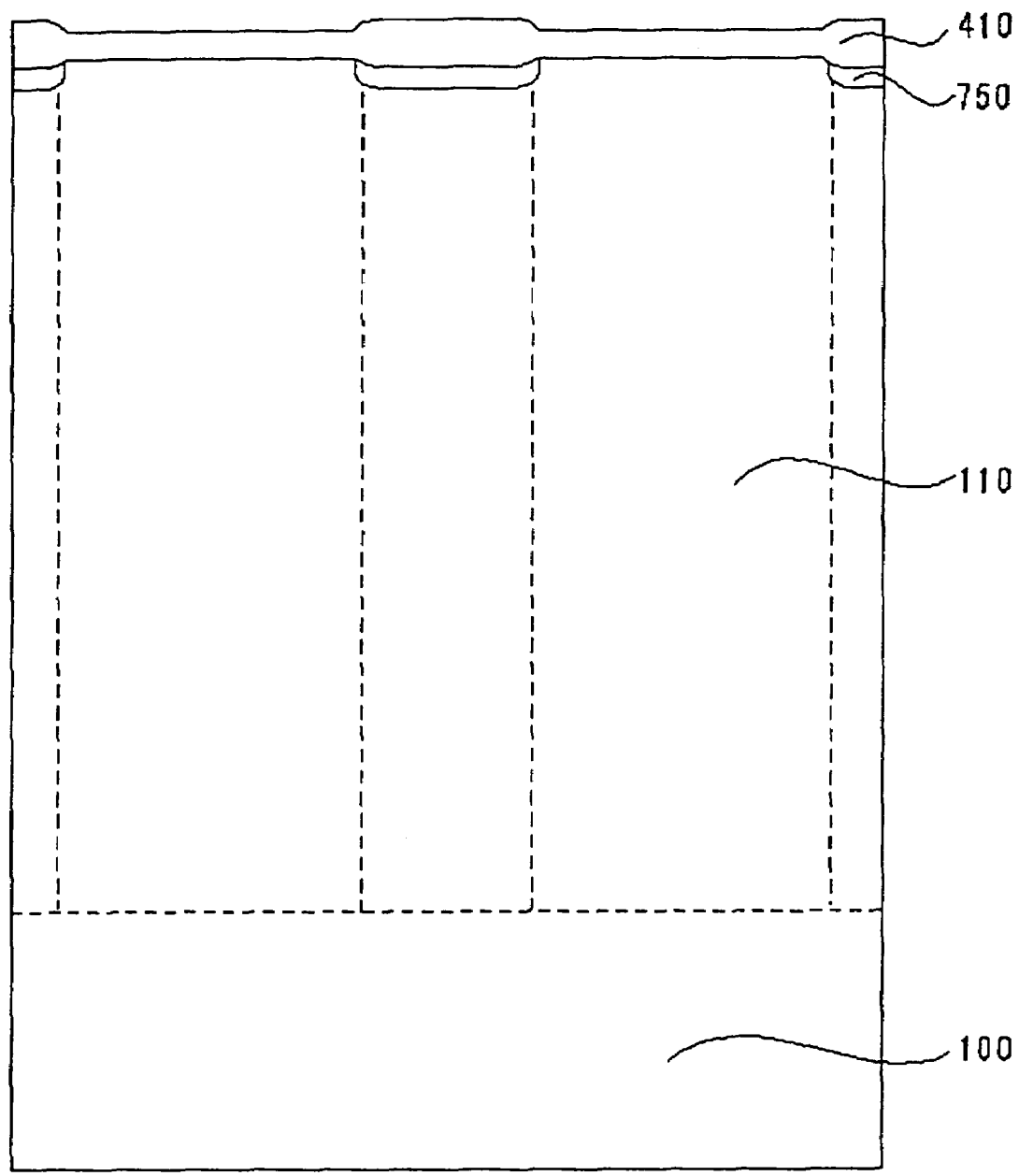

After that, portions of or the entirety of the upper portions and the corners of the protruding semiconductor layers 110, the surface of impurity diffusion layers 750 and the surface of the silicon substrate 110 are oxidized so that a silicon oxide film 410 that becomes the sixth insulating film is formed to have a thickness of from approximately 10 to 500 nm (FIGS. 139 and 146). Here, the silicon oxide film 410 may be formed according to the CVD method or the like.

Next, the silicon nitride film 220 are selectively removed to a memory cells forming region by means of isotropic etching so as to the plurality of memory cells are aligned to a longitudinal direction of a side surface of the steps of the protruding semiconductor layers 110, and then a channel ion implantation is carried out on the sides of each protruding semiconductor layer 110 by utilizing a diagonal ion implantation in the same manner as in the fifth embodiment insulating film if necessary.

Subsequently, a silicon oxide film 520, which is the seventh insulating film and becomes a tunnel oxide film with a thickness of approximately 10 nm, is formed around the periphery of each protruding semiconductor layer 110 by using the thermal oxidation method.

Figure 140:
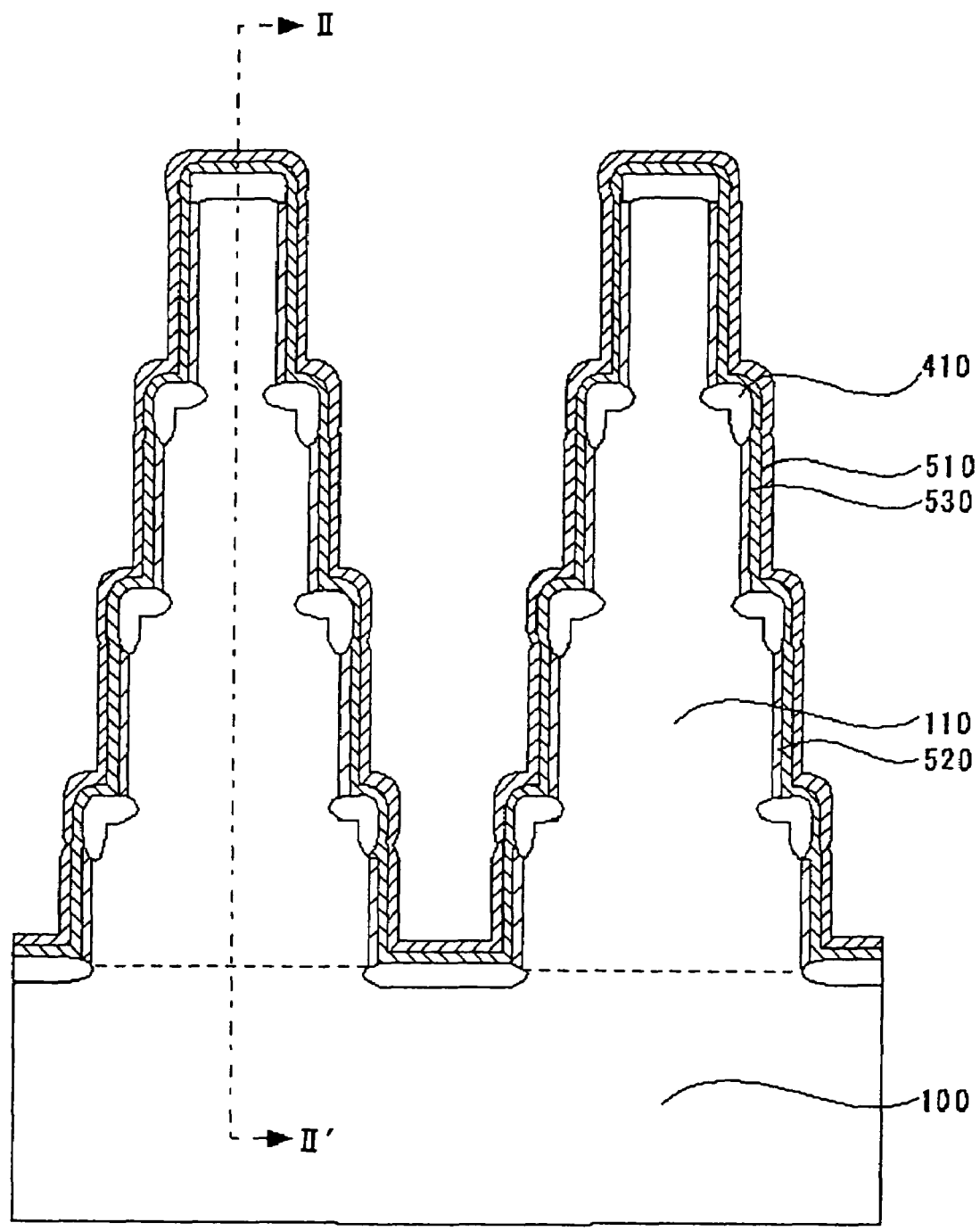
Figure 147:
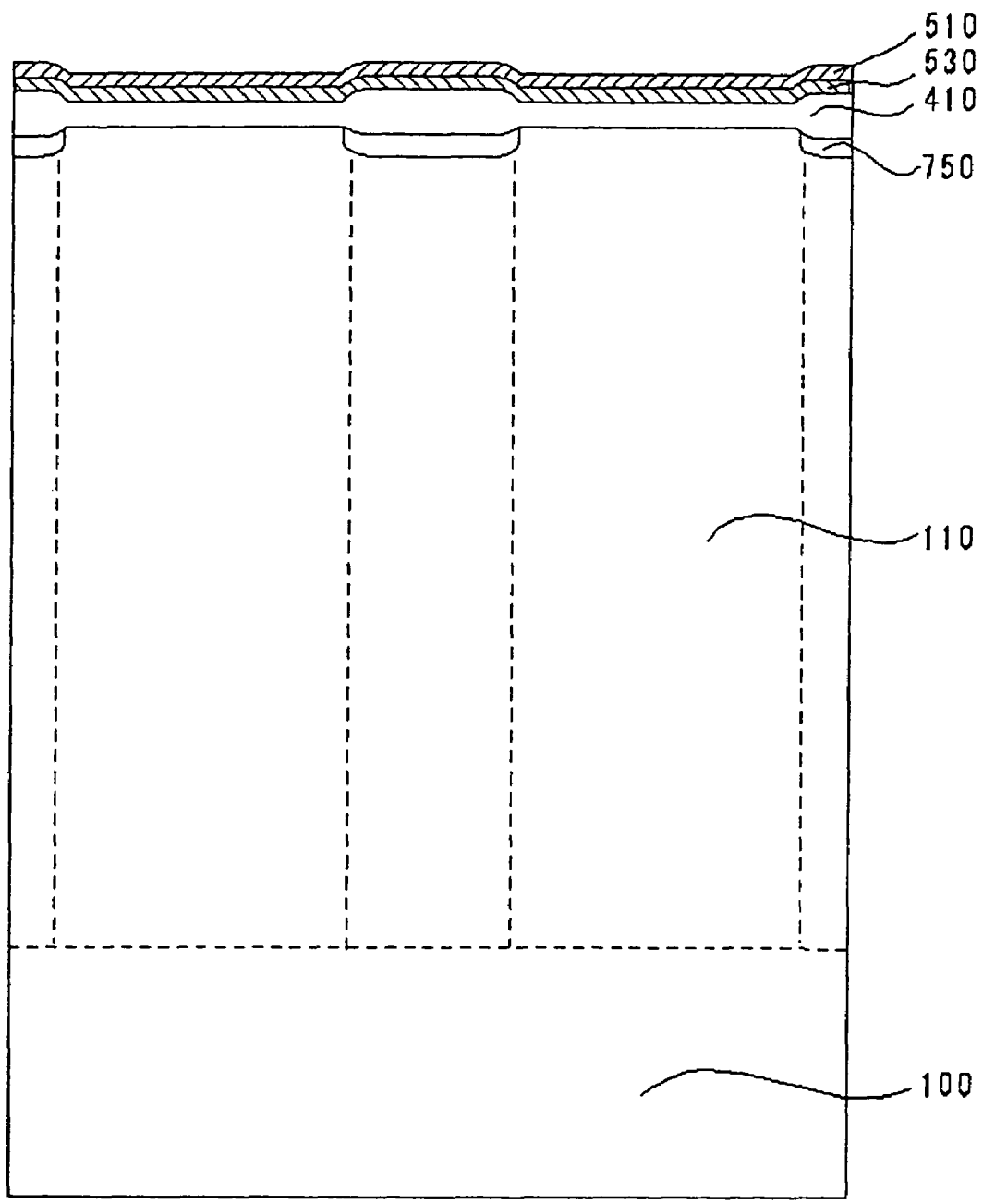

Next, a silicon nitride film 530 is deposited as the eighth insulating film to have a thickness of from approximately 5 to 100 nm, and then a silicon oxide film 510, which is the ninth insulating film, is deposited to have a thickness of from 5 to 100 nm (FIGS. 140 and 147).

Figure 141:
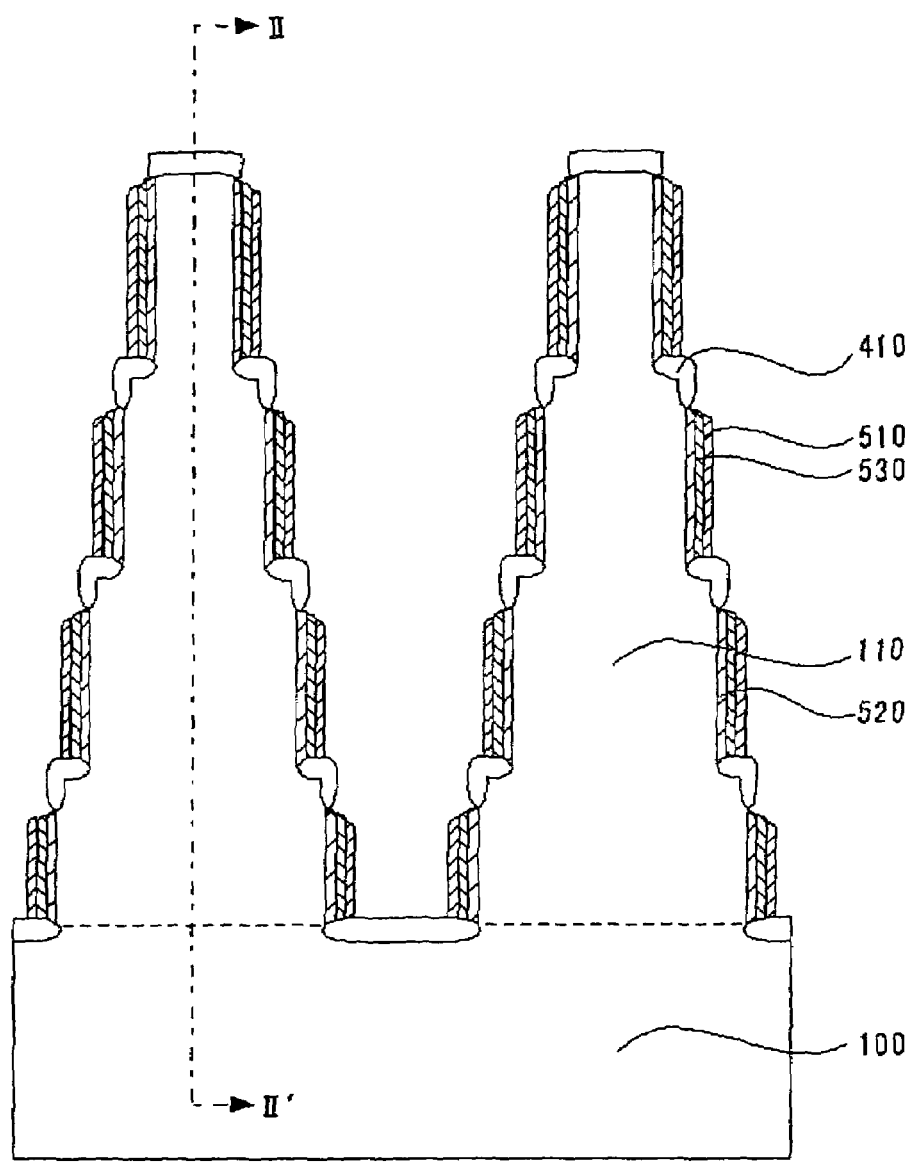
Figure 148:
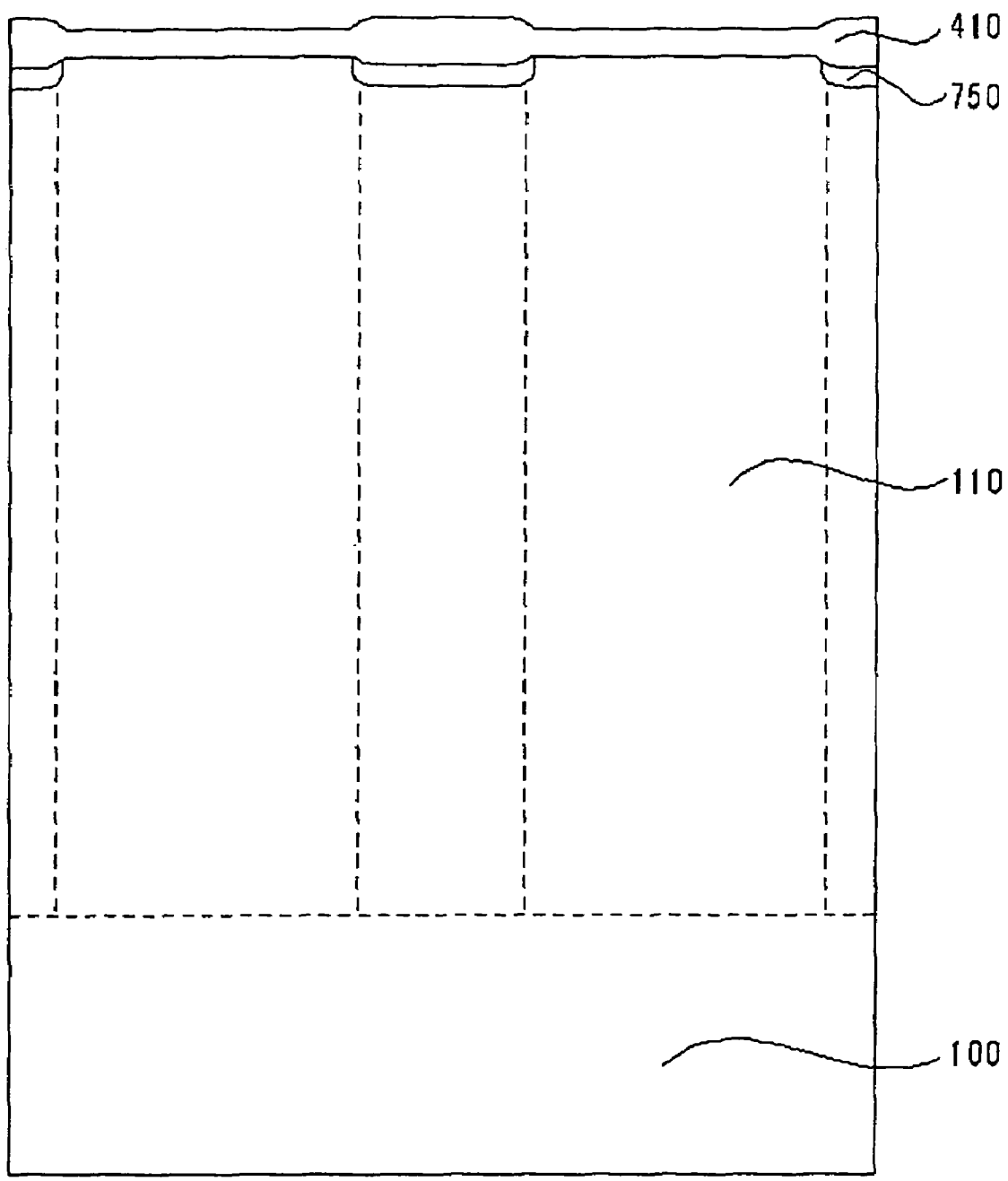

Next, the silicon oxide film 510 and the silicon nitride film 530 are etched by means of anisotropic etching, for example reactive ion etching, so as to be collectively separated to form side wall spacers (FIGS. 141 and 148). This separation may be or may not be carried out according to another method as described in the manufacturing method 1.

Figure 142:
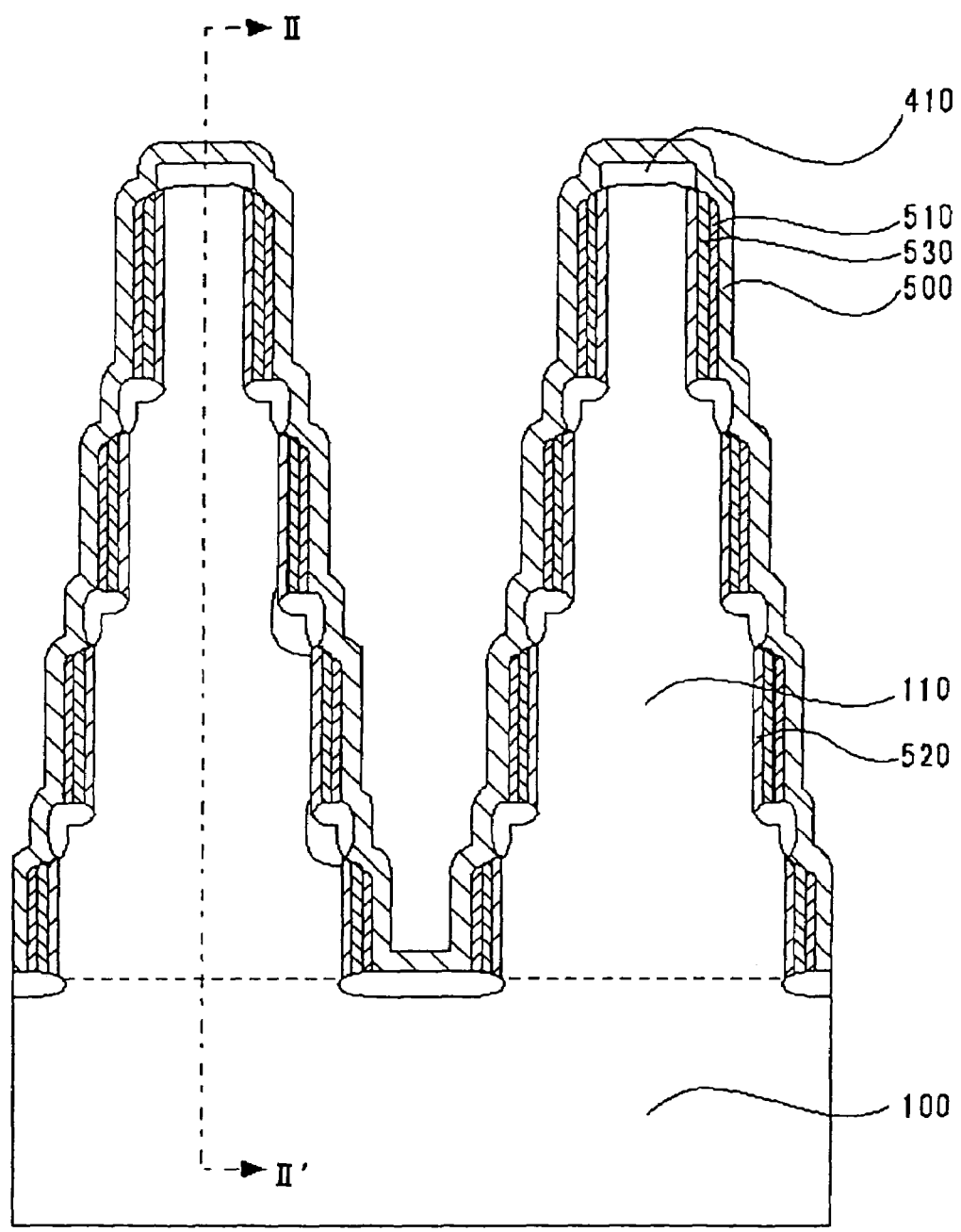
Figure 149:
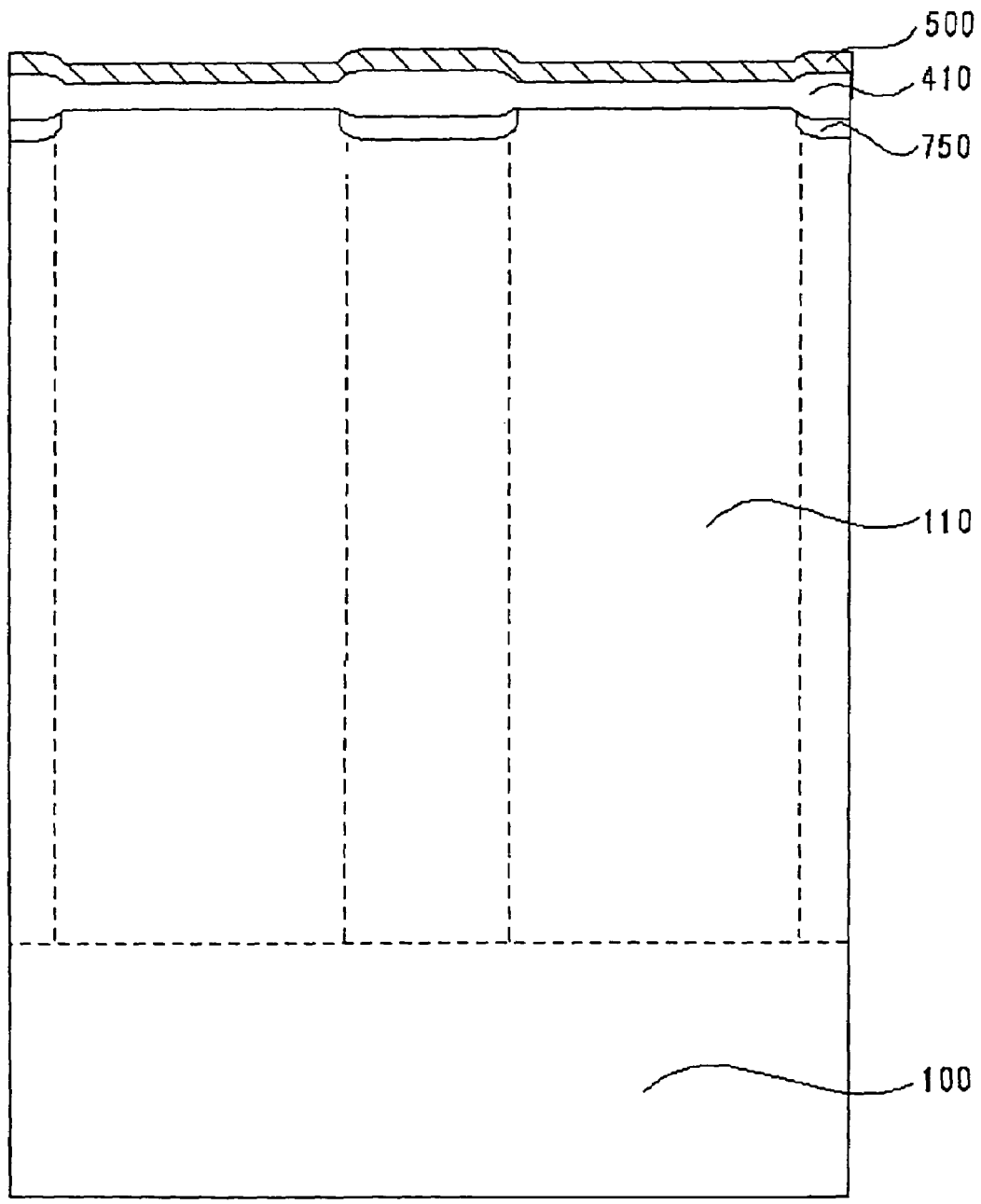

Subsequently, a polycrystal silicon film (control gate 500), which becomes the first conductive film, is deposited to have a thickness of from approximately 20 to 200 nm (FIGS. 142 and 149). After that, an impurity introduction is carried out on the polycrystal silicon film. This introduction can be carried out in the same manner as in the fifth embodiment.

Figure 143:
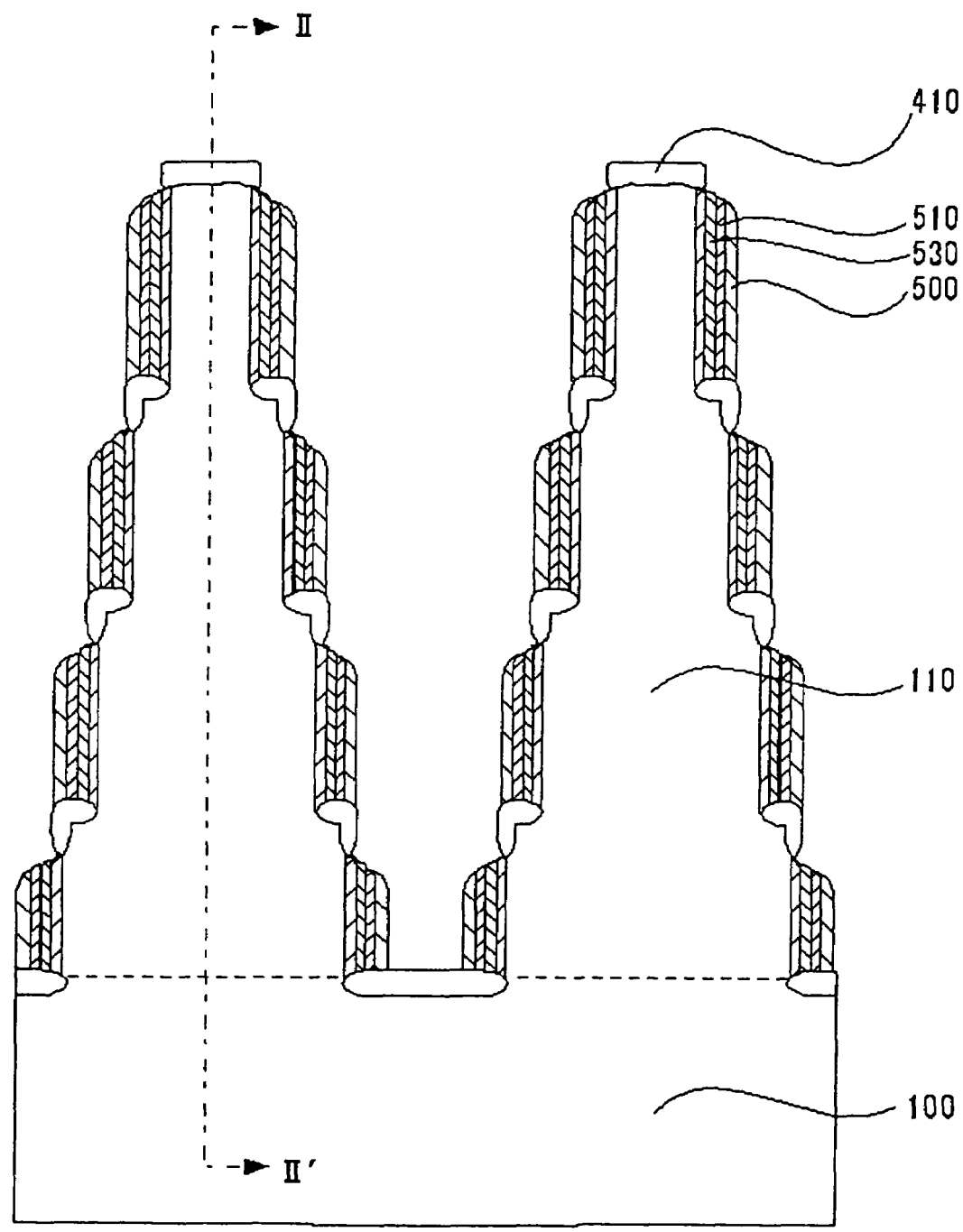
Figure 150:
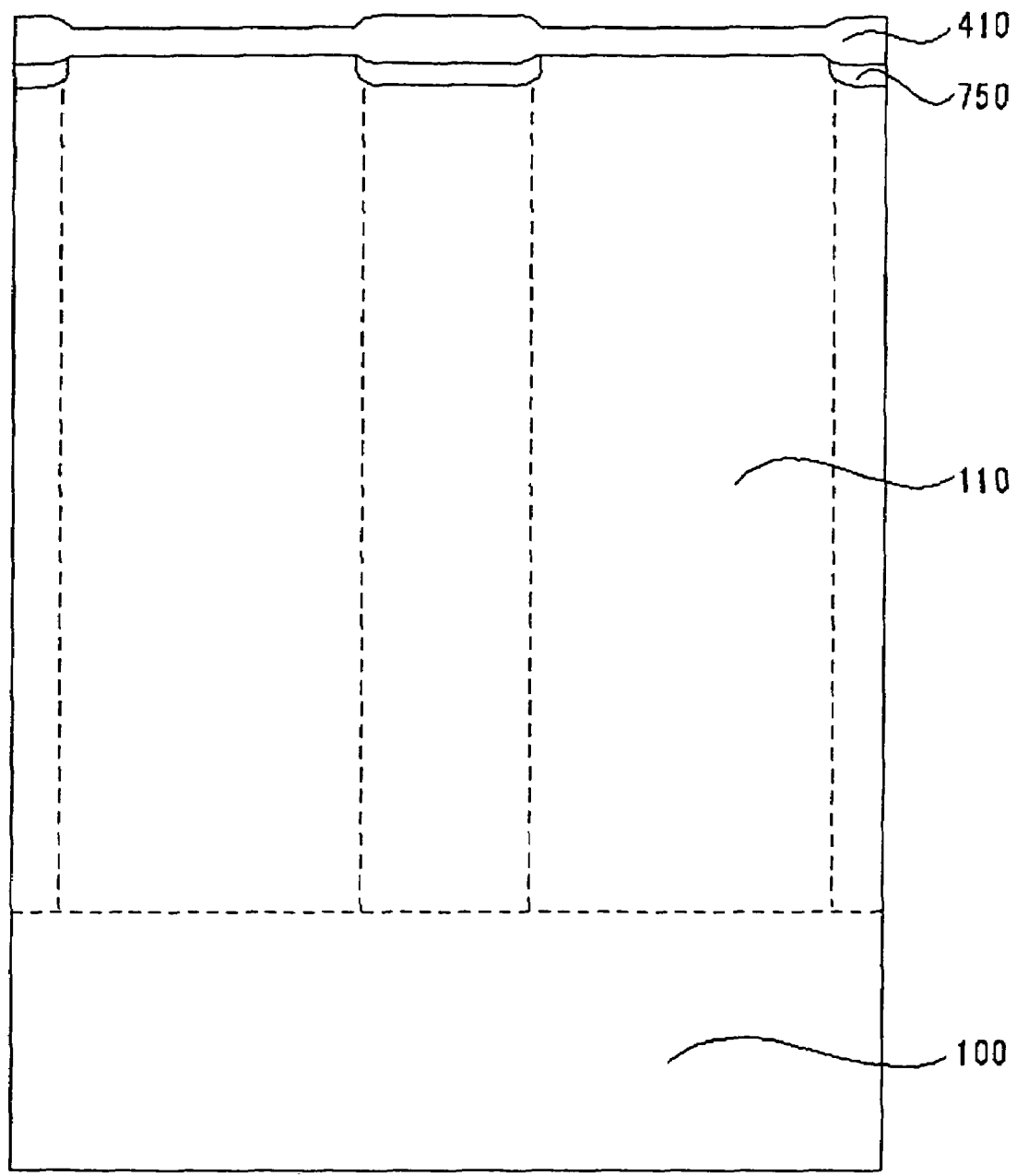

Next, anisotropic etching, for example, is carried out so that the polycrystal silicon film is processed to form side wall spacers on each side of each step of each protruding semiconductor layer 110, and thereby, the polycrystal silicon film is collectively separated to form the control gates (word lines) 500 (FIGS. 143 and 150).

After that, the semiconductor memory device is completed in the same manner as in the manufacturing method 1.

Next, a manufacturing method 3 for a semiconductor memory device in the case where active region surfaces of the protruding semiconductor layers and the impurity diffusion layers 720 and 710 have offset structure will be described.

Figure 151:
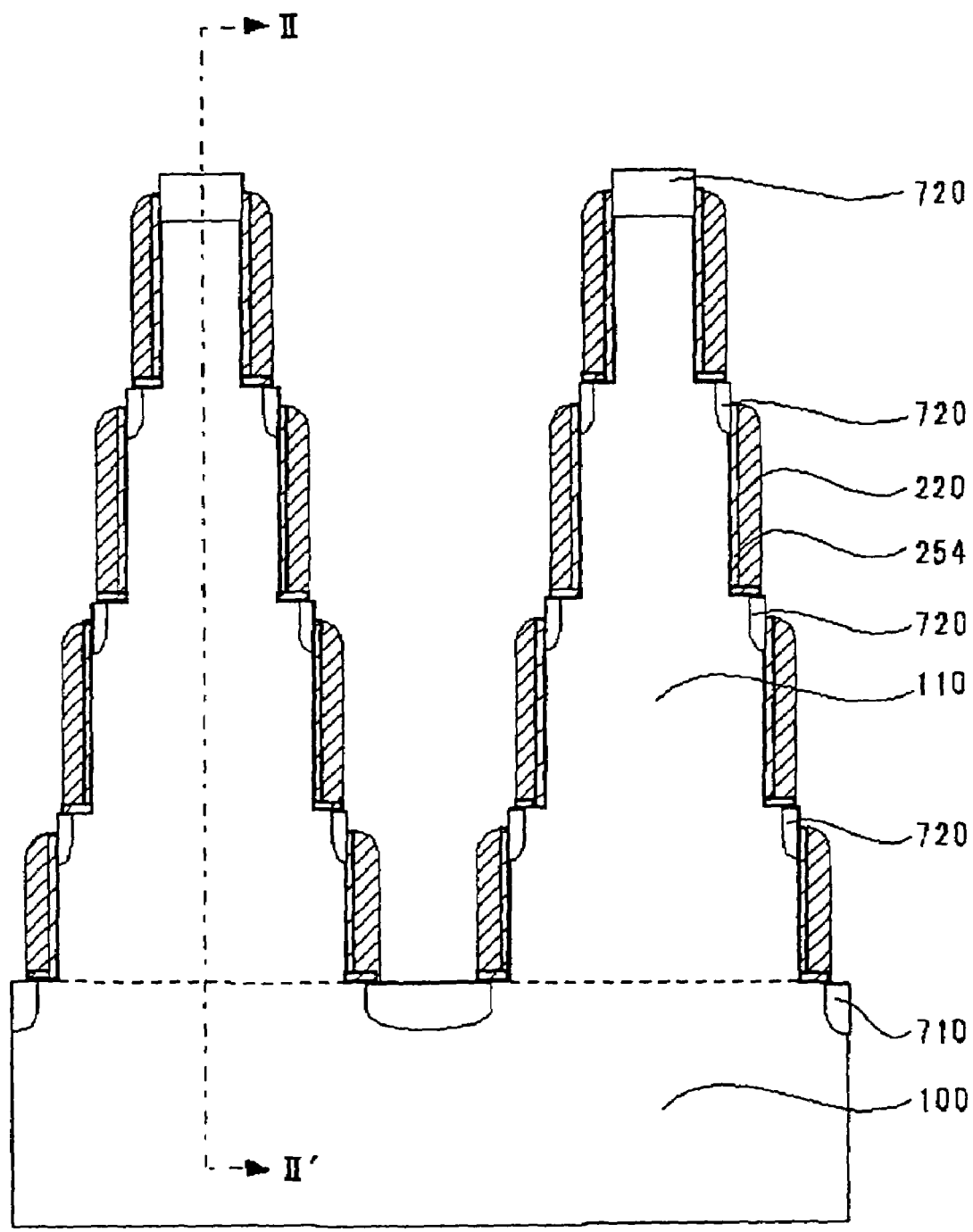
FIG. 151 is a diagram for explaining a step of a manufacturing method 3 of the semiconductor memory device of the present invention as seen at section I-I' of FIG. 29.
Figure 152:
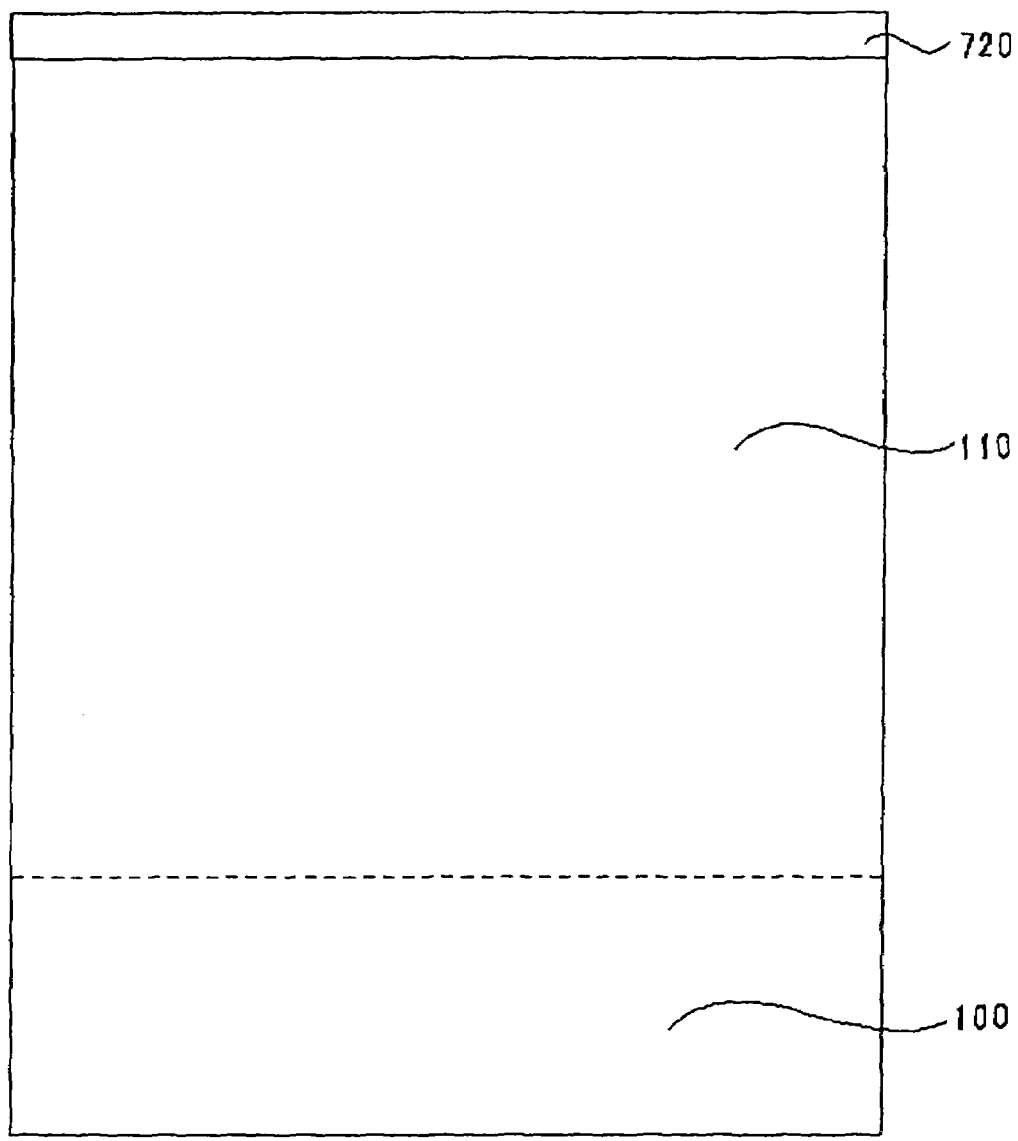
FIG. 152 is a cross sectional view of the semiconductor memory device taken along line II-II' of FIG. 151.
Figure 153:
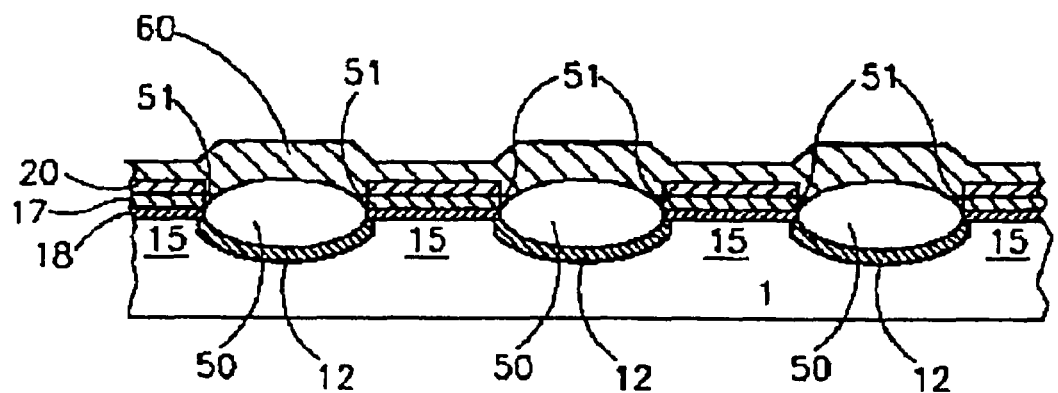
FIG. 153 is a schematic sectional view of essential parts of a conventional semiconductor memory device.
Figure 154:
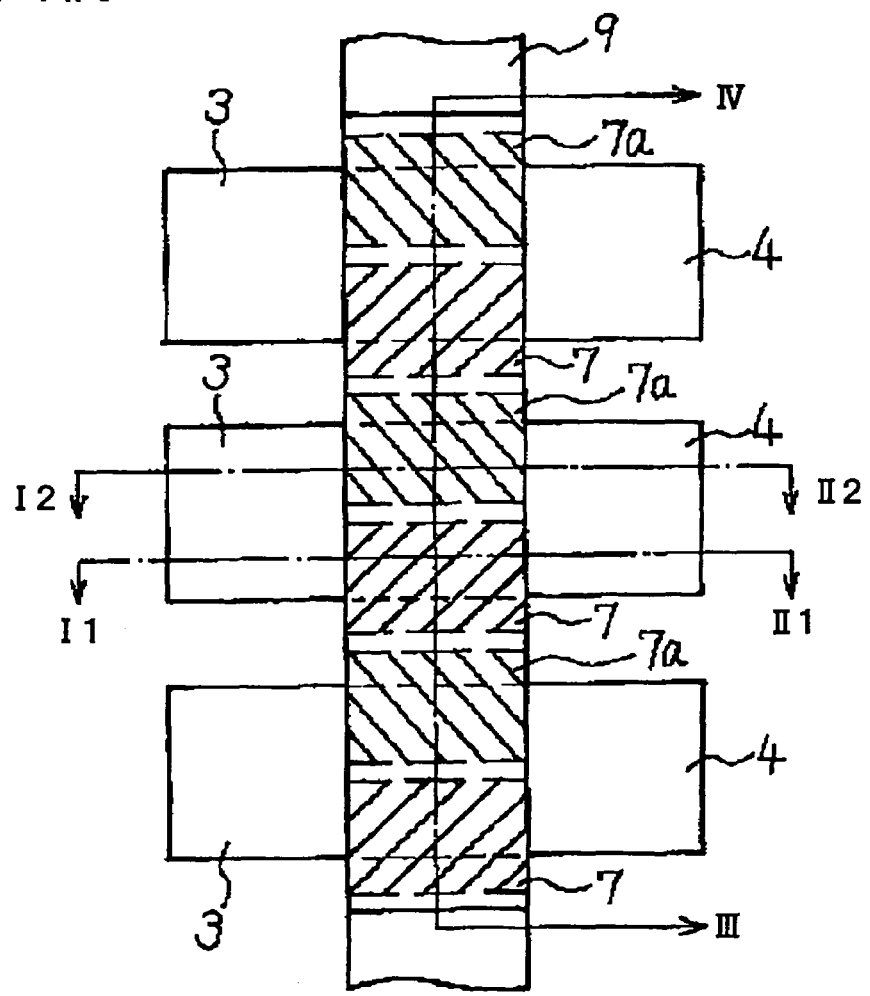
FIG. 154 is a schematic plan view of another conventional semiconductor memory device.
Figure 155:
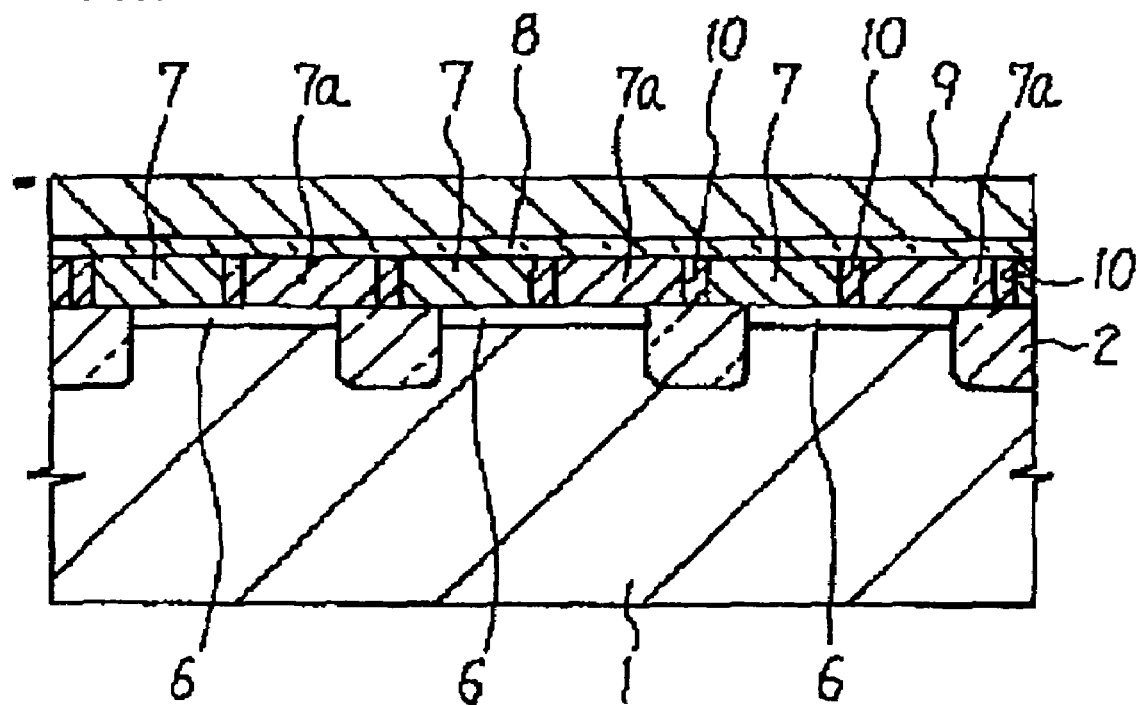
FIG. 155 is a cross sectional view of the semiconductor memory device taken along line III-IV of FIG. 154.

According to this manufacturing method 3, in the process where the impurity diffusion layers 720 and 710 are formed in portions of or the entirety of the upper portions of and the corners of the protruding semiconductor layers 110 as well as in silicon substrate 100, the side wall spacers of an insulating film such as the silicon nitride film 220 or of a conductive film are used as a mask so that arsenic or phosphorus is implanted into at least one or more active region surfaces of the protruding semiconductor layers 110 in the direction perpendicular to the surfaces with an inclination of 0° with an implantation energy of 5 to 100 keV by means of the ion implantation method so that the dose becomes approximately $1 \times 10^{12}/cm^2$ to $1 \times 10^{17}/cm^2$ and an offset structure is formed (FIGS. 151 and 152). Here, the processes other than the above description in the manufacturing method 3 are essentially the same as in the manufacturing method 1. Here, according to this manufacturing method 3 it is necessary to prevent the active region surfaces of the protruding semiconductor layers 110 and the impurity diffusion layers 720 and 710 from overlapping each other as a result of impurity diffusion by means of a thermal treatment.

According to a semiconductor memory device of the present invention, the semiconductor substrate has protruding semiconductor layers on which memory cells are formed, and thereby, an increase in the capacity of the memory cells per unit area can be achieved. In particular, the steps of the protruding semiconductor layers can be increased so that an increase in the degree of the integration becomes possible.

In addition, the charge storage layers are formed of ONO films, and thereby, it becomes possible for one memory cell to store 2 bit data.

Furthermore, the height of the steps of the protruding semiconductor layers can be sufficiently secured so that it becomes possible to suppress a punch through between bit lines and source line diffusion layers without an increase of the area occupied by the cells, and thereby, a semiconductor memory device having a high reliability can be obtained.

In addition, according to a manufacturing method for a semiconductor memory device of the present invention, positioning in the height direction and isolation of memory cells in the direction vertical to the substrate, which used to be difficult due to low control ability in the manufacture of a three dimensional memory, can be implemented mainly by means of anisotropic etching, and therefore, an easy formation of a three dimensional memory cell array becomes possible. Furthermore, many self-alignment processes can be used without depending on the photolithographic technology so that a reduction in the period of time for manufacture as a result of a simple manufacturing process, an increase in the yield and a prevention of dispersion in the cell characteristics can be implemented, and it becomes possible to manufacture a semiconductor memory device having a large capacity and a high reliability at a low cost. In particular, memory cells can be formed in a collective manner without depending on the difference of the steps so that the dispersion can be restricted and a reduction in cost, a reduction in the period of time for the manufacture and an increase in the yield can be implemented without fail.

What is claimed is:

1. A semiconductor memory device comprising one or more protruding semiconductor layers formed on a semiconductor substrate of a first conductivity type and a plurality of memory cells on surfaces of the protruding semiconductor layers, wherein a memory cell of the plurality of memory cells comprises a charge storage layer, a control gate and an impurity diffusion layer of a second conductivity type which is formed in a portion of the one or more protruding semiconductor layers and the plurality of memory cells is aligned to at least a predetermined direction, the control gate is aligned to the predetermined direction and placed so as to be separated from another control gate, wherein the one or more protruding semiconductor layers are of the same first conductivity type as that of the semiconductor substrate, wherein the one or more protruding semiconductor layers has at least two or more surfaces, and the plurality of memory cells is formed on said at least two or more surfaces of the protruding semiconductor layer, the plurality of memory cells aligned to the predetermined direction is further aligned in the direction perpendicular to the predetermined direction, and the memory cells aligned in the direction perpendicular to the predetermined direction are connected to each other in series, the protruding semiconductor layer is formed so as to have step forms having two or more steps in a cross section in the direction perpendicular to the surface of the semiconductor substrate where a charge storage layer and a control gate are placed on a side of each step of the protruding semiconductor layer in the step form, and the impurity diffusion layer of the second conductivity type is formed in a portion or the entirety of corners of the protruding semiconductor layer in the step form and, thereby, the plurality of memory cells formed on sides of the respective steps of the protruding semiconductor layer is connected in series.

2. The semiconductor memory device according to claim 1, wherein the protruding semiconductor layer is in a band shape as a cross section in horizontal direction related to the semiconductor substrate.

3. The semiconductor memory device according to claim 1, wherein the plurality of the protruding semiconductor layers are formed on the surface of the semiconductor substrate at predetermined intervals and the impurity diffusion layer of the second conductivity type is further formed on the surface of the semiconductor substrate between adjacent protruding semiconductor layers and, thereby, memory cells formed in the adjacent protruding semiconductor layers are connected in series.

4. The semiconductor memory device according to claim 1, wherein one or more element isolation films are placed in a direction in which memory cells are connected in series so as to form a fence shape.

5. The semiconductor memory device according to claim 1, wherein a bit line is provided in the direction in which memory cells are connected in series and a selection gate is provided at least at one end of the bit line so that the selection gate is connected to the memory cells.

6. The semiconductor memory device according to claim 1, wherein the control gates in the memory cells are connected to each other in the direction in which the memory cells are connected in series so as to form a word line.

7. The semiconductor memory device according to claim 1, wherein the impurity diffusion layers of the second conductivity type are at offset positions relative to the charge storage layer.

8. The semiconductor memory device according to claim 1, wherein the charge storage layer is formed of silicon oxide film/silicon nitride film/silicon oxide film.

9. The semiconductor memory device according to claim 1, wherein the charge storage layer is formed of a floating gate or nanocrystal silicon.

10. The semiconductor memory device according to claim 1, wherein at least one surface of the protruding semiconductor layer on which the charge storage layer is formed has a crystal plane direction having a high mobility of minority carriers in the protruding semiconductor layer.

11. The semiconductor memory device according to claim 1, wherein the control gates are formed of a metal.

* * * * *